(12) United States Patent
Breed et al.

(10) Patent No.: US 7,880,594 B2
(45) Date of Patent: Feb. 1, 2011

(54) SWITCH ASSEMBLIES AND METHOD FOR CONTROLLING VEHICULAR COMPONENTS

(75) Inventors: David S. Breed, Boonton Township, NJ (US); Wendell C. Johnson, Kaneohe, HI (US); Wilbur E. DuVall, Reeds Spring, MO (US)

(73) Assignee: Automotive Technologies International, Inc., Denville, NJ (US)

( * ) Notice: Subject to any disclaimer, the term of this patent is extended or adjusted under 35 U.S.C. 154(b) by 825 days.

(21) Appl. No.: 11/428,498

(22) Filed: Jul. 3, 2006

(65) Prior Publication Data

US 2007/0096565 A1 May 3, 2007

Related U.S. Application Data

(63) Continuation-in-part of application No. 10/642,028, filed on Aug. 15, 2003, now Pat. No. 7,253,725, application No. 11/428,498, which is a continuation-in-part of application No. 10/931,288, filed on Aug. 31, 2004, now Pat. No. 7,164,117, which is a continuation-in-part of application No. 10/613,453, filed on Jul. 3, 2003, now Pat. No. 6,850,824, which is a continuation-in-part of application No. 10/188,673, filed on Jul. 3, 2002, now Pat. No. 6,738,697, which is a continuation-in-part of application No. 10/079,065, filed on Feb. 19, 2002, now Pat. No. 6,662,642, which is a continuation-in-part of application No. 09/765,558, filed on Jan. 19, 2001, now Pat. No. 6,748,797, said application No. 10/931,288 is a continuation-in-part of application No. 10/805,903, filed on Mar. 22, 2004, now Pat. No. 7,050,897, which is a continuation-in-part of application No. 10/188,673, filed on Jul. 3, 2002, now Pat. No. 6,738,697, application No. 11/428,498, which is a continuation-in-part of application No. 11/082,739, filed on Mar. 17, 2005, now Pat. No. 7,421,321, which is a continuation-in-part of application No. 10/701,361, filed on Nov. 4, 2003, now Pat. No. 6,988,026, and a continuation-in-part of application No. 10/642,028, filed on Aug. 15, 2003, now Pat. No. 7,253,725, which is a continuation-in-part of application No. 10/613,453, filed on Jul. 3, 2003, now Pat. No. 6,850,824, and a continuation-in-part of application No. 10/079,065, filed on Feb. 19, 2002, now Pat. No. 6,662,642, and a continuation-in-part of application No. 09/765,558, filed on Jan. 19, 2001, now Pat. No. 6,748,797, application No. 11/428,498, which is a continuation-in-part of application No. 11/220,139, filed on Sep. 6, 2005, now Pat. No. 7,103,460, which is a continuation-in-part of application No. 11/120,065, filed on May 2, 2005, now abandoned, application No. 11/428,498, and a continuation-in-part of application No. 11/382,091, filed on May 8, 2006, now Pat. No. 7,549,327, and a continuation-in-part of application No. 11/381,609, filed on May 4, 2006, now Pat. No. 7,408,453, which is a continuation-in-part of application No. 11/379,078, filed on Apr. 18, 2006, now Pat. No. 7,379,800, and a continuation-in-part of application No. 11/421,500, filed on Jun. 1, 2006.

(60) Provisional application No. 60/415,862, filed on Oct. 3, 2002, provisional application No. 60/231,378, filed on Sep. 8, 2000, provisional application No. 60/291,511, filed on May 16, 2001, provisional application No. 60/304,013, filed on Jul. 9, 2001.

(51) Int. Cl.
*B60Q 1/00* (2006.01)
*H04Q 5/22* (2006.01)

(52) U.S. Cl. ............ 340/425.5; 340/438; 340/475; 340/459; 340/10.33; 340/10.42; 180/273; 280/732; 73/514.28

(58) Field of Classification Search ........... 340/425.5, 340/438, 475, 539, 10.33, 10.42, 573.1; 180/273; 280/732; 73/514.28
See application file for complete search history.

(56) References Cited

U.S. PATENT DOCUMENTS

| | | | |
|---|---|---|---|
| 3,270,283 A | | 8/1966 | Ikrath et al. |
| 3,796,888 A | * | 3/1974 | Berry .................... 180/270 |
| 4,382,386 A | | 5/1983 | Coussot et al. |

| | | | |
|---|---|---|---|
| 4,402,524 | A | 9/1983 | D'Antonio et al. |
| 4,994,798 | A | 2/1991 | McColl |
| 5,065,067 | A | 11/1991 | Todd et al. |
| 5,801,475 | A | 9/1998 | Kimura |
| 5,949,340 | A * | 9/1999 | Rossi .................. 340/573.1 |
| 6,003,378 | A | 12/1999 | Scherr et al. |
| 6,037,879 | A * | 3/2000 | Tuttle .................... 340/10.4 |
| 6,056,079 | A * | 5/2000 | Cech et al. ............. 180/273 |
| 6,078,252 | A | 6/2000 | Kulczycki et al. |
| 6,084,503 | A | 7/2000 | Ruile et al. |
| 6,144,288 | A | 11/2000 | Jahn et al. |
| 6,255,956 | B1 * | 7/2001 | Tingley et al. ............ 340/667 |
| 6,285,295 | B1 * | 9/2001 | Casden ................ 340/825.22 |
| 6,407,483 | B1 | 6/2002 | Nunuparov et al. |
| 6,428,095 | B1 * | 8/2002 | Hirata .................. 297/217.3 |
| 6,541,893 | B2 | 4/2003 | Zhu et al. |
| 6,571,638 | B2 | 6/2003 | Hines et al. |
| 6,630,894 | B1 * | 10/2003 | Boyd et al. ................ 341/22 |
| 6,662,642 | B2 | 12/2003 | Breed et al. |
| 6,700,310 | B2 | 3/2004 | Maue et al. |
| 6,748,797 | B2 | 6/2004 | Breed et al. |
| 6,907,787 | B2 | 6/2005 | Cook et al. |
| 6,933,655 | B2 | 8/2005 | Morrison et al. |
| 6,958,565 | B1 | 10/2005 | Liu |

FOREIGN PATENT DOCUMENTS

| | | |
|---|---|---|
| GB | 1488155 | 10/1977 |
| GB | 2383415 | 2/2005 |

OTHER PUBLICATIONS

Bulst, W.E. et al., "State of the Art in Wireless Sensing with Surface Acoustic Waves", 1998 IEEE, pp. 2391-2396, Munich, Germany.

Vlassov, Yu.N. et al., "Precision SAW Pressure Sensors", 1993 IEEE International Frequency Control Symposium, pp. 665-669, Novosibirsk, Russia.

Schimetta, G. et al., "A Wireless Pressure Measurement System Using a SAW Hybrid Sensor", 2000 IEEE, pp. 1407-1410, Munich, Germany.

* cited by examiner

*Primary Examiner*—Brian A Zimmerman
*Assistant Examiner*—Nam V Nguyen
(74) *Attorney, Agent, or Firm*—Brian Roffe

(57) ABSTRACT

Vehicle including a switch assembly includes a vehicular component subject to control by an occupant in the passenger compartment, and a switch assembly for controlling the component based on pressure applied by the occupant of the vehicle to an exposed surface of the vehicle. The switch assembly includes at least one wireless transmission component arranged to wirelessly transmit an indication of the application of pressure to the exposed surface, and a control mechanism for controlling the wireless transmission by the wireless transmission component(s) based on the application of pressure to the exposed surface. The control mechanism may be a switch or a variable impedance which react to the application of pressure to the exposed surface.

28 Claims, 33 Drawing Sheets

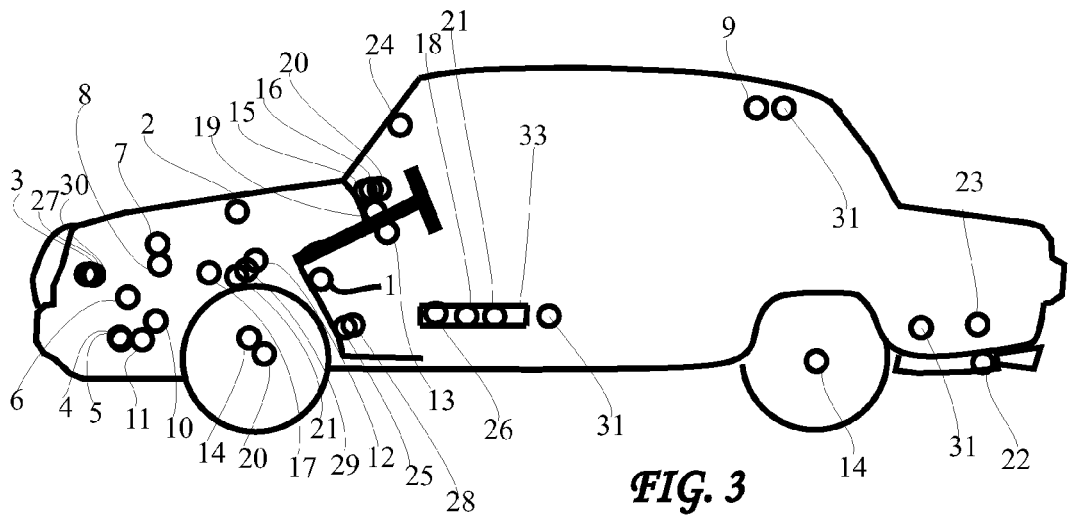

FIG. 3

| | |
|---|---|
| 1 | CRASH SENSOR |
| 2 | MICROPHONES |
| 3 | COOLANT THERMOMETER |
| 4 | OIL PRESSURE SENSOR |
| 5 | OIL LEVEL SENSOR |
| 6 | AIR FLOW METER |
| 7 | VOLTMETER |
| 8 | AMMETER |
| 9 | HUMIDITY SENSOR |
| 10 | ENGINE KNOCK SENSOR |
| 11 | OIL TURBIDITY SENSOR |
| 12 | THROTTLE POSITION SENSOR |
| 13 | STEERING TORQUE SENSOR |
| 14 | WHEEL SPEED SENSOR |
| 15 | TACHOMETER |
| 16 | SPEEDOMETER |
| 17 | OXYGEN SENSOR |
| 18 | PITCH & ROLL SENSOR |
| 19 | CLOCK |
| 20 | ODOMETER |
| 21 | PWR STR PRESSURE SENSOR |
| 22 | POLUTION SENSOR |
| 23 | FUEL GAGE |
| 24 | CABIN THEROMETER |
| 25 | TRANSMISSION FLD LVL SNSR |
| 26 | YAW SENSOR |
| 27 | COOLANT LEVEL SENSOR |
| 28 | TRANS. FLUID TURBIDITY |
| 29 | BREAK PRESSURE SENSOR |
| 30 | COOLANT PRESSURE SENSOR |
| 31 | ACCELEROMETERS |

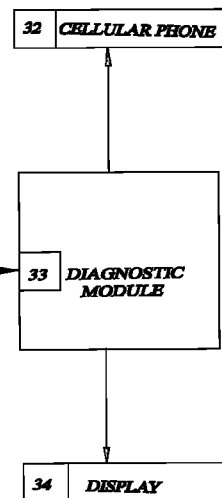

FIG. 4

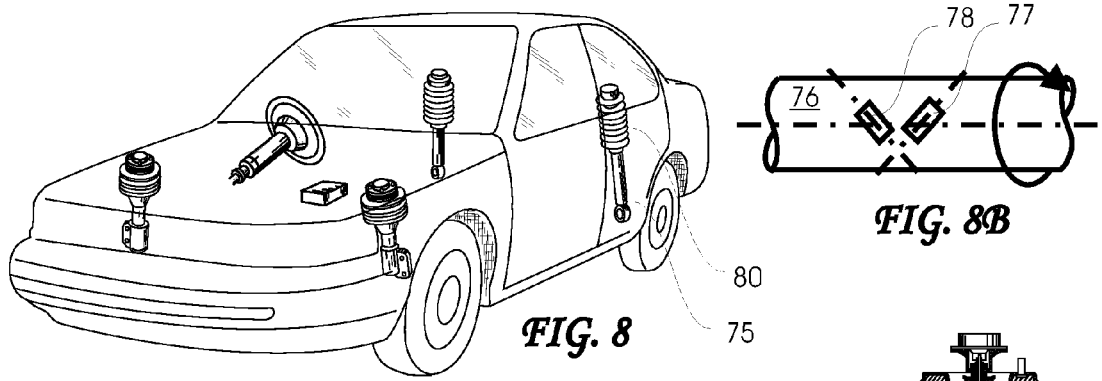
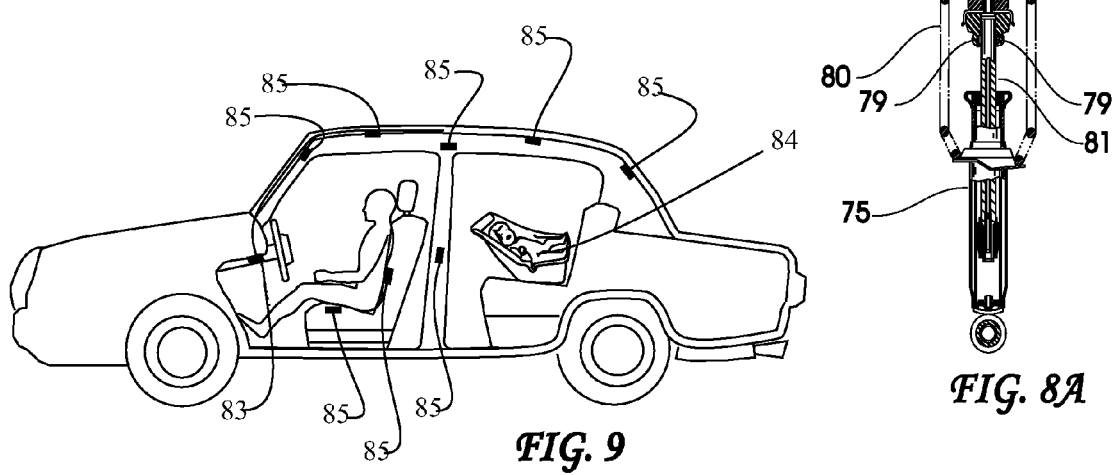
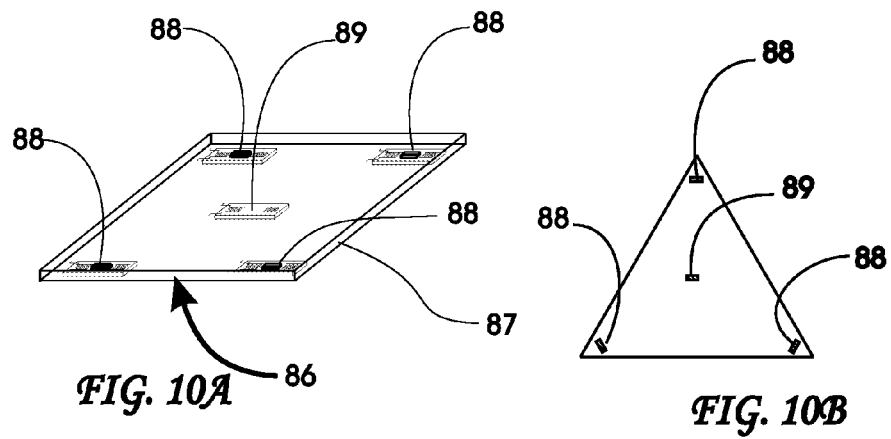

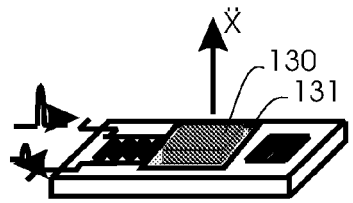
FIG. 17A
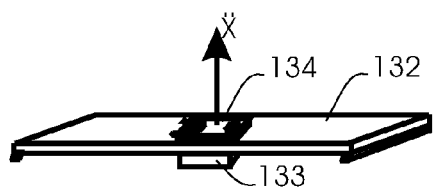
FIG. 17B
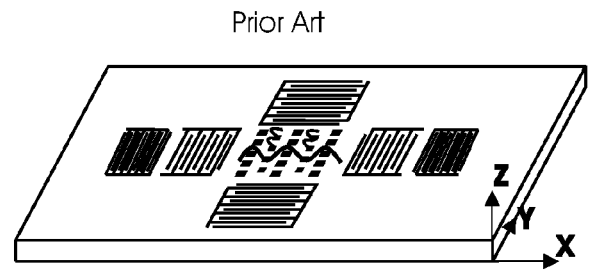
Prior Art
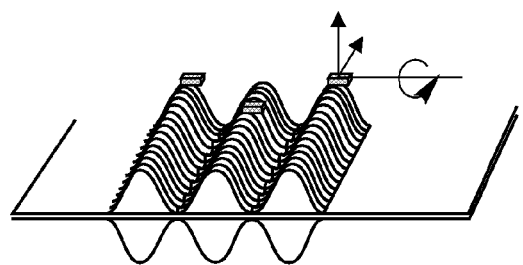
FIG. 18
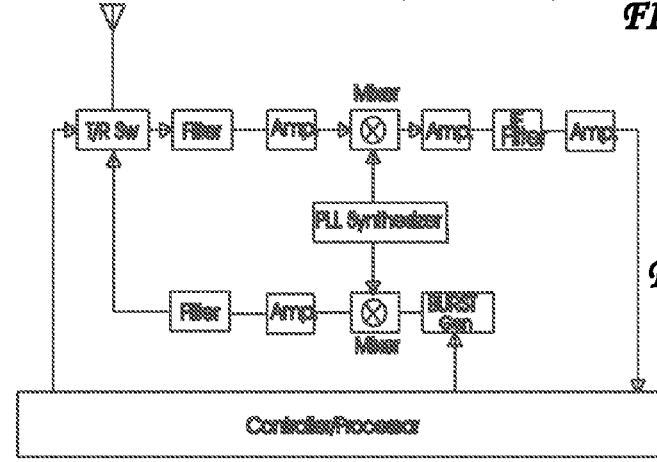
FIG. 19A
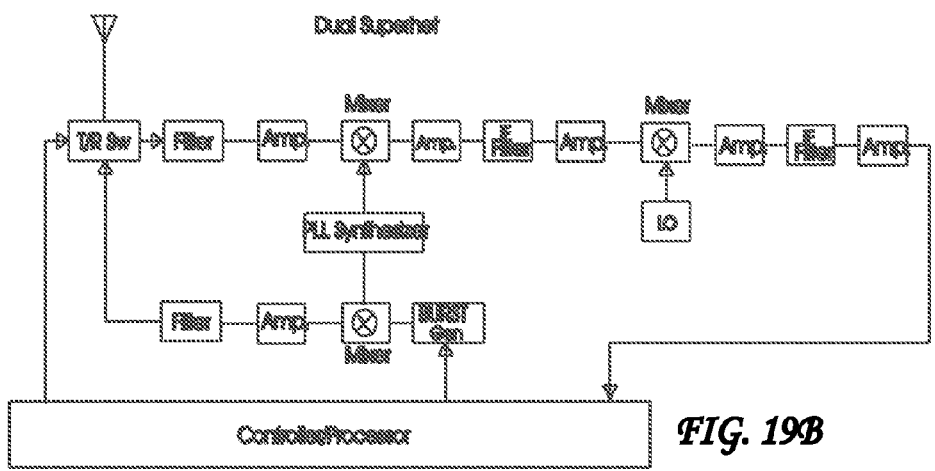
FIG. 19B

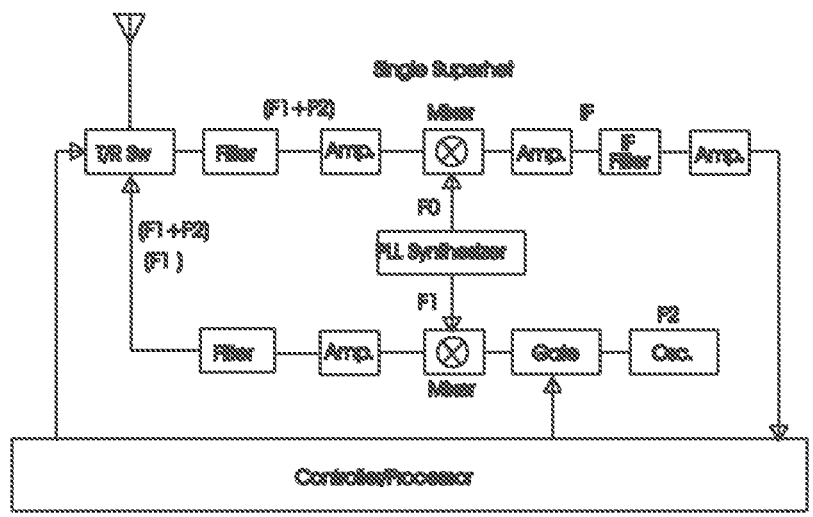
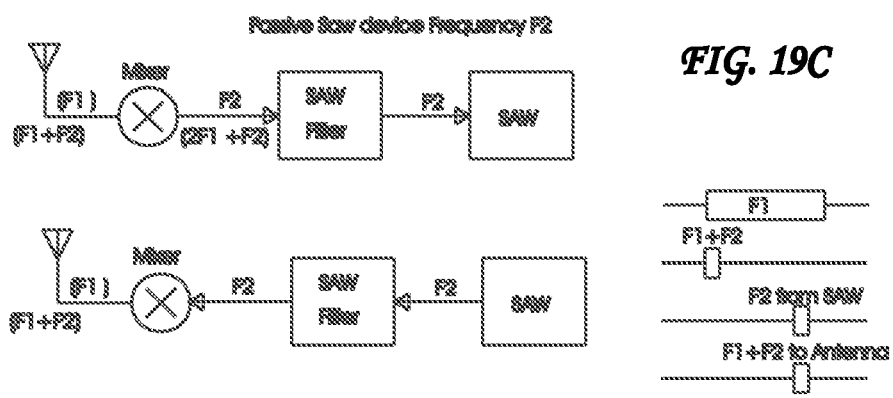
FIG. 19C
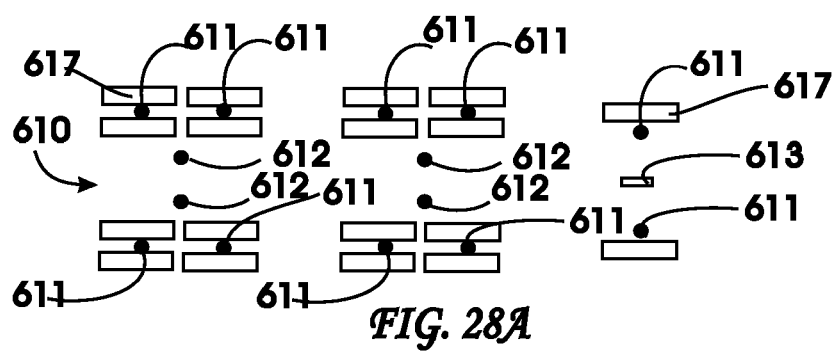
FIG. 28A
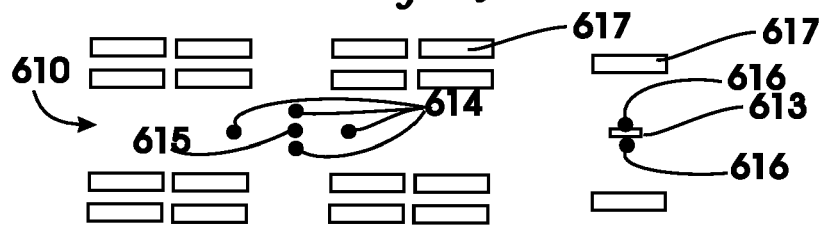
FIG. 28B

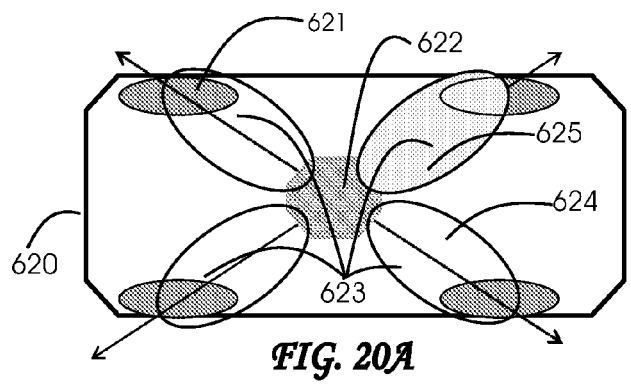
FIG. 20A
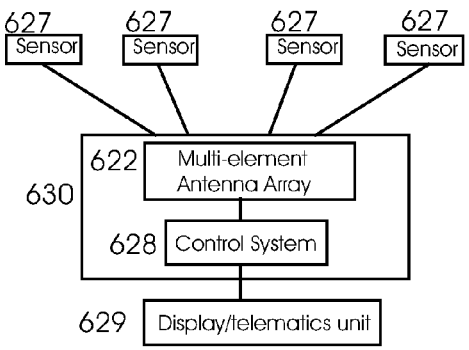
FIG. 20C
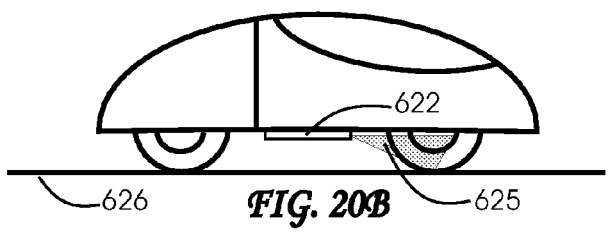
FIG. 20B
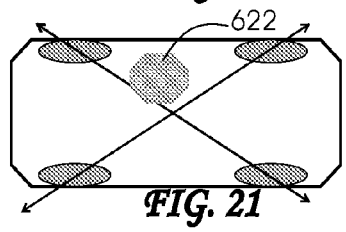
FIG. 21
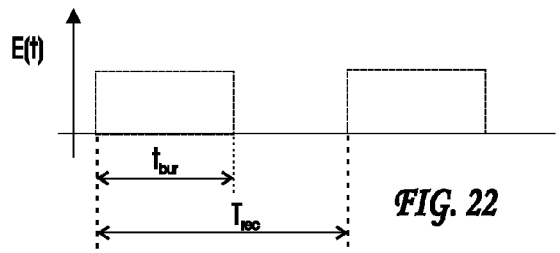
FIG. 22
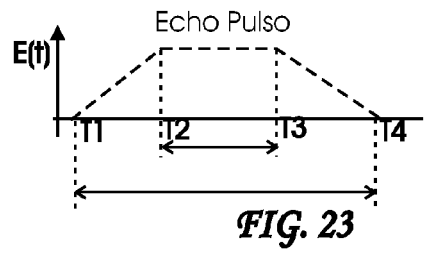
FIG. 23
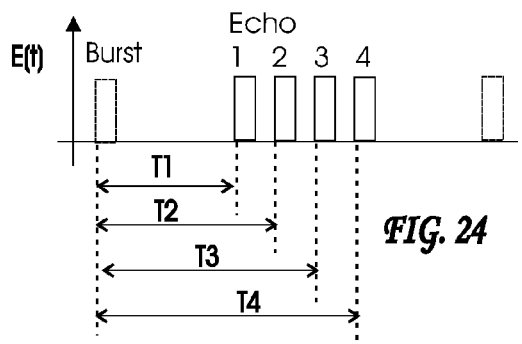
FIG. 24
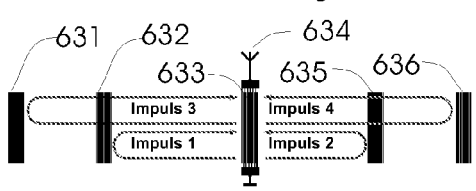
FIG. 25
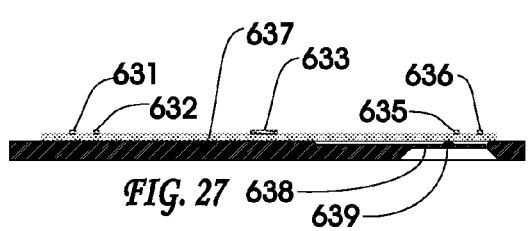
FIG. 27
FIG. 26

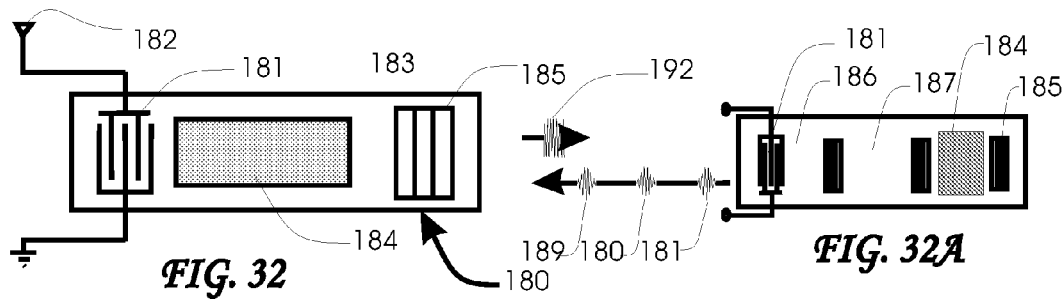
FIG. 32    FIG. 32A
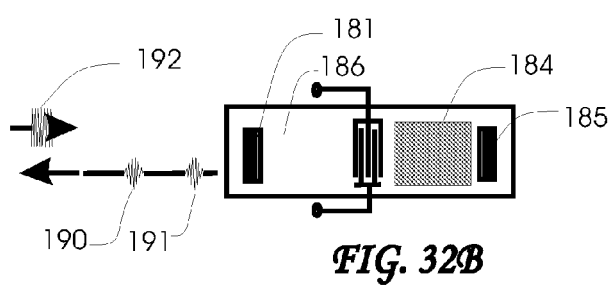    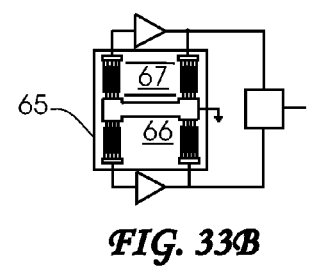
FIG. 32B    FIG. 33B
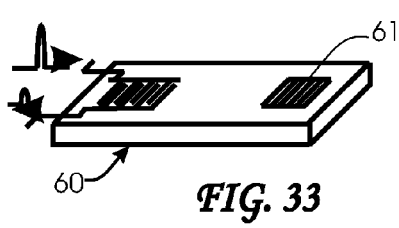    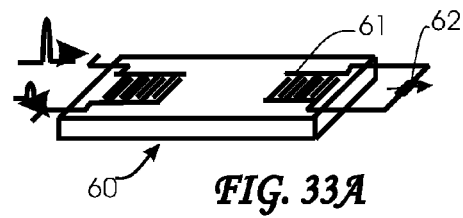
FIG. 33    FIG. 33A
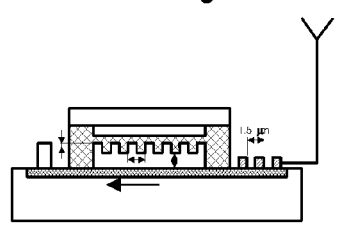    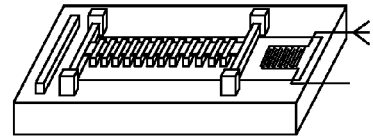
FIG. 34    FIG. 34A
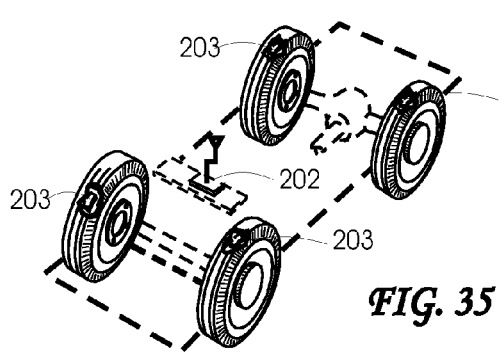    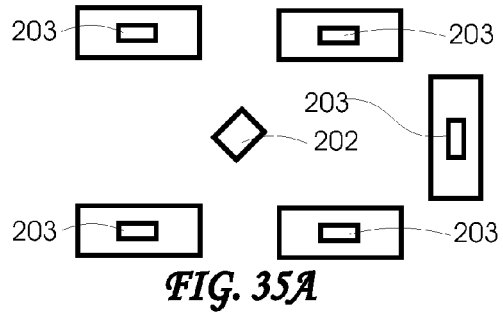
FIG. 35    FIG. 35A

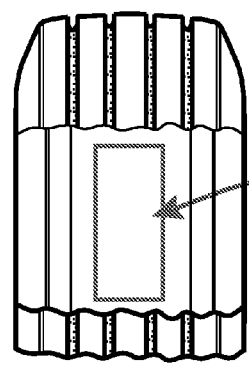
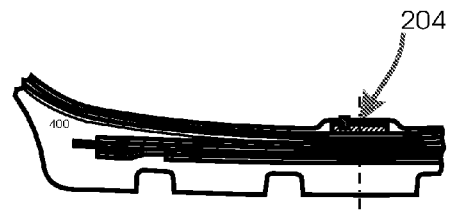
FIG. 36
FIG. 36A
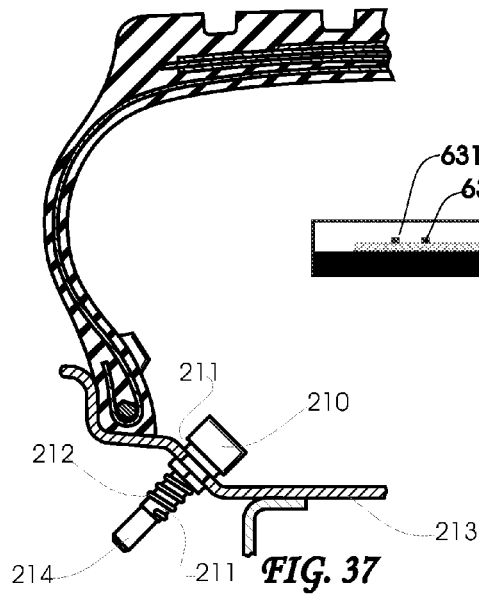
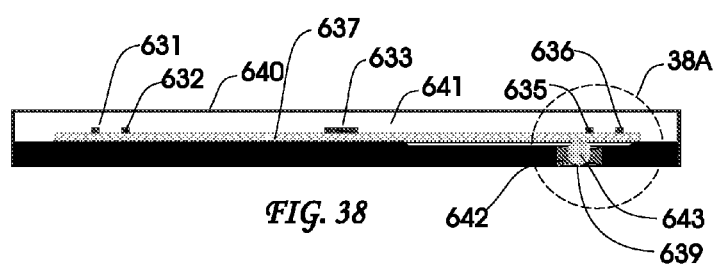
FIG. 37
FIG. 38
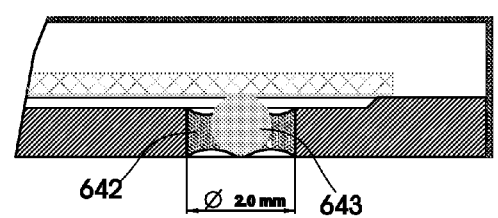
FIG. 38A
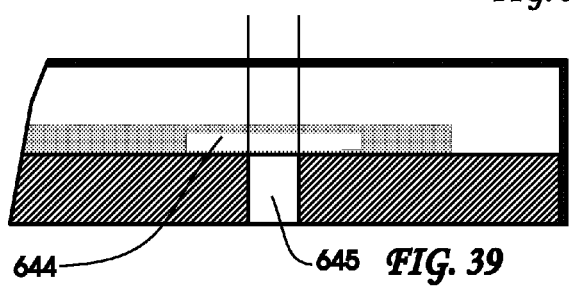
FIG. 39

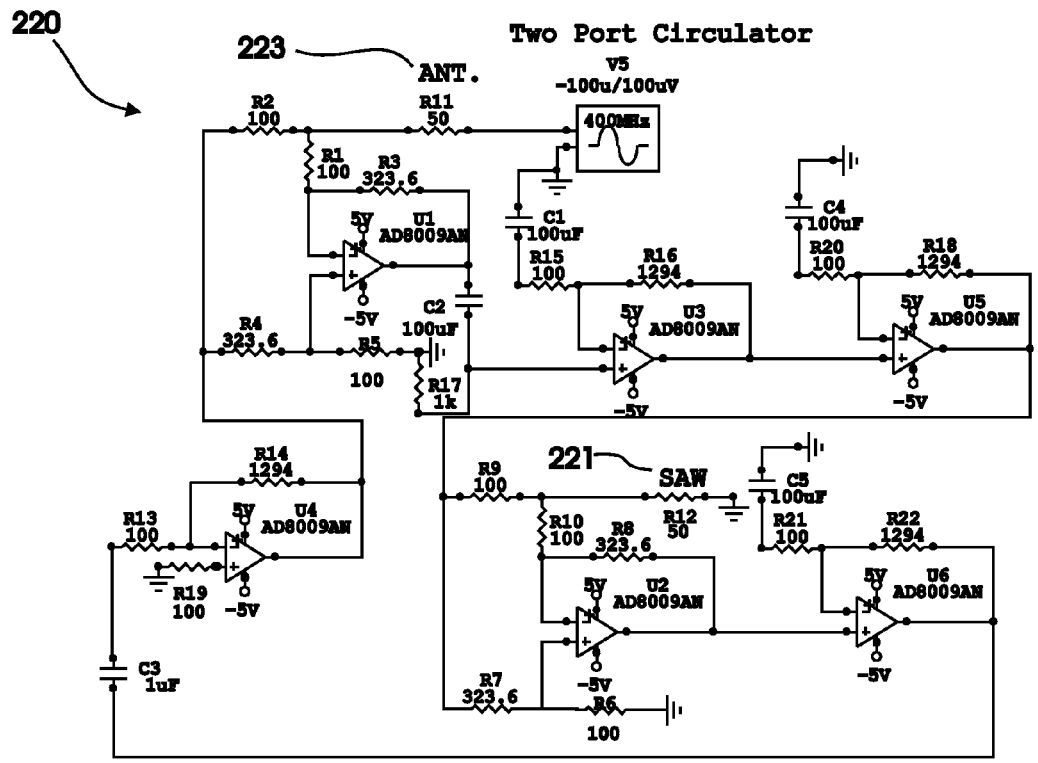
FIG. 43
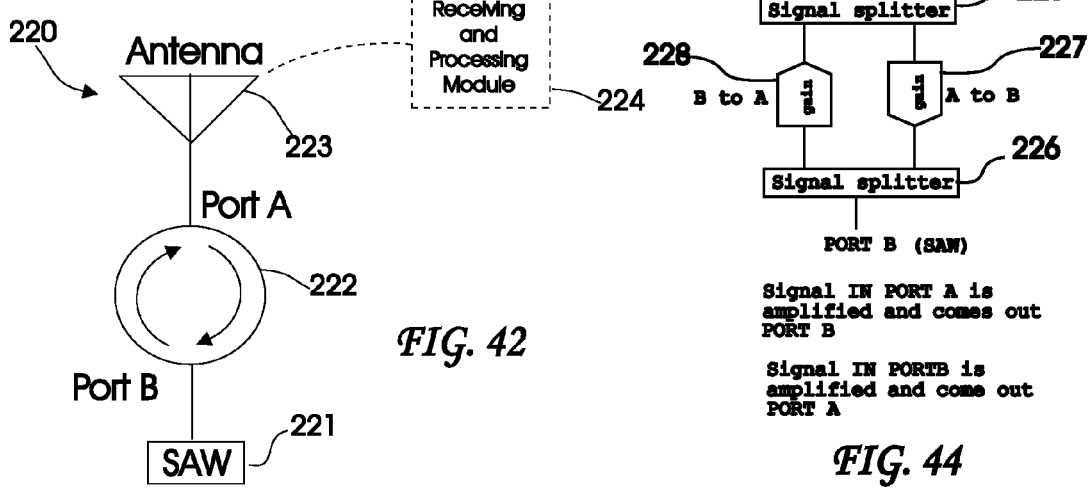
FIG. 42
FIG. 44

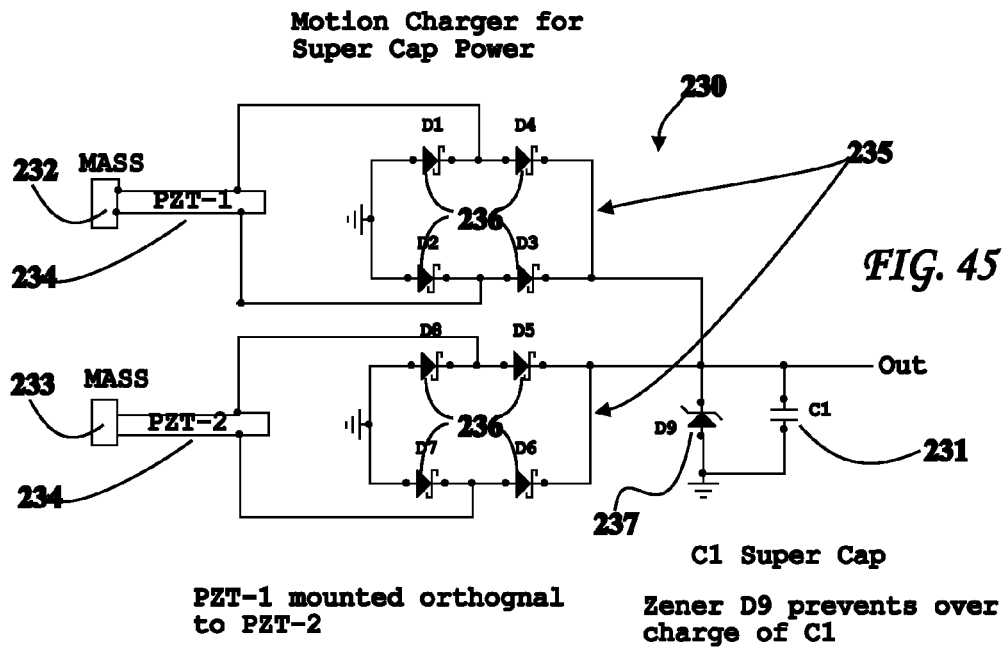
FIG. 45
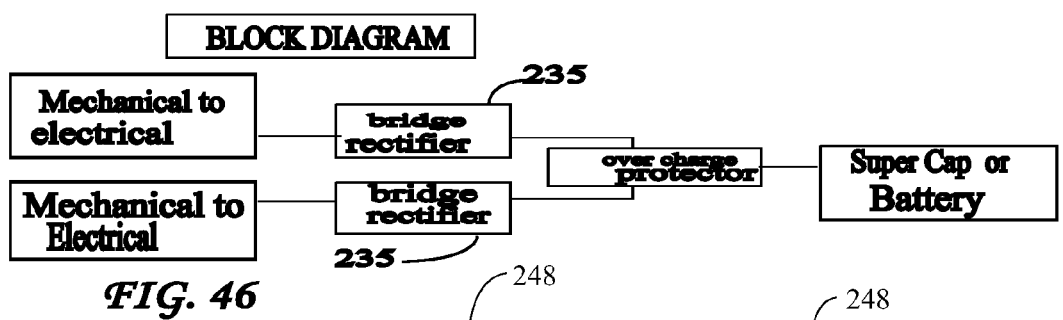
FIG. 46
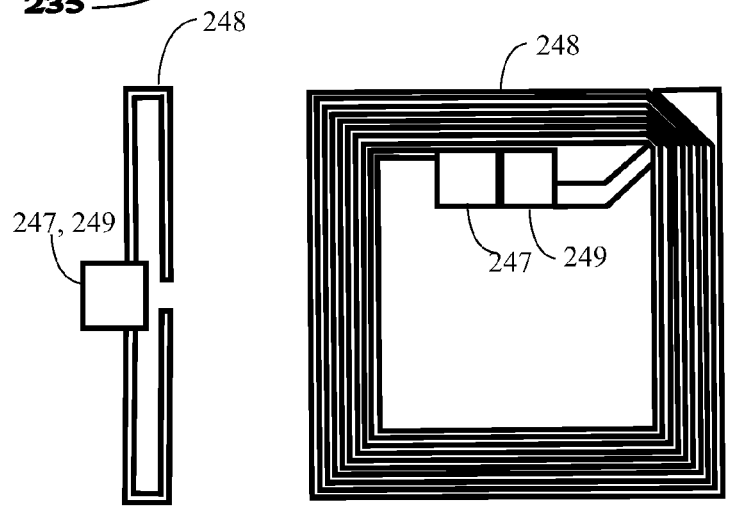
FIG. 48A
FIG. 48B

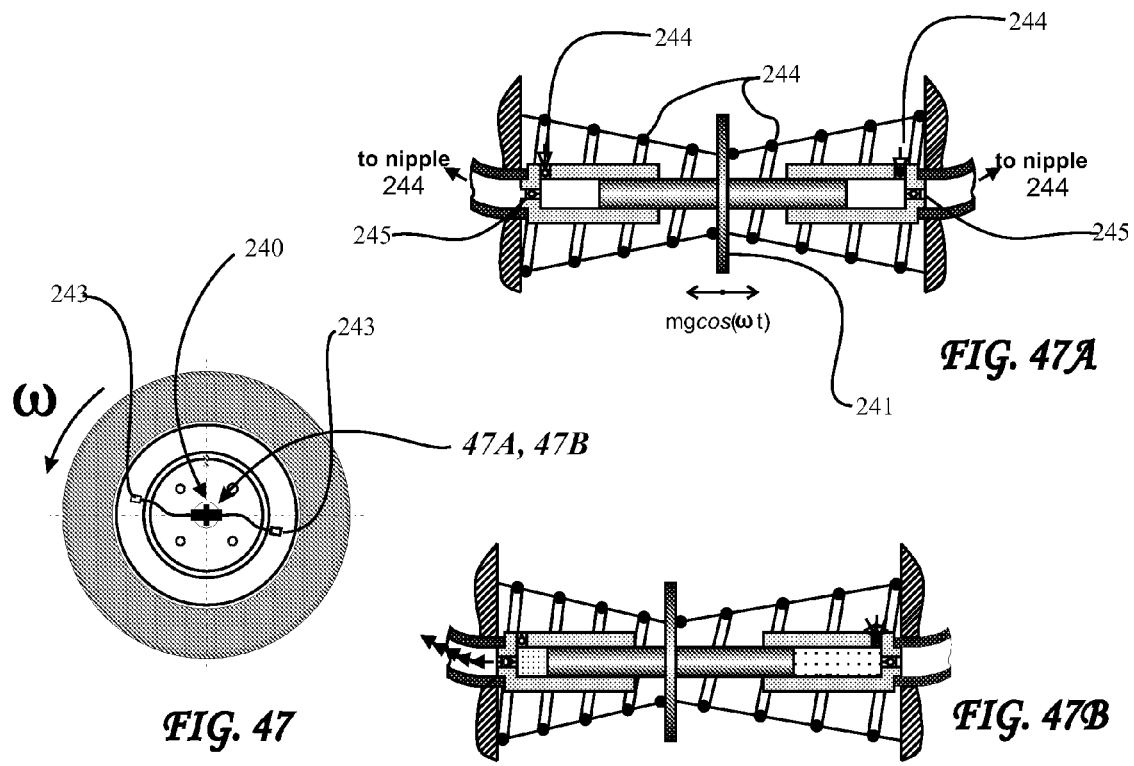
FIG. 47
FIG. 47A
FIG. 47B
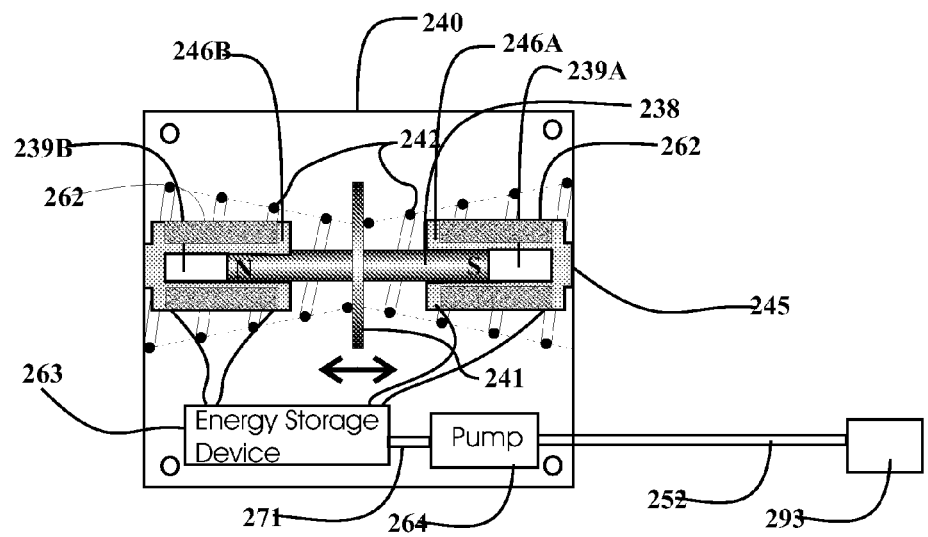
FIG. 47C

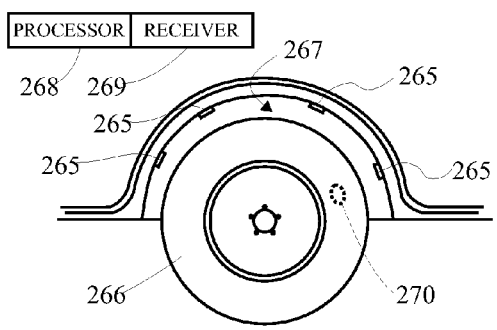
FIG. 56
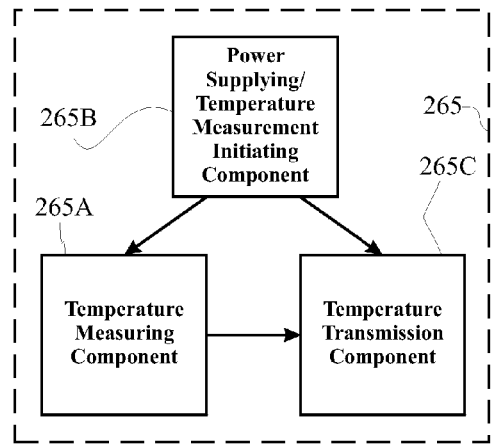
FIG. 56A
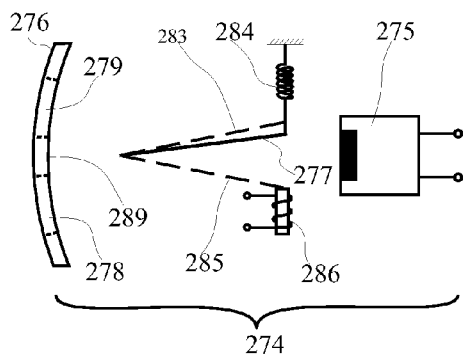
FIG. 57A
FIG. 57B
FIG. 58
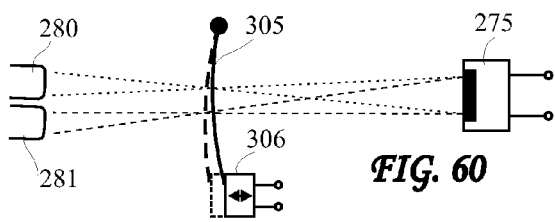
FIG. 60
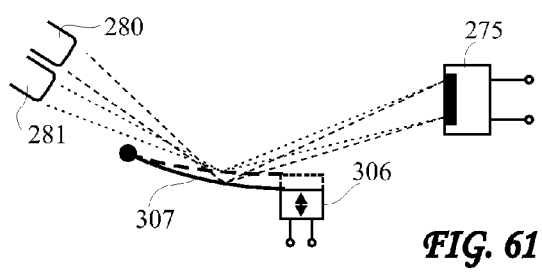
FIG. 61
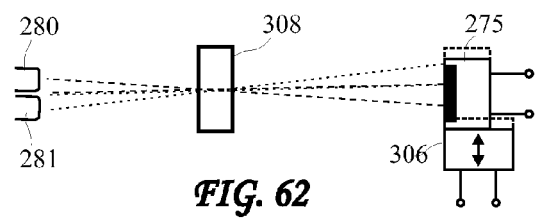
FIG. 62

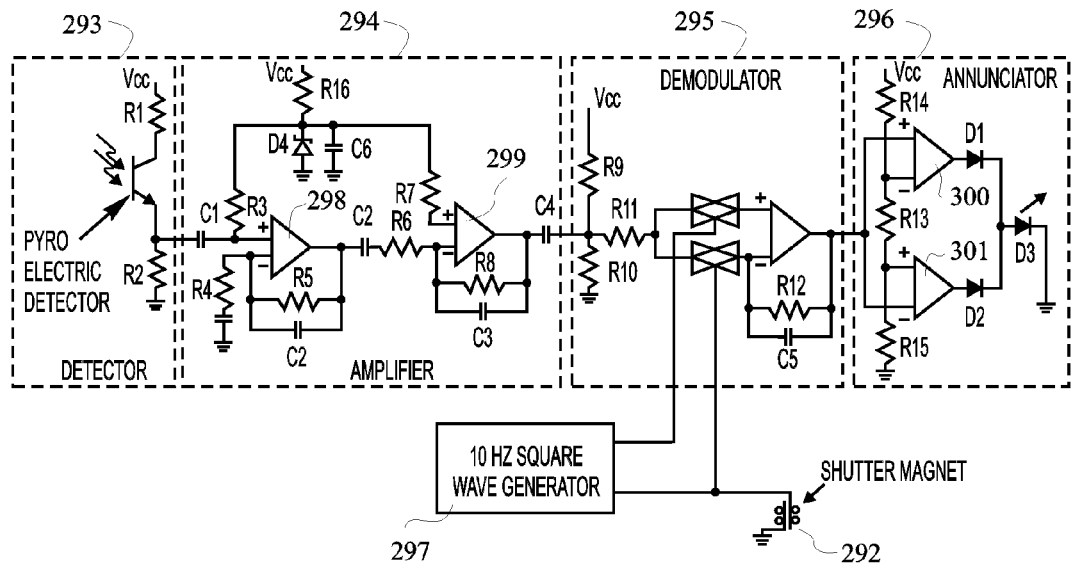
FIG. 59
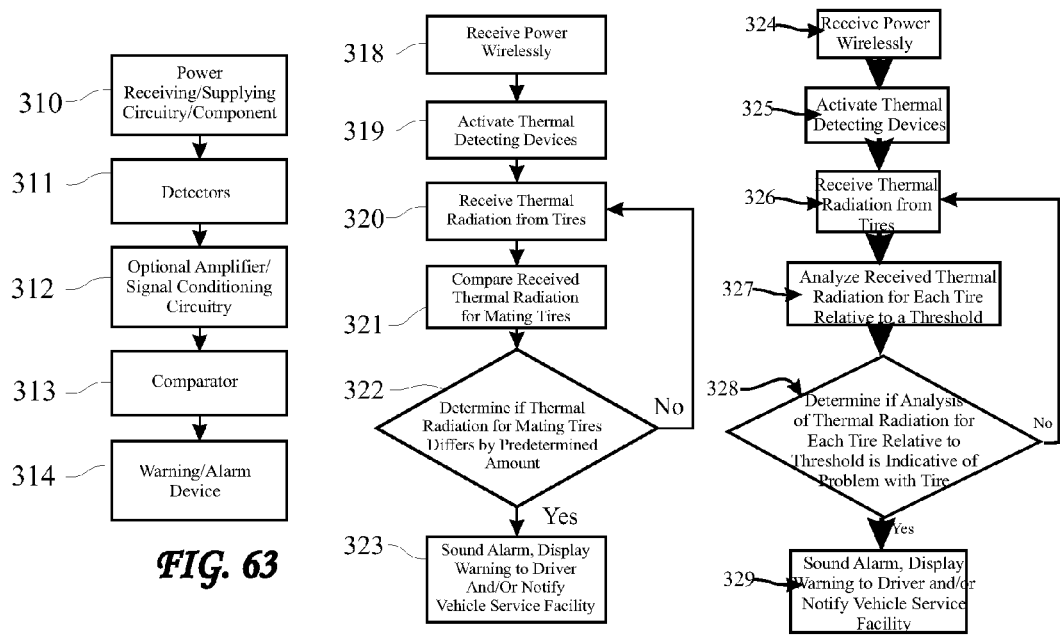
FIG. 63
FIG. 64
FIG. 65

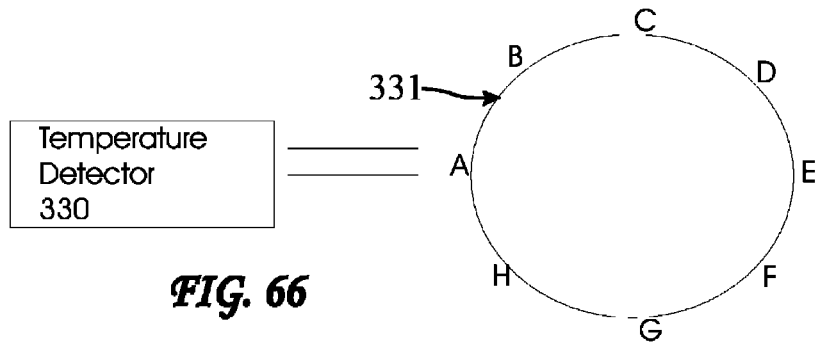
FIG. 66
| Circumferential Location on Tire | Detected Temperature (degrees) | Deviation from average (degrees) | Comparison to threshold of 70 degrees |
|---|---|---|---|
| A | 60 | 1 | Below |
| B | 61 | 0 | Below |
| C | 62 | 1 | Below |
| D | 61 | 0 | Below |
| E | 61 | 0 | Below |
| F | 75 | 14 | Above |
| G | 62 | 1 | Below |
| H | 60 | 1 | Below |
FIG. 67
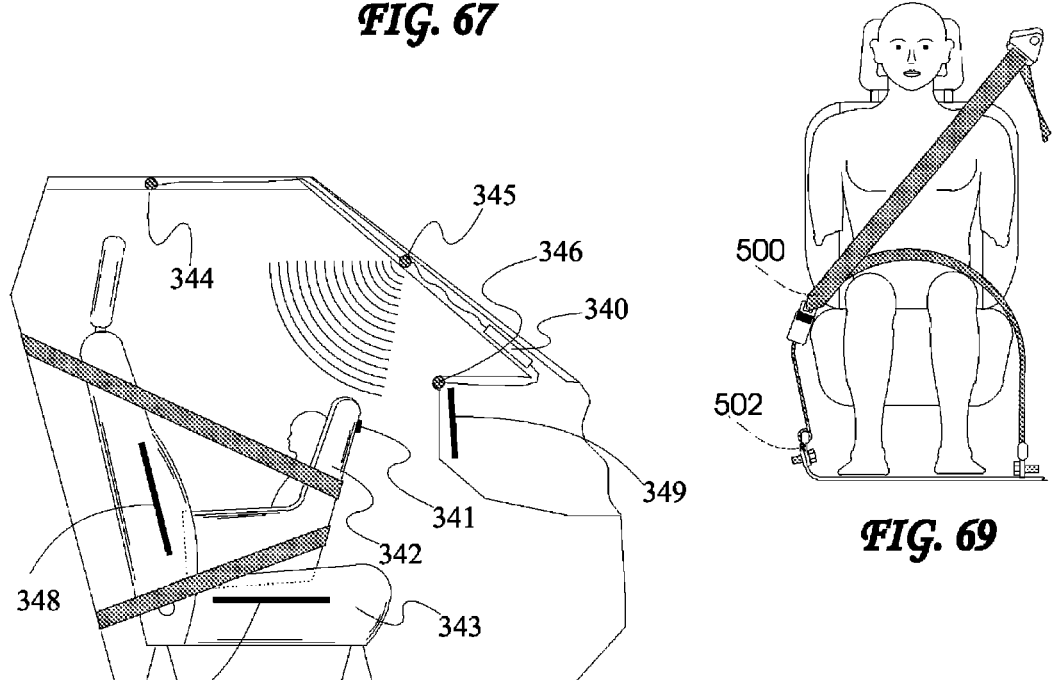
FIG. 68
FIG. 69

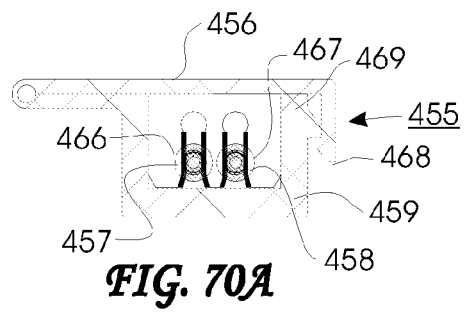
FIG. 70A
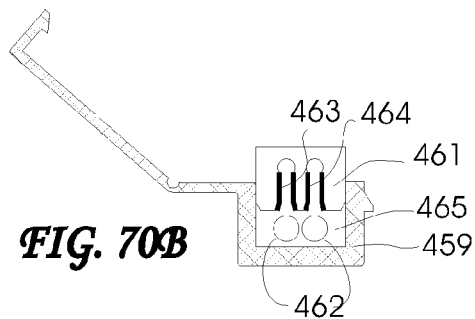
FIG. 70B
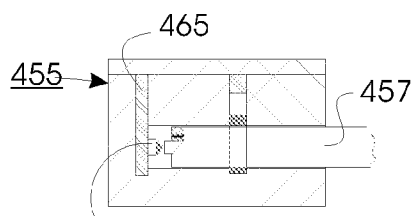
FIG. 70C
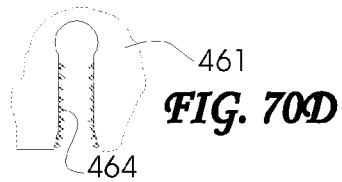
FIG. 70D
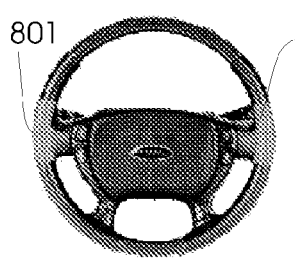
FIG. 71A
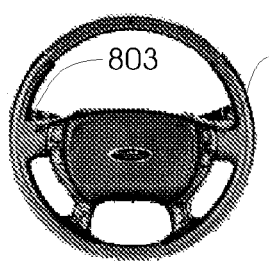
FIG. 71B
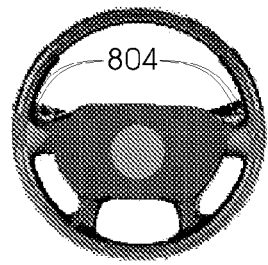
FIG. 71C
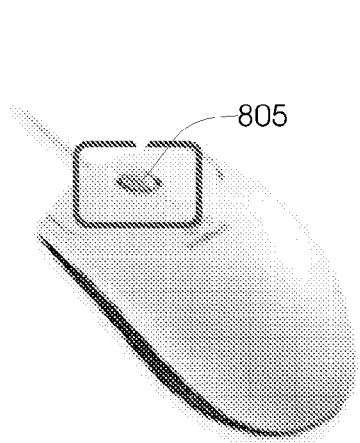
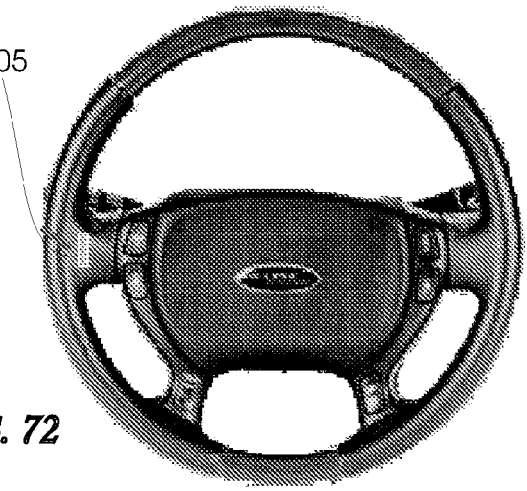
FIG. 72

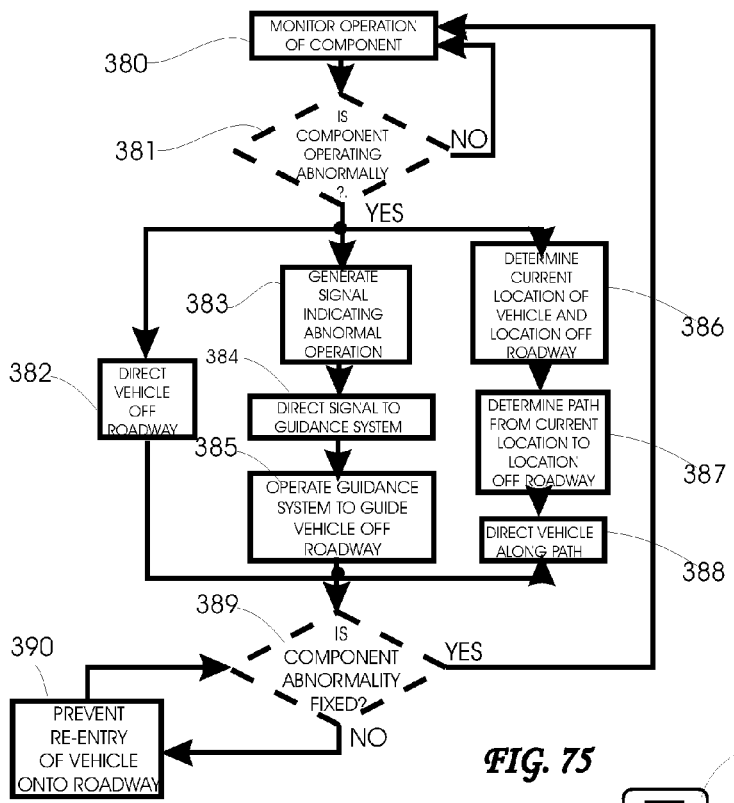
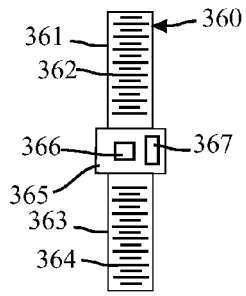
FIG. 73
FIG. 75
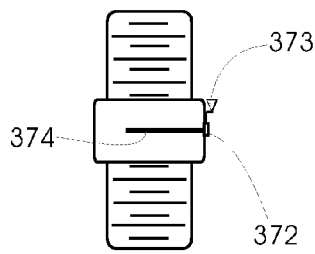
FIG. 74B
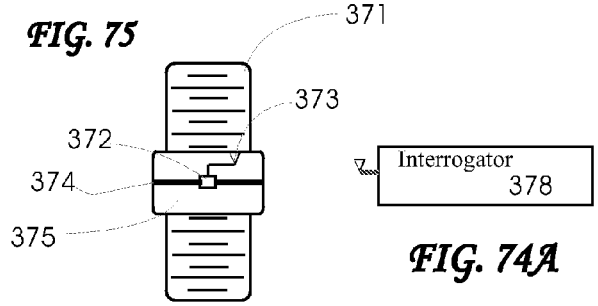
FIG. 74A
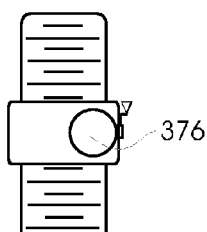
FIG. 74C
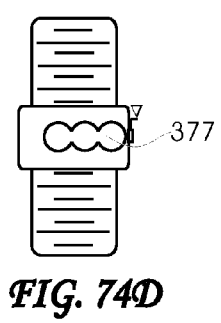
FIG. 74D
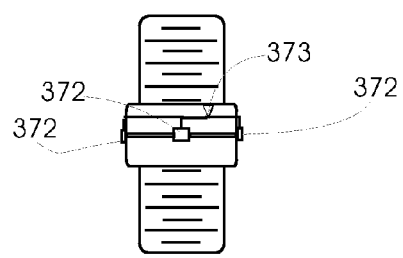
FIG. 74E

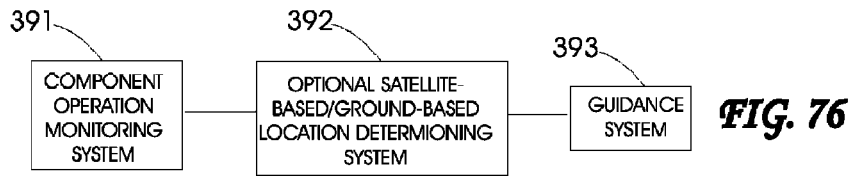
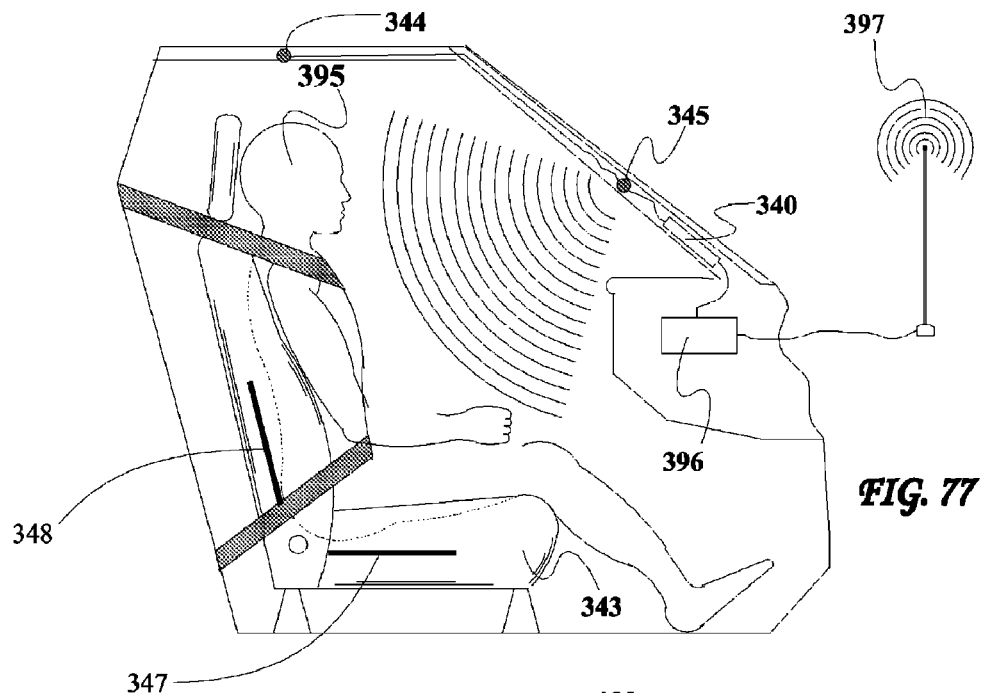
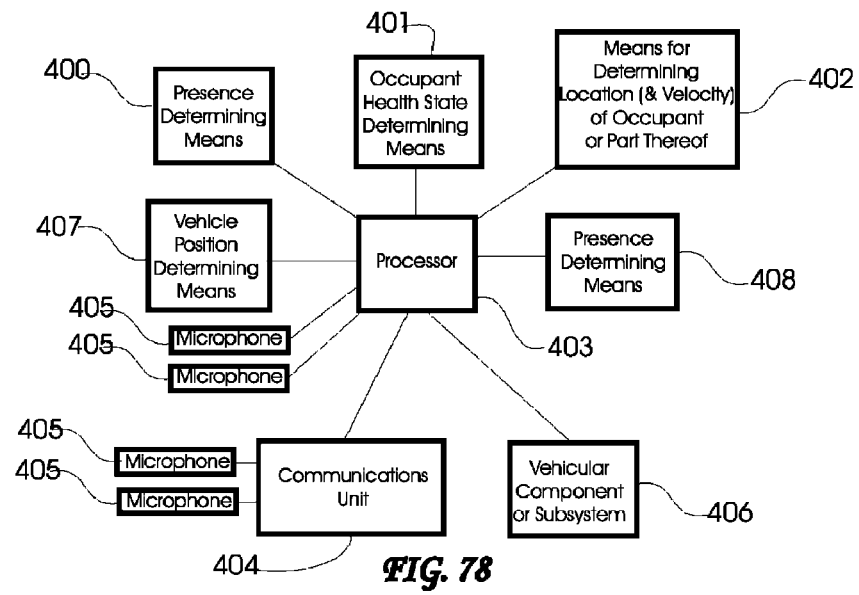

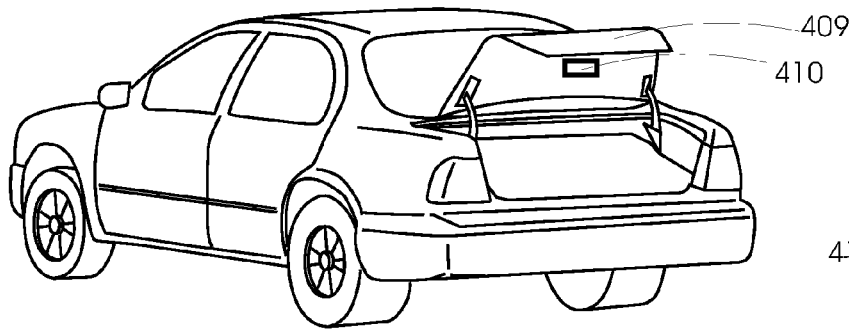
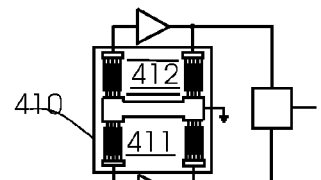
FIG. 79
FIG. 79A
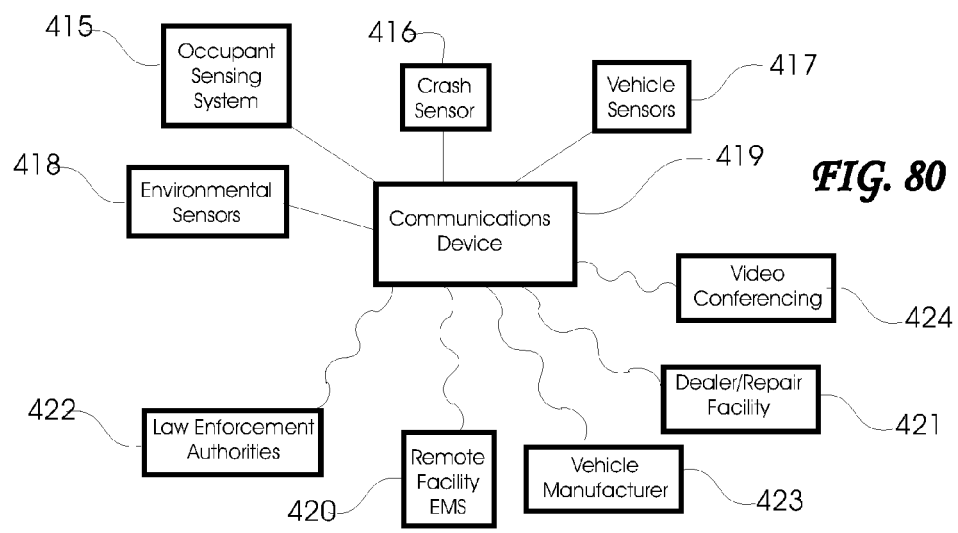
FIG. 80
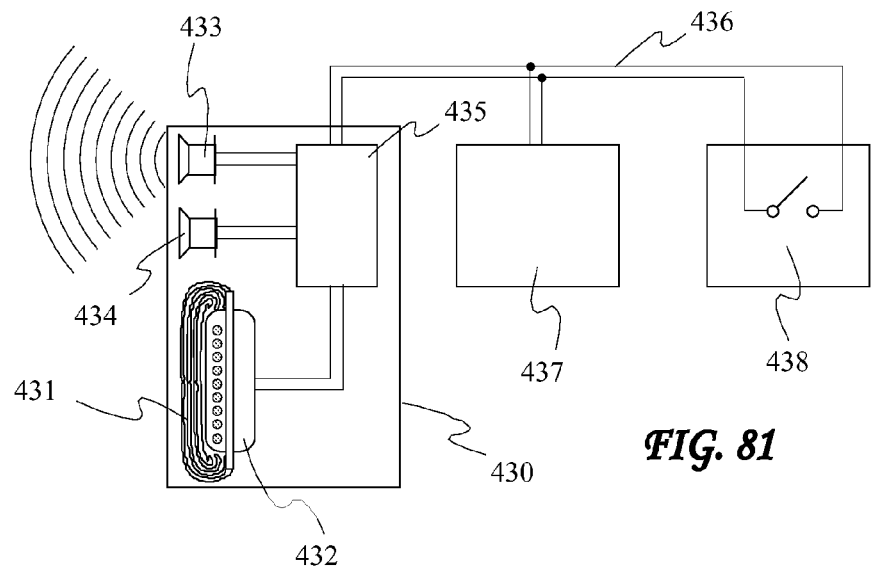
FIG. 81

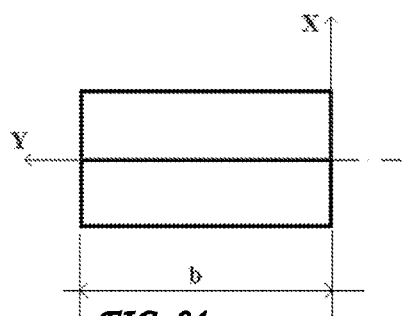
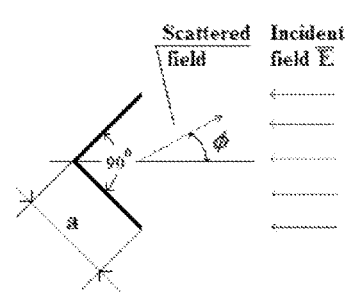
FIG. 84　　FIG. 84A
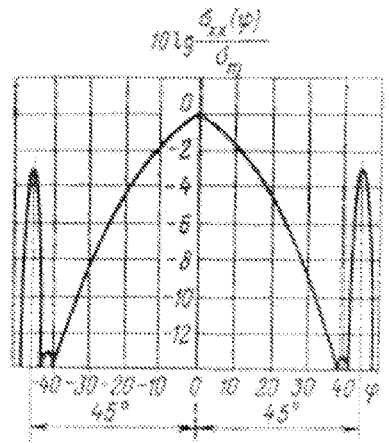
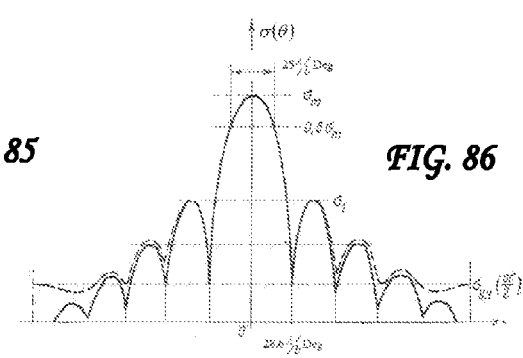
FIG. 85　　FIG. 86
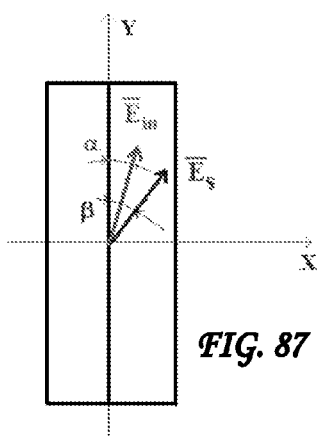
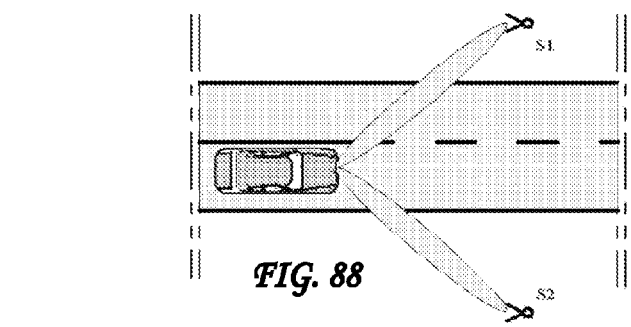
FIG. 87　　FIG. 88
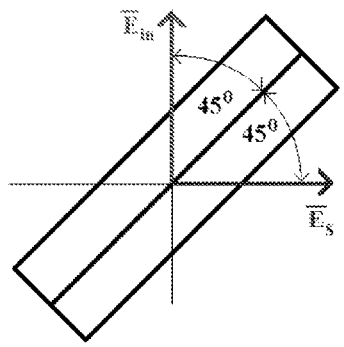
FIG. 89

SWITCH ASSEMBLIES AND METHOD FOR CONTROLLING VEHICULAR COMPONENTS

CROSS REFERENCE TO RELATED APPLICATIONS

This application is:

1. a continuation-in-part (CIP) of U.S. patent application Ser. No. 10/642,028 filed Aug. 15, 2003, now U.S. Pat. No. 7,253,725, which claims priority under 35 U.S.C. §119(e) of U.S. provisional patent application Ser. No. 60/415,862 filed Oct. 3, 2002, now expired;

2. a CIP of U.S. patent application Ser. No. 10/931,288 filed Aug. 31, 2004, now U.S. Pat. No. 7,164,117, which is a
   A. a CIP of U.S. patent application Ser. No. 10/613,453 filed Jul. 3, 2003, now U.S. Part. No. 6,850,824, which is a continuation of U.S. patent application Ser. No. 10/188,673 filed Jul. 3, 2002, now U.S. Pat. No. 6,738,697, which is:
      1) a CIP of U.S. patent application Ser. No. 10/079,065 filed Feb. 19, 2002, now U.S. Pat. No. 6,662,642, which is:
         a) a CIP of U.S. patent application Ser. No. 09/765,558 filed Jan. 19, 2001, now U.S. Pat. No. 6,748,797, which claims priority under 35 U.S.C. §119(e) of U.S. provisional patent application Ser. No. 60/231,378 filed Sep. 8, 2000, now expired; and
         b) claims priority under 35 U.S.C. §119(e) of U.S. provisional patent application Ser. No. 60/269,415 filed Feb. 16, 2001, now expired, U.S. provisional patent application Ser. No. 60/291,511 filed May 16, 2001, now expired, and U.S. provisional patent application Ser. No. 60/304,013 filed Jul. 9, 2001, now expired; and
   B. a CIP of U.S. patent application Ser. No. 10/805,903 filed Mar. 22, 2004, now U.S. Pat. No. 7,050,897, which is a CIP of U.S. patent application Ser. No. 10/188,673, filed Jul. 3, 2002, now U.S. Pat. No. 6,738,697;

3. a CIP of U.S. patent application Ser. No. 11/082,739 filed Mar. 17, 2005, now U.S. Pat. No. 7,421,321, which is a CIP of U.S. patent application Ser. No. 10/701,361, filed Nov. 4, 2003, now U.S. Pat. No. 6,988,026, which is:
   A. a CIP of U.S. patent application Ser. No. 10/613,453 filed Jul. 3, 2003, now U.S. Pat. No. 6,850,824;
   B. a CIP of U.S. patent application Ser. No. 09/765,558 filed Jan. 19, 2001, now U.S. Pat. No. 6,748,797;
   C. a CIP of U.S. patent application Ser. No. 10/642,028 filed Aug. 15, 2003, now U.S. Pat. No. 7,253,725; and
   D. a CIP of U.S. patent application Ser. No. 10/079,065 filed Feb. 19, 2002, now U.S. Pat. No. 6,662,642;

4. a CIP of U.S. patent application Ser. No. 11/220,139 filed Sep. 6, 2005, now U.S. Pat. No. 7,103,460, which is a CIP of U.S. patent application Ser. No. 11/120,065 filed May 2, 2005, now abandoned;

5. a CIP of U.S. patent application Ser. No. 11/379,078 filed Apr. 18, 2006, now U.S. Pat. No. 7,379,800;

6. a CIP of U.S. patent application Ser. No. 11/381,609 filed May 4, 2006, now U.S. Pat. No. 7,408,453;

7. a CIP of U.S. patent application Ser. No. 11/382,091 filed May 8, 2006, now U.S. Pat. No. 7,549,327; and 8. a CIP of U.S. patent application Ser. No. 11/421,500 filed Jun. 1, 2006.

This application contains common subject matter as U.S. patent application Ser. No. 10/940,881 filed Sep. 13, 2004 and Ser. No. 11/278,188 filed Mar. 31, 2006, now U.S. Pat. No. 7,313,467.

All of the references, patents and patent applications that are referred to herein and in the parent applications are incorporated by reference in their entirety as if they had each been set forth herein in full. Note that this application is one in a series of applications covering safety and other systems for vehicles and other uses. The disclosure herein goes beyond that needed to support the claims of the particular invention set forth herein. This is not to be construed that the inventor is thereby releasing the unclaimed disclosure and subject matter into the public domain. Rather, it is intended that patent applications have been or will be filed to cover all of the subject matter disclosed below and in the current assignee's granted and pending applications. Also please note that the terms frequently used below "the invention" or "this invention" is not meant to be construed that there is only one invention being discussed. Instead, when the terms "the invention" or "this invention" are used, it is referring to the particular invention being discussed in the paragraph where the term is used.

FIELD OF THE INVENTION

The present invention relates generally to tire monitoring techniques and more particularly to tire monitoring systems and methods wherein energy to power one or more tire condition sensors is generated upon rotation of the tire.

The present invention also relates to techniques for harvesting energy based on deflection or flexure of a tire, in particular to provide energy for a tire pressure and temperature monitor.

There are numerous methods and components described and disclosed herein. Many combinations of these methods and components are described but in order to conserve space the inventor has not described all combinations and permutations of these methods and components, however, the inventor intends that each and every such combination and permutation is an invention to be considered disclosed by this disclosure. The inventor further intends to file continuation and continuation-in-part applications to cover many of these combinations and permutations, if necessary.

BACKGROUND OF THE INVENTION

A detailed background of the invention is found in the parent application, U.S. patent application Ser. No. 11/220,139, incorporated by reference herein.

The definitions set forth in section 5.0 of the Background of the Invention section of the '139 application are also incorporate by reference herein.

All of the patents, patent applications, technical papers and other references referenced in the '139 application and herein are incorporated herein by reference in their entirety.

OBJECTS AND SUMMARY OF THE INVENTION

It is an object of the present invention to provide new and improved switch assemblies and methods for controlling vehicular components.

In order to achieve this object and others, a vehicle including a switch assembly in accordance with the invention includes a component subject to control by an occupant in the passenger compartment, and a switch assembly for controlling the component based on pressure applied by the occupant of the vehicle to an exposed surface of the vehicle. The switch assembly includes at least one wireless transmission component arranged to wirelessly transmit an indication of the application of pressure to the exposed surface, and a control mechanism for controlling the wireless transmission by the wireless transmission component(s) based on the application of pressure to the exposed surface.

Various forms of control mechanisms are possible. In one embodiment in which the switch assembly includes a substrate, and a material sheet defining the exposed surface (the material sheet being any sheet having an outer surface exposed to the passenger compartment of the vehicle and an inner surface facing the substrate), the control mechanism includes a projection arranged on or between the material sheet and a space on the substrate such that pressure on the exposed surface of the material sheet is transferred by the projection to the substrate and the indication of the application of pressure is wirelessly transmitted by the wireless transmission component(s) to be used to control the vehicular component. The projection may be formed on or in connection with the material sheet and additionally or alternatively, on or in connection with the substrate. When two projections are provided, one on the material sheet and one on the substrate, they are aligned with one another. A wireless transmission component may be arranged to wirelessly transmit a magnitude of the application of pressure to the substrate. If the wireless transmission components include an interdigital transducer arranged on the substrate and a reflector arranged on the substrate spaced from the interdigital transducer, the space on the substrate is situated between the interdigital transducer and the reflector. The switch assembly may include a variable impedance device attached across the reflector to enable a determination of the magnitude of the pressure applied to the exposed surface of the material sheet.

The switch assembly may be a passive switch assembly in that power for the wireless transmission component(s) is provided through radio frequency transmission. Alternatively, it may be an active switch assembly in that power for the wireless transmission component(s) is provided through a wire leading from a source of power mounted on the vehicle.

The exposed surface may be an armrest of the vehicle, a steering wheel cover of the vehicle or an airbag cover of the vehicle.

In one embodiment, the switch assembly includes a substrate underlying the exposed surface, and the wireless transmission components include an interdigital transducer arranged on the substrate and a reflector arranged on the substrate spaced from the interdigital transducer. The control mechanism includes a switch arranged across the interdigital transducer or the reflector and arranged relative to the exposed surface such that pressure applied to the exposed surface alters the switch between a fully closed position and a fully open position. When the switch is in the open position, the wireless transmission component(s) cannot transmit.

In another embodiment, the switch assembly includes a substrate underlying the exposed surface, and the wireless transmission components include at least one reflector arranged on the substrate. The control mechanism includes a variable impedance arranged across a reflector and arranged relative to the exposed surface such that pressure applied to the exposed surface alters the variable impedance. The condition of the variable impedance determines the wireless transmission via the wireless transmission component(s).

The switch assembly may include a radio-frequency identification device (RFID) with a wireless transmission component being a part of the RFID. The control mechanism may be arranged to short the RFID such that the RFID is unable to transmit. In this case, an antenna of the switch assembly may be coupled to the RFID and the control mechanism includes a switch or variable impedance connecting an output from and an input to the antenna and arranged relative to the exposed surface such that pressure applied to the exposed surface alters the switch or the variable impedance and thereby causes variation of a responsive signal provided by the RFID.

The switch assembly may include a surface-acoustic-wave (SAW) device. In this case, an antenna of the switch assembly is coupled to the SAW device and the control mechanism includes a switch or variable impedance connecting an output from and an input to the antenna and arranged relative to the exposed surface such that pressure applied to the exposed surface alters the switch or the variable impedance and thereby causes variation of a signal provided by the SAW device.

An interrogator can be arranged on the vehicle to transmit signals to the switch assembly to obtain a responsive signal generated or modified by the switch assembly.

In another embodiment, the wireless transmission component is an antenna capable of reflecting a received signal and the control mechanism includes a switch or variable impedance connecting an intermediate portion of the antenna to ground and arranged relative to the exposed surface such that pressure applied to the exposed surface alters the switch or the variable impedance and thereby causes variation of the reflected signal.

A method for controlling a component in a vehicle based on a pressure measurement on an exposed surface within a passenger compartment of the vehicle in accordance with the invention includes coupling the component to a switch assembly to enable control of the component upon application of pressure to an exposed surface of the vehicle, arranging at least one wireless transmission component to wirelessly transmit an indication of the application of pressure to the exposed surface, controlling the wireless transmission by the wireless transmission component(s) based on the application of pressure to the exposed surface, and controlling the component based on the wireless transmission by the wireless transmission component(s).

The wireless transmission may be controlled by arranging a switch or variable impedance in connection with the wireless transmission component(s) such that pressure applied to the exposed surface alters the switch or variable impedance and thereby causes variation of a signal provided by the wireless transmission component(s). One or more projections may be arranged on or between a material sheet defining the exposed surface and a space on a substrate underlying the material sheet such that pressure on the exposed surface of the material sheet is transferred by the projection to the substrate. Additional variations of the method include those described above for the apparatus.

Other objects and advantages of the present claimed invention and inventions disclosed below are set forth in the '139 application and others will become apparent from the following description of the preferred embodiments taken in conjunction with the accompanying drawings.

BRIEF DESCRIPTION OF THE DRAWINGS

The following drawings are illustrative of embodiments of the systems developed or adapted using the teachings of these inventions and are not meant to limit the scope of the invention as encompassed by the claims.

FIG. 3 is a schematic of a vehicle with several components and several sensors and a total vehicle diagnostic system in accordance with the invention utilizing a diagnostic module in accordance with the invention and which may be used in a method in accordance with the invention.

FIG. 4 is a flow diagram of information flowing from various sensors onto the vehicle data bus and thereby into the diagnostic module in accordance with the invention with outputs to a display for notifying the driver, and to the vehicle cellular phone for notifying another person, of a potential component failure.

FIG. 8 is a perspective view of a vehicle suspension system with SAW load sensors.

FIG. 8A is a cross section detail view of a vehicle spring and shock absorber system with a SAW torque sensor system mounted for measuring the stress in the vehicle spring of the suspension system of FIG. 8.

FIG. 8B is a detail view of a SAW torque sensor and shaft compression sensor arrangement for use with the arrangement of FIG. 8.

FIG. 9 is a cutaway view of a vehicle showing possible mounting locations for vehicle interior temperature, humidity, carbon dioxide, carbon monoxide, alcohol or other chemical or physical property measuring sensors.

FIG. 10A is a perspective view of a SAW tilt sensor using four SAW assemblies for tilt measurement and one for temperature.

FIG. 10B is a top view of a SAW tilt sensor using three SAW assemblies for tilt measurement each one of which can also measure temperature.

FIG. 17A is a detailed perspective view of a polymer and mass on SAW accelerometer for use in crash sensors, vehicle navigation, etc.

FIG. 17B is a detailed perspective view of a normal mass on SAW accelerometer for use in crash sensors, vehicle navigation, etc.

FIG. 18 is a view of a prior art SAW gyroscope that can be used with this invention.

FIGS. 19A, 19B and 19C are block diagrams of three interrogators that can be used with this invention to interrogate several different devices.

FIG. 20A is a top view of a system for obtaining information about a vehicle or a component therein, specifically information about the tires, such as pressure and/or temperature thereof.

FIG. 20B is a side view of the vehicle shown in FIG. 20A.

FIG. 20C is a schematic of the system shown in FIGS. 20A and 20B.

FIG. 21 is a top view of an alternate system for obtaining information about the tires of a vehicle.

FIG. 22 is a plot which is useful to illustrate the interrogator burst pulse determination for interrogating SAW devices.

FIG. 23 illustrates the shape of an echo pulse on input to the quadrature demodulator from a SAW device.

FIG. 24 illustrates the relationship between the burst and echo pulses for a 4 echo pulse SAW sensor.

FIG. 25 illustrates the paths taken by various surface waves on a tire temperature and pressure monitoring device of one or more of the inventions disclosed herein.

FIG. 26 is an illustration of a SAW tire temperature and pressure monitoring device.

FIG. 27 is a side view of the SAW device of FIG. 26.

FIGS. 28A and 28B are schematic drawings showing two possible antenna layouts for 18 wheeler truck vehicles that permits the positive identification of a tire that is transmitting a signal containing pressure, temperature or other tire information through the use of multiple antennas arranged in a geometric pattern to permit triangulation calculations based on the time of arrival or phase of the received pulses.

FIG. 32 is a detailed view of a polymer on SAW pressure sensor.

FIG. 32A is a view of a SAW temperature and pressure monitor on a single SAW device.

FIG. 32B is a view of an alternate design of a SAW temperature and pressure monitor on a single SAW device.

FIG. 33 is a perspective view of a SAW temperature sensor.

FIG. 33A is a perspective view of a device that can provide two measurements of temperature or one of temperature and another of some other physical or chemical property such as pressure or chemical concentration.

FIG. 33B is a top view of an alternate SAW device capable of determining two physical or chemical properties such as pressure and temperature.

FIGS. 34 and 34A are views of a prior art SAW accelerometer that can be used for the tire monitor assembly of FIG. 31.

FIG. 35 is a perspective view of a SAW antenna system adapted for mounting underneath a vehicle and for communicating with the four mounted tires.

FIG. 35A is a detail view of an antenna system for use in the system of FIG. 35.

FIG. 36 is a partial cutaway view of a piezoelectric generator and tire monitor using PVDF film.

FIG. 36A is a cutaway view of the PVDF sensor of FIG. 36.

FIG. 37 is an alternate arrangement of a SAW tire pressure and temperature monitor installed in the wheel rim facing inside.

FIG. 38 illustrates an alternate method of applying a force to a SAW pressure sensor from the pressure capsule.

FIG. 38A is a detailed view of FIG. 38 of area 38A.

FIG. 39 is an alternate method of FIG. 38A using a thin film of Lithium Niobate

FIG. 42 is a schematic illustration of an arrangement for boosting signals to and from a SAW device in accordance with the invention.

FIG. 43 is a schematic of a circuit used in the boosting arrangement of FIG. 42.

FIG. 44 is a block diagram of the components of the circuit shown in FIG. 43.

FIG. 45 is a schematic of a circuit used for charging a capacitor during movement of a vehicle which may be used to power the boosting arrangement of FIG. 42.

FIG. 46 is a block diagram of the components of the circuit shown in FIG. 45.

FIG. 47 is a view of a wheel including a tire pumping system in accordance with the invention.

FIG. 47A is an enlarged view of the tire pumping system shown in FIG. 47.

FIG. 47B is an enlarged view of the tire pumping system shown in FIG. 47 during a pumping stroke.

FIG. 47C is an enlarged view of an electricity generating system used for powering a pump.

FIGS. 48A and 48B show an RFID energy generator.

FIG. 56 shows an arrangement for measuring tire temperature in accordance with a preferred embodiment of the present invention.

FIG. 56A schematically illustrates the elements of a tire temperature sensor in accordance with the invention.

FIG. 57A shows a thermal emitted radiation detecting device in accordance with a preferred embodiment of the invention.

FIG. 57B is a cross-sectional, partial view of a tire well of a truck trailer showing the placement of the thermal emitted radiation detecting device shown in FIG. 57A.

FIG. 58 schematically shows a compound Fresnel lens used in the thermal emitted radiation detecting device of FIG. 57A.

FIG. 59 schematically illustrates a circuit for deriving an indication of a temperature imbalance between two tires using tire temperature sensor of FIGS. 57A and 57B.

FIG. 60 illustrates another embodiment of the thermal emitted radiation detector for use in the method and apparatus in accordance with the invention.

FIG. 61 illustrates another embodiment of the thermal emitted radiation detector for use in the method and apparatus in accordance with the invention.

FIG. 62 illustrates another embodiment of the thermal emitted radiation detector for use in the method and apparatus in accordance with the invention.

FIG. 63 is a schematic illustration showing a basic apparatus for monitoring tires in accordance with the invention.

FIG. 64 is a schematic illustration showing one basic method for monitoring tires in accordance with the invention.

FIG. 65 is a schematic illustration showing another basic method for monitoring tires in accordance with the invention.

FIG. 66 is a schematic of another embodiment of the invention for detecting problems with a tire.

FIG. 67 is a table showing temperatures for the different circumferential locations of the tire shown in FIG. 63.

FIG. 68 is a side view with parts cutaway and removed of a vehicle showing the passenger compartment containing a rear facing child seat on the front passenger seat and a preferred mounting location for an occupant and rear facing child seat presence detector.

FIG. 69 is a partial cutaway view of a vehicle driver wearing a seatbelt with SAW force sensors.

FIGS. 70A, 70B, 70C and 70D are different views of an automotive connector for use with a coaxial electrical bus for a motor vehicle illustrating the teachings of this invention.

FIG. 71A is a front view of a steering wheel having two generalized switches located at 3 and 9 o'clock of the steering wheel rim.

FIG. 71B is a view similar to FIG. 71A with the addition of a thumb switch option.

FIG. 71C is a rear view of the steering wheel of FIG. 71B with a finger trigger option.

FIG. 72 illustrates the addition of a mouse type scroll wheel for the left hand.

FIG. 73 illustrates a strain gage on a bolt weight sensor.

FIGS. 74A, 74B, 74C, 74D and 74E are views of occupant seat weight sensors using a slot spanning SAW strain gage and other strain concentrating designs.

FIG. 75 is a flow chart of the methods for automatically monitoring a vehicular component in accordance with the invention.

FIG. 76 is a schematic illustration of the components used in the methods for automatically monitoring a vehicular component.

FIG. 77 is a side view with parts cutaway and removed showing schematically the interface between the vehicle interior monitoring system of this invention and the vehicle cellular communication system.

FIG. 78 is a diagram of one exemplifying embodiment of the invention.

FIG. 79 is a perspective view of a carbon dioxide SAW sensor for mounting in the trunk lid for monitoring the inside of the trunk for detecting trapped children or animals.

FIG. 79A is a detailed view of the SAW carbon dioxide sensor of FIG. 79.

FIG. 80 is a schematic view of overall telematics system in accordance with the invention.

FIG. 81 is a perspective view of the combination of an occupant position sensor, diagnostic electronics and power supply and airbag module designed to prevent the deployment of the airbag if the seat is unoccupied.

FIG. 82 shows the application of a preferred implementation of the invention for mounting on the rear of front seats to provide protection for rear seat occupants.

FIG. 83 is another implementation of the invention incorporating the electronic components into and adjacent the airbag module.

FIGS. 84 and 84A illustrate a dihedral reflector.

FIG. 85 illustrates the reflection pattern from a dihedral reflector in the azimuth plane.

FIG. 86 illustrates the reflection pattern from a dihedral reflector in the vertical plane.

FIG. 87 illustrates the angle doubling effect of a dihedral reflector when a polarized wave impinges at an angle.

FIG. 88 is an example of the use of a dihedral reflector for determining the position of a vehicle on a roadway.

FIG. 89 shows a dihedral reflector set at 45 degrees to an incident polarized radar beam to achieve a 90 degree rotation during reflection.

Figure 90A:
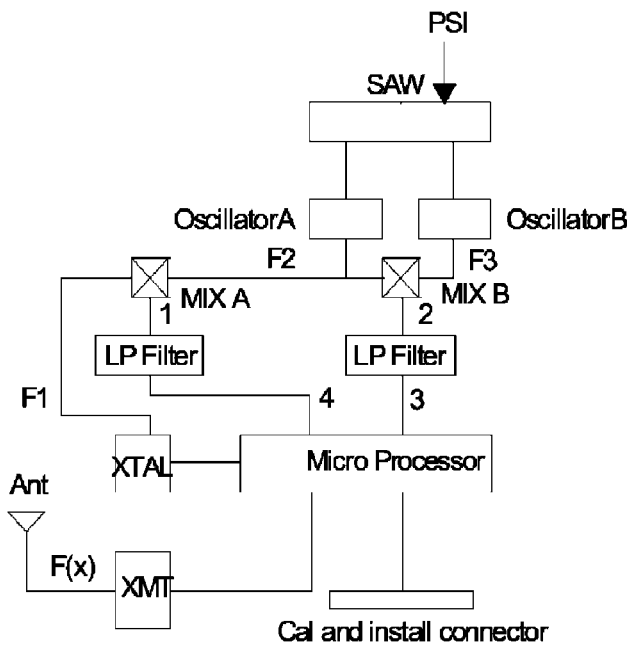

FIG. 90A is a block diagram of an alternate very low cost low power method of making a tire pressure and temperature monitor where the electronics resides in the tire mounted transceiver.

Figure 90B:
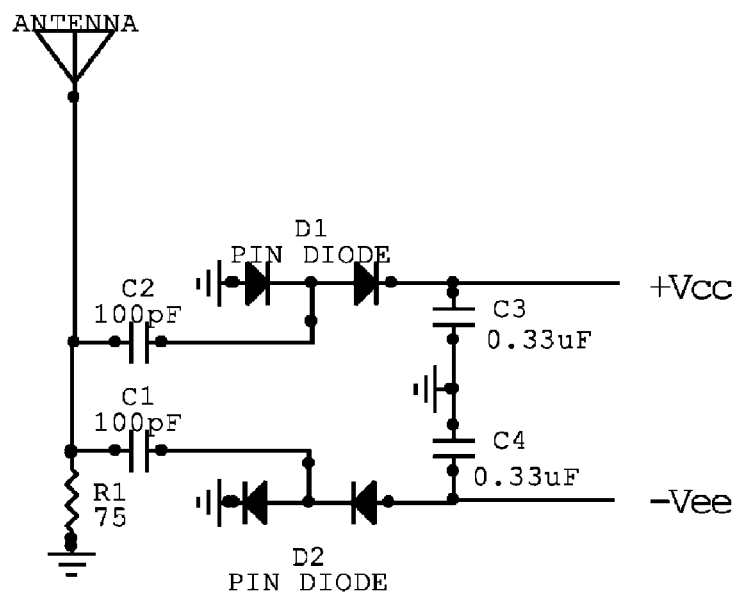

FIG. 90B is a circuit diagram of an RF operated power supply for the device of FIG. 90A.

Figure 91:
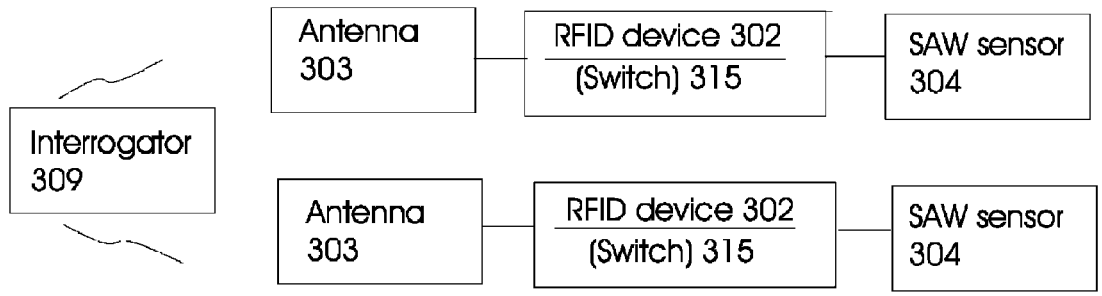

FIG. 91 is a sketch showing a sensor assembly system in accordance with the invention.

Figure 92:
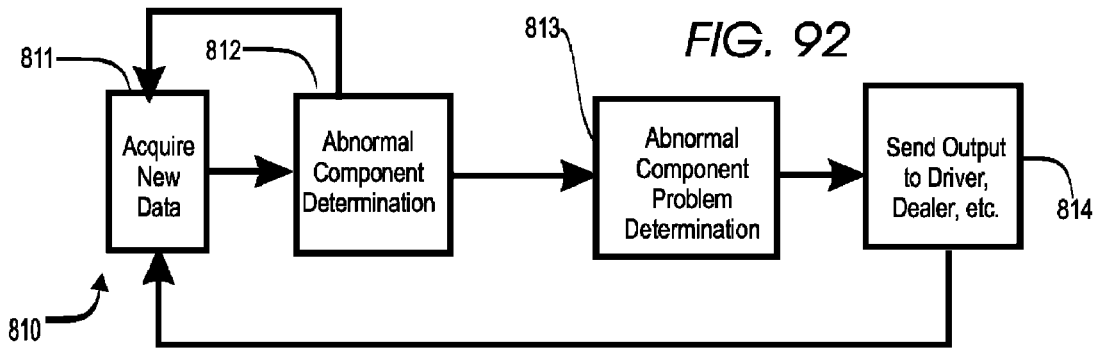

FIG. 92 is a diagram of a first combination neural network used to diagnose components in accordance with the invention.

Figure 93:

FIG. 93 is a diagram of a second combination neural network used to diagnose components in accordance with the invention.

Figures 94, 94A:
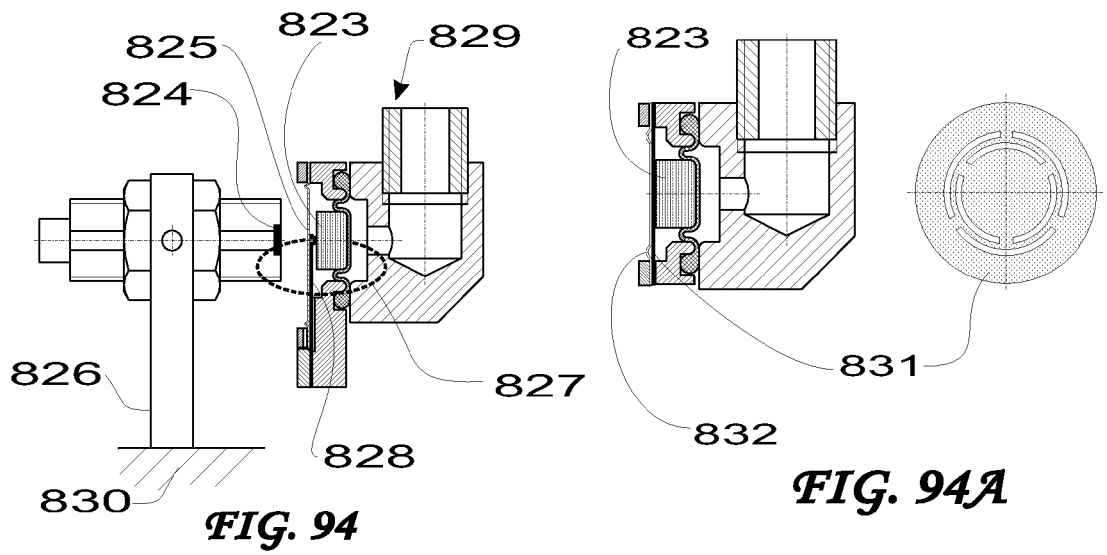

FIG. 94 illustrates a Hall effect based tire pressure monitor utilizing a cantilevered spring to support the moving magnet.

FIG. 94A illustrates a Hall effect based tire pressure monitor utilizing a spring washer to support the moving magnet.

Figure 95:
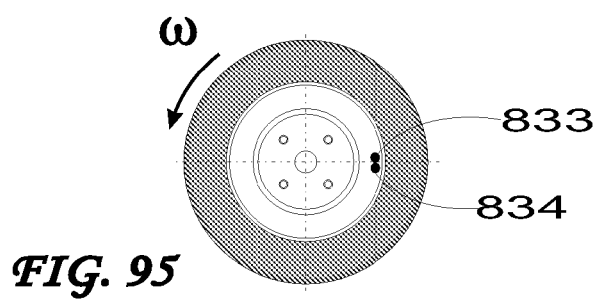

FIG. 95 illustrates the use of dual magnets, one fixed and the other stationary, permitting a differential measurement.

Figures 96, 97:
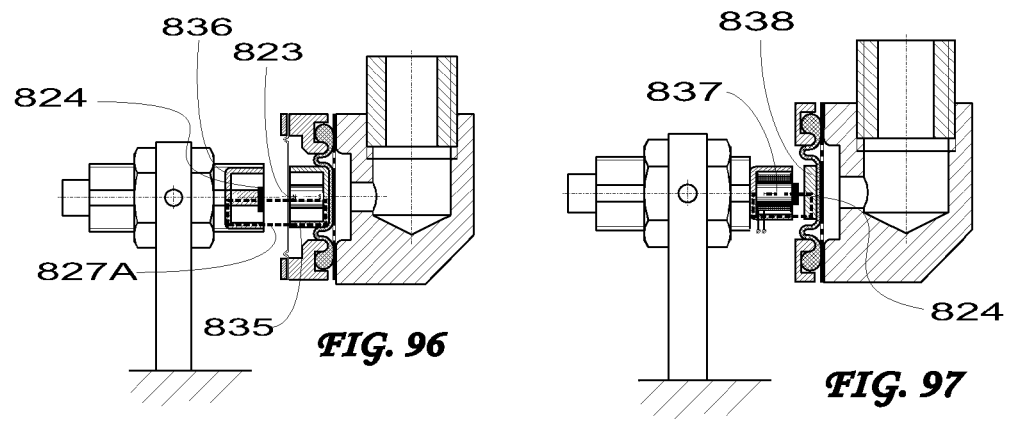

FIG. 96 illustrates the addition of a magnetic circuit to concentrate the magnetic field lines in the Hall effect sensing element.

FIG. 97 illustrates the addition of a magnetic circuit to concentrate the magnetic field lines in the Hall effect sensing element and the use of an electro magnet adjacent the sensor in place of a magnet on the wheel.

DETAILED DESCRIPTION OF THE INVENTION

1.1 General Diagnostics and Prognostics

The output of a diagnostic system is generally the present condition of the vehicle or component. However the vehicle operator wants to repair the vehicle or replace the component before it fails, but a diagnosis system in general does not specify when that will occur. Prognostics is the process of determining when the vehicle or a component will fail. At least one of the inventions disclosed herein in concerned with prognostics. Prognostics can be based on models of vehicle or component degradation and the effects of environment and usage. In this regard it is useful to have a quantitative formulation of how the component degradation depends on environment, usage and current component condition. This formulation may be obtained by monitoring condition, environment and usage level, and by modeling the relationships with statistical techniques or pattern recognition techniques such as neural networks, combination neural networks and fuzzy logic. In some cases, it can also be obtained by theoretical methods or from laboratory experiments.

A preferred embodiment of the vehicle diagnostic and prognostic unit described below performs the diagnosis and prognostics, i.e., processes the input from the various sensors, on the vehicle using, for example, a processor embodying a pattern recognition technique such as a neural network. The processor thus receives data or signals from the sensors and generates an output indicative or representative of the operating conditions of the vehicle or its component. A signal could thus be generated indicative of an under-inflated tire, or an overheating engine.

For the discussion below, the following terms are defined as follows:

The term "component" as used herein generally refers to any part or assembly of parts which is mounted to or a part of a motor vehicle and which is capable of emitting a signal representative of its operating state. The following is a partial list of general automobile and truck components, the list not being exhaustive:

Engine; transmission; brakes and associated brake assembly; tires; wheel; steering wheel and steering column assembly; water pump; alternator; shock absorber; wheel mounting assembly; radiator; battery; oil pump; fuel pump; air conditioner compressor; differential gear assembly; exhaust system; fan belts; engine valves; steering assembly; vehicle suspension including shock absorbers; vehicle wiring system; and engine cooling fan assembly.

The term "sensor" as used herein generally refers to any measuring, detecting or sensing device mounted on a vehicle or any of its components including new sensors mounted in conjunction with the diagnostic module in accordance with the invention. A partial, non-exhaustive list of sensors that are or can be mounted on an automobile or truck is:

Airbag crash sensor; microphone; camera; chemical sensor; vapor sensor; antenna, capacitance sensor or other electromagnetic wave sensor; stress or strain sensor; pressure sensor; weight sensor; magnetic field sensor; coolant thermometer; oil pressure sensor; oil level sensor; air flow meter; voltmeter; ammeter; humidity sensor; engine knock sensor; oil turbidity sensor; throttle position sensor; steering wheel torque sensor; wheel speed sensor; tachometer; speedometer; other velocity sensors; other position or displacement sensors; oxygen sensor; yaw, pitch and roll angular sensors; clock; odometer; power steering pressure sensor; pollution sensor; fuel gauge; cabin thermometer; transmission fluid level sensor; gyroscopes or other angular rate sensors including yaw, pitch and roll rate sensors; accelerometers including single axis, dual axis and triaxial accelerometers; an inertial measurement unit; coolant level sensor; transmission fluid turbidity sensor; brake pressure sensor; tire pressure sensor; tire temperature sensor, tire acceleration sensor; GPS receiver; DGPS receiver; and coolant pressure sensor.

The term "signal" as used herein generally refers to any time-varying output from a component including electrical, acoustic, thermal, electromagnetic radiation or mechanical vibration.

Sensors on a vehicle are generally designed to measure particular parameters of particular vehicle components. However, frequently these sensors also measure outputs from other vehicle components. For example, electronic airbag crash sensors currently in use contain one or more accelerometers for determining the accelerations of the vehicle structure so that the associated electronic circuitry of the airbag crash sensor can determine whether a vehicle is experiencing a crash of sufficient magnitude so as to require deployment of the airbag. This or these accelerometers continuously monitors the vibrations in the vehicle structure regardless of the source of these vibrations. If a wheel is out of balance, or if there is extensive wear of the parts of the front wheel mounting assembly, or wear in the shock absorbers, the resulting abnormal vibrations or accelerations can, in many cases, be sensed by a crash sensor accelerometer. There are other cases, however, where the sensitivity or location of an airbag crash sensor accelerometer is not appropriate and one or more additional accelerometers or gyroscopes may be mounted onto a vehicle for the purposes of this invention. Some airbag crash sensors are not sufficiently sensitive accelerometers or have sufficient dynamic range for the purposes herein.

For example, a technique for some implementations of an invention disclosed herein is the use of multiple accelerometers and/or microphones that will allow the system to locate the source of any measured vibrations based on the time of flight, time of arrival, direction of arrival and/or triangulation techniques. Once a distributed accelerometer installation, or one or more IMUs, has been implemented to permit this source location, the same sensors can be used for smarter crash sensing as it can permit the determination of the location of the impact on the vehicle. Once the impact location is known, a highly tailored algorithm can be used to accurately forecast the crash severity making use of knowledge of the force vs. crush properties of the vehicle at the impact location.

Every component of a vehicle can emit various signals during its life. These signals can take the form of electromagnetic radiation, acoustic radiation, thermal radiation, vibrations transmitted through the vehicle structure and voltage or current fluctuations, depending on the particular component. When a component is functioning normally, it may not emit a perceptible signal. In that case, the normal signal is no signal, i.e., the absence of a signal. In most cases, a component will emit signals that change over its life and it is these changes which typically contain information as to the state of the component, e.g., whether failure of the component is impending. Usually components do not fail without warning. However, most such warnings are either not perceived or if perceived, are not understood by the vehicle operator until the component actually fails and, in some cases, a breakdown of the vehicle occurs.

An important system and method as disclosed herein for acquiring data for performing the diagnostics, prognostics and health monitoring functions makes use of the acoustic transmissions from various components. This can involve the placement of one or more microphones, accelerometers, or other vibration sensors onto and/or at a variety of locations within the vehicle where the sound or vibrations are most effectively sensed. In addition to acquiring data relative to a particular component, the same sensors can also obtain data that permits analysis of the vehicle environment. A pothole, for example, can be sensed and located for possible notification to a road authority if a location determining apparatus is also resident on the vehicle.

In a few years, it is expected that various roadways will have systems for automatically guiding vehicles operating thereon. Such systems have been called "smart highways" and are part of the field of intelligent transportation systems (ITS). If a vehicle operating on such a smart highway were to breakdown due to the failure of a component, serious disruption of the system could result and the safety of other users of the smart highway could be endangered.

When a vehicle component begins to change its operating behavior, it is not always apparent from the particular sensors which are monitoring that component, if any. The output from any one of these sensors can be normal even though the component is failing. By analyzing the output of a variety of sensors, however, the pending failure can frequently be diagnosed. For example, the rate of temperature rise in the vehicle coolant, if it were monitored, might appear normal unless it were known that the vehicle was idling and not traveling down a highway at a high speed. Even the level of coolant temperature which is in the normal range could be in fact abnormal in some situations signifying a failing coolant pump, for example, but not detectable from the coolant thermometer alone.

The pending failure of some components is difficult to diagnose and sometimes the design of the component requires modification so that the diagnosis can be more readily made. A fan belt, for example, frequently begins failing as a result of a crack of the inner surface. The belt can be designed to provide a sonic or electrical signal when this cracking begins in a variety of ways. Similarly, coolant hoses can be designed with an intentional weak spot where failure will occur first in a controlled manner that can also cause a whistle sound as a small amount of steam exits from the hose. This whistle sound can then be sensed by a general purpose microphone, for example.

Figure 1:
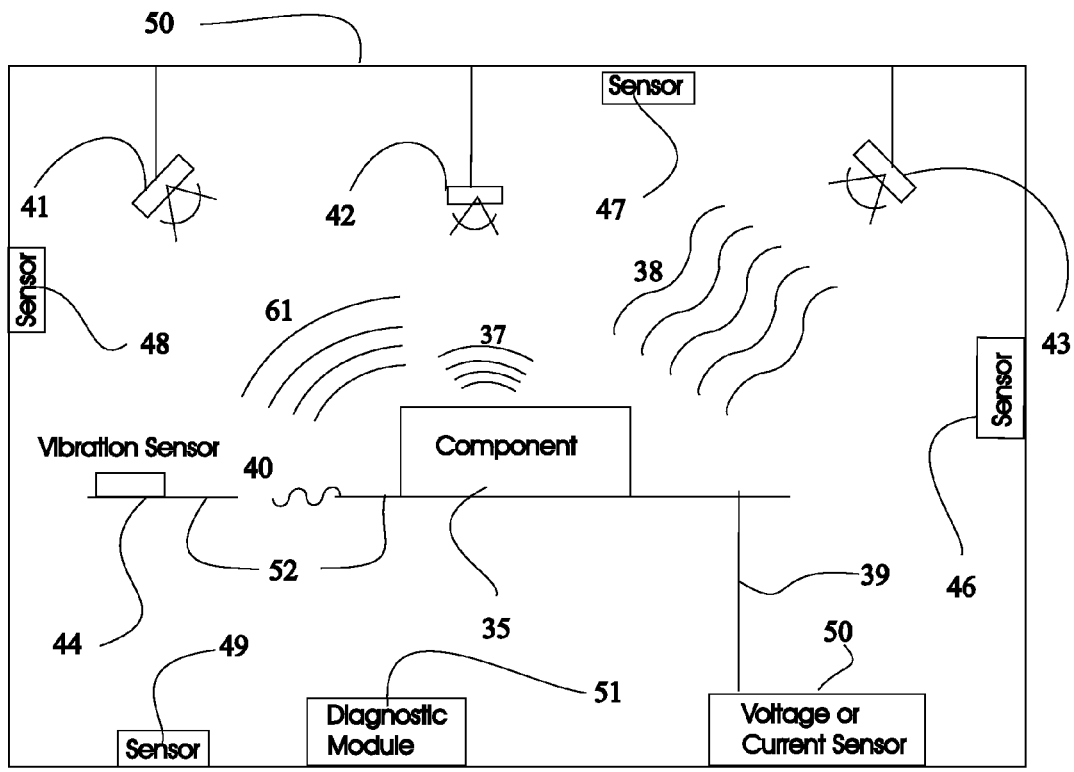
FIG. 1 is a schematic illustration of a generalized component with several signals being emitted and transmitted along a variety of paths, sensed by a variety of sensors and analyzed by the diagnostic module in accordance with the invention and for use in a method in accordance with the invention.

In FIG. 1, a generalized component 35 emitting several signals which are transmitted along a variety of paths, sensed by a variety of sensors and analyzed by the diagnostic device in accordance with the invention is illustrated schematically. Component 35 is mounted to a vehicle 52 and during operation it emits a variety of signals such as acoustic 36, electromagnetic radiation 37, thermal radiation 38, current and voltage fluctuations in conductor 39 and mechanical vibrations 40. Various sensors are mounted in the vehicle to detect the signals emitted by the component 35. These include one or more vibration sensors (accelerometers) 44, 46 and/or gyroscopes or one or more IMUs, one or more acoustic sensors 41, 47, electromagnetic radiation sensors 42, heat radiation sensors 43 and voltage or current sensors 45.

In addition, various other sensors 48, 49 measure other parameters of other components that in some manner provide information directly or indirectly on the operation of component 35. Each of the sensors illustrated in FIG. 1 can be connected to a data bus 50. A diagnostic module 51, in accordance with the invention, can be attached to the vehicle data bus 50 and it can receive the signals generated by the various sensors. The sensors may however be wirelessly connected to the diagnostic module 51 and be integrated into a wireless power and communications system or a combination of wired and wireless connections. The wireless connection of one or more sensors to a receiver, controller or diagnostic module is an important teaching of one or more of the inventions disclosed herein.

The diagnostic module 51 will analyze the received data in light of the data values or patterns itself either statically or over time. In some cases, a pattern recognition algorithm as discussed below will be used and in others, a deterministic algorithm may also be used either alone or in combination with the pattern recognition algorithm. Additionally, when a new data value or sequence is discovered the information can be sent to an off-vehicle location, perhaps a dealer or manufacturer site, and a search can be made for other similar cases and the results reported back to the vehicle. Also additionally as more and more vehicles are reporting cases that perhaps are also examined by engineers or mechanics, the results can be sent to the subject vehicle or to all similar vehicles and the diagnostic software updated automatically. Thus, all vehicles can have the benefit from information relative to performing the diagnostic function. Similarly, the vehicle dealers and manufacturers can also have up-to-date information as to how a particular class or model of vehicle is performing. This telematics function is discussed in more detail elsewhere herein. By means of this system, a vehicle diagnostic system can predict component failures long before they occur and thus prevent on-road problems.

An important function that can be performed by the diagnostic system herein is to substantially diagnose the vehicle's own problems rather then, as is the case with the prior art, forwarding raw data to a central site for diagnosis. Eventually, a prediction as to the failure point of all significant components can be made and the owner can have a prediction that the fan belt will last another 20,000 miles, or that the tires should be rotated in 2,000 miles or replaced in 20,000 miles. This information can be displayed or reported orally or sent to the dealer who can then schedule a time for the customer to visit the dealership or for the dealer to visit the vehicle wherever it is located. If it is displayed, it can be automatically displayed periodically or when there is urgency or whenever the operator desires. The display can be located at any convenient place such as the dashboard or it can be a heads-up display. The display can be any convenient technology such as an LCD display or an OLED based display. This can permit the vehicle manufacturer to guarantee that the owner will never experience a vehicle breakdown provided he or she permits the dealer to service the vehicle at appropriate times based on the output of the prognostics system.

It is worth emphasizing that in many cases, it is the rate that a parameter is changing that can be as or more important than the actual value in predicting when a component is likely to fail. In a simple case when a tire is losing pressure, for example, it is a quite different situation if it is losing one psi per day or one psi per minute. Similarly for the tire case, if the tire is heating up at one degree per hour or 100 degrees per hour may be more important in predicting failure due to delamination or overloading than the particular temperature of the tire.

The diagnostic module, or other component, can also consider situation awareness factors such as the age or driving habits of the operator, the location of the vehicle (e.g., is it in the desert, in the arctic in winter), the season, the weather forecast, the length of a proposed trip, the number and location of occupants of the vehicle etc. The system may even put limits on the operation of the vehicle such as turning off unnecessary power consuming components if the alternator is failing or limiting the speed of the vehicle if the driver is an elderly woman sitting close to the steering wheel, for example. Furthermore, the system may change the operational parameters of the vehicle such as the engine RPM or the fuel mixture if doing so will prolong vehicle operation. In some cases where there is doubt whether a component is failing, the vehicle operating parameters may be temporarily varied by the system in order to accentuate the signal from the component to permit more accurate diagnosis.

In addition to the above discussion there are some diagnostic features already available on some vehicles some of which are related to the federally mandated OBD-II and can be included in the general diagnostics and health monitoring features of this invention. In typical applications, the set of diagnostic data includes at least one of the following: diagnostic trouble codes, vehicle speed, fuel level, fuel pressure, miles per gallon, engine RPM, mileage, oil pressure, oil temperature, tire pressure, tire temperature, engine coolant temperature, intake-manifold pressure, engine-performance tuning parameters, alarm status, accelerometer status, cruise-control status, fuel-injector performance, spark-plug timing, and a status of an anti-lock braking system.

The data parameters within the set describe a variety of electrical, mechanical, and emissions-related functions in the vehicle. Several of the more significant parameters from the set are:
  Pending DTCs (Diagnostic Trouble Codes)
  Ignition Timing Advance
  Calculated Load Value
  Air Flow Rate MAF Sensor
  Engine RPM
  Engine Coolant Temperature
  Intake Air Temperature
  Absolute Throttle Position Sensor
  Vehicle Speed
  Short-Term Fuel Trim
  Long-Term Fuel Trim
  MIL Light Status
  Oxygen Sensor Voltage
  Oxygen Sensor Location Delta Pressure Feedback EGR Pressure Sensor
Evaporative Purge Solenoid Duty cycle
Fuel Level Input Sensor
Fuel Tank Pressure Voltage
Engine Load at the Time of Misfire
Engine RPM at the Time of Misfire
Throttle Position at the Time of Misfire
Vehicle Speed at the Time of Misfire
Number of Misfires
Transmission Fluid Temperature
PRNDL position (1,2,3,4,5=neutral, 6=reverse)
Number of Completed OBDII Trips, and
Battery Voltage.

When the diagnostic system determines that the operator is operating the vehicle in such a manner that the failure of a component is accelerated, then a warning can be issued to the operator. For example, the driver may have inadvertently placed the automatic gear shift lever in a lower gear and be driving at a higher speed than he or she should for that gear. In such a case, the driver can be notified to change gears.

Managing the diagnostics and prognostics of a complex system has been termed "System Health Management" and has not been applied to over the road vehicles such as trucks and automobiles. Such systems are used for fault detection and identification, failure prediction (estimating the time to failure), tracking degradation, maintenance scheduling, error correction in the various measurements which have been corrupted and these same tasks are applicable here.

Various sensors, both wired and wireless, will be discussed below. Representative of such sensors are those available from Honeywell which are MEMS-based sensors for measuring temperature, pressure, acoustic emission, strain, and acceleration. The devices are based on resonant microbeam force sensing technology. Coupled with a precision silicon microstructure, the resonant microbeams provide a high sensitivity for measuring inertial acceleration, inclination, and vibrations. Alternate designs based on SAW technology lend themselves more readily to wireless and powerless operation as discussed below. The Honeywell sensors can be networked wirelessly but still require power.

Since this system is independent of the dedicated sensor monitoring system and instead is observing more than one sensor, inconsistencies in sensor output can be detected and reported indicating the possible erratic or inaccurate operation of a sensor even if this is intermittent (such as may be caused by a lose wire) thus essentially eliminating many of the problems reported in the above-referenced article "What's Bugging the Hi-Tech Car". Furthermore, the software can be independent of the vehicle specific software for a particular sensor and system and can further be based on pattern recognition, to be discussed next, rendering it even less likely to provide the wrong diagnostic. Since the output from the diagnostic and prognostic system herein described can be sent via telematics to the dealer and vehicle manufacturer, the occurrence of a sensor or system failure can be immediately logged to form a frequency of failure log for a particular new vehicle model allowing the manufacturer to more quickly schedule a recall if a previously unknown problem surfaces in the field.

1.2 Pattern Recognition

In accordance with at least one invention, each of the signals emitted by the sensors can be converted into electrical signals and then digitized (i.e., the analog signal is converted into a digital signal) to create numerical time series data which is entered into a processor. Pattern recognition algorithms can be applied by the processor to attempt to identify and classify patterns in this time series data. For a particular component, such as a tire for example, the algorithm attempts to determine from the relevant digital data whether the tire is functioning properly or whether it requires balancing, additional air, or perhaps replacement.

Frequently, the data entered into the pattern recognition algorithm needs to be preprocessed before being analyzed. The data from a wheel speed sensor, for example, might be used "as is" for determining whether a particular tire is operating abnormally in the event it is unbalanced, whereas the integral of the wheel speed data over a long time period (a preprocessing step), when compared to such sensors on different wheels, might be more useful in determining whether a particular tire is going flat and therefore needs air. This is the basis of some tire monitors now on the market. Such indirect systems are not permitted as a means for satisfying federal safety requirements. These systems generally depend on the comparison of the integral of the wheel speed to determine the distance traveled by the wheel surface and that system is then compared with other wheels on the vehicle to determine that one tire has relatively less air than another. Of course this system fails if all of the tires have low pressure. One solution is to compare the distance traveled by a wheel with the distance that it should have traveled. If the angular motion (displacement and/or velocity) of the wheel axle is known, than this comparison can be made directly. Alternately, if the position of the vehicle is accurately monitored so that the actual travel along its path can be determined through a combination of GPS and an IMU, for example, then again the pressure within a vehicle tire can be determined.

In some cases, the frequencies present in a set of data are a better predictor of component failures than the data itself. For example, when a motor begins to fail due to worn bearings, certain characteristic frequencies began to appear. In most cases, the vibrations arising from rotating components, such as the engine, will be normalized based on the rotational frequency. Moreover, the identification of which component is causing vibrations present in the vehicle structure can frequently be accomplished through a frequency analysis of the data. For these cases, a Fourier transformation of the data can be made prior to entry of the data into a pattern recognition algorithm. Wavelet transforms and other mathematical transformations are also made for particular pattern recognition purposes in practicing the teachings of this invention. Some of these include shifting and combining data to determine phase changes for example, differentiating the data, filtering the data and sampling the data. Also, there exist certain more sophisticated mathematical operations that attempt to extract or highlight specific features of the data. The inventions herein contemplate the use of a variety of these preprocessing techniques and the choice of which one or ones to use is left to the skill of the practitioner designing a particular diagnostic and prognostic module. Note, whenever diagnostics is used below it will be assumed to also include prognostics.

As shown in FIG. 1, the diagnostic module 51 has access to the output data of each of the sensors that are known to have or potentially may have information relative to or concerning the component 35. This data appears as a series of numerical values each corresponding to a measured value at a specific point in time. The cumulative data from a particular sensor is called a time series of individual data points. The diagnostic module 51 compares the patterns of data received from each sensor individually, or in combination with data from other sensors, with patterns for which the diagnostic module has been programmed or trained to determine whether the component is functioning normally or abnormally.

Important to some embodiments of the inventions herein is the manner in which the diagnostic module 51 determines a normal pattern from an abnormal pattern and the manner in which it decides what data to use from the vast amount of data available. This can be accomplished using pattern recognition technologies such as artificial neural networks and training and in particular, combination neural networks as described in U.S. patent application Ser. No. 10/413,426 (Publication 20030209893). The theory of neural networks including many examples can be found in several books on the subject including: (1) *Techniques And Application Of Neural Networks*, edited by Taylor, M. and Lisboa, P., Ellis Horwood, West Sussex, England, 1993; (2) *Naturally Intelligent Systems*, by Caudill, M. and Butler, C., MIT Press, Cambridge Mass., 1990; (3) J. M. Zaruda, *Introduction to Artificial Neural Systems*, West Publishing Co., N.Y., 1992, (4) *Digital Neural Networks*, by Kung, S. Y., PTR Prentice Hall, Englewood Cliffs, N.J., 1993, Eberhart, R., Simpson, P., (5) Dobbins, R., *Computational Intelligence PC Tools*, Academic Press, Inc., 1996, Orlando, Fla., (6) Cristianini, N. and Shawe-Taylor, J. *An Introduction to Support Vector Machines and other kernal-based learning methods*. Cambridge University Press, Cambridge England, 2000; (7) *Proceedings of the 2000 6th IEEE International Workshop on Cellular Neural Networks and their Applications* (CNNA 2000), IEEE, Piscataway N.J.; and (8) Sinha, N. K. and Gupta, M. M. *Soft Computing & Intelligent Systems, Academic Press* 2000 San Diego, Calif. The neural network pattern recognition technology is one of the most developed of pattern recognition technologies. The invention described herein frequently uses combinations of neural networks to improve the pattern recognition process, as discussed in detail in U.S. patent application Ser. No. 10/413,426.

The neural network pattern recognition technology is one of the most developed of pattern recognition technologies. The neural network will be used here to illustrate one example of a pattern recognition technology but it is emphasized that this invention is not limited to neural networks. Rather, the invention may apply any known pattern recognition technology including various segmentation techniques, sensor fusion and various correlation technologies. In some cases, the pattern recognition algorithm is generated by an algorithm-generating program and in other cases, it is created by, e.g., an engineer, scientist or programmer. A brief description of a particular simple example of a neural network pattern recognition technology is set forth below.

Neural networks are constructed of processing elements known as neurons that are interconnected using information channels called interconnects and are arranged in a plurality of layers. Each neuron can have multiple inputs but generally only one output. Each output however is usually connected to many, frequently all, other neurons in the next layer. The neurons in the first layer operate collectively on the input data as described in more detail below. Neural networks learn by extracting relational information from the data and the desired output. Neural networks have been applied to a wide variety of pattern recognition problems including automobile occupant sensing, speech recognition, optical character recognition and handwriting analysis.

To train a neural network, data is provided in the form of one or more time series that represents the condition to be diagnosed, which can be induced to artificially create an abnormally operating component, as well as normal operation. In the training stage of the neural network or other type of pattern recognition algorithm, the time series data for both normal and abnormal component operation is entered into a processor which applies a neural network-generating program to output a neural network capable of determining abnormal operation of a component.

As an example, the simple case of an out-of-balance tire will be used. Various sensors on the vehicle can be used to extract information from signals emitted by the tire such as an accelerometer, a torque sensor on the steering wheel, the pressure output of the power steering system, a tire pressure monitor or tire temperature monitor. Other sensors that might not have an obvious relationship to tire unbalance (or imbalance) are also included such as, for example, the vehicle speed or wheel speed that can be determined from the anti-lock brake (ABS) system. Data is taken from a variety of vehicles where the tires were accurately balanced under a variety of operating conditions also for cases where varying amounts of tire unbalance was intentionally introduced. Once the data had been collected, some degree of pre-processing (e.g., time or frequency modification) and/or feature extraction is usually performed to reduce the total amount of data fed to the neural network-generating program. In the case of the unbalanced tire, the time period between data points might be selected such that there are at least ten data points per revolution of the wheel. For some other application, the time period might be one minute or one millisecond.

Once the data has been collected, it is processed by the neural network-generating program, for example, if a neural network pattern recognition system is to be used. Such programs are available commercially, e.g., from NeuralWare of Pittsburgh, Pa. or from International Scientific Research, Inc., of Panama for modular neural networks. The program proceeds in a trial and error manner until it successfully associates the various patterns representative of abnormal behavior, an unbalanced tire in this case, with that condition. The resulting neural network can be tested to determine if some of the input data from some of the sensors, for example, can be eliminated. In this manner, the engineer can determine what sensor data is relevant to a particular diagnostic problem. The program then generates an algorithm that is programmed onto a microprocessor, microcontroller, neural processor, FPGA, or DSP (herein collectively referred to as a microprocessor or processor). Such a microprocessor appears inside the diagnostic module 51 in FIG. 1.

Once trained, the neural network, as represented by the algorithm, is installed in a processor unit of a motor vehicle and will now recognize an unbalanced tire on the vehicle when this event occurs. At that time, when the tire is unbalanced, the diagnostic module 51 will receive output from the sensors, determine whether the output is indicative of abnormal operation of the tire, e.g., lack of tire balance, and instruct or direct another vehicular system to respond to the unbalanced tire situation. Such an instruction may be a message to the driver indicating that the tire should now be balanced, as described in more detail below. The message to the driver is provided by an output device coupled to or incorporated within the module 51, e.g., an icon or text display, and may be a light on the dashboard, a vocal tone or any other recognizable indication apparatus. A similar message may also be sent to the dealer, vehicle manufacturer or other repair facility or remote facility via a communications channel between the vehicle and the dealer or repair facility which is established by a suitable transmission device.

It is important to note that there may be many neural networks involved in a total vehicle diagnostic system. These can be organized either in parallel, series, as an ensemble, cellular neural network or as a modular neural network system. In one implementation of a modular neural network, a primary neural network identifies that there is an abnormality and tries to identify the likely source. Once a choice has been made as to the likely source of the abnormality, another, specific neural network of a group of neural networks can be called upon to determine the exact cause of the abnormality. In this manner, the neural networks are arranged in a tree pattern with each neural network trained to perform a particular pattern recognition task.

Discussions on the operation of a neural network can be found in the above references on the subject and are understood by those skilled in the art. Neural networks are the most well-known of the pattern recognition technologies based on training, although neural networks have only recently received widespread attention and have been applied to only very limited and specialized problems in motor vehicles such as occupant sensing (by the current assignee) and engine control (by Ford Motor Company). Other non-training based pattern recognition technologies exist, such as fuzzy logic. However, the programming required to use fuzzy logic, where the patterns must be determine by the programmer, usually render these systems impractical for general vehicle diagnostic problems such as described herein (although their use is not impossible in accordance with the teachings of the invention). Therefore, preferably the pattern recognition systems that learn by training are used herein. It should be noted that neural networks are frequently combined with fuzzy logic and such a combination is contemplated herein. The neural network is the first highly successful of what will be a variety of pattern recognition techniques based on training. There is nothing that suggests that it is the only or even the best technology. The characteristics of all of these technologies which render them applicable to this general diagnostic problem include the use of time-of frequency-based input data and that they are trainable. In most cases, the pattern recognition technology learns from examples of data characteristic of normal and abnormal component operation.

Figure 2:
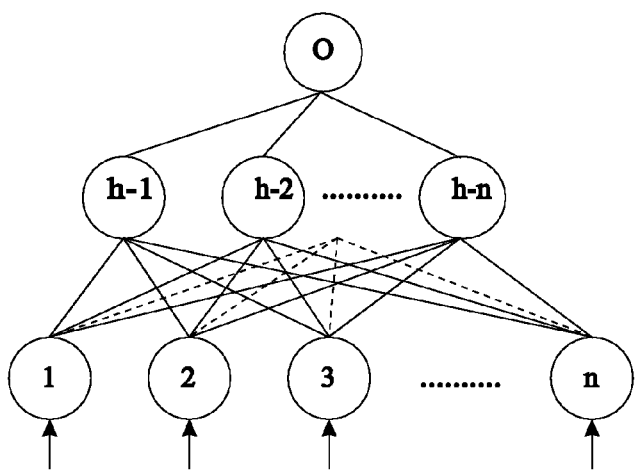
FIG. 2 is a schematic of one pattern recognition methodology known as a neural network which may be used in a method in accordance with the invention.

A diagram of one example of a neural network used for diagnosing an unbalanced tire, for example, based on the teachings of this invention is shown in FIG. 2. The process can be programmed to periodically test for an unbalanced tire. Since this need be done only infrequently, the same processor can be used for many such diagnostic problems. When the particular diagnostic test is run, data from the previously determined relevant sensor(s) is preprocessed and analyzed with the neural network algorithm. For the unbalanced tire, using the data from an accelerometer for example, the digital acceleration values from the analog-to-digital converter in the accelerometer are entered into nodes 1 through n and the neural network algorithm compares the pattern of values on nodes 1 through n with patterns for which it has been trained as follows.

Each of the input nodes is usually connected to each of the second layer nodes, h-1, h-2, . . . h-n, called the hidden layer, either electrically as in the case of a neural computer, or through mathematical functions containing multiplying coefficients called weights, in the manner described in more detail in the above references. At each hidden layer node, a summation occurs of the values from each of the input layer nodes, which have been operated on by functions containing the weights, to create a node value. Similarly, the hidden layer nodes are, in a like manner, connected to the output layer node(s), which in this example is only a single node 0 representing the decision to notify the driver, and/or a remote facility, of the unbalanced tire. During the training phase, an output node value of 1, for example, is assigned to indicate that the driver should be notified and a value of 0 is assigned to not notifying the driver. Once again, the details of this process are described in above-referenced texts and will not be presented in detail here.

In the example above, twenty input nodes were used, five hidden layer nodes and one output layer node. In this example, only one sensor was considered and accelerations from only one direction were used. If other data from other sensors such as accelerations from the vertical or lateral directions were also used, then the number of input layer nodes would increase. Again, the theory for determining the complexity of a neural network for a particular application has been the subject of many technical papers and will not be presented in detail here. Determining the requisite complexity for the example presented here can be accomplished by those skilled in the art of neural network design. Also one particular preferred type of neural network has been discussed. Many other types exist as discussed in the above references and the inventions herein is not limited to the particular type discussed here.

Briefly, the neural network described above defines a method, using a pattern recognition system, of sensing an unbalanced tire and determining whether to notify the driver, and/or a remote facility, and comprises the steps of:

(a) obtaining an acceleration signal from an accelerometer mounted on a vehicle;

(b) converting the acceleration signal into a digital time series;

(c) entering the digital time series data into the input nodes of the neural network;

(d) performing a mathematical operation on the data from each of the input nodes and inputting the operated on data into a second series of nodes wherein the operation performed on each of the input node data prior to inputting the operated-on value to a second series node is different from that operation performed on some other input node data (e.g., a different weight value can be used);

(e) combining the operated-on data from most or all of the input nodes into each second series node to form a value at each second series node;

(f) performing a mathematical operation on each of the values on the second series of nodes and inputting this operated-on data into an output series of nodes wherein the operation performed on each of the second series node data prior to inputting the operated-on value to an output series node is different from that operation performed on some other second series node data;

(g) combining the operated-on data from most or all of the second series nodes into each output series node to form a value at each output series node; and, (h) notifying a driver if the value on one output series node is within a selected range signifying that a tire requires balancing.

This method can be generalized to a method of predicting that a component of a vehicle will fail comprising the steps of:

(a) sensing a signal emitted from the component;

(b) converting the sensed signal into a digital time series;

(c) entering the digital time series data into a pattern recognition algorithm;

(d) executing the pattern recognition algorithm to determine if there exists within the digital time series data a pattern characteristic of abnormal operation of the component; and (e) notifying a driver and/or a remote facility if the abnormal pattern is recognized.

The particular neural network described and illustrated above contains a single series of hidden layer nodes. In some network designs, more than one hidden layer is used, although only rarely will more than two such layers appear. There are of course many other variations of the neural network architecture illustrated above which appear in the referenced literature. For the purposes herein, therefore, "neural network" can be defined as a system wherein the data to be processed is separated into discrete values which are then operated on and combined in at least a two stage process and where the operation performed on the data at each stage is in general different for each discrete value and where the operation performed is at least determined through a training process. A different operation here is meant any difference in the way that the output of a neuron is treated before it is inputted into another neuron such as multiplying it by a different weight or constant.

The implementation of neural networks can take on at least two forms, an algorithm programmed on a digital microprocessor, FPGA, DSP or in a neural computer (including a cellular neural network or support vector machine). In this regard, it is noted that neural computer chips are now becoming available.

In the example above, only a single component failure was discussed using only a single sensor since the data from the single sensor contains a pattern which the neural network was trained to recognize as either normal operation of the component or abnormal operation of the component. The diagnostic module 51 contains preprocessing and neural network algorithms for a number of component failures. The neural network algorithms are generally relatively simple, requiring only a relatively small number of lines of computer code. A single general neural network program can be used for multiple pattern recognition cases by specifying different coefficients for the various node inputs, one set for each application. Thus, adding different diagnostic checks has only a small affect on the cost of the system. Also, the system can have available to it all of the information available on the data bus.

During the training process, the pattern recognition program sorts out from the available vehicle data on the data bus or from other sources, those patterns that predict failure of a particular component. If more than one sensor is used to sense the output from a component, such as two spaced-apart microphones or acceleration sensors, then the location of the component can sometimes be determined by triangulation based on the phase difference, time of arrival and/or angle of arrival of the signals to the different sensors. In this manner, a particular vibrating tire can be identified, for example. Since each tire on a vehicle does not always make the same number of revolutions in a given time period, a tire can be identified by comparing the wheel sensor output with the vibration or other signal from the tire to identify the failing tire. The phase of the failing tire will change relative to the other tires, for example. This technique can also be used to associate a tire pressure monitor RF signal with a particular tire. An alternate method for tire identification makes use of an RFID tag or an RFID switch as discussed below.

In view of the foregoing, a method for diagnosing whether one or more components of a vehicle are operating abnormally would entail in a training stage, obtaining output from the sensors during normal operation of the components, adjusting each component to induce abnormal operation thereof and obtaining output from the sensors during the induced abnormal operation, and determining which sensors provide data about abnormal operation of each component based on analysis of the output from the sensors during normal operation and during induced abnormal operation of the component, e.g., differences between signals output from the sensors during normal and abnormal operation. The output from the sensors can be processed and pre-processed as described above. When obtaining output from the sensors during abnormal component operation, different abnormalities can be induced in the components, one abnormality in one component at each time and/or multiple abnormalities in multiple components at one time.

During operation of the vehicle, output from the sensors is received and a determination is made whether any of the components are operating abnormally by analyzing the output from those sensors which have been determined to provide data about abnormal operation of that component. This determination is used to alert a driver of the vehicle, a vehicle manufacturer, a vehicle dealer or a vehicle repair facility about the abnormal operation of a component. As mentioned above, the determination of whether any of the components are operating abnormally may involve considering output from only those sensors which have been determined to provide data about abnormal operation of that component. This could be a subset of the sensors, although it is possible when using a neural network to input all of the sensor data with the neural network being designed to disregard output from sensors which have no bearing on the determination of abnormal operation of the component operating abnormally.

When a combination neural network 810 is used, its training can involve multiple steps. With reference to FIG. 92, after data acquisition from the sensors 811, a first neural network 812 could be designed to determine whether the data from the sensors being input therein corresponds to data obtained during normal operation of the components. If so, the output from this first neural network 812 would be an indication of normal vehicular operation (possibly displayed to the driver) and which would cause the system to obtain new data 811 at a preset time interval or upon occurrence of a condition. If not, the existence of abnormal operation of at least one component is indicated (as well as a possible condition of entry of bad data). The combination neural network 810 includes a second neural network 813 which receives the data and is trained to output an indication of which component is operating abnormally and possibly the exact manner in which the component is operating abnormally, e.g., an unbalanced tire or an underinflated tire. This output can be sent to the driver, a vehicle dealer, manufacturer, repair facility, etc. 814 via a display device, transmission device and other notification, alert, alarm and/or warning systems. After a preset time interval or upon occurrence of a condition, new data is acquired.

With reference to FIG. 93, a second combination neural network 815, after data acquisition from the sensors 816, a first neural network 817 could be designed to determine whether the data from the sensors being input therein corresponds to data obtained during normal operation of the components. If so, the output from this first neural network 817 would be an indication of normal vehicular operation (possibly displayed to the driver) and which would cause the system to obtain new data 816 at a preset time interval or upon occurrence of a condition. If not, the existence of abnormal operation of at least one component is indicated (as well as a possible condition of entry of bad data). The combination neural network 815 includes a second neural network 818 which receives the data and is trained to output an indication of which component is operating abnormally. Depending on which component is determined to be operating abnormally, data is provided to one of a plurality of additional neural networks 819, 820, 821, each of which is trained to output an indication of the specific manner of abnormal operation of a specific component. Thus, neural network 819 is designed to be used only when a problem with the tires of the vehicle is output from neural network 818, neural network 820 is designed to be used only when a problem with the brakes of the vehicle is output from neural network 818, and neural network 821 is designed to be used only when a problem with the coolant system of the vehicle is output from neural network 818. Only three neural networks 819, 820, 821 are shown, but there could be one trained for each component or set of like components.

Neural networks 819, 820, 821 can be provided with only a subset of the data from all of the sensors, namely, data only from those sensors determined in the training stage to have an effect on the determination of the problem with the particular component the neural network is diagnosing a problem with.

The output of the specific problem from one of neural networks 819, 820, 821 is sent to the driver, a vehicle dealer, manufacturer, repair facility, etc. 822 via a display device, transmission device and other notification, alert, alarm and/or warning systems. After a preset time interval or upon occurrence of a condition, new data is acquired.

To preclude the bad data situation, an additional neural network can be used in either combination neural network 810 or 815 to process the data and ascertain whether it is good or bad before providing the data to the neural network which determines abnormal operation of a component. In FIG. 3, a schematic of a vehicle with several components and several sensors is shown in their approximate locations on a vehicle along with a total vehicle diagnostic system in accordance with the invention utilizing a diagnostic module in accordance with the invention. A flow diagram of information passing from the various sensors shown in FIG. 3 onto the vehicle data bus, wireless communication system, wire harness or a combination thereof, and thereby into the diagnostic device in accordance with the invention is shown in FIG. 4 along with outputs to a display for notifying the driver and to the vehicle cellular phone, or other communication device, for notifying the dealer, vehicle manufacturer or other entity concerned with the failure of a component in the vehicle. If the vehicle is operating on a smart highway, for example, the pending component failure information may also be communicated to a highway control system and/or to other vehicles in the vicinity so that an orderly exiting of the vehicle from the smart highway can be facilitated. FIG. 4 also contains the names of the sensors shown numbered in FIG. 3.

Note, where applicable in one or more of the inventions disclosed herein, any form of wireless communication is contemplated for intra vehicle communications between various sensors and components including amplitude modulation, frequency modulation, TDMA, CDMA, spread spectrum, ultra wideband and all variations. Similarly, all such methods are also contemplated for vehicle-to-vehicle or vehicle-to-infrastructure communication.

Sensor 1 is a crash sensor having an accelerometer (alternately one or more dedicated accelerometers or IMUs 31 can be used), sensor 2 is represents one or more microphones, sensor 3 is a coolant thermometer, sensor 4 is an oil pressure sensor, sensor 5 is an oil level sensor, sensor 6 is an air flow meter, sensor 7 is a voltmeter, sensor 8 is an ammeter, sensor 9 is a humidity sensor, sensor 10 is an engine knock sensor, sensor 11 is an oil turbidity sensor, sensor 12 is a throttle position sensor, sensor 13 is a steering torque sensor, sensor 14 is a wheel speed sensor, sensor 15 is a tachometer, sensor 16 is a speedometer, sensor 17 is an oxygen sensor, sensor 18 is a pitch/roll sensor, sensor 19 is a clock, sensor 20 is an odometer, sensor 21 is a power steering pressure sensor, sensor 22 is a pollution sensor, sensor 23 is a fuel gauge, sensor 24 is a cabin thermometer, sensor 25 is a transmission fluid level sensor, sensor 26 is a yaw sensor, sensor 27 is a coolant level sensor, sensor 28 is a transmission fluid turbidity sensor, sensor 29 is brake pressure sensor and sensor 30 is a coolant pressure sensor. Other possible sensors include a temperature transducer, a pressure transducer, a liquid level sensor, a flow meter, a position sensor, a velocity sensor, a RPM sensor, a chemical sensor and an angle sensor, angular rate sensor or gyroscope.

If a distributed group of acceleration sensors or accelerometers are used to permit a determination of the location of a vibration source, the same group can, in some cases, also be used to measure the pitch, yaw and/or roll of the vehicle eliminating the need for dedicated angular rate sensors. In addition, as mentioned above, such a suite of sensors can also be used to determine the location and severity of a vehicle crash and additionally to determine that the vehicle is on the verge of rolling over. Thus, the same suite of accelerometers optimally performs a variety of functions including inertial navigation, crash sensing, vehicle diagnostics, roll-over sensing etc.

Consider now some examples. The following is a partial list of potential component failures and the sensors from the list in FIG. 4 that might provide information to predict the failure of the component:

| | |
|---|---|
| Out of balance tires | 1, 13, 14, 15, 20, 21 |
| Front end out of alignment | 1, 13, 21, 26 |
| Tune up required | 1, 3, 10, 12, 15, 17, 20, 22 |
| Oil change needed | 3, 4, 5, 11 |
| Motor failure | 1, 2, 3, 4, 5, 6, 10, 12, 15, 17, 22 |
| Low tire pressure | 1, 13, 14, 15, 20, 21 |
| Front end looseness | 1, 13, 16, 21, 26 |
| Cooling system failure | 3, 15, 24, 27, 30 |
| Alternator problems | 1, 2, 7, 8, 15, 19, 20 |
| Transmission problems | 1, 3, 12, 15, 16, 20, 25, 28 |
| Differential problems | 1, 12, 14 |
| Brakes | 1, 2, 14, 18, 20, 26, 29 |
| Catalytic converter and muffler | 1, 2, 12, 15, 22 |
| Ignition | 1, 2, 7, 8, 9, 10, 12, 17, 23 |
| Tire wear | 1, 13, 14, 15, 18, 20, 21, 26 |
| Fuel leakage | 20, 23 |
| Fan belt slippage | 1, 2, 3, 7, 8, 12, 15, 19, 20 |
| Alternator deterioration | 1, 2, 7, 8, 15, 19 |
| Coolant pump failure | 1, 2, 3, 24, 27, 30 |
| Coolant hose failure | 1, 2, 3, 27, 30 |
| Starter failure | 1, 2, 7, 8, 9, 12, 15 |
| Dirty air filter | 2, 3, 6, 11, 12, 17, 22 |

Several interesting facts can be deduced from a review of the above list. First, all of the failure modes listed can be at least partially sensed by multiple sensors. In many cases, some of the sensors merely add information to aid in the interpretation of signals received from other sensors. In today's automobile, there are few if any cases where multiple sensors are used to diagnose or predict a problem. In fact, there is virtually no failure prediction (prognostics) undertaken at all. Second, many of the failure modes listed require information from more than one sensor. Third, information for many of the failure modes listed cannot be obtained by observing one data point in time as is now done by most vehicle sensors. Usually an analysis of the variation in a parameter as a function of time is necessary. In fact, the association of data with time to create a temporal pattern for use in diagnosing component failures in automobile is believed to be unique to the inventions herein as is the combination of several such temporal patterns. Fourth, the vibration measuring capability of the airbag crash sensor, or other accelerometer or IMU, is useful for most of the cases discussed above yet there is no such current use of accelerometers. The airbag crash sensor is used only to detect crashes of the vehicle. Fifth, the second most used sensor in the above list, a microphone, does not currently appear on any automobiles, yet sound is the signal most often used by vehicle operators and mechanics to diagnose vehicle problems.

Another sensor that is listed above which also does not currently appear on automobiles is a pollution sensor. This is typically a chemical sensor mounted in the exhaust system for detecting emissions from the vehicle. It is expected that this and other chemical and biological sensors will be used more in the future. Such a sensor can be used to monitor the intake of air from outside the vehicle to permit such a flow to be cut off when it is polluted. Similarly, if the interior air is polluted, the exchange with the outside air can be initiated.

In addition, from the foregoing depiction of different sensors which receive signals from a plurality of components, it is possible for a single sensor to receive and output signals from a plurality of components which are then analyzed by the processor to determine if any one of the components for which the received signals were obtained by that sensor is operating in an abnormal state. Likewise, it is also possible to provide for a plurality of sensors each receiving a different signal related to a specific component which are then analyzed by the processor to determine if that component is operating in an abnormal state. Neural networks can simultaneously analyze data from multiple sensors of the same type or different types (a form of sensor fusion).

As can be appreciated from the above discussion, an invention described herein brings several new improvements to vehicles including, but not limited to, the use of pattern recognition technologies to diagnose potential vehicle component failures, the use of trainable systems thereby eliminating the need of complex and extensive programming, the simultaneous use of multiple sensors to monitor a particular component, the use of a single sensor to monitor the operation of many vehicle components, the monitoring of vehicle components which have no dedicated sensors, and the notification of both the driver and possibly an outside entity of a potential component failure prior to failure so that the expected failure can be averted and vehicle breakdowns substantially eliminated. Additionally, improvements to the vehicle stability, crash avoidance, crash anticipation and occupant protection are available.

To implement a component diagnostic system for diagnosing the component utilizing a plurality of sensors not directly associated with the component, i.e., independent of the component, a series of tests are conducted. For each test, the signals received from the sensors are input into a pattern recognition training algorithm with an indication of whether the component is operating normally or abnormally (the component being intentionally altered to provide for abnormal operation). The data from the test are used to generate the pattern recognition algorithm, e.g., neural network, so that in use, the data from the sensors is input into the algorithm and the algorithm provides an indication of abnormal or normal operation of the component. Also, to provide a more versatile diagnostic module for use in conjunction with diagnosing abnormal operation of multiple components, tests may be conducted in which each component is operated abnormally while the other components are operating normally, as well as tests in which two or more components are operating abnormally. In this manner, the diagnostic module may be able to determine based on one set of signals from the sensors during use that either a single component or multiple components are operating abnormally. Additionally, if a failure occurs which was not forecasted, provision can be made to record the output of some or all of the vehicle data and later make it available to the vehicle manufacturer for inclusion into the pattern recognition training database. Also, it is not necessary that a neural network system that is on a vehicle be a static system and some amount of learning can, in some cases, be permitted. Additionally, as the vehicle manufacturer updates the neural networks, the newer version can be downloaded to particular vehicles either when the vehicle is at a dealership or wirelessly via a cellular network or by satellite.

Furthermore, the pattern recognition algorithm may be trained based on patterns within the signals from the sensors. Thus, by means of a single sensor, it would be possible to determine whether one or more components are operating abnormally. To obtain such a pattern recognition algorithm, tests are conducted using a single sensor, such as a microphone, and causing abnormal operation of one or more components, each component operating abnormally while the other components operate normally and multiple components operating abnormally. In this manner, in use, the pattern recognition algorithm may analyze a signal from a single sensor and determine abnormal operation of one or more components. Note that in some cases, simulations can be used to analytically generate the relevant data.

The discussion above has centered mainly on the blind training of a pattern recognition system, such as a neural network, so that faults can be discovered and failures forecast before they happen. Naturally, the diagnostic algorithms do not have to start out being totally dumb and in fact, the physics or structure of the systems being monitored can be appropriately used to help structure or derive the diagnostic algorithms. Such a system is described in a recent article "Immobots Take Control", MIT Technology Review December, 2002. Also, of course, it is contemplated that once a potential failure has been diagnosed, the diagnostic system can in some cases act to change the operation of various systems in the vehicle to prolong the time of a failing component before the failure or in some rare cases, the situation causing the failure might be corrected. An example of the first case is where the alternator is failing and various systems or components can be turned off to conserve battery power and an example of the second case is rollover of a vehicle may be preventable through the proper application of steering torque and wheel braking force. Such algorithms can be based on pattern recognition or on models, as described in the Immobot article referenced above, or a combination thereof and all such systems are contemplated by the invention described herein.

1.3 SAW and other Wireless Sensors

Many sensors are now in vehicles and many more will be installed in vehicles. The following disclosure is primarily concerned with wireless sensors which can be based on MEMS, SAW and/or RFID technologies. Vehicle sensors include tire pressure, temperature and acceleration monitoring sensors; weight or load measuring sensors; switches; vehicle temperature, acceleration, angular position, angular rate, angular acceleration sensors; proximity; rollover; occupant presence; humidity; presence of fluids or gases; strain; road condition and friction, chemical sensors and other similar sensors providing information to a vehicle system, vehicle operator or external site. The sensors can provide information about the vehicle and/or its interior or exterior environment, about individual components, systems, vehicle occupants, subsystems, and/or about the roadway, ambient atmosphere, travel conditions and external objects.

For wireless sensors, one or more interrogators can be used each having one or more antennas that transmit energy at radio frequency, or other electromagnetic frequencies, to the sensors and receive modulated frequency signals from the sensors containing sensor and/or identification information. One interrogator can be used for sensing multiple switches or other devices. For example, an interrogator may transmit a chirp form of energy at 905 MHz to 925 MHz to a variety of sensors located within and/or in the vicinity of the vehicle.

These sensors may be of the RFID electronic type and/or of the surface acoustic wave (SAW) type or a combination thereof. In the electronic type, information can be returned immediately to the interrogator in the form of a modulated backscatter RF signal. In the case of SAW devices, the information can be returned after a delay. RFID tags may also exhibit a delay due to the charging of the energy storage device. Naturally, one sensor can respond in both the electronic (either RFID or backscatter) and SAW delayed modes.

When multiple sensors are interrogated using the same technology, the returned signals from the various sensors can be time, code, space or frequency multiplexed. For example, for the case of the SAW technology, each sensor can be provided with a different delay or a different code. Alternately, each sensor can be designed to respond only to a single frequency or several frequencies. The radio frequency can be amplitude, code or frequency modulated. Space multiplexing can be achieved through the use of two or more antennas and correlating the received signals to isolate signals based on direction.

In many cases, the sensors will respond with an identification signal followed by or preceded by information relating to the sensed value, state and/or property. In the case of a SAW-based or RFID-based switch, for example, the returned signal may indicate that the switch is either on or off or, in some cases, an intermediate state can be provided signifying that a light should be dimmed, rather than or on or off, for example. Alternately or additionally, an RFID based switch can be associated with a sensor and turned on or off based on an identification code or a frequency sent from the interrogator permitting a particular sensor or class of sensors to be selected.

SAW devices have been used for sensing many parameters including devices for chemical and biological sensing and materials characterization in both the gas and liquid phase. They also are used for measuring pressure, strain, temperature, acceleration, angular rate and other physical states of the environment.

Economies are achieved by using a single interrogator or even a small number of interrogators to interrogate many types of devices. For example, a single interrogator may monitor tire pressure and temperature, the weight of an occupying item of the seat, the position of the seat and seatback, as well as a variety of switches controlling windows, door locks, seat position, etc. in a vehicle. Such an interrogator may use one or multiple antennas and when multiple antennas are used, may switch between the antennas depending on what is being monitored.

Similarly, the same or a different interrogator can be used to monitor various components of the vehicle's safety system including occupant position sensors, vehicle acceleration sensors, vehicle angular position, velocity and acceleration sensors, related to both frontal, side or rear impacts as well as rollover conditions. The interrogator could also be used in conjunction with other detection devices such as weight sensors, temperature sensors, accelerometers which are associated with various systems in the vehicle to enable such systems to be controlled or affected based on the measured state.

Some specific examples of the use of interrogators and responsive devices will now be described.

The antennas used for interrogating the vehicle tire pressure transducers can be located outside of the vehicle passenger compartment. For many other transducers to be sensed the antennas can be located at various positions within passenger compartment. At least one invention herein contemplates, therefore, a series of different antenna systems, which can be electronically switched by the interrogator circuitry. Alternately, in some cases, all of the antennas can be left connected and total transmitted power increased.

There are several applications for weight or load measuring devices in a vehicle including the vehicle suspension system and seat weight sensors for use with automobile safety systems. As described in U.S. Pat. Nos. 4,096,740, 4,623,813, 5,585,571, 5,663,531, 5,821,425 and 5,910,647 and International Publication No. WO 00/65320(A1), SAW devices are appropriate candidates for such weight measurement systems, although in some cases RFID systems can also be used with an associated sensor such as a strain gage. In this case, the surface acoustic wave on the lithium niobate, or other piezoelectric material, is modified in delay time, resonant frequency, amplitude and/or phase based on strain of the member upon which the SAW device is mounted. For example, the conventional bolt that is typically used to connect the passenger seat to the seat adjustment slide mechanism can be replaced with a stud which is threaded on both ends. A SAW or other strain device can be mounted to the center unthreaded section of the stud and the stud can be attached to both the seat and the slide mechanism using appropriate threaded nuts. Based on the particular geometry of the SAW device used, the stud can result in as little as a 3 mm upward displacement of the seat compared to a normal bolt mounting system. No wires are required to attach the SAW device to the stud other than for an antenna.

In use, the interrogator transmits a radio frequency pulse at, for example, 925 MHz that excites antenna on the SAW strain measuring system. After a delay caused by the time required for the wave to travel the length of the SAW device, a modified wave is re-transmitted to the interrogator providing an indication of the strain of the stud with the weight of an object occupying the seat corresponding to the strain. For a seat that is normally bolted to the slide mechanism with four bolts, at least four SAW strain sensors could be used. Since the individual SAW devices are very small, multiple devices can be placed on a stud to provide multiple redundant measurements, or permit bending and twisting strains to be determined, and/or to permit the stud to be arbitrarily located with at least one SAW device always within direct view of the interrogator antenna. In some cases, the bolt or stud will be made on non-conductive material to limit the blockage of the RF signal. In other cases, it will be insulated from the slide (mechanism) and used as an antenna.

If two longitudinally spaced apart antennas are used to receive the SAW or RFID transmissions from the seat weight sensors, one antenna in front of the seat and the other behind the seat, then the position of the seat can be determined eliminating the need for current seat position sensors. A similar system can be used for other seat and seatback position measurements.

For strain gage weight sensing, the frequency of interrogation can be considerably higher than that of the tire monitor, for example. However, if the seat is unoccupied, then the frequency of interrogation can be substantially reduced. For an occupied seat, information as to the identity and/or category and position of an occupying item of the seat can be obtained through the multiple weight sensors described. For this reason, and due to the fact that during the pre-crash event, the position of an occupying item of the seat may be changing rapidly, interrogations as frequently as once every 10 milliseconds or faster can be desirable. This would also enable a distribution of the weight being applied to the seat to be obtained which provides an estimation of the center of pressure and thus the position of the object occupying the seat. Using pattern recognition technology, e.g., a trained neural network, sensor fusion, fuzzy logic, etc., an identification of the object can be ascertained based on the determined weight and/or determined weight distribution.

There are many other methods by which SAW devices can be used to determine the weight and/or weight distribution of an occupying item other than the method described above and all such uses of SAW strain sensors for determining the weight and weight distribution of an occupant are contemplated. For example, SAW devices with appropriate straps can be used to measure the deflection of the seat cushion top or bottom caused by an occupying item, or if placed on the seat belts, the load on the belts can determined wirelessly and powerlessly. Geometries similar to those disclosed in U.S. Pat. No. 6,242,701 (which discloses multiple strain gage geometries) using SAW strain-measuring devices can also be constructed, e.g., any of the multiple strain gage geometries shown therein.

Generally there is an RFID implementation that corresponds to each SAW implementation. Therefore, where SAW is used herein the equivalent RFID design will also be meant where appropriate.

Although a preferred method for using the invention is to interrogate each of the SAW devices using wireless mechanisms, in some cases, it may be desirable to supply power to and/or obtain information from one or more of the SAW devices using wires. As such, the wires would be an optional feature.

One advantage of the weight sensors of this invention along with the geometries disclosed in the '701 patent and herein below, is that in addition to the axial stress in the seat support, the bending moments in the structure can be readily determined. For example, if a seat is supported by four "legs", it is possible to determine the state of stress, assuming that axial twisting can be ignored, using four strain gages on each leg support for a total of 16 such gages. If the seat is supported by three legs, then this can be reduced to 12 gages. Naturally, a three-legged support is preferable to four since with four legs, the seat support is over-determined which severely complicates the determination of the stress caused by an object on the seat. Even with three supports, stresses can be introduced depending on the nature of the support at the seat rails or other floor-mounted supporting structure. If simple supports are used that do not introduce bending moments into the structure, then the number of gages per seat can be reduced to three, provided a good model of the seat structure is available. Unfortunately, this is usually not the case and most seats have four supports and the attachments to the vehicle not only introduce bending moments into the structure but these moments vary from one position to another and with temperature. The SAW strain gages of this invention lend themselves to the placement of multiple gages onto each support as needed to approximately determine the state of stress and thus the weight of the occupant depending on the particular vehicle application. Furthermore, the wireless nature of these gages greatly simplifies the placement of such gages at those locations that are most appropriate.

An additional point should be mentioned. In many cases, the determination of the weight of an occupant from the static strain gage readings yields inaccurate results due to the indeterminate stress state in the support structure. However, the dynamic stresses to a first order are independent of the residual stress state. Thus, the change in stress that occurs as a vehicle travels down a roadway caused by dips in the roadway can provide an accurate measurement of the weight of an object in a seat. This is especially true if an accelerometer is used to measure the vertical excitation provided to the seat.

Some vehicle models provide load leveling and ride control functions that depend on the magnitude and distribution of load carried by the vehicle suspension. Frequently, wire strain gage technology is used for these functions. That is, the wire strain gages are used to sense the load and/or load distribution of the vehicle on the vehicle suspension system. Such strain gages can be advantageously replaced with strain gages based on SAW technology with the significant advantages in terms of cost, wireless monitoring, dynamic range, and signal level. In addition, SAW strain gage systems can be more accurate than wire strain gage systems.

A strain detector in accordance with this invention can convert mechanical strain to variations in electrical signal frequency with a large dynamic range and high accuracy even for very small displacements. The frequency variation is produced through use of a surface acoustic wave (SAW) delay line as the frequency control element of an oscillator. A SAW delay line comprises a transducer deposited on a piezoelectric material such as quartz or lithium niobate which is arranged so as to be deformed by strain in the member which is to be monitored. Deformation of the piezoelectric substrate changes the frequency control characteristics of the surface acoustic wave delay line, thereby changing the frequency of the oscillator. Consequently, the oscillator frequency change is a measure of the strain in the member being monitored and thus the weight applied to the seat. A SAW strain transducer can be more accurate than a conventional resistive strain gage.

Other applications of weight measuring systems for an automobile include measuring the weight of the fuel tank or other containers of fluid to determine the quantity of fluid contained therein as described in more detail below.

One problem with SAW devices is that if they are designed to operate at the GHz frequency, the feature sizes become exceeding small and the devices are difficult to manufacture, although techniques are now available for making SAW devices in the tens of GHz range. On the other hand, if the frequencies are considerably lower, for example, in the tens of megahertz range, then the antenna sizes become excessive. It is also more difficult to obtain antenna gain at the lower frequencies. This is also related to antenna size. One method of solving this problem is to transmit an interrogation signal in the high GHz range which is modulated at the hundred MHz range. At the SAW transducer, the transducer is tuned to the modulated frequency. Using a nonlinear device such as a Shocky diode, the modified signal can be mixed with the incoming high frequency signal and re-transmitted through the same antenna. For this case, the interrogator can continuously broadcast the carrier frequency.

Devices based on RFID or SAW technology can be used as switches in a vehicle as described in U.S. Pat. Nos. 6,078,252, 6,144,288 and 6,748,797. There are many ways that this can be accomplished. A switch can be used to connect an antenna to either an RFID electronic device or to a SAW device. This of course requires contacts to be closed by the switch activation. An alternate approach is to use pressure from an occupant's finger, for example, to alter the properties of the acoustic wave on the SAW material much as in a SAW touch screen. The properties that can be modified include the amplitude of the acoustic wave, and its phase, and/or the time delay or an external impedance connected to one of the SAW reflectors as disclosed in U.S. Pat. No. 6,084,503. In this implementation, the SAW transducer can contain two sections, one which is modified by the occupant and the other which serves as a reference. A combined signal is sent to the interrogator that decodes the signal to determine that the switch has been activated. By any of these technologies, switches can be arbitrarily placed within the interior of an automobile, for example, without the need for wires. Since wires and connectors are the cause of most warranty repairs in an automobile, not only is the cost of switches substantially reduced but also the reliability of the vehicle electrical system is substantially improved.

The interrogation of switches can take place with moderate frequency such as once every 100 milliseconds. Either through the use of different frequencies or different delays, a large number of switches can be time, code, space and/or frequency multiplexed to permit separation of the signals obtained by the interrogator. Alternately, an RF activated switch on some or all of the sensors can be used as discussed in more detail below.

Another approach is to attach a variable impedance device across one of the reflectors on the SAW device. The impedance can therefore be used to determine the relative reflection from the reflector compared to other reflectors on the SAW device. In this manner, the magnitude as well as the presence of a force exerted by an occupant's finger, for example, can be used to provide a rate sensitivity to the desired function. In an alternate design, as shown U.S. Pat. No. 6,144,288, the switch is used to connect the antenna to the SAW device. Of course, in this case, the interrogator will not get a return from the SAW switch unless it is depressed.

Temperature measurement is another field in which SAW technology can be applied and the invention encompasses several embodiments of SAW temperature sensors.

U.S. Pat. No. 4,249,418 is one of many examples of prior art SAW temperature sensors. Temperature sensors are commonly used within vehicles and many more applications might exist if a low cost wireless temperature sensor is available such as disclosed herein. The SAW technology can be used for such temperature sensing tasks. These tasks include measuring the vehicle coolant temperature, air temperature within passenger compartment at multiple locations, seat temperature for use in conjunction with seat warming and cooling systems, outside temperatures and perhaps tire surface temperatures to provide early warning to operators of road freezing conditions. One example, is to provide air temperature sensors in the passenger compartment in the vicinity of ultrasonic transducers used in occupant sensing systems as described in the current assignee's U.S. Pat. No. 5,943,295 (Varga et al.), since the speed of sound in the air varies by approximately 20 % from −40° C. to 85° C. Current ultrasonic occupant sensor systems do not measure or compensate for this change in the speed of sound with the effect of reducing the accuracy of the systems at the temperature extremes. Through the judicious placement of SAW temperature sensors in the vehicle, the passenger compartment air temperature can be accurately estimated and the information provided wirelessly to the ultrasonic occupant sensor system thereby permitting corrections to be made for the change in the speed of sound.

Since the road can be either a source or a sink of thermal energy, strategically placed sensors that measure the surface temperature of a tire can also be used to provide an estimate of road temperature.

Acceleration sensing is another field in which SAW technology can be applied and the invention encompasses several embodiments of SAW accelerometers.

U.S. Pat. Nos. 4,199,990, 4,306,456 and 4,549,436 are examples of prior art SAW accelerometers. Most airbag crash sensors for determining whether the vehicle is experiencing a frontal or side impact currently use micromachined accelerometers. These accelerometers are usually based on the deflection of a mass which is sensed using either capacitive or piezoresistive technologies. SAW technology has previously not been used as a vehicle accelerometer or for vehicle crash sensing. Due to the importance of this function, at least one interrogator could be dedicated to this critical function. Acceleration signals from the crash sensors should be reported at least preferably every 100 microseconds. In this case, the dedicated interrogator would send an interrogation pulse to all crash sensor accelerometers every 100 microseconds and receive staggered acceleration responses from each of the SAW accelerometers wirelessly. This technology permits the placement of multiple low-cost accelerometers at ideal locations for crash sensing including inside the vehicle side doors, in the passenger compartment and in the frontal crush zone. Additionally, crash sensors can now be located in the rear of the vehicle in the crush zone to sense rear impacts. Since the acceleration data is transmitted wirelessly, concern about the detachment or cutting of wires from the sensors disappears. One of the main concerns, for example, of placing crash sensors in the vehicle doors where they most appropriately can sense vehicle side impacts, is the fear that an impact into the A-pillar of the automobile would sever the wires from the door-mounted crash sensor before the crash was sensed. This problem disappears with the current wireless technology of this invention. If two accelerometers are placed at some distance from each other, the roll acceleration of the vehicle can be determined and thus the tendency of the vehicle to rollover can be predicted in time to automatically take corrective action and/or deploy a curtain airbag or other airbag(s). Other types of sensors such as crash sensors based on pressure measurements, such as supplied by Siemens, can also now be wireless.

Although the sensitivity of measurement is considerably greater than that obtained with conventional piezoelectric or micromachined accelerometers, the frequency deviation of SAW devices remains low (in absolute value). Accordingly, the frequency drift of thermal origin should be made as low as possible by selecting a suitable cut of the piezoelectric material. The resulting accuracy is impressive as presented in U.S. Pat. No. 4,549,436, which discloses an angular accelerometer with a dynamic a range of 1 million, temperature coefficient of 0.005%/deg F., an accuracy of 1 microradian/sec$^2$, a power consumption of 1 milliwatt, a drift of 0.01% per year, a volume of 1 cc/axis and a frequency response of 0 to 1000 Hz. The subject matter of the '436 patent is hereby included in the invention to constitute a part of the invention. A similar design can be used for acceleration sensing.

In a similar manner as the polymer-coated SAW device is used to measure pressure, a device wherein a seismic mass is attached to a SAW device through a polymer interface can be made to sense acceleration. This geometry has a particular advantage for sensing accelerations below 1 G, which has proved to be very difficult for conventional micro-machined accelerometers due to their inability to both measure low accelerations and withstand high acceleration shocks.

Gyroscopes are another field in which SAW technology can be applied and the inventions herein encompass several embodiments of SAW gyroscopes.

SAW technology is particularly applicable for gyroscopes as described in International Publication No. WO 00/79217A2 to Varadan et al. The output of such gyroscopes can be determined with an interrogator that is also used for the crash sensor accelerometers, or a dedicated interrogator can be used. Gyroscopes having an accuracy of approximately 1 degree per second have many applications in a vehicle including skid control and other dynamic stability functions. Additionally, gyroscopes of similar accuracy can be used to sense impending vehicle rollover situations in time to take corrective action.

The inventors have represented that SAW gyroscopes of the type described in WO 00/79217 A2 have the capability of achieving accuracies approaching about 3 degrees per hour. This high accuracy permits use of such gyroscopes in an inertial measuring unit (IMU) that can be used with accurate vehicle navigation systems and autonomous vehicle control based on differential GPS corrections. Such a system is described in U.S. Pat. No. 6,370,475. An alternate preferred technology for an IMU is described in U.S. Pat. No. 4,711,125 to Morrison discussed in more detail below. Such navigation systems depend on the availability of four or more GPS satellites and an accurate differential correction signal such as provided by the OmniStar Corporation, NASA or through the National Differential GPS system now being deployed. The availability of these signals degrades in urban canyon environments, in tunnels and on highways when the vehicle is in the vicinity of large trucks. For this application, an IMU system should be able to accurately control the vehicle for perhaps 15 seconds and preferably for up to five minutes. IMUs based on SAW technology, the technology of U.S. Pat. No. 4,549,436 discussed above or of the U.S. Pat. No. 4,711,125 are the best-known devices capable of providing sufficient accuracies for this application at a reasonable cost. Other accurate gyroscope technologies such as fiber optic systems are more accurate but can be cost-prohibitive, although recent analysis by the current assignee indicates that such gyroscopes can eventually be made cost-competitive. In high volume production, an IMU of the required accuracy based on SAW technology is estimated to cost less than about $100. A cost competing technology is that disclosed in U.S. Pat. No. 4,711,125 which does not use SAW technology.

What follows is a discussion of the Morrison Cube of U.S. Pat. No. 4,711,125 known as the QUBIK™. Let us review the typical problems that are encountered with sensors that try to measure multiple physical quantities at the same time and how the QUBIK solves these problems. These problems were provided by an IMU expert unfamiliar with the QUBIK and the responses are provided by Morrison.

1. Problem: Errors of measurement of the linear accelerations and angular speed are mutually correlated. Even if every one of the errors, taken separately, does not accumulate with integration (the inertial system's algorithm does that), the cross-coupled multiplication (such as one during re-projecting the linear accelerations from one coordinate system to another) will have these errors detected and will make them a systematic error similar to a sensor's bias.

Solution: The QUBIK IMU is calibrated and compensated for any cross axis sensitivity. For example: if one of the angular accelerometer channels has a sensitivity to any of the three of linear accelerations, then the linear accelerations are buffered and scaled down and summed with the buffered angular accelerometer output to cancel out all linear acceleration sensitivity on all three angular accelerometer channels. This is important to detect pure angular rate signals. This is a very common practice throughout the U.S. aerospace industry to make navigation grade IMU's. Even when individual gyroscopes and accelerometers are used in navigation, they have their outputs scaled and summed together to cancel out these cross axis errors. Note that competitive MEMS products have orders of magnitude higher cross axis sensitivities when compared to navigation grade sensors and they will undoubtedly have to use this practice to improve performance. MEMS angular rate sensors are advertised in degrees per second and navigation angular rate sensors are advertised in degrees per hour. MEMS angular rate sensors have high linear acceleration errors that must be compensated for at the IMU level.

2. Problem: The gyroscope and accelerometer channels require settings to be made that contradict one another physically. For example, a gap between the cube and the housing for the capacitive sensors (that measure the displacements of the cube) is not to exceed 50 to 100 microns. On the other hand, the gyroscope channels require, in order to enhance a Coriolis effect used to measure the angular speed, that the amplitude and the linear speed of vibrations are as big as possible. To do this, the gap and the frequency of oscillations should be increased. A greater frequency of oscillations in the nearly resonant mode requires the stiffness of the electromagnetic suspension to be increased, too, which leads to a worse measurement of the linear accelerations because the latter require that the rigidity of the suspension be minimal when there is a closed feedback.

Solution: The capacitive gap all around the levitated inner cube of the QUBIK is nominally 0.010 inches. The variable capacitance plates are excited by a 1.5 MHz 25 volt peak to peak signal. The signal coming out is so strong (five volts) that there is no preamp required. Diode detectors are mounted directly above the capacitive plates. There is no performance change in the linear accelerometer channels when the angular accelerometer channels are being dithered or rotated back and forth about an axis. This was discovered by having a ground plane around the electromagnets that eliminated transformer coupling. Dithering or driving the angular accelerometer which rotates the inner cube proof mass is a gyroscopic displacement and not a linear displacement and has no effect on the linear channels. Another very important point to make is the servo loops measure the force required to keep the inner cube at its null and the servo loops are integrated to prevent any displacements. The linear accelerometer servo loops are not being exercised to dither the inner cube. The angular accelerometer servo loop is being exercised. The linear and angular channels have their own separate set of capacitance detectors and electromagnets. Driving the angular channels has no effect on the linear ones.

The rigidity of an integrated closed loop servo is infinite at DC and rolls off at higher frequencies. The QUBIK IMU measures the force being applied to the inner cube and not the displacement to measure angular rate. There is a force generated on the inner cube when it is being rotated and the servo will not allow any displacement by applying equal and opposite forces on the inner cube to keep it at null. The servo readout is a direct measurement of the gyroscopic forces on the inner cube and not the displacement.

The servo gain is so high at the null position that one will not see the null displacement but will see a current level equivalent to the force on the cube. This is why integrated closed loop servos are so good. They measure the force required to keep the inner cube at null and not the displacement. The angular accelerometer channel that is being dithered will have a noticeable displacement at its null. The sensor does not have to be driven at its resonance. Driving the angular accelerometer at resonance will run the risk of overdriving the inner cube to the point where it will bottom out and bang around inside its cavity. There is an active gain control circuit to keep the alternating momentum constant.

Note that competitive MEMS based sensors are open loop and allow displacements which increase cross axis errors. MEMS sensors must have displacements to work and do not measure the Coriolis force, they measure displacement which results in huge cross axis sensitivity issues.

3. Problem: As the electromagnetic suspension is used, the sensor is going to be sensitive to external constant and variable (alternating) fields. Its errors will vary with its position, for example, with respect to the Earth's magnetic field or other magnetic sources.

Solution: The earths magnetic field varies from −0.0 to +0.3 gauss and the magnets have gauss levels over 10,000. The earth field can be shielded if necessary.

4. Problem: The QUBIT sensing element is relatively heavy so the sensor is likely to be sensitive to angular accelerations and impacts. Also, the temperature of the environment can affect the micron-sized gaps, magnetic fields of the permanent magnets, the resistance of the inductance coils etc., which will eventually increase the sensor errors.

Solution: The inner cube has a gap of 0.010 inches and does not change significantly over temperature.

The resistance of the coils is not a factor in the active closed loop servo. Anybody who make this statement does not know what they are talking about. There is a stable one PPM/C current readout resistor in series with the coil that measures the current passing through the coil which eliminates the temperature sensitivity of the coil resistance.

Permanent magnets have already proven themselves to be very stable over temperature when used in active servo loops used in navigation gyroscopes and accelerometers.

Note that the sensitivity that the QUBIK IMU has achieved 0.01 degrees per hour.

5. Problem: High Cost. To produce the QUBIK, one may need to maintain micron-sized gaps and highly clean surfaces for capacitive sensors; the devices must be assembled in a dust-free room, and the device itself must be hermetic (otherwise dust or moisture will put the capacitive sensor and the electromagnetic suspension out of operation), the permanent magnets must have a very stable performance because they're going to work in a feedback circuit, and so on. In our opinion, all these issues make the technology overly complex and expensive, so an additional metrological control will be required and no full automation can be ever done.

Solution: The sensor does not have micron size gaps and does not need to be hermetic unless the sensor is submerged in water! Most of the QUBIK IMU sensor is a cut out PCB's that can certainly be automated. The PCB design can keep dust out and does not need to be hermetic. Humidity is not a problem unless the sensor is submerged in water. The permanent magnets achieve parts per million stability at a cost of $ 0.05 each for a per system cost of under one dollar. There are may navigation grade gyroscopes and accelerometers that use permanent magnets.

Competitive MEMS sensors can of course have process contamination problems. To my knowledge, there are no MEMS angular rate sensors that do not require human labor and/or calibration. The QUBIK IMU can instead use programmable potentiometers at calibration instead of human labor.

Once an IMU of the accuracy described above is available in the vehicle, this same device can be used to provide significant improvements to vehicle stability control and rollover prediction systems.

Keyless entry systems are another field in which SAW technology can be applied and the invention encompasses several embodiments of access control systems using SAW devices.

A common use of SAW or RFID technology is for access control to buildings however, the range of electronic unpowered RFID technology is usually limited to one meter or less. In contrast, the SAW technology, when powered or boosted, can permit sensing up to about 30 meters. As a keyless entry system, an automobile can be configured such that the doors unlock as the holder of a card containing the SAW ID system approaches the vehicle and similarly, the vehicle doors can be automatically locked when the occupant with the card travels beyond a certain distance from the vehicle. When the occupant enters the vehicle, the doors can again automatically lock either through logic or through a current system wherein doors automatically lock when the vehicle is placed in gear. An occupant with such a card would also not need to have an ignition key. The vehicle would recognize that the SAW-based card was inside vehicle and then permit the vehicle to be started by issuing an oral command if a voice recognition system is present or by depressing a button, for example, without the need for an ignition key.

Although they will not be discussed in detail, SAW sensors operating in the wireless mode can also be used to sense for ice on the windshield or other exterior surfaces of the vehicle, condensation on the inside of the windshield or other interior surfaces, rain sensing, heat-load sensing and many other automotive sensing functions. They can also be used to sense outside environmental properties and states including temperature, humidity, etc.

SAW sensors can be economically used to measure the temperature and humidity at numerous places both inside and outside of a vehicle. When used to measure humidity inside the vehicle, a source of water vapor can be activated to increase the humidity when desirable and the air conditioning system can be activated to reduce the humidity when necessary or desirable. Temperature and humidity measurements outside of the vehicle can be an indication of potential road icing problems. Such information can be used to provide early warning to a driver of potentially dangerous conditions. Although the invention described herein is related to land vehicles, many of these advances are equally applicable to other vehicles such as airplanes and even, in some cases, homes and buildings. The invention disclosed herein, therefore, is not limited to automobiles or other land vehicles.

Road condition sensing is another field in which SAW technology can be applied and the invention encompasses several embodiments of SAW road condition sensors.

The temperature and moisture content of the surface of a roadway are critical parameters in determining the icing state of the roadway. Attempts have been made to measure the coefficient of friction between a tire and the roadway by placing strain gages in the tire tread. Naturally, such strain gages are ideal for the application of SAW technology especially since they can be interrogated wirelessly from a distance and they require no power for operation. As discussed herein, SAW accelerometers can also perform this function. The measurement of the friction coefficient, however, is not predictive and the vehicle operator is only able to ascertain the condition after the fact. Boosted SAW or RFID based transducers have the capability of being interrogated as much as 100 feet from the interrogator. Therefore, the judicious placement of low-cost powerless SAW or RFID temperature and humidity sensors in and/or on the roadway at critical positions can provide an advance warning to vehicle operators that the road ahead is slippery. Such devices are very inexpensive and therefore could be placed at frequent intervals along a highway.

An infrared sensor that looks down the highway in front of the vehicle can actually measure the road temperature prior to the vehicle traveling on that part of the roadway. This system also would not give sufficient warning if the operator waited for the occurrence of a frozen roadway. The probability of the roadway becoming frozen, on the other hand, can be predicted long before it occurs, in most cases, by watching the trend in the temperature. Once vehicle-to-vehicle communications are common, roadway icing conditions can be communicated between vehicles.

Some lateral control of the vehicle can also be obtained from SAW transducers or electronic RFID tags placed down the center of the lane, either above the vehicles and/or in the roadway, for example. A vehicle having two receiving antennas, for example, approaching such devices, through triangulation or direct proportion, is able to determine the lateral location of the vehicle relative to these SAW devices. If the vehicle also has an accurate map of the roadway, the identification number associated with each such device can be used to obtain highly accurate longitudinal position determinations. Ultimately, the SAW devices can be placed on structures beside the road and perhaps on every mile or tenth of a mile marker. If three antennas are used, as discussed herein, the distances from the vehicle to the SAW device can be determined. These SAW devices can be powered in order to stay below current FCC power transmission limits. Such power can be supplied by a photocell, energy harvesting where applicable, by a battery or power connection.

Electronic RFID tags are also suitable for lateral and longitudinal positioning purposes, however, the range available for current electronic RFID systems can be less than that of SAW-based systems unless either are powered. On the other hand, as disclosed in U.S. Pat. No. 6,748,797, the time-of-flight of the RFID system can be used to determine the distance from the vehicle to the RFID tag. Because of the inherent delay in the SAW devices and its variation with temperature, accurate distance measurement is probably not practical based on time-of-flight but somewhat less accurate distance measurements based on relative time-of-arrival can be made. Even if the exact delay imposed by the SAW device was accurately known at one temperature, such devices are usually reasonably sensitive to changes in temperature, hence they make good temperature sensors, and thus the accuracy of the delay in the SAW device is more difficult to maintain. An interesting variation of an electronic RFID that is particularly applicable to this and other applications of this invention is described in A. Pohl, L. Reindl, "New passive sensors", Proc. 16 th IEEE Instrumentation and Measurement Technology Conf., IMTC/99, 1999, pp. 1251-1255.

Many SAW devices are based on lithium niobate or similar strong piezoelectric materials. Such materials have high thermal expansion coefficients. An alternate material is quartz that has a very low thermal expansion coefficient. However, its piezoelectric properties are inferior to lithium niobate. One solution to this problem is to use lithium niobate as the coupling system between the antenna and the material or substrate upon which the surface acoustic wave travels. In this manner, the advantages of a low thermal expansion coefficient material can be obtained while using the lithium niobate for its strong piezoelectric properties. Other useful materials such as LangasiteTm have properties that are intermediate between lithium niobate and quartz.

The use of SAW tags as an accurate precise positioning system as described above would be applicable for accurate vehicle location, as discussed in U.S. Pat. No. 6,370,475, for lanes in tunnels, for example, or other cases where loss of satellite lock, and thus the primary vehicle location system, is common.

The various technologies discussed above can be used in combination. The electronic RFID tag can be incorporated into a SAW tag providing a single device that provides both a quick reflection of the radio frequency waves as well as a re-transmission at a later time. This marriage of the two technologies permits the strengths of each technology to be exploited in the same device. For most of the applications described herein, the cost of mounting such a tag in a vehicle or on the roadway far exceeds the cost of the tag itself. Therefore, combining the two technologies does not significantly affect the cost of implementing tags onto vehicles or roadways or side highway structures.

A variation of this design is to use an RF circuit such as in an RFID to serve as an energy source. One design could be for the RFID to operate with directional antennas at a relatively high frequency such as 2.4 GHz. This can be primarily used to charge a capacitor to provide the energy for boosting the signal from the SAW sensor using circuitry such as a circulator discussed below. The SAW sensor can operate at a lower frequency, such as 400 MHz, permitting it to not interfere with the energy transfer to the RF circuit and also permit the signal to travel better to the receiver since it will be difficult to align the antenna at all times with the interrogator. Also, by monitoring the reception of the RF signal, the angular position of the tire can be determined and the SAW circuit designed so that it only transmits when the antennas are aligned or when the vehicle is stationary. Many other opportunities now present themselves with the RF circuit operating at a different frequency from the SAW circuit which will now be obvious to one skilled in the art.

An alternate method to the electronic RFID tag is to simply use a radar or lidar reflector and measure the time-of-flight to the reflector and back. The reflector can even be made of a series of reflecting surfaces displaced from each other to achieve some simple coding. It should be understood that RFID antennas can be similarly configured. An improvement would be to polarize the radiation and use a reflector that rotates the polarization angle allowing the reflector to be more easily found among other reflecting objects.

Another field in which SAW technology can be applied is for "ultrasound-on-a-surface" type of devices. U.S. Pat. No. 5,629,681, assigned to the current assignee herein and incorporated by reference herein, describes many uses of ultrasound in a tube. Many of the applications are also candidates for ultrasound-on-a-surface devices. In this case, a micromachined SAW device will in general be replaced by a much larger structure.

Figure 5:
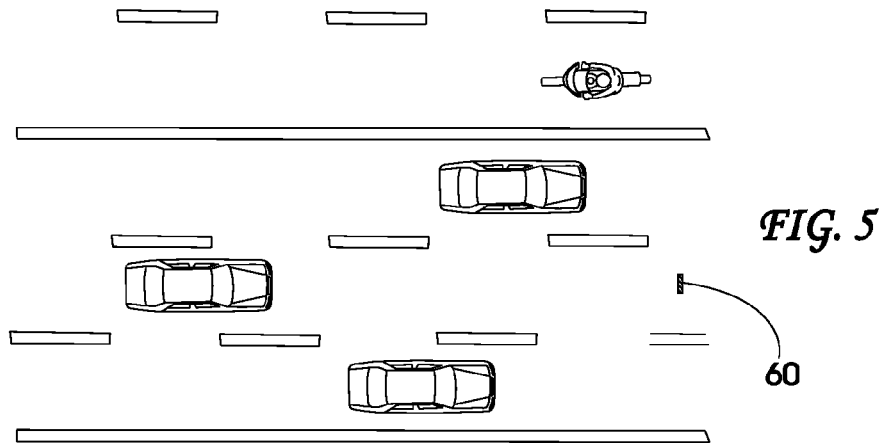
FIG. 5 is an overhead view of a roadway with vehicles and a SAW road temperature and humidity monitoring sensor.
Figure 5A:
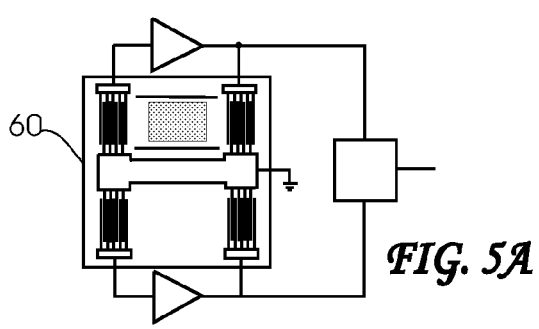
FIG. 5A is a detail drawing of the monitoring sensor of FIG. 5.

Based on the frequency and power available, and on FCC limitations, SAW or RFID or similar devices can be designed to permit transmission distances of many feet especially if minimal power is available. Since SAW and RFID devices can measure both temperature and humidity, they are also capable of monitoring road conditions in front of and around a vehicle. Thus, a properly equipped vehicle can determine the road conditions prior to entering a particular road section if such SAW devices are embedded in the road surface or on mounting structures close to the road surface as shown at 60 in FIG. 5. Such devices could provide advance warning of freezing conditions, for example. Although at 60 miles per hour such devices may only provide a one second warning if powered or if the FCC revises permitted power levels, this can be sufficient to provide information to a driver to prevent dangerous skidding. Additionally, since the actual temperature and humidity can be reported, the driver will be warned prior to freezing of the road surface. SAW device 60 is shown in detail in FIG. 5A. With vehicle-to-vehicle communication, the road conditions can be communicated as needed.

Figure 6:
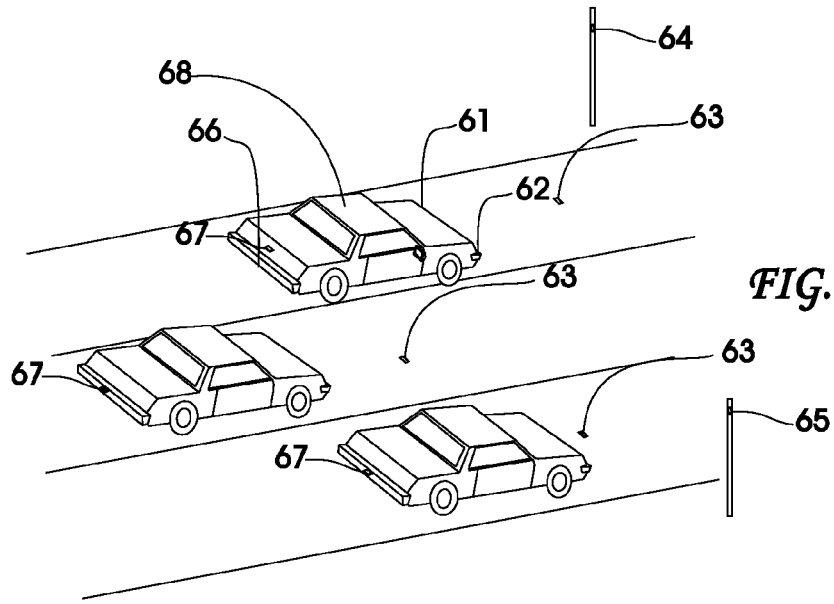
FIG. 6 is a perspective view of a SAW system for locating a vehicle on a roadway, and on the earth surface if accurate maps are available, and also illustrates the use of a SAW transponder in the license plate for the location of preceding vehicles and preventing rear end impacts.

If a SAW device 63 is placed in a roadway, as illustrated in FIG. 6, and if a vehicle 68 has two receiving antennas 61 and 62, an interrogator can transmit a signal from either of the two antennas and at a later time, the two antennas will receive the transmitted signal from the SAW device 63. By comparing the arrival time of the two received pulses, the position of vehicle 68 on a lane of the roadway can precisely calculated. If the SAW device 63 has an identification code encoded into the returned signal generated thereby, then a processor in the vehicle 68 can determine its position on the surface of the earth, provided a precise map is available such as by being stored in the processor's memory. If another antenna 66 is provided, for example, at the rear of the vehicle 68, then the longitudinal position of the vehicle 68 can also be accurately determined as the vehicle 68 passes the SAW device 63.

The SAW device 63 does not have to be in the center of the road. Alternate locations for positioning of the SAW device 63 are on overpasses above the road and on poles such as 64 and 65 on the roadside. For such cases, a source of power may be required. Such a system has an advantage over a competing system using radar and reflectors in that it is easier to measure the relative time between the two received pulses than it is to measure time-of-flight of a radar signal to a reflector and back. Such a system operates in all weather conditions and is known as a precise location system. Eventually, such a SAW device 63 can be placed every tenth of a mile along the roadway or at some other appropriate spacing. For the radar or laser radar reflection system, the reflectors can be active devices that provide environmental information in addition to location information to the interrogating vehicle.

If a vehicle is being guided by a DGPS and an accurate map system such as disclosed in U.S. Pat. No. 6,405,132 is used, a problem arises when the GPS receiver system looses satellite lock as would happen when the vehicle enters a tunnel, for example. If a precise location system as described above is placed at the exit of the tunnel, then the vehicle will know exactly where it is and can re-establish satellite lock in as little as one second rather than typically 15 seconds as might otherwise be required. Other methods making use of the cell phone system can be used to establish an approximate location of the vehicle suitable for rapid acquisition of satellite lock as described in G. M. Djuknic, R. E. Richton "Geolocation and Assisted GPS", Computer Magazine, February 2001, IEEE Computer Society, which is incorporated by reference herein in its entirety. An alternate location system is described in U.S. Pat. No. 6,480,788.

More particularly, geolocation technologies that rely exclusively on wireless networks such as time of arrival, time difference of arrival, angle of arrival, timing advance, and multipath fingerprinting, as is known to those skilled in the art, offer a shorter time-to-first-fix (TTFF) than GPS. They also offer quick deployment and continuous tracking capability for navigation applications, without the added complexity and cost of upgrading or replacing any existing GPS receiver in vehicles. Compared to either mobile-station-based, stand-alone GPS or network-based geolocation, assisted-GPS (AGPS) technology offers superior accuracy, availability and coverage at a reasonable cost. AGPS for use with vehicles can comprise a communications unit with a minimal capability GPS receiver arranged in the vehicle, an AGPS server with a reference GPS receiver that can simultaneously "see" the same satellites as the communications unit and a wireless network infrastructure consisting at least of base stations and a mobile switching center. The network can accurately predict the GPS signal the communication unit will receive and convey that information to the mobile unit such as a vehicle, greatly reducing search space size and shortening the TTFF from minutes to a second or less. In addition, an AGPS receiver in the communication unit can detect and demodulate weaker signals than those that conventional GPS receivers require. Because the network performs the location calculations, the communication unit only needs to contain a scaled-down GPS receiver. It is accurate within about 15 meters when they are outdoors, an order of magnitude more sensitive than conventional GPS. Of course with the additional of differential corrections and carrier phase corrections, the location accuracy can be improved to centimeters.

Since an AGPS server can obtain the vehicle's position from the mobile switching center, at least to the level of cell and sector, and at the same time monitor signals from GPS satellites seen by mobile stations, it can predict the signals received by the vehicle for any given time. Specifically, the server can predict the Doppler shift due to satellite motion of GPS signals received by the vehicle, as well as other signal parameters that are a function of the vehicle's location. In a typical sector, uncertainty in a satellite signal's predicted time of arrival at the vehicle is about ±5 µs. which corresponds to ±5 chips of the GPS coarse acquisition (C/A) code. Therefore, an AGPS server can predict the phase of the pseudorandom noise (PRN) sequence that the receiver should use to despread the C/A signal from a particular satellite (each GPS satellite transmits a unique PRN sequence used for range measurements) and communicate that prediction to the vehicle. The search space for the actual Doppler shift and PRN phase is thus greatly reduced, and the AGPS receiver can accomplish the task in a fraction of the time required by conventional GPS receivers. Further, the AGPS server maintains a connection with the vehicle receiver over the wireless link, so the requirement of asking the communication unit to make specific measurements, collect the results and communicate them back is easily met. After despreading and some additional signal processing, an AGPS receiver returns back "pseudoranges" (that is, ranges measured without taking into account the discrepancy between satellite and receiver clocks) to the AGPS server, which then calculates the vehicle's location. The vehicle can even complete the location fix itself without returnining any data to the server. Further discussion of cellular location-based systems can be found in Caffery, J. J. *Wireless Location in CDMA Cellular Radio Systems*, Kluwer Academic Publishers, 1999, ISBN: 0792377036.

Sensitivity assistance, also known as modulation wipe-off, provides another enhancement to detection of GPS signals in the vehicle's receiver. The sensitivity-assistance message contains predicted data bits of the GPS navigation message, which are expected to modulate the GPS signal of specific satellites at specified times. The mobile station receiver can therefore remove bit modulation in the received GPS signal prior to coherent integration. By extending coherent integration beyond the 20-ms GPS data-bit period (to a second or more when the receiver is stationary and to 400 ms when it is fast-moving) this approach improves receiver sensitivity. Sensitivity assistance provides an additional 3-to-4-dB improvement in receiver sensitivity. Because some of the gain provided by the basic assistance (code phases and Doppler shift values) is lost when integrating the GPS receiver chain into a mobile system, this can prove crucial to making a practical receiver.

Achieving optimal performance of sensitivity assistance in TIA/EIA-95 CDMA systems is relatively straightforward because base stations and mobiles synchronize with GPS time. Given that global system for mobile communication (GSM), time division multiple access (TDMA), or advanced mobile phone service (AMPS) systems do not maintain such stringent synchronization, implementation of sensitivity assistance and AGPS technology in general will require novel approaches to satisfy the timing requirement. The standardized solution for GSM and TDMA adds time calibration receivers in the field (location measurement units) that can monitor both the wireless-system timing and GPS signals used as a timing reference.

Many factors affect the accuracy of geolocation technologies, especially terrain variations such as hilly versus flat and environmental differences such as urban versus suburban versus rural. Other factors, like cell size and interference, have smaller but noticeable effects. Hybrid approaches that use multiple geolocation technologies appear to be the most robust solution to problems of accuracy and coverage.

AGPS provides a natural fit for hybrid solutions since it uses the wireless network to supply assistance data to GPS receivers in vehicles. This feature makes it easy to augment the assistance-data message with low-accuracy distances from receiver to base stations measured by the network equipment. Such hybrid solutions benefit from the high density of base stations in dense urban environments, which are hostile to GPS signals. Conversely, rural environments, where base stations are too scarce for network-based solutions to achieve high accuracy, provide ideal operating conditions for AGPS because GPS works well there.

From the above discussion, AGPS can be a significant part of the location determining system on a vehicle and can be used to augment other more accurate systems such as DGPS and a precise positioning system based on road markers or signature matching as discussed above and in patents assigned to Intelligent Technologies International.

SAW transponders can also be placed in the license plates 67 (FIG. 6) of all vehicles at nominal cost. An appropriately equipped automobile can then determine the angular location of vehicles in its vicinity. If a third antenna 66 is placed at the center of the vehicle front, then a more accurate indication of the distance to a license plate of a preceding vehicle can also be obtained as described above. Thus, once again, a single interrogator coupled with multiple antenna systems can be used for many functions. Alternately, if more than one SAW transponder is placed spaced apart on a vehicle and if two antennas are on the other vehicle, then the direction and position of the SAW-equipped vehicle can be determined by the receiving vehicle. The vehicle-mounted SAW or RFID device can also transmit information about the vehicle on which it is mounted such as the type of vehicle (car, van, SUV, truck, emergency vehicle etc.) as well as its weight and/or mass. One problem with many of the systems disclosed above results from the low power levels permitted by the FCC. Thus changes in FCC regulations may be required before some of them can be implemented in a powerless mode.

Figure 7:
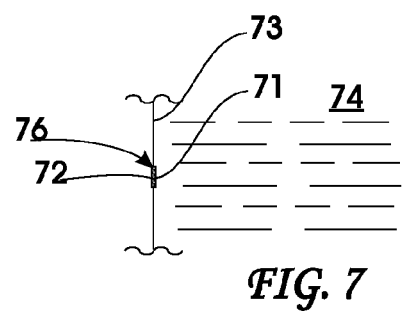
FIG. 7 is a partial cutaway view of a section of a fluid reservoir with a SAW fluid pressure and temperature sensor for monitoring oil, water, or other fluid pressure.

A general SAW temperature and pressure gage which can be wireless and powerless is shown generally at 70 located in the sidewall 73 of a fluid container 74 in FIG. 7. A pressure sensor 71 is located on the inside of the container 74, where it measures deflection of the container wall, and the fluid temperature sensor 72 on the outside. The temperature measuring SAW 70 can be covered with an insulating material to avoid the influence of the ambient temperature outside of the container 74.

A SAW load sensor can also be used to measure load in the vehicle suspension system powerless and wirelessly as shown in FIG. 8. FIG. 8A illustrates a strut 75 such as either of the rear struts of the vehicle of FIG. 8. A coil spring 80 stresses in torsion as the vehicle encounters disturbances from the road and this torsion can be measured using SAW strain gages as described in U.S. Pat. No. 5,585,571 for measuring the torque in shafts. This concept is also described in U.S. Pat. No. 5,714,695. The use of SAW strain gages to measure the torsional stresses in a spring, as shown in FIG. 8B, and in particular in an automobile suspension spring has, to the knowledge of the inventor, not been previously disclosed. In FIG. 8B, the strain measured by SAW strain gage 78 is subtracted from the strain measured by SAW strain gage 77 to get the temperature compensated strain in spring 76.

Since a portion of the dynamic load is also carried by the shock absorber, the SAW strain gages 77 and 78 will only measure the steady or average load on the vehicle. However, additional SAW strain gages 79 can be placed on a piston rod 81 of the shock absorber to obtain the dynamic load. These load measurements can then be used for active or passive vehicle damping or other stability control purposes. Knowing the dynamic load on the vehicle coupled with measuring the response of the vehicle or of the load of an occupant on a seat also permits a determination of the vehicle's inertial properties and, in the case of the seat weight sensor, of the mass of an occupant and the state of the seat belt (is it buckled and what load is it adding to the seat load sensors).

FIG. 9 illustrates a vehicle passenger compartment, and the engine compartment, with multiple SAW or RFID temperature sensors 85. SAW temperature sensors can be distributed throughout the passenger compartment, such as on the A-pillar, on the B-pillar, on the steering wheel, on the seat, on the ceiling, on the headliner, and on the windshield, rear and side windows and generally in the engine compartment. These sensors, which can be independently coded with different IDs and/or different delays, can provide an accurate measurement of the temperature distribution within the vehicle interior. RFID switches as discussed below can also be used to isolate one device from another. Such a system can be used to tailor the heating and air conditioning system based on the temperature at a particular location in the passenger compartment. If this system is augmented with occupant sensors, then the temperature can be controlled based on seat occupancy and the temperature at that location. If the occupant sensor system is based on ultrasonics, then the temperature measurement system can be used to correct the ultrasonic occupant sensor system for the speed of sound within the passenger compartment. Without such a correction, the error in the sensing system can be as large as about 20 percent.

In one implementation, SAW temperature and other sensors can be made from PVDF film and incorporated within the ultrasonic transducer assembly. For the 40 kHz ultrasonic transducer case, for example, the SAW temperature sensor would return the several pulses sent to drive the ultrasonic transducer to the control circuitry using the same wires used to transmit the pulses to the transducer after a delay that is proportional to the temperature within the transducer housing. Thus, a very economical device can add this temperature sensing function using much of the same hardware that is already present for the occupant sensing system. Since the frequency is low, PVDF could be fabricated into a very low cost temperature sensor for this purpose. Other piezoelectric materials can of course also be used.

Note, the use of PVDF as a piezoelectric material for wired and wireless SAW transducers or sensors is an important disclosure of at least one of the inventions disclosed herein. Such PVDF SAW devices can be used as chemical, biological, temperature, pressure and other SAW sensors as well as for switches. Such devices are very inexpensive to manufacture and are suitable for many vehicle-mounted devices as well as for other non-vehicle-mounted sensors. Disadvantages of PVDF stem from the lower piezoelectric constant (compared with lithium niobate) and the low acoustic wave velocity thus limiting the operating frequency. The key advantage is very low cost. When coupled with plastic electronics (plastic chips), it now becomes very economical to place sensors throughout the vehicle for monitoring a wide range of parameters such as temperature, pressure, chemical concentration etc. In particular implementations, an electronic nose based on SAW or RFID technology and neural networks can be implemented in either a wired or wireless manner for the monitoring of cargo containers or other vehicle interiors (or building interiors) for anti-terrorist or security purposes. See, for example, Reznik, A. M. "Associative Memories for Chemical Sensing", IEEE 2002 ICONIP, p. 2630-2634, vol. 5. In this manner, other sensors can be combined with the temperature sensors 85, or used separately, to measure carbon dioxide, carbon monoxide, alcohol, biological agents, radiation, humidity or other desired chemicals or agents as discussed above. Note, although the examples generally used herein are from the automotive industry, many of the devices disclosed herein can be advantageously used with other vehicles including trucks, boats, airplanes and shipping containers.

The SAW temperature sensors 85 provide the temperature at their mounting location to a processor unit 83 via an interrogator with the processor unit 83 including appropriate control algorithms for controlling the heating and air conditioning system based on the detected temperatures. The processor unit 83 can control, e.g., which vents in the vehicle are open and closed, the flow rate through vents and the temperature of air passing through the vents. In general, the processor unit 83 can control whatever adjustable components are present or form part of the heating and air conditioning system.

In FIG. 9 a child seat 84 is illustrated on the rear vehicle seat. The child seat 84 can be fabricated with one or more RFID tags or SAW tags (not shown). The RFID and SAW tag(s) can be constructed to provide information on the occupancy of the child seat, i.e., whether a child is present, based on the weight, temperature, and/or any other measurable parameter. Also, the mere transmission of waves from the RFID or SAW tag(s) on the child seat 84 would be indicative of the presence of a child seat. The RFID and SAW tag(s) can also be constructed to provide information about the orientation of the child seat 84, i.e., whether it is facing rearward or forward. Such information about the presence and occupancy of the child seat and its orientation can be used in the control of vehicular systems, such as the vehicle airbag system or heating or air conditioning system, especially useful when a child is left in a vehicle. In this case, a processor would control the airbag or HVAC system and would receive information from the RFID and SAW tag(s) via an interrogator.

There are many applications for which knowledge of the pitch and/or roll orientation of a vehicle or other object is desired. An accurate tilt sensor can be constructed using SAW devices. Such a sensor is illustrated in FIG. 10A and designated 86. This sensor 86 can utilize a substantially planar and rectangular mass 87 and four supporting SAW devices 88 which are sensitive to gravity. For example, the mass 87 acts to deflect a membrane on which the SAW device 88 resides thereby straining the SAW device 88. Other properties can also be used for a tilt sensor such as the direction of the earth's magnetic field. SAW devices 88 are shown arranged at the corners of the planar mass 87, but it must be understood that this arrangement is an exemplary embodiment only and not intended to limit the invention. A fifth SAW device 89 can be provided to measure temperature. By comparing the outputs of the four SAW devices 88, the pitch and roll of the automobile can be measured. This sensor 86 can be used to correct errors in the SAW rate gyros described above. If the vehicle has been stationary for a period of time, the yaw SAW rate gyro can initialized to 0 and the pitch and roll SAW gyros initialized to a value determined by the tilt sensor of FIG. 10A. Many other geometries of tilt sensors utilizing one or more SAW devices can now be envisioned for automotive and other applications.

In particular, an alternate preferred configuration is illustrated in FIG. 10B where a triangular geometry is used. In this embodiment, the planar mass is triangular and the SAW devices 88 are arranged at the corners, although as with FIG. 10A, this is a non-limiting, preferred embodiment.

Figures 11, 12:
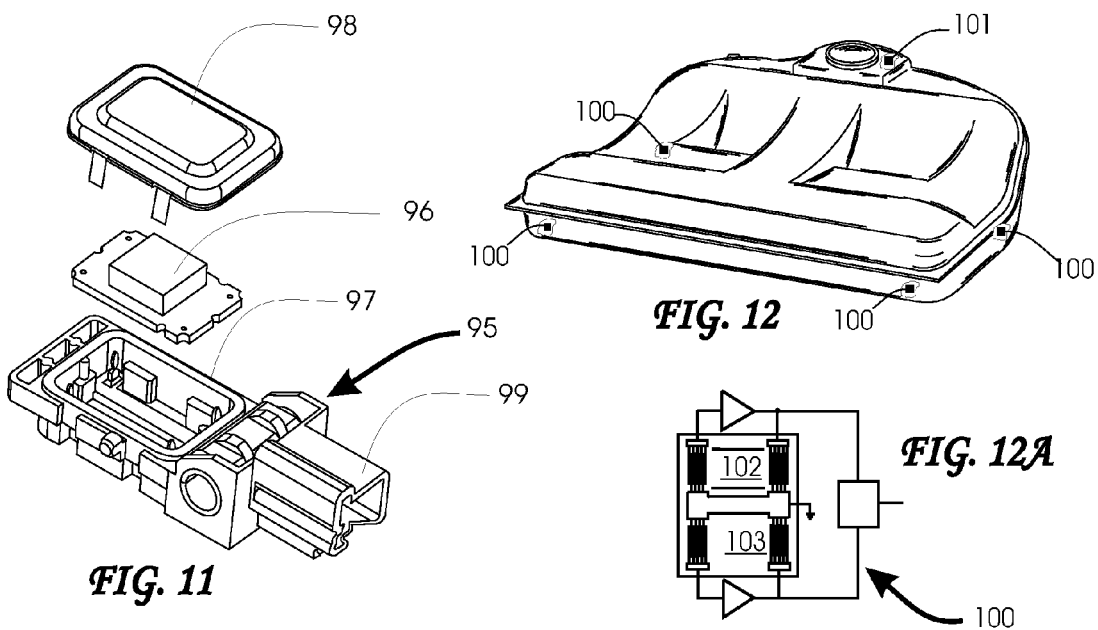
FIG. 11 is a perspective exploded view of a SAW crash sensor for sensing frontal, side or rear crashes.
FIG. 12 is a perspective view with portions cutaway of a SAW based vehicle gas gage.

Either of the SAW accelerometers described above can be utilized for crash sensors as shown in FIG. 11. These accelerometers have a substantially higher dynamic range than competing accelerometers now used for crash sensors such as those based on MEMS silicon springs and masses and others based on MEMS capacitive sensing. As discussed above, this is partially a result of the use of frequency or phase shifts which can be measured over a very wide range. Additionally, many conventional accelerometers that are designed for low acceleration ranges are unable to withstand high acceleration shocks without breaking. This places practical limitations on many accelerometer designs so that the stresses in the silicon are not excessive. Also for capacitive accelerometers, there is a narrow limit over which distance, and thus acceleration, can be measured.

The SAW accelerometer for this particular crash sensor design is housed in a container 96 which is assembled into a housing 97 and covered with a cover 98. This particular implementation shows a connector 99 indicating that this sensor would require power and the response would be provided through wires. Alternately, as discussed for other devices above, the connector 99 can be eliminated and the information and power to operate the device transmitted wirelessly. Also, power can be supplied thorough a connector and stored in a capacitor while the information is transmitted wirelessly thus protecting the system from a wire failure during a crash when the sensor is mounted in the crush zone. Such sensors can be used as frontal, side or rear impact sensors. They can be used in the crush zone, in the passenger compartment or any other appropriate vehicle location. If two such sensors are separated and have appropriate sensitive axes, then the angular acceleration of the vehicle can also be determined. Thus, for example, forward-facing accelerometers mounted in the vehicle side doors can be used to measure the yaw acceleration of the vehicle. Alternately, two vertical sensitive axis accelerometers in the side doors can be used to measure the roll acceleration of vehicle, which would be useful for rollover sensing.

Figure 12A:
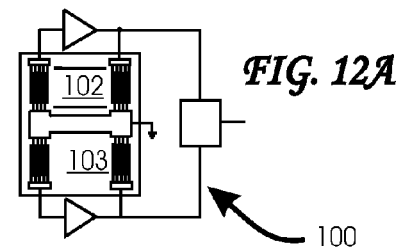
FIG. 12A is a top detailed view of a SAW pressure and temperature monitor for use in the system of FIG. 12.

U.S. Pat. No. 6,615,656, assigned to the current assignee of this invention, and the description below, provides multiple apparatus for determining the amount of liquid in a tank. Using the SAW pressure devices of this invention, multiple pressure sensors can be placed at appropriate locations within a fuel tank to measure the fluid pressure and thereby determine the quantity of fuel remaining in the tank. This can be done both statically and dynamically. This is illustrated in FIG. 12. In this example, four SAW pressure transducers 100 are placed on the bottom of the fuel tank and one SAW pressure transducer 101 is placed at the top of the fuel tank to eliminate the effects of vapor pressure within tank. Using neural networks, or other pattern recognition techniques, the quantity of fuel in the tank can be accurately determined from these pressure readings in a manner similar to that described the '656 patent and below. The SAW measuring device illustrated in FIG. 12A combines temperature and pressure measurements in a single unit using parallel paths 102 and 103 in the same manner as described above.

Figure 13A:
FIG. 13A is a schematic of a prior art deployment scheme for an airbag module.
Figure 13B:
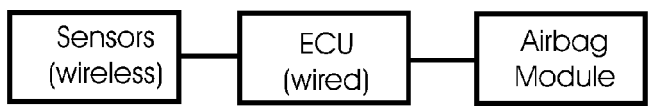
FIG. 13B is a schematic of a deployment scheme for an airbag module in accordance with the invention.

FIG. 13A shows a schematic of a prior art airbag module deployment scheme in which sensors, which detect data for use in determining whether to deploy an airbag in the airbag module, are wired to an electronic control unit (ECU) and a command to initiate deployment of the airbag in the airbag module is sent wirelessly. By contrast, as shown in FIG. 13B, in accordance with an invention herein, the sensors are wirelessly connected to the electronic control unit and thus transmit data wirelessly. The ECU is however wired to the airbag module. The ECU could also be connected wirelessly to the airbag module. Alternately, a safety bus can be used in place of the wireless connection.

SAW sensors also have applicability to various other sectors of the vehicle, including the powertrain, chassis, and occupant comfort and convenience. For example, SAW and RFID sensors have applicability to sensors for the powertrain area including oxygen sensors, gear-tooth Hall effect sensors, variable reluctance sensors, digital speed and position sensors, oil condition sensors, rotary position sensors, low pressure sensors, manifold absolute pressure/manifold air temperature (MAP/MAT) sensors, medium pressure sensors, turbo pressure sensors, knock sensors, coolant/fluid temperature sensors, and transmission temperature sensors.

SAW sensors for chassis applications include gear-tooth Hall effect sensors, variable reluctance sensors, digital speed and position sensors, rotary position sensors, non-contact steering position sensors, and digital ABS (anti-lock braking system) sensors. In one implementation, a Hall Effect tire pressure monitor comprises a magnet that rotates with a vehicle wheel and is sensed by a Hall Effect device which is attached to a SAW or RFID device that is wirelessly interrogated. This arrangement eliminates the need to run a wire into each wheel well.

SAW sensors for the occupant comfort and convenience field include low tire pressure sensors, HVAC temperature and humidity sensors, air temperature sensors, and oil condition sensors.

SAW sensors also have applicability such areas as controlling evaporative emissions, transmission shifting, mass air flow meters, oxygen, NOx and hydrocarbon sensors. SAW based sensors are particularly useful in high temperature environments where many other technologies fail.

SAW sensors can facilitate compliance with U.S. regulations concerning evaporative system monitoring in vehicles, through a SAW fuel vapor pressure and temperature sensors that measure fuel vapor pressure within the fuel tank as well as temperature. If vapors leak into the atmosphere, the pressure within the tank drops. The sensor notifies the system of a fuel vapor leak, resulting in a warning signal to the driver and/or notification to a repair facility, vehicle manufacturer and/or compliance monitoring facility. This application is particularly important since the condition within the fuel tank can be ascertained wirelessly reducing the chance of a fuel fire in an accident. The same interrogator that monitors the tire pressure SAW sensors can also monitor the fuel vapor pressure and temperature sensors resulting in significant economies.

A SAW humidity sensor can be used for measuring the relative humidity and the resulting information can be input to the engine management system or the heating, ventilation and air conditioning (HVAC) system for more efficient operation. The relative humidity of the air entering an automotive engine impacts the engine's combustion efficiency; i.e., the ability of the spark plugs to ignite the fuel/air mixture in the combustion chamber at the proper time. A SAW humidity sensor in this case can measure the humidity level of the incoming engine air, helping to calculate a more precise fuel/air ratio for improved fuel economy and reduced emissions.

Dew point conditions are reached when the air is fully saturated with water. When the cabin dew point temperature matches the windshield glass temperature, water from the air condenses quickly, creating frost or fog. A SAW humidity sensor with a temperature-sensing element and a window glass-temperature-sensing element can prevent the formation of visible fog formation by automatically controlling the HVAC system.

Figure 14:
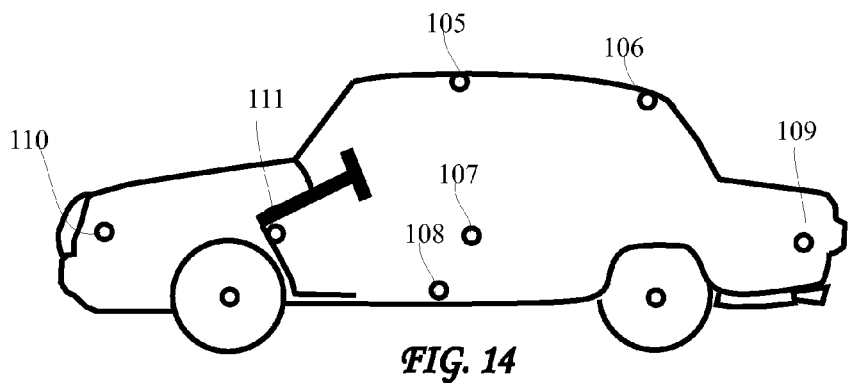
FIG. 14 is a schematic of a vehicle with several accelerometers and/or gyroscopes at preferred locations in the vehicle.

FIG. 14 illustrates the placement of a variety of sensors, primarily accelerometers and/or gyroscopes, which can be used to diagnose the state of the vehicle itself. Sensor 105 can be located in the headliner or attached to the vehicle roof above the side door. Typically, there can be two such sensors one on either side of the vehicle. Sensor 106 is shown in a typical mounting location midway between the sides of the vehicle attached to or near the vehicle roof above the rear window. Sensor 109 is shown in a typical mounting location in the vehicle trunk adjacent the rear of the vehicle. One, two or three such sensors can be used depending on the application. If three such sensors are used, preferably one would be adjacent each side of vehicle and one in the center. Sensor 107 is shown in a typical mounting location in the vehicle door and sensor 108 is shown in a typical mounting location on the sill or floor below the door. Sensor 110, which can be also multiple sensors, is shown in a typical mounting location forward in the crush zone of the vehicle. Finally, sensor 111 can measure the acceleration of the firewall or instrument panel and is located thereon generally midway between the two sides of the vehicle. If three such sensors are used, one would be adjacent each vehicle side and one in the center. An IMU would serve basically the same functions.

In general, sensors 105-111 provide a measurement of the state of the vehicle, such as its velocity, acceleration, angular orientation or temperature, or a state of the location at which the sensor is mounted. Thus, measurements related to the state of the sensor would include measurements of the acceleration of the sensor, measurements of the temperature of the mounting location as well as changes in the state of the sensor and rates of changes of the state of the sensor. As such, any described use or function of the sensors 105-111 above is merely exemplary and is not intended to limit the form of the sensor or its function. Thus, these sensors may or may not be SAW or RFID sensors and may be powered or unpowered and may transmit their information through a wire harness, a safety or other bus or wirelessly.

Each of the sensors 105-111 may be single axis, double axis or triaxial accelerometers and/or gyroscopes typically of the MEMS type. One or more can be IMUs. These sensors 105-111 can either be wired to the central control module or processor directly wherein they would receive power and transmit information, or they could be connected onto the vehicle bus or, in some cases, using RFID, SAW or similar technology, the sensors can be wireless and would receive their power through RF from one or more interrogators located in the vehicle. In this case, the interrogators can be connected either to the vehicle bus or directly to control module. Alternately, an inductive or capacitive power and/or information transfer system can be used.

One particular implementation will now be described. In this case, each of the sensors 105-111 is a single or dual axis accelerometer. They are made using silicon micromachined technology such as described in U.S. Pat. No. 5,121,180 and U.S. Pat. No. 5,894,090. These are only representative patents of these devices and there exist more than 100 other relevant U.S. patents describing this technology. Commercially available MEMS gyroscopes such as from Systron Doner have accuracies of approximately one degree per second. In contrast, optical gyroscopes typically have accuracies of approximately one degree per hour. Unfortunately, the optical gyroscopes are believed to be expensive for automotive applications. However new developments by the current assignee are reducing this cost and such gyroscopes are likely to become cost effective in a few years. On the other hand, typical MEMS gyroscopes are not sufficiently accurate for many control applications unless corrected using location technology such as precise positioning or GPS-based systems as described elsewhere herein.

The angular rate function can be obtained by placing accelerometers at two separated, non-co-located points in a vehicle and using the differential acceleration to obtain an indication of angular motion and angular acceleration. From the variety of accelerometers shown in FIG. 14, it can be appreciated that not only will all accelerations of key parts of the vehicle be determined, but the pitch, yaw and roll angular rates can also be determined based on the accuracy of the accelerometers. By this method, low cost systems can be developed which, although not as accurate as the optical gyroscopes, are considerably more accurate than uncorrected conventional MEMS gyroscopes. Alternately, it has been found that from a single package containing up to three low cost MEMS gyroscopes and three low cost MEMS accelerometers, when carefully calibrated, an accurate inertial measurement unit (IMU) can be constructed that performs as well as units costing a great deal more. Such a package is sold by Crossbow Technology, Inc. 41 Daggett Dr., San Jose, Calif. 95134. If this IMU is combined with a GPS system and sometimes other vehicle sensor inputs using a Kalman filter, accuracy approaching that of expensive military units can be achieved. A preferred IMU that uses a single device to sense both accelerations in three directions and angular rates about three axis is described in U.S. Pat. No. 4,711,125. Although this device has been available for many years, it has not been applied to vehicle sensing and in particular automobile vehicle sensing for location and navigational purposes.

Instead of using two accelerometers at separate locations on the vehicle, a single conformal MEMS-IDT gyroscope may be used. Such a conformal MEMS-IDT gyroscope is described in a paper by V. K. Varadan, "Conformal MEMS-IDT Gyroscopes and Their Comparison With Fiber Optic Gyro", Proceedings of SPIE Vol. 3990 (2000). The MEMS-IDT gyroscope is based on the principle of surface acoustic wave (SAW) standing waves on a piezoelectric substrate. A surface acoustic wave resonator is used to create standing waves inside a cavity and the particles at the anti-nodes of the standing waves experience large amplitude of vibrations, which serves as the reference vibrating motion for the gyroscope. Arrays of metallic dots are positioned at the anti-node locations so that the effect of Coriolis force due to rotation will acoustically amplify the magnitude of the waves. Unlike other MEMS gyroscopes, the MEMS-IDT gyroscope has a planar configuration with no suspended resonating mechanical structures. Other SAW-based gyroscopes are also now under development.

The system of FIG. 14 using dual axis accelerometers, or the IMU Kalman filter system, therefore provides a complete diagnostic system of the vehicle itself and its dynamic motion. Such a system is far more accurate than any system currently available in the automotive market. This system provides very accurate crash discrimination since the exact location of the crash can be determined and, coupled with knowledge of the force deflection characteristics of the vehicle at the accident impact site, an accurate determination of the crash severity and thus the need for occupant restraint deployment can be made. Similarly, the tendency of a vehicle to rollover can be predicted in advance and signals sent to the vehicle steering, braking and throttle systems to attempt to ameliorate the rollover situation or prevent it. In the event that it cannot be prevented, the deployment side curtain airbags can be initiated in a timely manner. Additionally, the tendency of the vehicle to the slide or skid can be considerably more accurately determined and again the steering, braking and throttle systems commanded to minimize the unstable vehicle behavior. Thus, through the deployment of inexpensive accelerometers at a variety of locations in the vehicle, or the IMU Kalman filter system, significant improvements are made in vehicle stability control, crash sensing, rollover sensing and resulting occupant protection technologies.

As mentioned above, the combination of the outputs from these accelerometer sensors and the output of strain gage weight sensors in a vehicle seat, or in or on a support structure of the seat, can be used to make an accurate assessment of the occupancy of the seat and differentiate between animate and inanimate occupants as well as determining where in the seat the occupants are sitting. This can be done by observing the acceleration signals from the sensors of FIG. 14 and simultaneously the dynamic strain gage measurements from seat-mounted strain gages. The accelerometers provide the input function to the seat and the strain gages measure the reaction of the occupying item to the vehicle acceleration and thereby provide a method of determining dynamically the mass of the occupying item and its location. This is particularly important during occupant position sensing during a crash event. By combining the outputs of the accelerometers and the strain gages and appropriately processing the same, the mass and weight of an object occupying the seat can be determined as well as the gross motion of such an object so that an assessment can be made as to whether the object is a life form such as a human being.

For this embodiment, a sensor, not shown, that can be one or more strain gage weight sensors, is mounted on the seat or in connection with the seat or its support structure. Suitable mounting locations and forms of weight sensors are discussed in the current assignee's U.S. Pat. No. 6,242,701 and contemplated for use in the inventions disclosed herein as well. The mass or weight of the occupying item of the seat can thus be measured based on the dynamic measurement of the strain gages with optional consideration of the measurements of accelerometers on the vehicle, which are represented by any of sensors 105-111.

A SAW Pressure Sensor can also be used with bladder weight sensors permitting that device to be interrogated wirelessly and without the need to supply power. Similarly, a SAW device can be used as a general switch in a vehicle and in particular as a seatbelt buckle switch indicative of seatbelt use. SAW devices can also be used to measure seatbelt tension or the acceleration of the seatbelt adjacent to the chest or other part of the occupant and used to control the occupant's acceleration during a crash. Such systems can be boosted as disclosed herein or not as required by the application. These inventions are disclosed in patents and patent applications of the current assignee.

The operating frequency of SAW devices has hereto for been limited to less that about 500 MHz due to problems in lithography resolution, which of course is constantly improving and currently SAW devices based on lithium niobate are available that operate at 2.4 GHz. This lithography problem is related to the speed of sound in the SAW material. Diamond has the highest speed of sound and thus would be an ideal SAW material. However, diamond is not piezoelectric. This problem can be solved partially by using a combination or laminate of diamond and a piezoelectric material. Recent advances in the manufacture of diamond films that can be combined with a piezoelectric material such as lithium niobate promise to permit higher frequencies to be used since the spacing between the inter-digital transducer (IDT) fingers can be increased for a given frequency. A particularly attractive frequency is 2.4 GHz or Wi-Fi as the potential exists for the use of more sophisticated antennas such as the Yagi antenna or the Motia smart antenna that have more gain and directionality. In a different development, SAW devices have been demonstrated that operate in the tens of GHz range using a novel stacking method to achieve the close spacing of the IDTs.

Figure 15A:
FIG. 15A illustrates a driver with a timed RFID standing with groceries by a closed trunk.
Figure 15B:
FIG. 15B illustrates the driver with the timed RFID 5 seconds after the trunk has been opened.

In a related invention, the driver can be provided with a keyless entry device, other RFID tag, smart card or cell phone with an RF transponder that can be powerless in the form of an RFID or similar device, which can also be boosted as described herein. The interrogator determines the proximity of the driver to the vehicle door or other similar object such as a building or house door or vehicle trunk. As shown in FIG. 15A, if a driver 118 remains within 1 meter, for example, from the door or trunk lid 116, for example, for a time period such as 5 seconds, then the door or trunk lid 116 can automatically unlock and ever open in some implementations. Thus, as the driver 118 approaches the trunk with his or her arms filled with packages 117 and pauses, the trunk can automatically open (see FIG. 15B). Such a system would be especially valuable for older people. Naturally, this system can also be used for other systems in addition to vehicle doors and trunk lids.

Figure 15C:
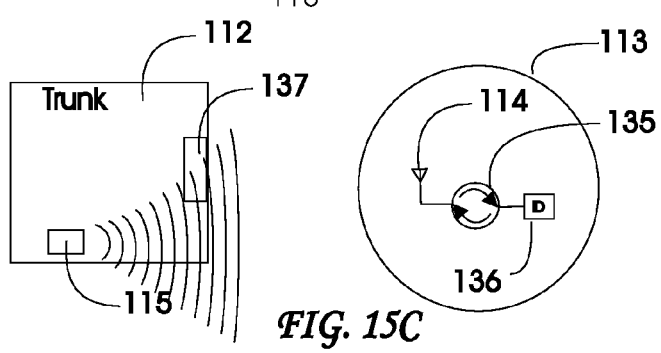
FIG. 15C illustrates a trunk opening arrangement for a vehicle in accordance with the invention.
Figure 16B:
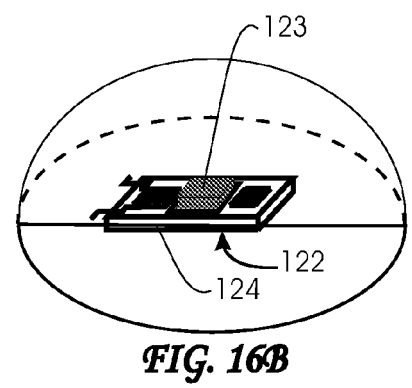
FIG. 16B is a detailed perspective view of the device of FIG. 16A with the force-transmitting member rendered transparent.
Figure 16A:
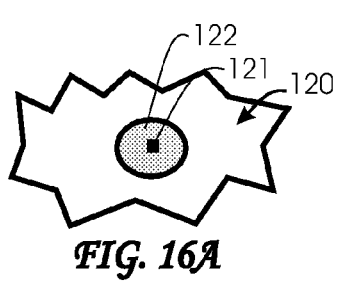
FIG. 16A is a view of a view of a SAW switch sensor for mounting on or within a surface such as a vehicle armrest.

As shown in FIG. 15C, an interrogator 115 is placed on the vehicle, e.g., in the trunk 112 as shown, and transmits waves. When the keyless entry device 113, which contains an antenna 114 and a circuit including a circulator 135 and a memory containing a unique ID code 136, is a set distance from the interrogator 115 for a certain duration of time, the interrogator 115 directs a trunk opening device 137 to open the trunk lid 116 A SAW device can also be used as a wireless switch as shown in FIGS. 16A and 16B. FIG. 16A illustrates a surface 120 containing a projection 122 on top of a SAW device 121. Surface material 120 could be, for example, the armrest of an automobile, the steering wheel airbag cover, or any other surface within the passenger compartment of an automobile or elsewhere. Projection 122 will typically be a material capable of transmitting force to the surface of SAW device 121. As shown in FIG. 20B, a projection 123 may be placed on top of the SAW device 124. This projection 123 permits force exerted on the projection 122 to create a pressure on the SAW device 124. This increased pressure changes the time delay or natural frequency of the SAW wave traveling on the surface of material. Alternately, it can affect the magnitude of the returned signal. The projection 123 is typically held slightly out of contact with the surface until forced into contact with it.

Figure 16C:
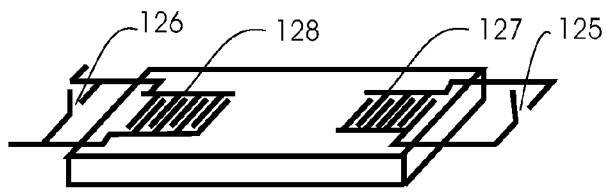
FIG. 16C is a detailed perspective view of an alternate SAW device for use in FIGS. 16A and 16B showing the use of one of two possible switches, one that activates the SAW and the other that suppresses the SAW.

An alternate approach is to place a switch across the IDT 127 as shown in FIG. 16C. If switch 125 is open, then the device will not return a signal to the interrogator. If it is closed, than the IDT 127 will act as a reflector sending a signal back to IDT 128 and thus to the interrogator. Alternately, a switch 126 can be placed across the SAW device. In this case, a switch closure shorts the SAW device and no signal is returned to the interrogator. For the embodiment of FIG. 16C, using switch 126 instead of switch 125, a standard reflector IDT would be used in place of the IDT 127.

Figure 16D:
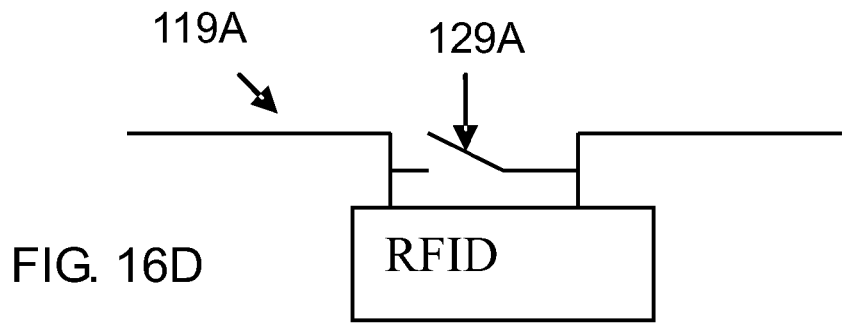
FIG. 16D is a schematic of a RFID controlled by a switch.

FIG. 16D shows an embodiment wherein a radio-frequency identification device (RFID) is controlled by a switch 129A, and may be one of the wireless transmission components of a switch assembly. The switch 129A may be a conventional, mechanical switch such as a push button, toggle and the like. A switch assembly would therefore comprise the RFID, the switch 129A and an antenna 119A which may constitute another a wireless transmission component. In this case, when the user presses on an exposed surface of the passenger compartment, he or she would close the switch 129A and thereby short the RFID so that it would be inoperative. That is, the RFID would not respond when interrogated. Instead of a switch, a variable impedance could also be provided which would modify the output of the RFID based on the magnitude of pressure to the exposed surface. Instead of using the switch or variable impedance, another control mechanism for causing variation in the transmission by the wireless transmission components of the switch assembly can be provided. In this embodiment, as well as the other embodiments herein wherein an RFID is provided, the RFID can be either a passive RFID or an active RFID. In the latter case, the RFID is supplied with power from a power source on the vehicle, such as the vehicle's battery, a local battery, photo cell, or a local energy generator or harvester.

Figure 16E:
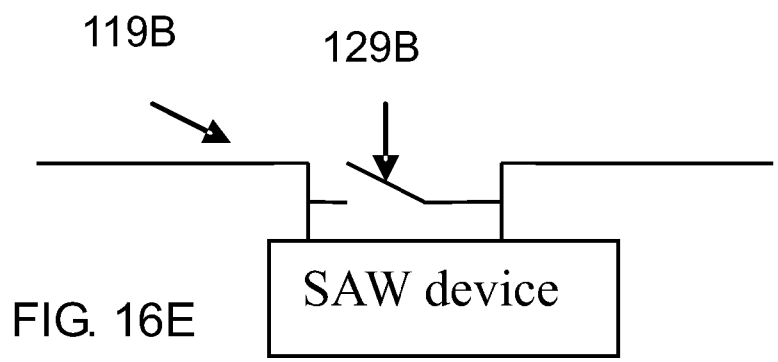
FIG. 16E is a schematic of a SAW device controlled by a switch.

FIG. 16E shows an embodiment wherein a surface-acoustic-wave (SAW) device is controlled by a switch 129B, and may be one of the wireless transmission components of a switch assembly. The switch 129B may be a conventional, mechanical switch such as a push button, toggle and the like. A switch assembly would therefore comprise the SAW device, the switch 129B and an antenna 119B which may constitute another a wireless transmission component. In this case, when the user presses on an exposed surface of the passenger compartment, he or she would close the switch 129B and thereby prevent the SAW device from receiving a signal so that it would be inoperative. Instead of a switch, a variable impedance could also be provided which would modify the output of the SAW device based on the magnitude of pressure to the exposed surface. Instead of using the switch or variable impedance, another control mechanism for causing variation in the transmission by the wireless transmission components of the switch assembly can be provided. In this embodiment, as well as the other embodiments herein wherein a SAW device is provided, the SAW device can be either a passive SAW device or an active SAW device. In the latter case, the SAW device is supplied with power from a power source on the vehicle, such as the vehicle's battery, a local battery or a local energy generator or harvester.

A variable impedance is used as the control mechanism for situations when variations in the operation of a vehicular component are desired. For example, if a light is capable of being dimmed, then the variable impedance would be useful to control the dimming of the light. It is also useful to control adjustment of the volume of a sound system in the vehicle, as well as other analogue functions.

Figure 16F:
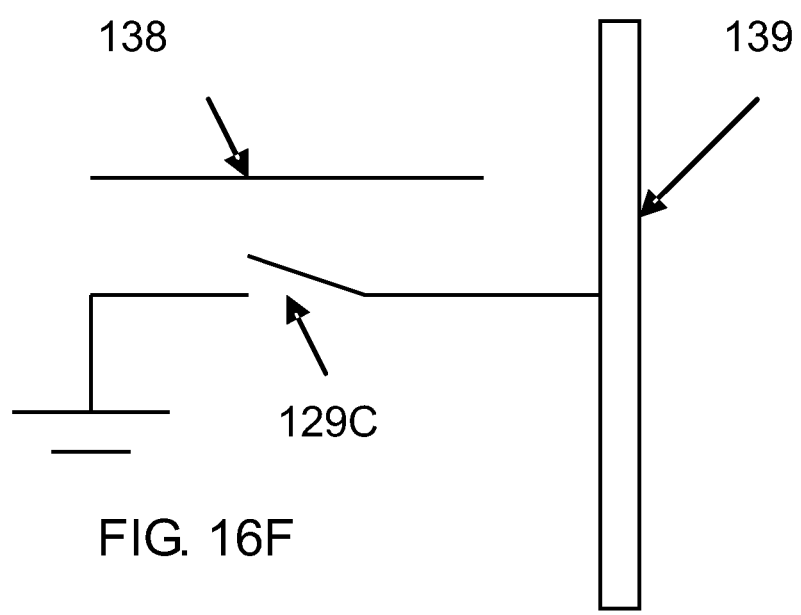
FIG. 16F is a schematic of a backscatter antenna which is controlled by a switch.

Referring now to FIG. 16F, another embodiment of the invention using a control mechanism, i.e., a switch or variable impedance, is an antenna 139 capable of reflecting an interrogating signal, and even which slightly modifies the interrogating signal (reflection from such an antenna being termed backscatter). The modification to the interrogating signal can be correlated to the desired manner for controlling the vehicular component. In this case, a lead is connected to an intermediate location on the antenna 139, e.g., the middle of the antenna 139, and a switch or variable impedance (a switch 129C is shown) is placed between the lead and ground. In the embodiment having a switch 129C, when the switch 129C is open, the antenna 139 will reflect at a particular frequency based on its length (for a simple dipole antenna). When the switch 129C is closed by the application of pressure to the exposed surface 138 of the passenger compartment, the antenna 139 will short and thereby effectively reduce the length of the antenna 139 and alter the resonant frequency of the antenna 139. A lead placed at the middle of the antenna 139 would, when connected to a closed switch 129C leading to ground, cause the resonant frequency to approximately double. In the embodiment having a variable impedance, the antenna would be provided with a variable effect depending on the pressure exerted on the exposed surface or otherwise controlling the variable impedance.

Most SAW-based accelerometers work on the principle of straining the SAW surface and thereby changing either the time delay or natural frequency of the system. An alternate novel accelerometer is illustrated FIG. 17A wherein a mass 130 is attached to a silicone rubber coating 131 which has been applied the SAW device. Acceleration of the mass in FIG. 17A in the direction of arrow X changes the amount of rubber in contact with the surface of the SAW device and thereby changes the damping, natural frequency or the time delay of the device. By this method, accurate measurements of acceleration below 1 G are readily obtained. Furthermore, this device can withstand high deceleration shocks without damage. FIG. 17B illustrates a more conventional approach where the strain in a beam 132 caused by the acceleration acting on a mass 133 is measured with a SAW strain sensor 134.

It is important to note that all of these devices have a high dynamic range compared with most competitive technologies. In some cases, this dynamic range can exceed 100,000 and up to 1,000,000 has been reported. This is the direct result of the ease with which frequency and phase can be accurately measured.

A gyroscope, which is suitable for automotive applications, is illustrated in FIG. 18 and described in detail in Varadan U.S. Pat. No. 6,516,665. This SAW-based gyroscope has applicability for the vehicle navigation, dynamic control, and rollover sensing among others.

Note that any of the disclosed applications can be interrogated by the central interrogator of this invention and can either be powered or operated powerlessly as described in general above. Block diagrams of three interrogators suitable for use in this invention are illustrated in FIGS. 19A-19C. FIG. 19A illustrates a super heterodyne circuit and FIG. 19B illustrates a dual super heterodyne circuit. FIG. 19C operates as follows. During the burst time two frequencies, F1 and F1+F2, are sent by the transmitter after being generated by mixing using oscillator Osc. The two frequencies are needed by the SAW transducer where they are mixed yielding F2 which is modulated by the SAW and contains the information. Frequency (F1+F2) is sent only during the burst time while frequency F1 remains on until the signal F2 returns from the SAW. This signal is used for mixing. The signal returned from the SAW transducer to the interrogator is F1+F2 where F2 has been modulated by the SAW transducer. It is expected that the mixing operations will result in about 12 db loss in signal strength.

As discussed, theoretically a SAW can be used for any sensing function provided the surface across which the acoustic wave travels can be modified in terms of its length, mass, elastic properties or any property that affects the travel distance, speed, amplitude or damping of the surface wave. Thus, gases and vapors can be sensed through the placement of a layer on the SAW that absorbs the gas or vapor, for example (a chemical sensor or electronic nose). Similarly, a radiation sensor can result through the placement of a radiation sensitive coating on the surface of the SAW.

Normally, a SAW device is interrogated with a constant amplitude and frequency RF pulse. This need not be the case and a modulated pulse can also be used. If for example a pseudorandom or code modulation is used, then a SAW interrogator can distinguish its communication from that of another vehicle that may be in the vicinity. This doesn't totally solve the problem of interrogating a tire that is on an adjacent vehicle but it does solve the problem of the interrogator being confused by the transmission from another interrogator. This confusion can also be partially solved if the interrogator only listens for a return signal based on when it expects that signal to be present based on when it sent the signal. That expectation can be based on the physical location of the tire relative to the interrogator which is unlikely to come from a tire on an adjacent vehicle which only momentarily could be at an appropriate distance from the interrogator. The interrogator would of course need to have correlation software in order to be able to differentiate the relevant signals. The correlation technique also permits the interrogator to separate the desired signals from noise thereby improving the sensitivity of the correlator. An alternate approach as discussed elsewhere herein is to combine a SAW sensor with an RFID switch where the switch is programmed to open or close based on the receipt of the proper identification code.

As discussed elsewhere herein, the particular tire that is sending a signal can be determined if multiple antennas, such as three, each receive the signal. For a 500 MHz signal, for example, the wave length is about 60 cm. If the distance from a tire transmitter to each of three antennas is on the order of one meter, then the relative distance from each antenna to the transmitter can be determined to within a few centimeters and thus the location of the transmitter can be found by triangulation. If that location is not a possible location for a tire transmitter, then the data can be ignored thus solving the problem of a transmitter from an adjacent vehicle being read by the wrong vehicle interrogator. This will be discussed in more detail below with regard to solving the problem of a truck having 18 tires that all need to be monitored. Note also, each antenna can have associated with it some simple circuitry that permits it to receive a signal, amplify it, change its frequency and retransmit it either through a wire of through the air to the interrogator thus eliminating the need for long and expensive coax cables.

U.S. Pat. No. 6,622,567 describes a peak strain RFID technology based device with the novelty being the use of a mechanical device that records the peak strain experienced by the device. Like the system of the invention herein, the system does not require a battery and receives its power from the RFID circuit. The invention described herein includes the use of RFID based sensors either in the peak strain mode or in the preferred continuous strain mode. This invention is not limited to measuring strain as SAW and RFID based sensors can be used for measuring many other parameters including chemical vapor concentration, temperature, acceleration, angular velocity etc.

A key aspect of at least one of the inventions disclosed herein is the use of an interrogator to wirelessly interrogate multiple sensing devices thereby reducing the cost of the system since such sensors are in general inexpensive compared to the interrogator. The sensing devices are preferably based of SAW and/or RFID technologies although other technologies are applicable.

1.3.1 Antenna Considerations

Antennas are a very important aspect to SAW and RFID wireless devices such as can be used in tire monitors, seat monitors, weight sensors, child seat monitors, fluid level sensors and similar devices or sensors which monitor, detect, measure, determine or derive physical properties or characteristics of a component in or on the vehicle or of an area near the vehicle, as disclosed in the current assignee's patents and pending patent applications. In many cases, the location of a SAW or RFID device needs to be determined such as when a device is used to locate the position of a movable item in or on a vehicle such as a seat. In other cases, the particular device from a plurality of similar devices, such as a tire pressure and/or temperature monitor that is reporting, needs to be identified. Thus, a combination of antennas can be used and the time or arrival, angle of arrival, multipath signature or similar method used to identify the reporting device. One preferred method is derived from the theory of smart antennas whereby the signals from multiple antennas are combined to improve the signal-to-noise ratio of the incoming or outgoing signal in the presence of multipath effects, for example.

Additionally, since the signal level from a SAW or RFID device is frequently low, various techniques can be used to improve the signal-to-noise ratio as described below. Finally, at the frequencies frequently used such as 433 MHz, the antennas can become large and methods are needed to reduce their size. These and other antenna considerations that can be used to improve the operation of SAW, RFID and similar wireless devices are described below.

1.3.1.1 Tire Information Determination

One method of maintaining a single central antenna assembly while interrogating all four tires on a conventional automobile, is illustrated in FIGS. 20A and 20B. An additional antenna can be located near the spare tire, which is not shown. It should be noted that the system described below is equally applicable for vehicles with more than four tires such as trucks.

A vehicle body is illustrated as 620 having four tires 621 and a centrally mounted four element, switchable directional antenna array 622. The four beams are shown schematically as 623 with an inactivated beam as 624 and the activated beam as 625. The road surface 626 supports the vehicle. An electronic control circuit, not shown, which may reside inside the antenna array housing 622 or elsewhere, alternately switches each of the four antennas of the array 622 which then sequentially, or in some other pattern, send RF signals to each of the four tires 621 and wait for the response from the RFID, SAW or similar tire pressure, temperature, ID, acceleration and/or other property monitor arranged in connection with or associated with the tire 621. This represents a time domain multiple access system.

The interrogator makes sequential interrogation of wheels as follows:

Stage 1. Interrogator radiates 8 RF pulses via the first RF port directed to the 1st wheel.
Pulse duration is about 0.8 μs.
Pulse repetition period is about 40 μs.
Pulse amplitude is about 8 V (peak to peak)
Carrier frequency is about 426.00 MHz.
(Of course, between adjacent pulses receiver opens its input and receives four-pulses echoes from transponder located in the first wheel).
Then, during a time of about 8 ms internal micro controller processes and stores received data.
Total duration of this stage is 32 μs+8 ms=8.032 ms.
Stage 2,3,4. Interrogator repeats operations as on stage 1 for $2^{nd}$, $3^{rd}$ and $4^{th}$ wheel sequent
Stage 5. Interrogator stops radiating RF pulses and transfers data stored during stages 1-4 to the external PC for final processing and displaying. Then it returns to stage 1. The time interval for data transfer equals about 35 ms.
Some notes relative to FCC Regulations:
The total duration of interrogation cycle of four wheels is 8.032 ms*4+35 ms=67.12 ms.

During this time, interrogator radiates 8*4=32 pulses, each of 0.8 μs duration.

Thus, average period of pulse repetition is 67.12 ms/32=2.09 ms=2090 μs

Assuming that duration of the interrogation pulse is 0.8 μs as mentioned, an average repetition rate is obtained 0.8 μs/2090 μs=0.38*10$^{-3}$ Finally, the radiated pulse power is Pp=(4 V)$^2$/(2*50 Ohm)=0.16 W and the average radiated power is Pave=0.16*0.38*10$^{-3}$=0.42*10$^{-3}$ W, or 0.42 mW In another application, the antennas of the array 622 transmit the RF signals simultaneously and space the returns through the use of a delay line in the circuitry from each antenna so that each return is spaced in time in a known manner without requiring that the antennas be switched. Another method is to offset the antenna array, as illustrated in FIG. 21, so that the returns naturally are spaced in time due to the different distances from the tires 621 to the antennas of the array 622. In this case, each signal will return with a different phase and can be separated by this difference in phase using methods known to those in the art.

In another application, not shown, two wide angle antennas can be used such that each receives any four signals but each antenna receives each signal at a slightly different time and different amplitude permitting each signal to be separated by looking at the return from both antennas since, each signal will be received differently based on its angle of arrival.

Additionally, each SAW or RFID device can be designed to operate on a slightly different frequency and the antennas of the array 622 can be designed to send a chirp signal and the returned signals will then be separated in frequency, permitting the four signals to be separated. Alternately, the four antennas of the array 622 can each transmit an identification signal to permit separation. This identification can be a numerical number or the length of the SAW substrate, for example, can be random so that each property monitor has a slightly different delay built in which permits signal separation. The identification number can be easily achieved in RFID systems and, with some difficulty and added expense, in SAW systems. Other methods of separating the signals from each of the tires 621 will now be apparent to those skilled in the art. One preferred method in particular will be discussed below and makes use of an RFID switch.

There are two parameters of SAW system, which has led to the choice of a four echo pulse system:
ITU frequency rules require that the radiated spectrum width be reduced to:

$\Delta \Phi \leq 1.75$ MHz(in ISM band, F=433.92 MHz);

The range of temperature measurement should be from −40 F up to +260 F.

Therefore, burst (request) pulse duration should be not less than 0.6 microseconds (see FIG. 22).

$\tau_{bur.}=1/\Delta\Phi \geq 0.6$ μs

This burst pulse travels to a SAW sensor and then it is returned by the SAW to the interrogator. The sensor's antenna, interdigital transducer (IDT), reflector and the interrogator are subsystems with a restricted frequency pass band. Therefore, an efficient pass band of all the subsystems H(f)$_\Sigma$ will be defined as product of the partial frequency characteristic of all components:

H(f)$_\Sigma$=H(f)$_1$*H(f)$_2$* ... H(f)i

On the other hand, the frequency $H(\Phi)_\Sigma$ and a time $I(\tau)_\Sigma$ response of any system are interlinked to each other by Fourier's transform. Therefore, the shape and duration ($\tau_{echo\,puls}$) an echo signal on input to the quadrature demodulator will differ from an interrogation pulse (see FIG. 23).

In other words, duration an echo signal on input to the quadrature demodulator is defined as mathematical convolution of a burst signal cbur. and the total impulse response of the system $I(\tau)_\Sigma$.

$$\tau_{echo} = \tau_{bur.} \otimes I(\tau)_\Sigma$$

The task is to determine maximum pulse duration on input to the quadrature demodulator $\tau_{echo}$ under a burst pulse duration $\tau_{bur}$ of 0.6 microseconds. It is necessary to consider in time all echo signals. In addition, it is necessary to take into account the following:

- each subsequent echo signal should not begin earlier than the completion of the previous echo pulse. Otherwise, the signals will interfere with each other, and measurement will not be correct;
- for normal operation of available microcircuits, it is necessary that the signal has a flat apex with a duration not less than 0.25 microseconds ($\tau_{meg}$=t3-t2, see FIG. 23). The signal's phase will be constant only on this segment;
- the total sensor's pass band (considering double transit IDT and it's antenna as a reflector) constitutes 10 MHz;
- the total pass band of the interrogator constitutes no more than 4 MHz.

Conducting the corresponding calculations yields the determination that duration of impulse front (t2-t1=t4-t3, see FIG. 23) constitutes about 0.35 microseconds. Therefore, total duration of one echo pulse is not less than:

$$\tau_{echo.} = (t2-t1) + \tau_{meg.} + (t4-t3) = 0.35 + 0.25 + 0.35 = 0.95\,\mu s$$

Hence, the arrival time of each following echo pulse should be not earlier than 1.0 microsecond (see FIG. 24). This conclusion is very important.

In Appendix 1 of the '139 application, it is shown that for correct temperature measuring in the required band it is necessary to meet the following conditions:

$$(T2-T1) = 1/(72*10{-6}\,1/^\circ K * (125^\circ C.(-40^\circ C.))*434.92*106) = 194\,ns$$

This condition is outrageous. If to execute ITU frequency rules, the band of correct temperature measuring will be reduced five times:

$$(125^\circ C.-(-40^\circ C.)*194\,ns)/1000\,ns = 32^\circ C. = 58^\circ F.$$

This is the main reason that it is necessary to add the fourth echo pulse in a sensor (see FIG. 24). The principle purpose of the fourth echo pulse is to make the temperature measurement unambiguous in a wide interval of temperatures when a longer interrogation pulse is used (the respective time intervals between the sensor's echo pulses are also longer). A mathematical model of the processing of a four-pulse echo that explains these statements is presented in Appendix 3 of the '139 application.

The duration of the interrogation pulse and the time positions of the four pulses are calculated as:

$$T1 > 4*\tau_{echo} = 4.00\,\mu s$$

$$T2 = T1 + \tau_{echo} = 5.00\,\mu s$$

$$T3 = T2 + \tau_{echo} = 6.00\,\mu s$$

$$T4 = T3 + \tau_{echo} + 0.08\,\mu s = 7.08\,\mu s$$

The sensor's design with four pulses is exhibited in FIG. 25 and FIG. 26.

| | |
|---|---|
| $\tau_{bur}$ | 0.60 µs |
| T1 | 4.00 µs |
| T2 | 5.00 µs |
| T3 | 6.00 µs |
| T4 | 7.08 µs |

The reason that such a design was selected is that this design provides three important conditions:

1. It has the minimum RF signal propagation loss. Both SAW waves use for measuring (which are propagated to the left and to the right from IDT).

2. All parasitic echo signals (signals of multiple transits) are eliminated after the fourth pulse. For example, the pulse is excited by the IDT, then it is reflected from a reflector No. 1 and returns to the IDT. The pulse for the second time is re-emitted and it passes the second time on the same trajectory. The total time delay will be 8.0 microseconds in this case.

3. It has the minimum length.

FIGS. 25-27 illustrate the paths taken by various surface waves on a tire temperature and pressure monitoring device of one or more of the inventions disclosed herein. The pulse from the interrogator is received by the antenna 634 which excited a wave in the SAW substrate 637 by way of the interdigital transducer (IDT) 633. The pulse travels in two directions and reflects off of reflectors 631, 632, 635 and 636. The reflected pulses return to the IDT 633 and are re-radiated from the antenna 634 back to the interrogator. The pressure in the pressure capsule causes the micro-membrane 638 to deflect causing the membrane to strain in the SAW through the point of application of the force 639.

The IDT 633, reflectors 632 and 631 are rigidly fastened to a base package. Reflectors 635 and 636 are disposed on a portion of the substrate that moves under the action of changes in pressure. Therefore, it is important that magnitudes of phase shift of pulses No 2 and No 4 were equal for a particular pressure.

For this purpose, the point of application of the force (caused by pressure) has been arranged between reflector 635 and the IDT 633, as it is exhibited in FIG. 27. Phase shifts of echo pulses No 2 and No 4 vary equally with changes in pressure. The area of strain is equal for echo pulses No 2 and No 4. Phase shifts of echo pulses No 1 and No 4 do not vary with pressure.

The phase shifts of all four echo pulses vary under temperature changes (proportionally to each time delay). All necessary computing of the temperature and pressure can be executed without difficulties in this case only.

This is taken into account in a math model, which is presented below.

Although the discussion herein concerns the determination of tire information, the same system can be used to determine the location of seats, the location of child seats when equipped with sensors, information about the presence of object or chemicals in vehicular compartments and the like.

1.3.1.2 Smart Antennas

Some of the shortcomings in today's wireless products can be overcome by using smart antenna technology. A smart antenna is a multi-element antenna that significantly improves reception by intelligently combining the signals received at each antenna element and adjusting the antenna characteristics to optimize performance as the transmitter or receiver moves and the environment changes.

Smart antennas can suppress interfering signals, combat signal fading and increase signal range thereby increasing the performance and capacity of wireless systems.

A method of separating signals from multiple tires, for example, is to use a smart antenna such as that manufactured by Motia. This particular Motia device is designed to operate at 433 MHz and to mitigate multipath signals at that frequency. The signals returning to the antennas from tires, for example, contain some multipath effects that, especially if the antennas are offset somewhat from the vehicle center, are different for each wheel. Since the adaptive formula will differ for each wheel, the signals can be separated (see "enhancing 802.11 WLANs through Smart Antennas", January 2004 available at motia.com). The following is taken from that paper.

"Antenna arrays can provide gain, combat multipath fading, and suppress interfering signals, thereby increasing both the performance and capacity of wireless systems. Smart antennas have been implemented in a wide variety of wireless systems, where they have been demonstrated to provide a large performance improvement. However, the various types of spatial processing techniques have different advantages and disadvantages in each type of system."

"This strategy permits the seamless integration of smart antenna technology with today's legacy WLAN chipset architecture. Since the 802.11 system uses time division duplexing (the same frequency is used for transmit and receive), smart antennas can be used for both transmit and receive, providing a gain on both uplink and downlink, using smart antennas on either the client or access point alone. Results show a 13 dB gain with a four element smart antenna over a single antenna system with the smart antenna on one side only, and an 18 dB gain with the smart antenna on both the client and access point. Thus, this "plug-and-play" adaptive array technology can provide greater range, average data rate increases per user, and better overall coverage.

"In the multibeam or phased array antenna, a beamformer forms several narrow beams, and a beam selector chooses the beam for reception that has the largest signal power. In the adaptive array, the signal is received by several antenna elements, each with similar antenna patterns, and the received signals are weighted and combined to form the output signal. The multibeam antenna is simpler to implement as the beamformer is fixed, with the beam selection only needed every few seconds for user movement, while the adaptive array must calculate the complex beamforming weights at least an order of magnitude faster than the fading rate, which can be several Hertz for pedestrian users."

"Finally, there is pattern diversity, the use of antenna elements with different patterns. The combination of these types of diversity permits the use of a large number of antennas even in a small form factor, such as a PCMCIA card or handset, with near ideal performance."

Through its adaptive beamforming technology, Motia has developed cost-effective smart antenna appliques that vastly improve wireless performance in a wide variety of wireless applications including Wi-Fi that can be incorporated into wireless systems without major modifications to existing products. Although the Motia chipset has been applied to several communication applications, it has yet to be applied to the monitoring applications as disclosed in the current assignee's patents and pending patent applications, and in particular vehicular monitoring applications such as tire monitoring.

The smart antenna works by determining a set of factors or weights that are used to operate on the magnitude and/or phase of the signals from each antenna before the signals are combined. However, since the geometry of a vehicle tire relative to the centralized antenna array does not change much as the tire rotates, but is different for each wheel, the weights themselves contain the information as to which tire signal is being received. In fact, the weights can be chosen to optimize signal transmission from a particular tire thus providing a method of selectively interrogating each tire at the maximum antenna gain.

1.3.1.3 Distributed Load Monopole

Recent antenna developments in the physics department at the University of Rhode Island have resulted in a new antenna technology. The antennas developed called DLM's (Distributed loaded monopole) are small efficient, wide bandwidth antennas. The simple design exhibits 50-ohm impedance and is easy to implement. They require only a direct feed from a coax cable and require no elaborate matching networks.

The prime advantage to this technology is a substantial reduction of the size of an antenna. Typically, the DLM antenna is about ⅓ the size of a normal dipole with only minor loss in efficiency. This is especially important for vehicle applications where space is always at a premium. Such antennas can be used for a variety of vehicle radar and communication applications as well for the monitoring of RFID, SAW and similar devices on a vehicle and especially for tire pressure, temperature, and/or acceleration monitoring as well as other monitoring purposes. Such applications have not previously been disclosed.

Although the DLM is being applied to several communication applications, it has yet to be applied to the monitoring applications as disclosed in the current assignee's patents and pending patent applications. The antenna gain that results and the ability to pack several into a small package are attractive features of this technology.

1.3.1.4 Plasma Antenna

The following disclosure was taken from "Markland Technologies —Gas Plasma":(www.marklandtech.com)

"Plasma antenna technology employs ionized gas enclosed in a tube (or other enclosure) as the conducting element of an antenna. This is a fundamental change from traditional antenna design that generally employs solid metal wires as the conducting element. Ionized gas is an efficient conducting element with a number of important advantages. Since the gas is ionized only for the time of transmission or reception, "ringing" and associated effects of solid wire antenna design are eliminated. The design allows for extremely short pulses, important to many forms of digital communication and radars. The design further provides the opportunity to construct an antenna that can be compact and dynamically reconfigured for frequency, direction, bandwidth, gain and beamwidth. Plasma antenna technology will enable antennas to be designed that are efficient, low in weight and smaller in size than traditional solid wire antennas."

"When gas is electrically charged, or ionized to a plasma state it becomes conductive, allowing radio frequency (RF) signals to be transmitted or received. We employ ionized gas enclosed in a tube as the conducting element of an antenna. When the gas is not ionized, the antenna element ceases to exist. This is a fundamental change from traditional antenna design that generally employs solid metal wires as the conducting element. We believe our plasma antenna offers numerous advantages including stealth for military applications and higher digital performance in commercial applications. We also believe our technology can compete in many metal antenna applications."

Initial studies have concluded that a plasma antenna's performance is equal to a copper wire antenna in every respect.

Plasma antennas can be used for any transmission and/or modulation technique: continuous wave (CW), phase modulation, impulse, AM, FM, chirp, spread spectrum or other digital techniques. And the plasma antenna can be used over a large frequency range up to 20 GHz and employ a wide variety of gases (for example neon, argon, helium, krypton, mercury vapor and xenon). The same is true as to its value as a receive antenna."

"Plasma antenna technology has the following additional attributes:
  No antenna ringing provides an improved signal to noise ratio and reduces multipath signal distortion.
  Reduced radar cross section provides stealth due to the non-metallic elements.
  Changes in the ion density can result in instantaneous changes in bandwidth over wide dynamic ranges.
  After the gas is ionized, the plasma antenna has virtually no noise floor.
  While in operation, a plasma antenna with a low ionization level can be decoupled from an adjacent high-frequency transmitter.
  A circular scan can be performed electronically with no moving parts at a higher speed than traditional mechanical antenna structures.
  It has been mathematically illustrated that by selecting the gases and changing ion density that the electrical aperture (or apparent footprint) of a plasma antenna can be made to perform on par with a metal counterpart having a larger physical size.
  Our plasma antenna can transmit and receive from the same aperture provided the frequencies are widely separated.
  Plasma resonance, impedance and electron charge density are all dynamically reconfigurable. Ionized gas antenna elements can be constructed and configured into an array that is dynamically reconfigurable for frequency, beamwidth, power, gain, polarization and directionality —on the fly.
  A single dynamic antenna structure can use time multiplexing so that many RF subsystems can share one antenna resource reducing the number and size of antenna structures."

Several of the characteristics discussed above are of particular usefulness for several of the inventions herein including the absence of ringing, the ability to turn the antenna off after transmission and then immediately back on for reception, the ability to send very short pulses, the ability to alter the directionality of the antenna and to sweep thereby allowing one antenna to service multiple devices such as tires and to know which tire is responding. Additional advantages include, smaller size, the ability to work with chirp, spread spectrum and other digital technologies, improved signal to noise ratio, wide dynamic range, circular scanning without moving parts, and antenna sharing over differing frequencies, among others.

Some of the applications disclosed herein can use ultra wideband transceivers. UWB transceivers radiate most of the energy with its frequency centered on the physical length of the antenna. With the UWB connected to a plasma antenna, the center frequency of the UWB transceiver could be hopped or swept simultaneously.

A plasma antenna can solve the problem of multiple antennas by changing its electrical characteristic to match the function required—Time domain multiplexed. It can be used for high-gain antennas such as phase array, parabolic focus steering, log periodic, yogi, patch quadrafiler, etc. One antenna can be used for GPS, ad-hoc (such as car-to-car) communication, collision avoidance, back up sensing, cruse control, radar, toll identification and data communications.

Although the plasma antennas are being applied to several communication applications, they have yet to be applied to the monitoring applications as disclosed herein. The many advantages that result and the ability to pack several antenna functions into a small package are attractive features of this technology. Patents and applications that discuss plasma antennas include: U.S. Pat. No. 6,710.746, US20030160742 and US20040130497.

1.3.1.5 Dielectric Antenna

A great deal of work is underway to make antennas from dielectric materials. In one case, the electric field that impinges on the dielectric is used to modulate a transverse electric light beam. In another case, the reduction of the speed of electro magnetic waves due to the dielectric constant is used to reduce the size of the antenna. It can be expected that developments in this area will affect the antennas used in cell phones as well as in RFID and SAW-based communication devices in the future. Thus, dielectric antennas can be advantageously used with some of the inventions disclosed herein.

1.3.1.6 Nanotube Antenna

Antennas made from carbon nanotubes are beginning to show promise of increasing the sensitivity of antennas and thus increasing the range for communication devices based on RFID, SAW or similar devices where the signal strength frequently limits the range of such devices. The use of these antennas is therefore contemplated herein for use in tire monitors and the other applications disclosed herein.

Combinations of the above antenna designs in many cases can benefit from the advantages of each type to add further improvements to the field. Thus the inventions herein are not limited to any one of the above concepts nor is it limited to their use alone. Where feasible, all combinations are contemplated herein.

1.3.1.7 Summary

A general system for obtaining information about a vehicle or a component thereof or therein is illustrated in FIG. 20C and includes multiple sensors 627 which may be arranged at specific locations on the vehicle, on specific components of the vehicle, on objects temporarily placed in the vehicle such as child seats, or on or in any other object in or on the vehicle or in its vicinity about which information is desired. The sensors 627 may be SAW or RFID sensors or other sensors which generate a return signal upon the detection of a transmitted radio frequency signal. A multi-element antenna array 622 is mounted on the vehicle, in either a central location as shown in FIG. 20A or in an offset location as shown in FIG. 21, to provide the radio frequency signals which cause the sensors 627 to generate the return signals.

A control system 628 is coupled to the antenna array 622 and controls the antennas in the array 622 to be operative as necessary to enable reception of return signals from the sensors 627. There are several ways for the control system 628 to control the array 622, including to cause the antennas to be alternately switched on in order to sequentially transmit the RF signals therefrom and receive the return signals from the sensors 627 and to cause the antennas to transmit the RF signals simultaneously and space the return signals from the sensors 627 via a delay line in circuitry from each antennas such that each return signal is spaced in time in a known manner without requiring switching of the antennas. The control system can also be used to control a smart antenna array.

The control system 628 also processes the return signals to provide information about the vehicle or the component. The processing of the return signals can be any known processing including the use of pattern recognition techniques, neural networks, fuzzy systems and the like.

The antenna array 622 and control system 628 can be housed in a common antenna array housing 630.

Once the information about the vehicle or the component is known, it is directed to a display/telematics/adjustment unit 629 where the information can be displayed on a display 629 to the driver, sent to a remote location for analysis via a telematics unit 629 and/or used to control or adjust a component on, in or near the vehicle. Although several of the figures illustrate applications of these technologies to tire monitoring, it is intended that the principles and devices disclosed can be applied to the monitoring of a wide variety of components on and off a vehicle.

1.4 Tire Monitoring

The tire monitoring systems of some of the inventions herein comprises at least three separate systems corresponding to three stages of product evolution. Generation 1 is a tire valve cap that provides information as to the pressure within the tire as described below. Generation 2 requires the replacement of the tire valve stem, or the addition of a new stem-like device, with a new valve stem that also measures temperature and pressure within the tire or it may be a device that attaches to the vehicle wheel rim. Generation 3 is a product that is attached to the inside of the tire adjacent the tread and provides a measure of the diameter of the footprint between the tire and the road, the tire pressure and temperature, indications of tire wear and, in some cases, the coefficient of friction between the tire and the road.

As discussed above, SAW technology permits the measurement of many physical and chemical parameters without the requirement of local power or energy. Rather, the energy to run devices can be obtained from radio frequency electromagnetic waves. These waves excite an antenna that is coupled to the SAW device. Through various devices, the properties of the acoustic waves on the surface of the SAW device are modified as a function of the variable to be measured. The SAW device belongs to the field of microelectromechanical systems (MEMS) and can be produced in high-volume at low cost.

For the Generation 1 system, a valve cap contains a SAW material at the end of the valve cap, which may be polymer covered. This device senses the absolute pressure in the valve cap. Upon attaching the valve cap to the valve stem, a depressing member gradually depresses the valve permitting the air pressure inside the tire to communicate with a small volume inside the valve cap. As the valve cap is screwed onto the valve stem, a seal prevents the escape of air to the atmosphere. The SAW device is electrically connected to the valve cap, which is also electrically connected to the valve stem that can act as an antenna for transmitting and receiving radio frequency waves. An interrogator located in the vicinity of the tire periodically transmits radio waves that power the SAW device, the actual distance between the interrogator and the device depending on the relative orientation of the antennas and other factors. The SAW device measures the absolute pressure in the valve cap that is equal to the pressure in the tire.

The Generation 2 system permits the measurement of both the tire pressure and tire temperature. In this case, the tire valve stem can be removed and replaced with a new tire valve stem that contains a SAW device attached at the bottom of the valve stem. This device preferably contains two SAW devices, one for measuring temperature and the second for measuring pressure through a novel technology discussed below. This second generation device therefore permits the measurement of both the pressure and the temperature inside the tire. Alternately, this device can be mounted inside the tire, attached to the rim or attached to another suitable location. An external pressure sensor is mounted in the interrogator to measure the pressure of the atmosphere to compensate for altitude and/or barometric changes.

The Generation 3 device can contain a pressure and temperature sensor, as in the case of the Generation 2 device, but additionally contains one or more accelerometers which measure at least one component of the acceleration of the vehicle tire tread adjacent the device. This acceleration varies in a known manner as the device travels in an approximate circle attached to the wheel. This device is capable of determining when the tread adjacent the device is in contact with road surface. In some cases, it is also able to measure the coefficient of friction between the tire and the road surface. In this manner, it is capable of measuring the length of time that this tread portion is in contact with the road and thereby can provide a measure of the diameter or circumferential length of the tire footprint on the road. A technical discussion of the operating principle of a tire inflation and load detector based on flat area detection follows:

When tires are inflated and not in contact with the ground, the internal pressure is balanced by the circumferential tension in the fibers of the shell. Static equilibrium demands that tension is equal to the radius of curvature multiplied by the difference between the internal and the external gas pressure. Tires support the weight of the automobile by changing the curvature of the part of the shell that touches the ground. The relation mentioned above is still valid. In the part of the shell that gets flattened, the radius of curvature increases while the tension in the tire structure stays the same. Therefore, the difference between the external and internal pressures becomes small to compensate for the growth of the radius. If the shell were perfectly flexible, the tire contact with the ground would develop into a flat spot with an area equal to the load divided by the pressure.

A tire operating at correct values of load and pressure has a precise signature in terms of variation of the radius of curvature in the loaded zone. More flattening indicates under-inflation or over-loading, while less flattening indicates over-inflation or under-loading. Note that tire loading has essentially no effect on internal pressure.

From the above, one can conclude that monitoring the curvature of the tire as it rotates can provide a good indication of its operational state. A sensor mounted inside the tire at its largest diameter can accomplish this measurement. Preferably, the sensor would measure mechanical strain. However, a sensor measuring acceleration in any one axis, preferably the radial axis, could also serve the purpose.

In the case of the strain measurement, the sensor would indicate a constant strain as it spans the arc over which the tire is not in contact with the ground and a pattern of increased stretch during the time when the sensor spans an arc in close proximity with the ground. A simple ratio of the times of duration of these two states would provide a good indication of inflation, but more complex algorithms could be employed where the values and the shape of the period of increased strain are utilized.

As an indicator of tire health, the measurement of strain on the largest inside diameter of the tire is believed to be superior to the measurement of stress, such as inflation pressure, because, the tire could be deforming, as it ages or otherwise progresses toward failure, without any changes in inflation pressure. Radial strain could also be measured on the inside of the tire sidewall thus indicating the degree of flexure that the tire undergoes.

The accelerometer approach has the advantage of giving a signature from which a harmonic analysis of once-per-revolution disturbances could indicate developing problems such as hernias, flat spots, loss of part of the tread, sticking of foreign bodies to the tread, etc.

As a bonus, both of the above-mentioned sensors (strain and acceleration) give clear once-per-revolution signals for each tire that could be used as input for speedometers, odometers, differential slip indicators, tire wear indicators, etc.

Tires can fail for a variety of reasons including low pressure, high temperature, delamination of the tread, excessive flexing of the sidewall, and wear (see, e.g., Summary Root Cause Analysis Bridgestone/Firestone, Inc." http://www.bridgestone-firestone.com/homeimgs/rootcause.htm. Printed March, 2001). Most tire failures can be predicted based on tire pressure alone and the TREAD Act thus addresses the monitoring of tire pressure. However, some failures, such as the Firestone tire failures, can result from substandard materials especially those that are in contact with a steel-reinforcing belt. If the rubber adjacent the steel belt begins to move relative to the belt, then heat will be generated and the temperature of the tire will rise until the tire fails catastrophically. This can happen even in properly inflated tires.

Finally, tires can fail due to excessive vehicle loading and excessive sidewall flexing even if the tire is properly inflated. This can happen if the vehicle is overloaded or if the wrong size tire has been mounted on the vehicle. In most cases, the tire temperature will rise as a result of this additional flexing, however, this is not always the case, and it may even occur too late. Therefore, the device which measures the diameter of the tire footprint on the road is a superior method of measuring excessive loading of the tire.

Generation 1 devices monitor pressure only while Generation 2 devices also monitor the temperature and therefore will provide a warning of imminent tire failure more often than if pressure alone is monitored. Generation 3 devices will provide an indication that the vehicle is overloaded before either a pressure or temperature monitoring system can respond. The Generation 3 system can also be augmented to measure the vibration signature of the tire and thereby detect when a tire has worn to the point that the steel belt is contacting the road. In this manner, the Generation 3 system also provides an indication of a worn out tire and, as will be discussed below, an indication of the road coefficient of friction.

Each of these devices communicates to an interrogator with pressure, temperature, and acceleration as appropriate. In none of these generational devices is a battery mounted within the vehicle tire required, although in some cases an energy generator can be used. In some cases, the SAW or RFID devices will optionally provide an identification number corresponding to the device to permit the interrogator to separate one tire from another.

Key advantages of the tire monitoring system disclosed herein over most of the currently known prior art are:
  very small size and weight eliminating the need for wheel counterbalance,
  cost competitive for tire monitoring alone and cost advantage for combined systems,
  high update rate,
  self-diagnostic,
  automatic wheel identification,
  no batteries required—powerless, and
  no wires required—wireless.

The monitoring of temperature and or pressure of a tire can take place infrequently. It can be adequate to check the pressure and temperature of vehicle tires once every ten seconds to once per minute. To utilize the centralized interrogator of this invention, the tire monitoring system would preferably use SAW technology and the device could be located in the valve stem, wheel, tire side wall, tire tread, or other appropriate location with access to the internal tire pressure of the tires. A preferred system is based on a SAW technology discussed above.

At periodic intervals, such as once every minute, the interrogator sends a radio frequency signal at a frequency such as 905 MHz to which the tire monitor sensors have been sensitized. When receiving this signal, the tire monitor sensors (of which there are five in a typical configuration) respond with a signal providing an optional identification number, temperature, pressure and acceleration data where appropriate. In one implementation, the interrogator would use multiple, typically two or four, antennas which are spaced apart. By comparing the time of the returned signals from the tires to the antennas, or by using smart antenna techniques, the location of each of the senders (the tires) can be approximately determined as discussed in more detail above. That is, the antennas can be so located that each tire is a different distance from each antenna and by comparing the return time of the signals sensed by the antennas, the location of each tire can be determined and associated with the returned information. If at least three antennas are used, then returns from adjacent vehicles can be eliminated. Alternately, a smart antenna array such as manufactured by Motia can be used.

An illustration of this principle applied to an 18 wheeler truck vehicle is shown generally at 610 in FIGS. 28A and 28B. Each of the vehicle wheels is represented by a rectangle 617. In FIG. 28A, the antennas 611 and 612 are placed near to the tires due to the short transmission range of typical unboosted SAW tire monitor systems. In FIG. 28B, transmitters such as conventional battery operated systems or boosted SAW systems, for example, allow a reduction in the number of antennas and their placement in a more central location such as antennas 614, 615 and 616. In FIG. 28A, antennas 611, 612 transmit an interrogation signal generated in the interrogator 613 to tires in their vicinity. Antennas 611 and 612 then receive the retransmitted signals and based on the time of arrival or the phase differences between the arriving signals, the distance or direction from the antennas to the transmitters can be determined by triangulation or based on the intersection of the calculated vectors, the location of the transmitter can be determined by those skilled in the art. For example, if there is a smaller phase difference between the received signals at antennas 611 and 612, then the transmitter will be inboard and if the phase difference is larger, then the transmitter will be an outboard tire. The exact placement of each antenna 611, 612 can be determined by analysis or by experimentation to optimize the system. The signals received by the antennas 611, 612 can be transmitted as received to the interrogator 613 by wires (not shown) or, at the other extreme, each antenna 611, 612 can have associated circuitry to process the signal to change its frequency and/or amplify the received signal and retransmit it by wires or wirelessly to the transmitter. Various combinations of features can also be used. If processing circuitry is present, then each antenna with such circuitry would need a power source which can be supplied by the interrogator or by another power-supply method. If supplied by the interrogator, power can be supplied using the same cabling as is used to send the interrogating pulse which may be a coax cable. Since the power can be supplied as DC, it can be easily separated from the RF signal. Naturally, this system can be used with all types of tire monitors and is not limited to SAW type devices. Other methods exist to transmit data from the antennas including a vehicle bus or a fiber optic line or bus.

In FIG. 28B, the transmitting antenna 615 is used for 16 of the wheels and receiving antennas 614, and optionally antenna 615, are used to determine receipt of the TPM signals and determine the transmitting tire as described above. However, since the range of the tire monitors is greater in this case, the antennas 614, 615 can be placed in a more centralized location thereby reducing the cost of the installation and improving its reliability.

Other methods can also be used to permit tire differentiation including CDMA and FDMA, for example, as discussed elsewhere herein. If, for example, each device is tuned to a slightly different frequency or code and this information is taught to the interrogator, then the receiving antenna system can be simplified.

An identification number can accompany each transmission from each tire sensor and can also be used to validate that the transmitting sensor is in fact located on the subject vehicle. In traffic situations, it is possible to obtain a signal from the tire of an adjacent vehicle. This would immediately show up as a return from more than five vehicle tires and the system would recognize that a fault had occurred. The sixth return can be easily eliminated, however, since it could contain an identification number that is different from those that have heretofore been returned frequently to the vehicle system or based on a comparison of the signals sensed by the different antennas. Thus, when the vehicle tire is changed or tires are rotated, the system will validate a particular return signal as originating from the tire-monitoring sensor located on the subject vehicle.

This same concept is also applicable for other vehicle-mounted sensors. This permits a plug and play scenario whereby sensors can be added to, changed, or removed from a vehicle and the interrogation system will automatically adjust. The system will know the type of sensor based on the identification number, frequency, delay and/or its location on the vehicle. For example, a tire monitor could have an ID in a different range of identification numbers from a switch or weight-monitoring device. This also permits new kinds of sensors to be retroactively installed on a vehicle. If a totally new type of the sensor is mounted to the vehicle, the system software would have to be updated to recognize and know what to do with the information from the new sensor type. By this method, the configuration and quantity of sensing systems on a vehicle can be easily changed and the system interrogating these sensors need only be updated with software upgrades which could occur automatically, such as over the Internet and by any telematics communication channel including cellular and satellite.

Preferred tire-monitoring sensors for use with this invention use the surface acoustic wave (SAW) technology. A radio frequency interrogating signal can be sent to all of the tire gages simultaneously and the received signal at each tire gage is sensed using an antenna. The antenna is connected to the IDT transducer that converts the electrical wave to an acoustic wave that travels on the surface of a material such as lithium niobate, or other piezoelectric material such as zinc oxide, Langasite™ or the polymer polyvinylidene fluoride (PVDF). During its travel on the surface of the piezoelectric material, either the time delay, resonant frequency, amplitude or phase of the signal (or even possibly combinations thereof) is modified based on the temperature and/or pressure in the tire. This modified wave is sensed by one or more IDT transducers and converted back to a radio frequency wave that is used to excite an antenna for re-broadcasting the wave back to interrogator. The interrogator receives the wave at a time delay after the original transmission that is determined by the geometry of the SAW transducer and decodes this signal to determine the temperature and/or pressure in the subject tire. By using slightly different geometries for each of the tire monitors, slightly different delays can be achieved and randomized so that the probability of two sensors having the same delay is small. The interrogator transfers the decoded information to a central processor that determines whether the temperature and/or pressure of each of the tires exceed specifications. If so, a warning light can be displayed informing the vehicle driver of the condition. Other notification devices such as a sound generator, alarm and the like could also be used. In some cases, this random delay is all that is required to separate the five tire signals and to identify which tires are on the vehicle and thus ignore responses from adjacent vehicles.

With an accelerometer mounted in the tire, as is the case for the Generation 3 system, information is present to diagnose other tire problems. For example, when the steel belt wears through the rubber tread, it will make a distinctive noise and create a distinctive vibration when it contacts the pavement. This can be sensed by a SAW or other technology accelerometer. The interpretation of various such signals can be done using neural network technology. Similar systems are described more detail in U.S. Pat. No. 5,829,782. As the tread begins to separate from the tire as in the Bridgestone cases, a distinctive vibration is created which can also be sensed by a tire-mounted accelerometer.

As the tire rotates, stresses are created in the rubber tread surface between the center of the footprint and the edges. If the coefficient of friction on the pavement is low, these stresses can cause the shape of the footprint to change. The Generation 3 system, which measures the circumferential length of the footprint, can therefore also be used to measure the friction coefficient between the tire and the pavement.

Piezoelectric generators are another field in which SAW technology can be applied and some of the inventions herein can comprise several embodiments of SAW or other piezoelectric or other generators, as discussed extensively elsewhere herein.

An alternate approach for some applications, such as tire monitoring, where it is difficult to interrogate the SAW device as the wheel, and thus the antenna is rotating; the transmitting power can be significantly increased if there is a source of energy inside the tire. Many systems now use a battery but this leads to problems related to disposal, having to periodically replace the battery and temperature effects. In some cases, the manufacturers recommend that the battery be replaced as often as every 6 to 12 months. Batteries also sometimes fail to function properly at cold temperatures and have their life reduced when operated at high temperatures. For these reasons, there is a belief that a tire monitoring system should obtain its power from some source external of the tire. Similar problems can be expected for other applications.

One novel solution to this problem is to use the flexing of the tire itself to generate electricity. If a thin film of PVDF is attached to the tire inside and adjacent to the tread, then as the tire rotates the film will flex and generate electricity. This energy can then be stored on one or more capacitors and used to power the tire monitoring circuitry. Also, since the amount of energy that is generated depends of the flexure of the tire, this generator can also be used to monitor the health of the tire in a similar manner as the Generation 3 accelerometer system described above. Mention is made of using a bi-morph to generate energy in a rotating tire in U.S. Pat. No. 5,987,980 without describing how it is implemented other than to say that it is mounted to the sensor housing and uses vibration. In particular, there is no mention of attaching the bi-morph to the tread of the tire as disclosed herein.

As mentioned above, the transmissions from different SAW devices can be time-multiplexed by varying the delay time from device to device, frequency-multiplexed by varying the natural frequencies of the SAW devices, code-multiplexed by varying the identification code of the SAW devices or space-multiplexed by using multiple antennas. Additionally, a code operated RFID switch can be used to permit the devices to transmit one at a time as discussed below.

Considering the time-multiplexing case, varying the length of the SAW device and thus the delay before retransmission can separate different classes of devices. All seat sensors can have one delay which would be different from tire monitors or light switches etc. Such devices can also be separated by receiving antenna location.

Figure 29A:
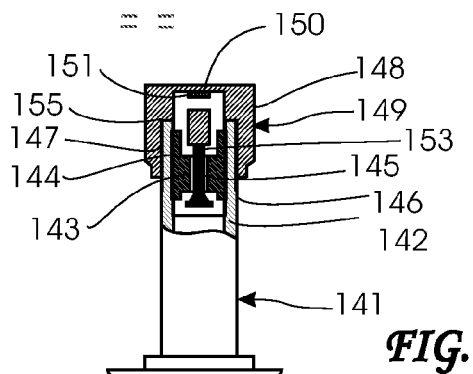
FIG. 29A is a partial cutaway view of a tire pressure monitor using an absolute pressure measuring SAW device.
Figure 29B:
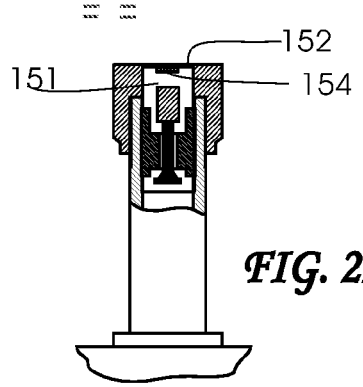
FIG. 29B is a partial cutaway view of a tire pressure monitor using a differential pressure measuring SAW device.

Referring now to FIGS. 29A and 29B, a first embodiment of a valve cap 149 including a tire pressure monitoring system in accordance with the invention is shown generally at 10 in FIG. 29A. A tire 140 has a protruding, substantially cylindrical valve stem 141 which is shown in a partial cutaway view in FIG. 29A. The valve stem 141 comprises a sleeve 142 and a tire valve assembly 144. The sleeve 142 of the valve stem 141 is threaded on both its inner surface and its outer surface. The tire valve assembly 144 is arranged in the sleeve 142 and includes threads on an outer surface which are mated with the threads on the inner surface of the sleeve 142. The valve assembly 144 comprises a valve seat 143 and a valve pin 145 arranged in an aperture in the valve seat 143. The valve assembly 144 is shown in the open condition in FIG. 29A whereby air flows through a passage between the valve seat 143 and the valve pin 145.

The valve cap 149 includes a substantially cylindrical body 148 and is attached to the valve stem 141 by means of threads arranged on an inner cylindrical surface of body 148 which are mated with the threads on the outer surface of the sleeve 142. The valve cap 149 comprises a valve pin depressor 153 arranged in connection with the body 148 and a SAW pressure sensor 150. The valve pin depressor 153 engages the valve pin 145 upon attachment of the valve cap 149 to the valve stem 141 and depresses it against its biasing spring, not shown, thereby opening the passage between the valve seat 143 and the valve pin 145 allowing air to pass from the interior of tire 140 into a reservoir or chamber 151 in the body 148. Chamber 151 contains the SAW pressure sensor 150 as described in more detail below.

Pressure sensor 150 can be an absolute pressure-measuring device. If so, it can function based on the principle that the increase in air pressure and thus air density in the chamber 151 increases the mass loading on a SAW device changing the velocity of surface acoustic wave on the piezoelectric material. The pressure sensor 150 is therefore positioned in an exposed position in the chamber 151. This effect is small and generally requires that a very thin membrane is placed over the SAW that absorbs oxygen or in some manner increases the loading onto the surface of the SAW as the pressure increases.

A second embodiment of a valve cap 10' in accordance with the invention is shown in FIG. 29B and comprises a SAW strain sensing device 154 that is mounted onto a flexible membrane 152 attached to the body 148 of the valve cap 149 and in a position in which it is exposed to the air in the chamber 151. When the pressure changes in chamber 151, the deflection of the membrane 152 changes thereby changing the strain in the SAW device 154. This changes the path length that the waves must travel which in turn changes the natural frequency of the SAW device or the delay between reception of an interrogating pulse and its retransmission.

Strain sensor 154 is thus a differential pressure-measuring device. It functions based on the principle that changes in the flexure of the membrane 152 can be correlated to changes in pressure in the chamber 151 and thus, if an initial pressure and flexure are known, the change in pressure can be determined from the change in flexure or strain.

FIGS. 29A and 29B therefore illustrate two different methods of using a SAW sensor in a valve cap for monitoring the pressure inside a tire. A preferred manner in which the SAW sensors 150,154 operate is discussed more fully below but briefly, each sensor 150,154 includes an antenna and an interdigital transducer which receives a wave via the antenna from an interrogator which proceeds to travel along a substrate. The time in which the waves travel across the substrate and return to the interdigital transducer is dependent on the temperature, the loading on the substrate (in the embodiment of FIG. 29A) or the flexure of membrane 152 (in the embodiment of FIG. 29B). The antenna transmits a return wave which is received and the time delay between the transmitted and returned wave is calculated and correlated to the pressure in the chamber 151. In order to keep the SAW devices as small as possible for the tire calve cap design, the preferred mode of SAW operation is the resonant frequency mode where a change in the resonant frequency of the device is measured.

Sensors 150 and 154 are electrically connected to the metal valve cap 149 that is electrically connected to the valve stem 141. The valve stem 141 is electrically isolated from the tire rim and can thus serve as an antenna for transmitting radio frequency electromagnetic signals from the sensors 150 and 154 to a vehicle mounted interrogator, not shown, to be described in detail below. As shown in FIG. 29A., a pressure seal 155 is arranged between an upper rim of the sleeve 142 and an inner shoulder of the body 148 of the valve cap 149 and serves to prevent air from flowing out of the tire 140 to the atmosphere.

The speed of the surface acoustic wave on the piezoelectric substrate changes with temperature in a predictable manner as well as with pressure. For the valve cap implementations, a separate SAW device can be attached to the outside of the valve cap and protected with a cover where it is subjected to the same temperature as the SAW sensors 150 or 154 but is not subject to pressure or strain. This requires that each valve cap comprise two SAW devices, one for pressure sensing and another for temperature sensing. Since the valve cap is exposed to ambient temperature, a preferred approach is to have a single device on the vehicle which measures ambient temperature outside of the vehicle passenger compartment. Many vehicles already have such a temperature sensor. For those installations where access to this temperature data is not convenient, a separate SAW temperature sensor can be mounted associated with the interrogator antenna, as illustrated below, or some other convenient place.

Figure 30:
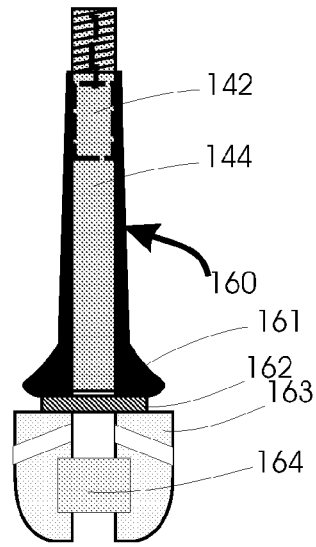
FIG. 30 is a partial cutaway view of an interior SAW tire temperature and pressure monitor mounted onto and below the valve stem.

Although the valve cap 149 is provided with the pressure seal 155, there is a danger that the valve cap 149 will not be properly assembled onto the valve stem 141 and a small quantity of the air will leak over time. FIG. 30 provides an alternate design where the SAW temperature and pressure measuring devices are incorporated into the valve stem. This embodiment is thus particularly useful in the initial manufacture of a tire.

The valve stem assembly is shown generally at 160 and comprises a brass valve stem 144 which contains a tire valve assembly 142. The valve stem 144 is covered with a coating 161 of a resilient material such as rubber, which has been partially removed in the drawing. A metal conductive ring 162 is electrically attached to the valve stem 144. A rubber extension 163 is also attached to the lower end of the valve stem 144 and contains a SAW pressure and temperature sensor 164. The SAW pressure and temperature sensor 164 can be of at least two designs wherein the SAW sensor is used as an absolute pressure sensor as shown in FIG. 30A or an as a differential sensor based on membrane strain as shown in FIG. 30B.

Figure 30A:
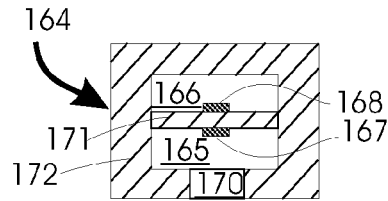
FIG. 30A is a sectioned view of the SAW tire pressure and temperature monitor of FIG. 30 incorporating an absolute pressure SAW device.

In FIG. 30A, the SAW sensor 164 comprises a capsule 172 having an interior chamber in communication with the interior of the tire via a passageway 170. A SAW absolute pressure sensor 167 is mounted onto one side of a rigid membrane or separator 171 in the chamber in the capsule 172. Separator 171 divides the interior chamber of the capsule 172 into two compartments 165 and 166, with only compartment 165 being in flow communication with the interior of the tire. The SAW absolute pressure sensor 167 is mounted in compartment 165 which is exposed to the pressure in the tire through passageway 170. A SAW temperature sensor 168 is attached to the other side of the separator 171 and is exposed to the pressure in compartment 166. The pressure in compartment 166 is unaffected by the tire pressure and is determined by the atmospheric pressure when the device was manufactured and the effect of temperature on this pressure. The speed of sound on the SAW temperature sensor 168 is thus affected by temperature but not by pressure in the tire.

The operation of SAW sensors 167 and 168 is discussed elsewhere more fully but briefly, since SAW sensor 167 is affected by the pressure in the tire, the wave which travels along the substrate is affected by this pressure and the time delay between the transmission and reception of a wave can be correlated to the pressure. Similarly, since SAW sensor 168 is affected by the temperature in the tire, the wave which travels along the substrate is affected by this temperature and the time delay between the transmission and reception of a wave can be correlated to the temperature. Similarly, the natural frequency of the SAW device will change due to the change in the SAW dimensions and that natural frequency can be determined if the interrogator transmits a chirp.

Figure 30B:
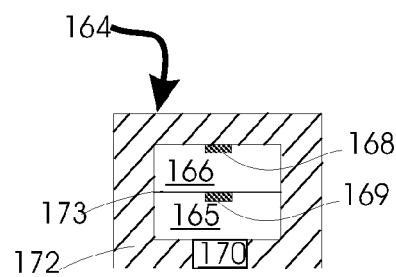
FIG. 30B is a sectioned view of the SAW tire pressure and temperature monitor of FIG. 30 incorporating a differential pressure SAW device.

FIG. 30B illustrates an alternate and preferred configuration of sensor 164 where a flexible membrane 173 is used instead of the rigid separator 171 shown in the embodiment of FIG. 30A, and a SAW device is mounted on flexible member 173. In this embodiment, the SAW temperature sensor 168 is mounted to a different wall of the capsule 172. A SAW device 169 is thus affected both by the strain in membrane 173 and the pressure in the tire. Normally, the strain effect will be much larger with a properly designed membrane 173.

The operation of SAW sensors 168 and 169 is discussed elsewhere more fully but briefly, since SAW sensor 168 is affected by the temperature in the tire, the wave which travels along the substrate is affected by this temperature and the time delay between the transmission and reception of a wave can be correlated to the temperature. Similarly, since SAW sensor 169 is affected by the pressure in the tire, the wave which travels along the substrate is affected by this pressure and the time delay between the transmission and reception of a wave can be correlated to the pressure.

In both of the embodiments shown in FIG. 30A and FIG. 30B, a separate temperature sensor is illustrated. This has two advantages. First, it permits the separation of the temperature effect from the pressure effect on the SAW device. Second, it permits a measurement of tire temperature to be recorded. Since a normally inflated tire can experience excessive temperature caused, for example, by an overload condition, it is desirable to have both temperature and pressure measurements of each vehicle tire The SAW devices 167, 168 and 169 are electrically attached to the valve stem 144 which again serves as an antenna to transmit radio frequency information to an interrogator. This electrical connection can be made by a wired connection; however, the impedance between the SAW devices and the antenna may not be properly matched. An alternate approach as described in Varadan, V.K. et al., "Fabrication, characterization and testing of wireless MEMS-IDT based micro accelerometers", Sensors and Actuators A 90 (2001) p. 7-19, 2001 Elsevier Netherlands, is to inductively couple the SAW devices to the brass tube.

Although an implementation into the valve stem and valve cap examples have been illustrated above, an alternate approach is to mount the SAW temperature and pressure monitoring devices elsewhere within the tire. Similarly, although the tire stem in both cases above can serve as the antenna, in many implementations, it is preferable to have a separately designed antenna mounted within or outside of the vehicle tire. For example, such an antenna can project into the tire from the valve stem or can be separately attached to the tire or tire rim either inside or outside of the tire. In some cases, it can be mounted on the interior of the tire on the sidewall.

Figure 31:
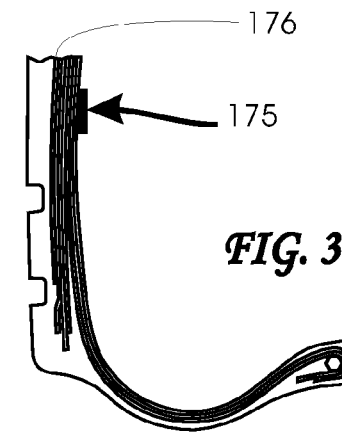
FIG. 31 is a view of an accelerometer-based tire monitor also incorporating a SAW pressure and temperature monitor and cemented to the interior of the tire opposite the tread.
Figure 31A:
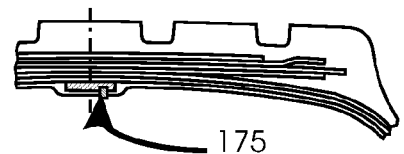
FIG. 31A is a view of an accelerometer-based tire monitor also incorporating a SAW pressure and temperature monitor and inserted into the tire opposite the tread during manufacture.

A more advanced embodiment of a tire monitor in accordance with the invention is illustrated generally at 40 in FIGS. 31 and 31A. In addition to temperature and pressure monitoring devices as described in the previous applications, the tire monitor assembly 175 comprises an accelerometer of any of the types to be described below which is configured to measure either or both of the tangential and radial accelerations. Tangential accelerations as used herein generally means accelerations tangent to the direction of rotation of the tire and radial accelerations as used herein generally means accelerations toward or away from the wheel axis.

In FIG. 31, the tire monitor assembly 175 is cemented, or otherwise attached, to the interior of the tire opposite the tread. In FIG. 31A, the tire monitor assembly 175 is inserted into the tire opposite the tread during manufacture.

Superimposed on the acceleration signals will be vibrations introduced into tire from road interactions and due to tread separation and other defects. Additionally, the presence of the nail or other object attached to the tire will, in general, excite vibrations that can be sensed by the accelerometers. When the tread is worn to the extent that the wire belts 176 begin impacting the road, additional vibrations will be induced.

Through monitoring the acceleration signals from the tangential or radial accelerometers within the tire monitor assembly 175, delamination, a worn tire condition, imbedded nails, other debris attached to the tire tread, hernias, can all be sensed. Additionally, as previously discussed, the length of time that the tire tread is in contact with the road opposite tire monitor 175 can be measured and, through a comparison with the total revolution time, the length of the tire footprint on the road can be determined. This permits the load on the tire to be measured, thus providing an indication of excessive tire loading. As discussed above, a tire can fail due to over-loading even when the tire interior temperature and pressure are within acceptable limits. Other tire monitors cannot sense such conditions.

In the discussion above, the use of the tire valve stem as an antenna has been discussed. An antenna can also be placed within the tire when the tire sidewalls are not reinforced with steel. In some cases and for some frequencies, it is sometimes possible to use the tire steel bead or steel belts as an antenna, which in some cases can be coupled to inductively. Alternately, the antenna can be designed integral with the tire beads or belts and optimized and made part of the tire during manufacture.

Although the discussion above has centered on the use of SAW devices, the configurations of FIGS. 31A and 31B can also be effectively accomplished with other pressure, temperature and accelerometer sensors particularly those based on RFID technology. One of the advantages of using SAW devices is that they are totally passive thereby eliminating the requirement of a battery. For the implementation of tire monitor assembly 175, the acceleration can also be used to generate sufficient electrical energy to power a silicon microcircuit. In this configuration, additional devices, typically piezoelectric devices, are used as a generator of electricity that can be stored in one or more conventional capacitors or ultra-capacitors. Other types of electrical generators can be used such as those based on a moving coil and a magnetic field etc. A PVDF piezoelectric polymer can also, and preferably, be used to generate electrical energy based on the flexure of the tire as described below.

FIG. 32 illustrates an absolute pressure sensor based on surface acoustic wave (SAW) technology. A SAW absolute pressure sensor 180 has an interdigital transducer (IDT) 181 which is connected to antenna 182. Upon receiving an RF signal of the proper frequency, the antenna 182 induces a surface acoustic wave in the material 183 which can be lithium niobate, quartz, zinc oxide, or other appropriate piezoelectric material. As the wave passes through a pressure sensing area 184 formed on the material 183, its velocity is changed depending on the air pressure exerted on the sensing area 184. The wave is then reflected by reflectors 185 where it returns to the IDT 181 and to the antenna 182 for retransmission back to the interrogator. The material in the pressure sensing area 184 can be a thin (such as one micron) coating of a polymer that absorbs or reversibly reacts with oxygen or nitrogen where the amount absorbed depends on the air density.

In FIG. 32A, two additional sections of the SAW device, designated 186 and 187, are provided such that the air pressure affects sections 186 and 187 differently than pressure sensing area 184. This is achieved by providing three reflectors. The three reflecting areas cause three reflected waves to appear, 189, 190 and 191 when input wave 192 is provided. The spacing between waves 189 and 190, and between waves 190 and 191 provides a measure of the pressure. This construction of a pressure sensor may be utilized in the embodiments of FIGS. 29A-31 or in any embodiment wherein a pressure measurement by a SAW device is obtained.

There are many other ways in which the pressure can be measured based on either the time between reflections or on the frequency or phase change of the SAW device as is well known to those skilled in the art. FIG. 32B, for example, illustrates an alternate SAW geometry where only two sections are required to measure both temperature and pressure. This construction of a temperature and pressure sensor may be utilized in the embodiments of FIGS. 29A-31 or in any embodiment wherein both a pressure measurement and a temperature measurement by a single SAW device is obtained.

Another method where the speed of sound on a piezoelectric material can be changed by pressure was first reported in Varadan et al., "Local/Global SAW Sensors for Turbulence" referenced above. This phenomenon has not been applied to solving pressure sensing problems within an automobile until now. The instant invention is believed to be the first application of this principle to measuring tire pressure, oil pressure, coolant pressure, pressure in a gas tank, etc. Experiments to date, however, have been unsuccessful.

In some cases, a flexible membrane is placed loosely over the SAW device to prevent contaminants from affecting the SAW surface. The flexible membrane permits the pressure to be transferred to the SAW device without subjecting the surface to contaminants. Such a flexible membrane can be used in most if not all of the embodiments described herein.

A SAW temperature sensor 195 is illustrated in FIG. 33. Since the SAW material, such as lithium niobate, expands significantly with temperature, the natural frequency of the device also changes. Thus, for a SAW temperature sensor to operate, a material for the substrate is selected which changes its properties as a function of temperature, i.e., expands with increasing temperature. Similarly, the time delay between the insertion and retransmission of the signal also varies measurably. Since speed of a surface wave is typically 100,000 times slower then the speed of light, usually the time for the electromagnetic wave to travel to the SAW device and back is small in comparison to the time delay of the SAW wave and therefore the temperature is approximately the time delay between transmitting electromagnetic wave and its reception.

An alternate approach as illustrated in FIG. 33A is to place a thermistor 197 across an interdigital transducer (IDT) 196, which is now not shorted as it was in FIG. 33. In this case, the magnitude of the returned pulse varies with the temperature. Thus, this device can be used to obtain two independent temperature measurements, one based on time delay or natural frequency of the device 195 and the other based on the resistance of the thermistor 197.

When some other property such as pressure is being measured by the device 198 as shown in FIG. 33B, two parallel SAW devices can be used. These devices are designed so that they respond differently to one of the parameters to be measured. Thus, SAW device 199 and SAW device 200 can be designed to both respond to temperature and respond to pressure. However, SAW device 200, which contains a surface coating, will respond differently to pressure than SAW device 199. Thus, by measuring natural frequency or the time delay of pulses inserted into both SAW devices 199 and 200, a determination can be made of both the pressure and temperature, for example. Naturally, the device which is rendered sensitive to pressure in the above discussion could alternately be rendered sensitive to some other property such as the presence or concentration of a gas, vapor, or liquid chemical as described in more detail below.

An accelerometer that can be used for either radial or tangential acceleration in the tire monitor assembly of FIG. 31 is illustrated in FIGS. 34 and 34A. The design of this accelerometer is explained in detail in Varadan, V. K. et al., "Fabrication, characterization and testing of wireless MEMS-IDT based microaccelerometers" referenced above and will not be repeated herein.

FIG. 35 illustrates a central antenna mounting arrangement for permitting interrogation of the tire monitors for four tires and is similar to that described in U.S. Pat. No. 4,237,728. An antenna package 202 is mounted on the underside of the vehicle and communicates with devices 203 through their antennas as described above. In order to provide for antennas both inside (for example for weight sensor interrogation) and outside of the vehicle, another antenna assembly (not shown) can be mounted on the opposite side of the vehicle floor from the antenna assembly 202. Devices 203 may be any of the tire monitoring devices described above.

FIG. 35A is a schematic of the vehicle shown in FIG. 35. The antenna package 202, which can be considered as an electronics module, contains a time domain multiplexed antenna array that sends and receives data from each of the five tires (including the spare tire), one at a time. It comprises a microstrip or stripline antenna array and a microprocessor on the circuit board. The antennas that face each tire are in an X configuration so that the transmissions to and from the tire can be accomplished regardless of the tire rotation angle.

Although piezoelectric SAW devices normally use rigid material such as quartz or lithium niobate, it is also possible to utilize PVDF provided the frequency is low. A piece of PVDF film can also be used as a sensor of tire flexure by itself. Such a sensor is illustrated in FIGS. 36 and 36A at 204. The output of flexure of the PVDF film can be used to supply power to a silicon microcircuit that contains pressure and temperature sensors. The waveform of the output from the PVDF film also provides information as to the flexure of an automobile tire and can be used to diagnose problems with the tire as well as the tire footprint in a manner similar to the device described in FIG. 31. In this case, however, the PVDF film supplies sufficient power to permit significantly more transmission energy to be provided. The frequency and informational content can be made compatible with the SAW interrogator described above such that the same interrogator can be used. The power available for the interrogator, however, can be significantly greater thus increasing the reliability and reading range of the system. In order to obtain significant energy based on the flexure of a PVDF film, many layers of such a film may be required.

There is a general problem with tire pressure monitors as well as systems that attempt to interrogate passive SAW or electronic RFID type devices in that the FCC severely limits the frequencies and radiating power that can be used. Once it becomes evident that these systems will eventually save many lives, the FCC can be expected to modify their position. In the meantime, various schemes can be used to help alleviate this problem. The lower frequencies that have been opened for automotive radar permit higher power to be used and they could be candidates for the devices discussed above. It is also possible, in some cases, to transmit power on multiple frequencies and combine the received power to boost the available energy. Energy can of course be stored and periodically used to drive circuits and work is ongoing to reduce the voltage required to operate semiconductors. The devices of this invention will make use of some or all of these developments as they take place.

If the vehicle has been at rest for a significant time period, power will leak from the storage capacitors and will not be available for transmission. However, a few tire rotations are sufficient to provide the necessary energy.

FIG. 37 illustrates another version of a tire temperature and/or pressure monitor 210. Monitor 210 may include at an inward end, any one of the temperature transducers or sensors described above and/or any one of the pressure transducers or sensors described above, or any one of the combination temperature and pressure transducers or sensors described above.

The monitor 210 has an elongate body attached through the wheel rim 213 typically on the inside of the tire so that the under-vehicle mounted antenna(s) have a line of sight view of antenna 214. Monitor 210 is connected to an inductive wire 212, which matches the output of the device with the antenna 214, which is part of the device assembly. Insulating material 211 surrounds the body which provides an air tight seal and prevents electrical contact with the wheel rim 213.

FIG. 38 illustrates an alternate method of applying a force to a SAW pressure sensor from the pressure capsule and FIG. 38A is a detailed view of area 38A in FIG. 38. In this case. the diaphragm in the pressure capsule is replaced by a metal ball 643 which is elastically held in a hole by silicone rubber 642. The silicone rubber 643 can be loaded with a clay type material or coated with a metallic coating to reduce gas leakage past the ball. Changes in pressure in the pressure capsule act on the ball 642 causing it to deflect and act on the SAW device 637 changing the strain therein.

An alternate method to that explained with reference to FIG. 38A using a thin film of lithium niobate 644 is illustrated in FIG. 39. In both of these cases, the lithium niobate 644 is placed within the pressure chamber which also contains the reference air pressure 640. A passage 645 for pressure feed is provided. In the embodiments shown in FIGS. 38, 38A and 39, the pressure and temperature measurement is done on different parts of a single SAW device whereas in the embodiment shown in FIGS. 30A and 30B, two separate SAW devices are used.

Figure 40:
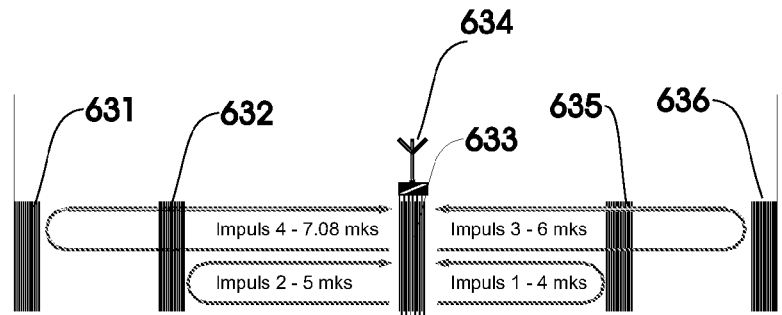
FIG. 40 illustrates a preferred four pulse design of a tire temperature and pressure monitor based on SAW.
Figure 40A:
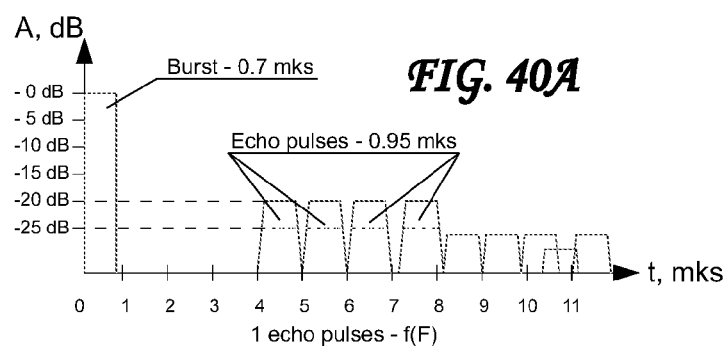
FIG. 40A illustrates the echo pulse magnitudes from the design of FIG. 40.

FIG. 40 illustrates a preferred four pulse design of a tire temperature and pressure monitor based on SAW and FIG. 40A illustrates the echo pulse magnitudes from the design of FIG. 40.

Figure 41:
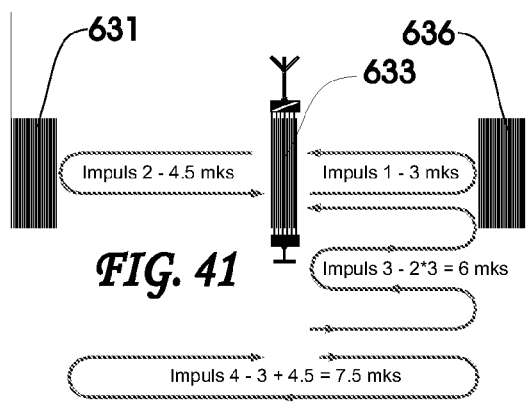
FIG. 41 illustrates an alternate shorter preferred four pulse design of a tire temperature and pressure monitor based on SAW.
Figure 41A:
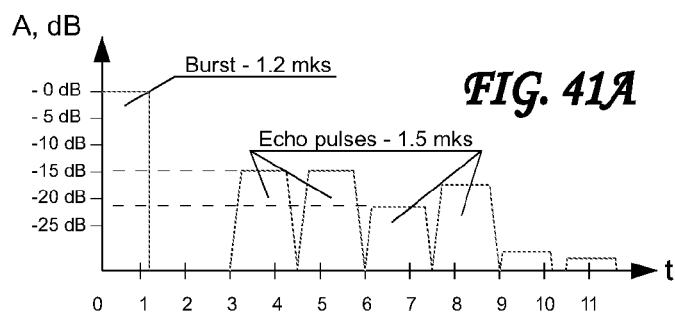
FIG. 41A illustrates the echo pulse magnitudes from the design of FIG. 41

FIG. 41 illustrates an alternate shorter preferred four pulse design of a tire temperature and pressure monitor based on SAW and FIG. 41A illustrates the echo pulse magnitudes from the design of FIG. 41. The innovative design of FIG. 41 is an improved design over that of FIG. 40 in that the length of the SAW is reduced by approximately 50%. This not only reduces the size of the device but also its cost.

1.4.1 Antenna Considerations

As discussed above in section 1.3.1, antennas are a very important part of SAW and RFID wireless devices such as tire monitors. The discussion of that section applies particularly to tire monitors but need not be repeated here.

1.4.2 Boosting Signals

FIG. 42 illustrates an arrangement for providing a boosted signal from a SAW device is designated generally as 220 and comprises a SAW device 221, a circulator 222 having a first port or input channel designated Port A and a second port or input channel designated Port B, and an antenna 223. The circulator 222 is interposed between the SAW device 221 and the antenna 223 with Port A receiving a signal from the antenna 223 and Port B receiving a signal from the SAW device 221.

In use, the antenna 223 receives a signal when a measurement from the SAW device 221 is wanted and a signal from the antenna 16 is switched into Port A where it is amplified and output to Port B. The amplified signal from Port B is directed to the SAW device 221 for the SAW to provide a delayed signal indicative of the property or characteristic measured or detected by the SAW device 221. The delayed signal is directed to Port B of the circulator 222 which boosts the delayed signal and outputs the boosted, delayed signal to Port A from where it is directed to the antenna 16 for transmission to a receiving and processing module 224.

The receiving and processing module 224 transmits the initial signal to the antenna 16 when a measurement or detection by the SAW device 221 is desired and then receives the delayed, boosted signal from the antenna 223 containing information about the measurement or detection performed by the SAW device 221.

The circuit which amplifies the signal from the antenna 223 and the delayed signal from the SAW device 221 is shown in FIG. 43. As shown, the circuit provides an amplification of approximately 6 db in each direction for a total, round-trip signal gain of 12 db. This circuit requires power as described herein which can be supplied by a battery or generator. A detailed description of the circuit is omitted as it will be understood by those skilled in the art.

As shown in FIG. 44, the circuit of FIG. 43 includes electronic components arranged to form a first signal splitter 225 in connection with the first port Port A adjacent the antenna 223 and a second signal splitter 226 in connection with the second port Port B adjacent the SAW device 221. Electronic components are also provided to amplify the signal being directed from the antenna 223 to the SAW device 221 (gain component 227) and to amplify the signal being directed from the SAW device 221 to the antenna 223 (gain component 228).

Figure 44A:
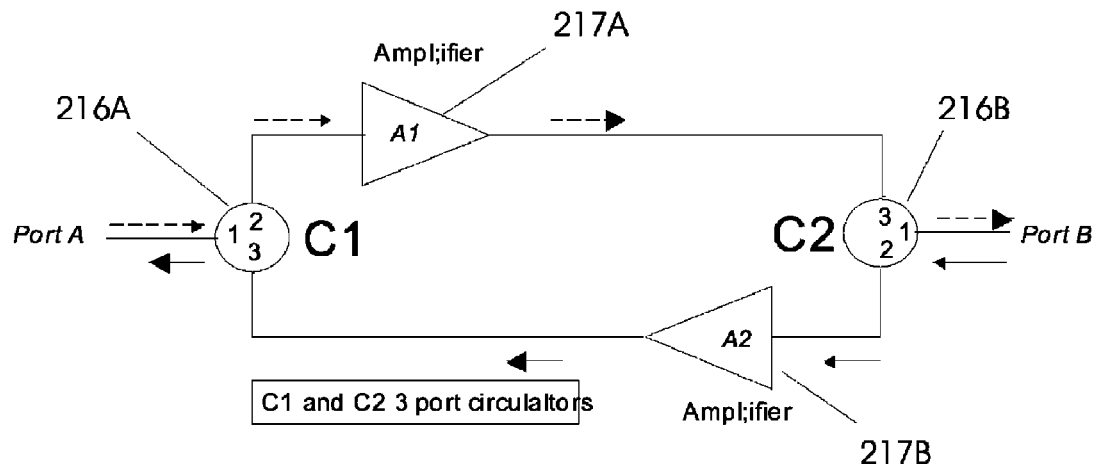
FIG. 44A is a block diagram of the two-port circular shown in FIG. 42 in which a pair of three-port circulators are provided.

As shown in FIG. 44A, the two-port circulator 222 can be constructed of a pair of active or passive three-port circulators 216A, 216B. Circulator 216A has a first port defining or coupled to Port A of FIG. 42, a second port leading to an input of amplifier 217A, and a third port leading from an output of a second amplifier 217B. Circulator 216B has a first port defining or coupled to Port B, a second port leading to an input of amplifier 217B and a third port leading from the output of amplifier 217A. Signal paths are represented by arrows in FIG. 44A. In operation, a signal from the antenna 223 goes into Port A and then into port 1 of circulator 216A and out of circulator 216A via its second port. The signal from circulator 216B is amplified by amplifier 217A and sent to the third port of circulator 216B where it comes out on port 1 to the SAW device 221 via Port B. A signal from the SAW device 221 goes into Port B and then into port 1 of circulator 216B and out of circulator 216B via its second port. The signal from circulator 216B is amplified by amplifier 217B and sent to the third port of circulator 216A where it comes out on port 1 to the antenna 223 via Port A. In one embodiment, amplifiers 217A, 217B typically have a gain of about 15 dB so that the round trip gain is about 30 B. Of course, the gain of amplifiers 217A, 217B is selectable as desired or required for the situation. Although this circuit is an active circuit, i.e., power is required to operate, passive circuits can also be designed to accomplished the same result.

Figure 44B:
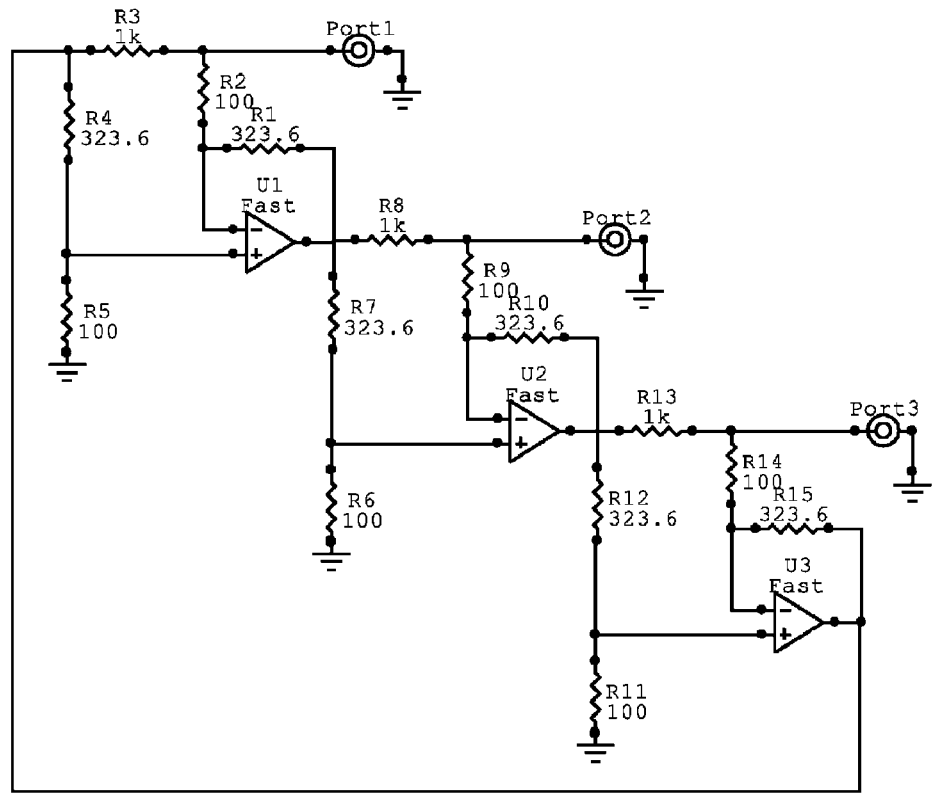
FIG. 44B is an exemplifying circuit diagram of a three-port circulator for use in the invention.

FIG. 44B shows an exemplifying embodiment of an active circuit representing each circulator 216A, 216B.

The circuit is powered by a battery, of either a conventional type or an atomic battery (as discussed below), or, when used in connection with a tire of the vehicle, a capacitor, super capacitor or ultracapacitor (super cap) and charged by, for example, rotation of the tire or movement of one or more masses as described in more detail elsewhere herein. Thus, when the vehicle is moving, the circuit is in an active mode and a capacitor in the circuit is charged. On the other hand, when the vehicle is stopped, the circuit is in a passive mode and the capacitor is discharged. In either case, the pressure measurement in the tire can be transmitted to the interrogator.

Instead of a SAW device 221, Port B can be connected to an RFID (radio frequency identification) tag or another electrical component which provides a response based on an input signal and/or generates a signal in response to a detected or measured property or characteristic.

Also, the circuit can be arranged on other movable structures, other than a vehicle tire, whereby the movement of the structure causes charging of the capacitor and when the structure is not moving, the capacitor discharges and provides energy. Other movable structures include other parts of a vehicle including trailers and containers, boats, airplanes etc., a person, animal, wind or wave-operated device, tree or any structure, living or not, that can move and thereby permit a properly designed energy generator to generate electrical energy. Naturally other sources of environmental energy can be used consistent with the invention such as wind, solar, tidal, thermal, acoustic etc.

FIGS. 45 and 46 show a circuit used for charging a capacitor during movement of a vehicle which may be used to power the boosting arrangement of FIG. 42 or for any other application in which energy is required to power a component such as a component of a vehicle. The energy can be generated by the motion of the vehicle so that the capacitor has a charging mode when the vehicle is moving (the active mode) and a discharge, energy-supplying phase when the vehicle is stationary or not moving sufficient fast to enable charging (the passive mode).

As shown in FIGS. 45 and 46, the charging circuit 230 has a charging capacitor 231 and two masses 232,233 (FIG. 45) mounted perpendicular to one another (one in a direction orthogonal or perpendicular to the other). The masses 232, 233 are each coupled to mechanical-electrical converters 234 to convert the movement of the mass into electric signals and each converter 234 is coupled to a bridge rectifier 235. Bridge rectifiers 235 may be the same as one another or different and are known to those skilled in the art. As shown, the bridge rectifiers 235 each comprise four Zener diodes 236. The output of the bridge rectifiers 235 is passed to the capacitor 231 to charge it. A Zener diode 44 is arranged in parallel with the capacitor 231 to prevent overcharging of the capacitor 231. Instead of capacitor 231, multiple capacitors or a rechargeable battery or other energy-storing device or component can be used.

An RF MEMS or equivalent switch, not shown, can be added to switch the circulator into and out of the circuit slightly increasing the efficiency of the system when power is not present. Heretofore, RF MEMS switches have not been used in the tire, RFID or SAW sensor environment such as for TPM power and antenna switching. One example of an RF MEMS switch is manufactured by Teravicta Technologies Inc. The company's initial product, the TT612, is a 0 to 6 GHz RF MEMS single-pole, double-throw (SPDT) switch. It has a loss of 0.14-dB at 2-GHz, good linearity and a power handling capability of three watts continuous, all enclosed within a surface mount package.

1.4.3 Energy Generation

There are a variety of non-conventional battery and battery less power sources for the use with tire monitors, some of which also will operate with other SAW sensors. One method is to create a magnetic field near the tire and to place a coil within the tire that passes through the magnetic field and thereby generate a current. It may even be possible to use the earth's magnetic field. Another method is to create an electrtric field and capacitively couple to a circuit within the tire that responds to an alternating electric field external to the tire and thereby induce a current in the circuit within the tire. One prior art system uses a weight that responds to the cyclic change in the gravity vector as the tire rotates to run a small pump that inflates the tire. That principle can also be used to generate a current as the weight moves back and forth.

One interesting possibility is to use the principle of regenerative braking to generate energy within a tire in a manner similar to the way such systems are in use on electric vehicles. Such a device can generate energy within each tire every time the vehicle is stopped. Such a regenerative unit can be a small device used in conjunction with a primary regenerative unit that could reside on the vehicle. Such a unit can be designed to operate just as the brakes are being applied and make use of the slip between the fixed and movable surfaces of the brake. many other methods will now be obvious wherein the relative motion of the two engaging surfaces of a brake assembly can be used to generate power. Another method, for example, could be to generate energy inductively between the moving and fixed brake surfaces or other surfaces that move relative to each other. A further method to generate energy could be based on movement of the plates of a capacitor relative to each other to generate a current. Many of these methods could be part of or separate from the brake assembly as desired by the skilled-in-the-art designer.

A novel method is to use a small generator that can be based on MEMS or other principles in a manner to that discussed in Gilleo, Ken, "Never Need Batteries Again" appearing at http://www.e-insite.net/epp/index.asp?layout=article& articleid=CA219070. This article describes a MEMS energy extractor that can be placed on any vibrating object where it will extract energy from the vibrations. Such a device would need to be especially designed for use in tire monitoring, or other vehicle or non-vehicle application, in order to optimize the extraction of energy. The device would not be limited to the variations in the gravity vector, although it could make use of it, but can also generate electricity from all motions of the tire including those caused by bumps and uneven roadways. The greater the vibration, the more electric power that will be generated.

FIGS. 47, 47A and 47B illustrate a tire pumping system having a housing for mounting external to a tire, e.g., on the wheel rim. This particular design is optimized for reacting to the variation in gravitational vector as the wheel rotates and is shown in the pumping design implementation mode. The housing includes a mass 241 responsive to the gravitational vector as the wheel rotates and a piston rod connected to, part of or formed integral with the mass 241. The mass 241 may thus have an annular portion (against which springs 242 bear) and an elongated cylindrical portion (movable in chambers) as shown, i.e., the piston rod or similar structure. The mass 241 alternately compresses the springs 242, one on each side of the mass 241, and draws in air through inlet valves 244 and exhausts air through exhaust valves 245 to enter the tire through nipples 243. Mass 241 is shown smaller that it would in fact be. To minimize the effects of centrifugal acceleration, the mass 241 is placed as close as possible to the wheel axis.

When the mass 241 moves in one direction, for example to the left in FIGS. 47A and 47B, the piston rod fixed to the mass 241 moves to the left so that air is drawn into a chamber defined in a cylinder through the inlet valve 244. Upon subsequent rotation of the wheel, the mass 241 moves to the right causing the piston rod to move to the right and force the air previously drawn into chamber through an exhaust valve 245 and into a tube leading to the nipple 243 and into the tire. During this same rightward movement of the piston rod, air is drawn into a chamber defined in the other cylinder through the other inlet valve 244. Upon subsequent rotation of the wheel, the mass 241 moves to the left causing the piston rod to move to the left and force the air previously drawn into chamber through an exhaust valve 245 and into a second tube leading to the other nipple 243 and into the tire. In this manner, the reciprocal movement of the mass 241 results in inflation of the tire.

Valves 244 are designed as inlet valves and do not allow flow from the chambers to the surrounding atmosphere. Valves 245 are designed as exhaust valves and do not allow flow from the tubes into the respective chamber.

In operation, other forces such as caused by the tire impacting a bump in the road will also effect the pump operation and in many cases it will dominate. As the wheel rotates (and the mass 241 moves back and forth for example at a rate of mg cos (ωt), the tire is pumped up.

In the illustrated embodiment, the housing includes two cylinders each defining a respective chamber, two springs 242, two tubes and an inlet and exhaust valve for each chamber. It is possible to provide a housing having only a single cylinder defining one chamber with inlet and exhaust valves, and associated tube leading to a nipple of the tire. The tire pumping system would then include only a single piston rod and a single spring.

The mass would thus inflate the tire at half the inflation rate when two cylinders are provided (assuming the same size cylinder is provided). It is also contemplated that a housing having three cylinders and associated pumping structure could be provided. The number of cylinders could depend on the number of nipples on the tire. Also, it is possible to have multiple cylinders leading to a common tube leading to a common nipple.

Alternately, instead of a pump which is operated based on movement of the mass, an electricity generating system can be provided which powers a pump or other device on the vehicle. FIG. 47C shows an electricity generating system in which the mass 241 is magnetized and includes a piston rod 238 and coils 262 are wrapped around cylinders 246A, 246B which define chambers 239A, 239B in which the piston rod 238 moves. As the tire rotates, the system generates electricity and charges a storage or load device 263 as described above. Thus, in this embodiment of an electricity generating system, the housing 240 is mounted external to the tire, or within the tire, and includes one or more cylinders 246A, 246B each defining a chamber 239A, 239B. The mass 241 is movable in the housing 240 in response to rotation thereof and includes a magnetic piston rod 238 movable in each chamber 239A, 239B. The magnetic piston rod 238 may be formed integral with or separate from, but connected to, the mass 241. A spring is compressed by the mass 241 upon movement thereof and if two springs 242 are provided, each may be arranged between a respective side of the mass 241 and the housing 240 and compressed upon movement of the mass 241 in opposite directions. An energy storage or load device 263 is connected to each coil 262, e.g., by wires, so that upon rotation of the tire, the mass 241 moves causing the piston 238 to move in each chamber 239A, 239B and impart a charge to each coil 262 which is stored or used by the energy storage or load device 263. When two coils 262 are provided, upon rotation of the tire, the mass 241 moves causing the piston rod 238 to alternately move in the chambers 239A, 239B relative to the coils 262 and impart a charge alternatingly to one or the other of the coils 262 which is stored or used by the energy storage or load device 263.

The energy storage device 263 can be used to power a tire pump 264 and coupled thereto can be a wire 271, and a tube 252 can be provided to couple the pump 264 to the nipple 293 of the tire. Obviously, the pump 264 must communicate with the atmosphere through the housing walls to provide an intake air flow.

The housing 240 may be mounted to the wheel rim or tire via any type of connection mechanism, such as by bolts or other fasteners through the holes provided. In the alternative, the housing 240 may be integrally constructed with the wheel rim.

Non-linear springs 242 can be used to help compensate for the effects of centrifugal accelerations. Naturally, this design will work best at low vehicle speeds or when the road is rough.

FIGS. 48A and 48B illustrate two versions of an RFID tag, FIG. 48A is optimized for high frequency operation such as a frequency of about 2.4 GHz and FIG. 48B is optimized for low frequency operation such as a frequency of about 13.5 MHz. The operation of both of these tags is described in U.S. Pat. No. 6,486,780 and each tag comprises an antenna 248, an electronic circuit 247 and a capacitor 249. The circuit 247 contains a memory that contains the ID portion of the tag. For the purposes herein, it is not necessary to have the ID portion of the tag present and the tag can be used to charge a capacitor or ultra-capacitor 249 which can then be used to boost the signal of the SAW TPM as described above. The frequency of the tag can be set to be the same as the SAW TPM or it can be different permitting a dual frequency system which can make better use of the available electromagnetic spectrum. For energy transfer purposes, a wideband or ultra-wideband system that allows the total amount of radiation within a particular band to be minimized but spreads the energy over a wide band can also be used.

Other systems that can be used to generate energy include a coil and appropriate circuitry, not shown, that cuts the lines of flux of the earth's magnetic field, a solar battery attached to the tire sidewall, not shown, and a MEMS or other energy-based generators which use the vibrations in the tire. The bending deflection of tread or the deflection of the tire itself relative to the tire rim can also be used as sources of energy, as disclosed below. Additionally, the use of a PZT or piezoelectric material with a weight, as in an accelerometer, can be used in the presence of vibration or a varying acceleration field to generate energy. All of these systems can be used with the boosting circuit with or without a MEMS RF or other appropriate mechanical or electronic switch.

Figure 49A:
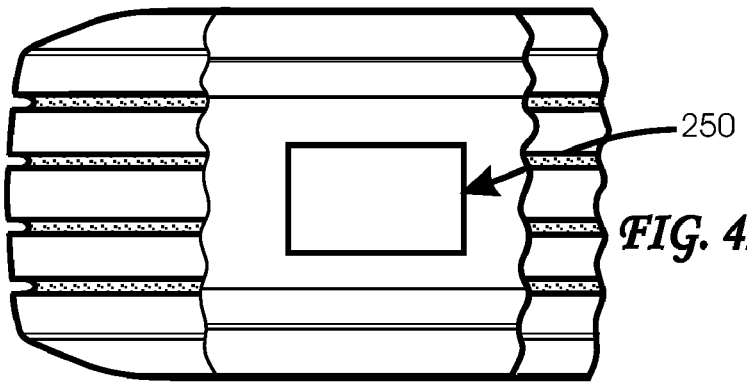
FIG. 49A shows a front view, partially broken away of a PVDF energy generator in accordance with the invention.
Figure 49B:
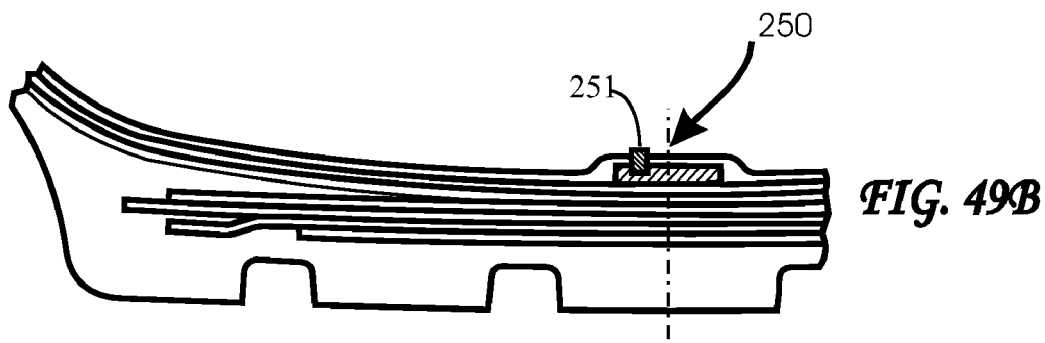
FIG. 49B is a cross-sectional view of the PVDF energy generator shown in FIG. 49A.
Figures 50B, 50D:
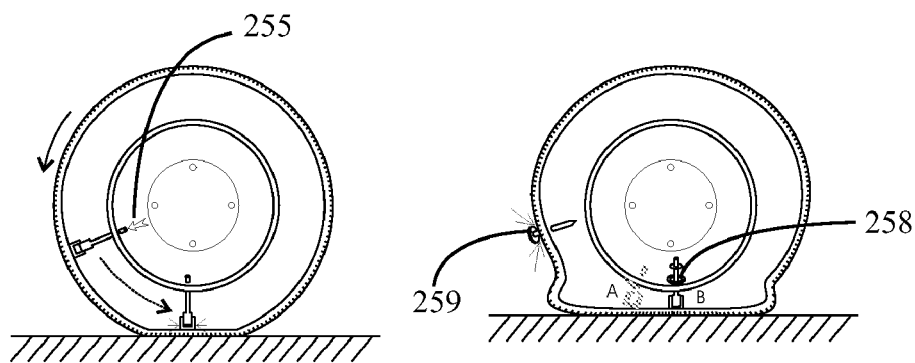
FIG. 50B shows a view of a first embodiment of a piston assembly of the energy generator shown in FIG. 50A.
FIG. 50D shows a position of the energy generator shown in FIG. 50A when the tire is flat.
Figures 50A, 50C:
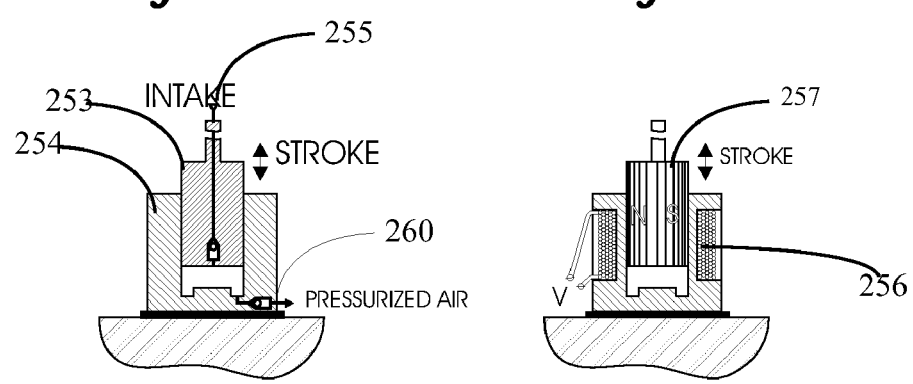
FIG. 50A is a front view of an energy generator based on changes in the distance between the tire tread and rim.
FIG. 50C shows a view of a second embodiment of a piston assembly of the energy generator shown in FIG. 50A.

FIGS. 49A and 49B illustrate a pad 250 made from a piezoelectric material such as polyvinylidene fluoride (PVDF) that is attached to the inside of a tire adjacent to the tread and between the side walls. Other PZT or piezoelectric materials can also be used instead of PVDF. As the material of the pad 250 flexes when the tire rotates and brings the pad 250 close to the ground, a charge appears on different sides of the pad 250 thereby creating a voltage that can be used along with appropriate circuitry, not shown, to charge an energy storage device or power a vehicular component. Similarly, as the pad 250 leaves the vicinity of the road surface and returns to its original shape, another voltage appears having the opposite polarity thereby creating an alternating current. The appropriate circuitry 251 coupled to the pad 250 then rectifies the current and charges the energy storage device, possibly incorporated within the circuitry 251.

Variations include the use of a thicker layer or a plurality of parallel layers of piezoelectric material to increase the energy generating capacity. Additionally, a plurality of pad sections can be joined together to form a belt that stretches around the entire inner circumference of the tire to increase the energy-generating capacity and allow for a simple self-supporting installation. Through a clever choice of geometry known or readily determinable by those skilled in the art, a substantial amount of generating capacity can be created and more than enough power produced to operate the booster as well as other circuitry including an accelerometer. Furthermore, PVDF is an inexpensive material so that the cost of this generator is small. Since substantial electrical energy can be generated by this system, an electrical pump can be driven to maintain the desired tire pressure for all normal deflation cases. Such a system will not suffice if a tire blowout occurs.

A variety of additional features can also be obtained from this geometry such as a measure of the footprint of the tire and thus, when combined with the tire pressure, a measure of the load on the tire can be obtained. Vibrations in the tire caused by exposed steel belts, indicating tire wear, a nail, bulge or other defect will also be detectable by appropriate circuitry that monitors the information available on the generated voltage or current. This can also be accomplished by the system that is powered by the change in distance between the tread and the rim as the tire rotates coupled with a measure of the pressure within the tire.

FIGS. 50A-50D illustrate another tire pumping and/or energy-generating system based on the principle that as the tire rotates the distance from the rim to the tire tread or ground changes and that fact can be used to pump air or generate electricity. In the embodiment shown in FIGS. 50A and 50B, air from the atmosphere enters a chamber in the housing or cylinder 254 through an inlet or intake valve 255 during the up-stroke of a piston 253, and during the down-stroke of the piston 253, the air is compressed in the chamber in the cylinder 254 and flows out of exhaust valve 260 into the tire. The piston 253 thus moves at least partly in the chamber in the cylinder 254. A conduit is provided in the piston 253 in connection with the inlet valve 255 to allow the flow of air from the ambient atmosphere to the chamber in the cylinder 254.

In the electrical energy-generating example (FIG. 50C), a piston 257 having a magnet that creates magnet flux travels within a coil 256 (the up and down stroke occur at least partly within the space enclosed by the coil 256) and electricity is generated. The electricity is rectified, processed and stored as in the above examples. Naturally, the force available can be substantial as a portion of the entire load on the tire can be used.

The rod connecting the rim to the device can be designed to flex under significant load so that the entire mechanism is not subjected to full load on the tire if the tire does start going flat. Alternately, a failure mode can be designed into the mechanism so that a replaceable gasket 258, or some other restorable system, permits the rod of the device to displace when the tire goes flat as, for example, when a nail 259 punctures the tire (see FIG. 50D). This design has a further advantage in that when the piston bottoms out indicating a substantial loss of air or failure of the tire, a once-per-revolution vibration that should be clearly noticeable to the driver occurs. Naturally, several devices can be used and positioned so that they remain in balance. Alternately this device, or a similar especially designed device, by itself can be used to measure tire deflection and thus a combination of tire pressure and vehicle load.

An alternate approach is to make use of a nuclear micro-battery as described in, A. Amit and J. Blanchard "The Daintiest Dynamos", (http://www.spectrum.ieee.org/WEB-ONLY/publicfeature/sep04/0904nuc.html#t1 ) IEEE Spectrum online 2004. Other energy harvesting devices include an inductive based technology from Ferro Solutions Inc. These innovative ideas and more to come are applicable for powering the devices described herein including tire pressure and temperature monitors, for example.

Ultra-capacitors are now being developed to replace batteries in laptop computers and other consumer electronic devices. They also have a unique role to play in tire monitors when energy harvesting systems are used and generally as replacement for batteries. A key advantage of an ultra-capacitor is its insensitivity to high temperatures that can destroy conventional batteries or to low temperatures that can temporarily render them non-functional. Ultra-capacitors also do not require replacement when their energy is exhausted and can be simply be recharged rather than requiring replacement as in the case of batteries.

1.4.4 Communication, RFID

One problem discussed in relevant patents and literature on tire monitoring is the determination of which tire has what pressure. A variety of approaches have been suggested in the current assignee's patents and patent applications including placing an antenna near each wheel, the use of highly directional antennas (one per wheel but centrally located), the use of multiple antennas and measuring the time of arrival or angle of arrival of the pulses and the use of an identification code, such as a number, that is transmitted along with the tire pressure and temperature readings. For this latter case, the combination of an RFID with a SAW TPM is suggested herein. Such a combination RFID and SAW in addition to providing energy to boost the SAW system, as described above, can also provide a tire ID to the interrogator. The ID portion of the RFID can be a number stored in memory or it can be in the form of another SAW device. In this case, a PVDF RFID Tag can be used that can be manufactured at low cost. Specifically, the PVDF ID inter-digital transducers (IDTs) can be printed onto the PVDF material using an ink jet printer, for example, or other printing method and thus create an ID tag at a low cost and remove the need for memory in the RFID electronic circuit.

The SAW-based tire monitor can preferably be mounted in a vertical plane to minimize the effects of centrifugal acceleration. This can be important with SAW devices due to the low signal level, unless boosted, and the noise that can be introduced into the system by mechanical vibrations, for example.

Use of a SAW-based TPM, and particularly a boosted SAW-based TPM as described herein, permits the aftermarket replacement for other battery-powered TPM systems, such as those manufactured by Schrader, which are mounted on the tire valves with a battery-less replacement product removing the need periodic replacement and solving the disposal problem.

Although in general, use of a single TPM per tire or wheel is discussed and illustrated above, it is also possible to place two or more such devices on a wheel thereby reducing the effect of angular position of the wheel on the transmission and reception of the signal. This is especially useful when passive SAW or RFID devices are used due to their limited range. Also, since the cost of such devices is low, the cost of adding this redundancy is also low.

U.S. Pat. No. 6,581,449 describes the use of an RFID-based TPM as also disclosed herein wherein a reader is associated with each tire. In the invention herein, the added cost associated with multiple interrogators, or multiple antennas connected with coax cable, is replaced with the lower cost solution of a single interrogator and multiple centrally located antennas.

The ability to monitor a variety of tires from a single location in or on a vehicle has been discussed above as being important for keeping the cost of the system low. The need to run a wire to each wheel well, and especially if this wire must be a coax cable, can add substantially to the installed system cost. One method of increasing the range of RFID is described in Karthaus, U. et al. "Fully integrated passive UHF RFID transponder IC with 16.7 microwatt Input Power" IEEE Journal of Solid-State Circuits, Vol. 38, No. 10, October 2003 and is applicable to the inventions disclosed herein. Another approach is to make use of the intermittent part of FCC Rule 15 wherein the transmissions per hour are limited to 2 seconds. In that case, the transmitted power can be increased substantially which can result in an 80 db gain which can very substantially increase the distance permitted from the antenna to the SAW or RFID device. Also, Niekerk describes an extended-range RFID that is useable with at least one invention disclosed herein as described in U.S. Pat. Nos. 6,463,798, 6,571,617 and U.S. patent application publication Nos. 20020092346 and 20020092347.

When using an RFID device as described herein, the frequency the RFID device transmits can be different from the frequency used to power the device and both can be different from the frequency used by a SAW device that may be present. Sometimes a low frequency in the KHz range can be used to pass energy to a tire-mounted device as the device can be in the near field which can be more efficient for energy transfer. On the other hand, a directional high frequency transmission, for example in the 900 MHz range, may be more efficient for information transfer. Also, FCC rules may permit higher transmit power for some frequencies such as Radar which can make these frequencies better for power transfer.

When a box, for example, contains 100 RFID tags (which may be passive tags), the RFID industry has developed methods to read and write to all 100 tags without data collision problems. This is partially due to the digital nature of the RFID communication protocols. See, for example GB 2,259, 227, WO 9,835,327, WO 241,650, U.S. Pat. Nos. 3,860,922, 4,471,345, 5,521,601, 5,266,925, 5,550,547, 5,521,601, 5,673,037, 5,515,053, 6,377,203, and U.S. patent application publication Nos. 20020063622 and 20030001009. When communicating with a SAW device, analogue information is received from each SAW making it more difficult to separate the transmissions from the four tires using a single, centrally mounted antenna system. Thus if the signals were purely RFID-based, then this separation can be achieved but with SAW systems, even thought they have a greater range than RFID systems, this separation is more difficult. Discussions above have addressed this problem using smart antennas, multiple antennas and other mechanisms that use information related to tire rotation etc. Others in the industry have solved the problem by putting an antenna in each wheel well which significantly increases the installation costs since the wires to each wheel well should be coax cables. The solution described below is thus a significant breakthrough in this field.

The following discussion is directed to a preferred embodiment of a tire pressure and temperature sensor based on SAW but using a companion RFID device in a novel and unique manner. In this design, sketched in FIG. 91, one or more RFID devices 302 each function as, controls or includes a switch 315 that turns on when it receives its appropriate code. This technique is equally applicable to other SAW-based sensors and is not limited to tire monitors. Each sensor assembly (tire pressure monitor or other) can include an antenna 303 in series with an RFID device 302/switch 315 in series with the SAW sensor 304. Each RFID device 302 has a programmable address (which may or may not come pre-programmed) and either has within, or can control externally, switch 315 that connects or disconnects the SAW sensor 304 from a circuit. The interrogator 309 can send either RFID device commands or can send SAW device interrogation pulses. RFID commands can be:

<Address> enable switch 315

All sensors disable

When the RFID device 302 receives the enable command from the interrogator 309, matched to its address, it can close the switch 315 and connect the SAW sensor 304 to the receive antenna 303. The interrogator 309 will then send a SAW interrogation signal to be received by the SAW sensor 304 (which can be part of a preferred pressure sensor) a single pulse and monitor the received transmission from the SAW sensor 304. After the transmission is received, the interrogator 309 will then send the disable command.

When the RFID device 302 sees the global disable command, it can open the switch 315, disconnecting the SAW sensor 304 from the circuit with the receive antenna 303. In this manner, only one SAW sensor 304 will respond at any given time. This can be advantageous for a tire pressure and temperature device, for example, in that coherent interference greatly influences the ability of the interrogator circuitry to accurately measure phase change, for example. This means that if multiple sensors responded at the same time, the accu racy of the system can be substantially degraded. Consider the following example:

Input information:
Radiated power of interrogator to remain within FCC requirements—$P_{burst}$=0.5 W;
Radiated frequency—433.92 MHz;
Total losses of a radio signal cycle—50 to 55 dB consisting of;
$IL_{sens.}$=−20 dB—sensor losses;
$IL_{inpt.}$=−15-17.5 dB—Losses in transmission from the interrogator to the sensor;
$IL_{out.}$=−15-17.5 dB—Losses in transmission from the sensor to the interrogator.
Transponder's antenna impedance—$R_{sens.}$=75 Ohm.
The pulse amplitude $U_{pic.}$ in the sensor's antenna (input signal) is:

$$Upic.=1.4* \sqrt{Pburs. *ILinpt. *Rsens.}=1.144\text{-}1.525 \text{ V}$$

Figure 51:
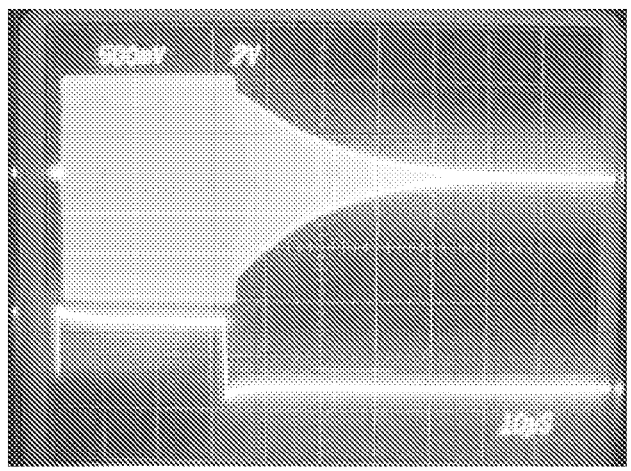
FIG. 51 is an oscilloscope trace by Transense Technologies, which one confirms correspondence between interrogator pulse and voltage at the saw antenna.

This is consistent with work of Transense Technologies in their published results where they show oscilloscope traces of a 500 mv interrogator pulse measured at the SAW antenna yielding a larger than 1 volt pulse in the SAW circuit as shown in FIG. 51.

Figure 52A:
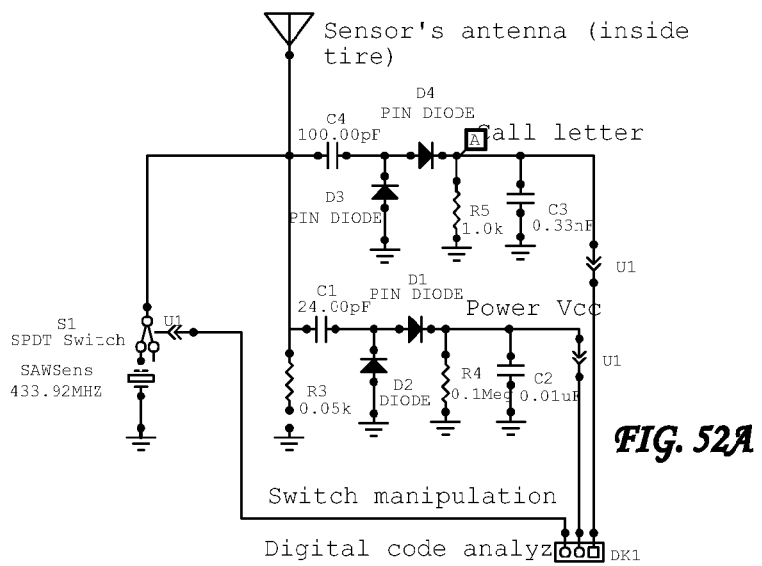
FIG. 52A illustrates an electronic circuit such as used by Transense Technologies for their SAW based tire temperature and pressure monitor.

An example of the electric circuit for such transponder is shown in FIG. 52A.

Figure 53:
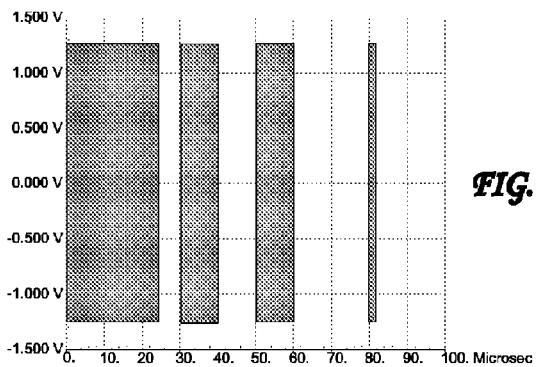
FIG. 53 is an oscillogram of RF pulses, which are radiated the interrogator.

An oscillogram of RF pulses, which are radiated by the interrogator, are illustrated in FIG. 53.

Figure 54:
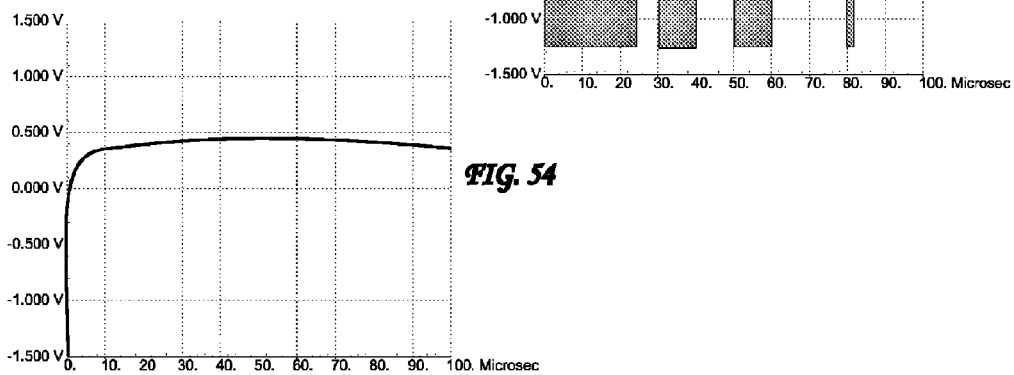
FIG. 54 show diodes which transpose any signal from the antenna to a supply voltage (approximately 1.2V) for a digital code analyzer and sensor's SPDT switch S1
Figure 55:
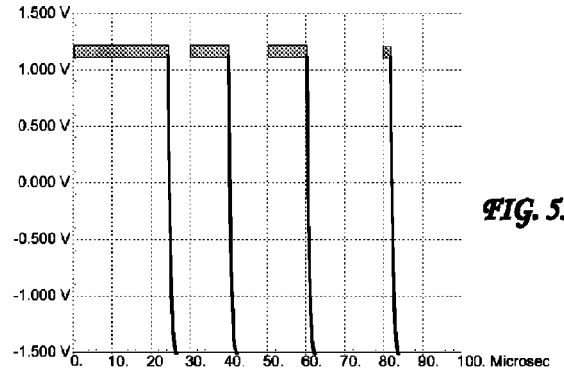
FIG. 55 shows diode detectors D3 and D4 which transpose signals from the antenna to digital code.

The transponder's antenna is connected to two diode detectors, D1 and D2, which transpose the signal from the antenna to create a supply voltage (approximately 1.2 V) for the digital code analyzer DK1 and sensor's SPDT switch S1 as shown in FIG. 54. FIG. 55 illustrated the output from diode detectors D3 and D4 which transpose signals from the antenna to digital code.

If the code sequence from the interrogator corresponds to an individual code of the given sensor, the digital code analyzer causes a switch to be turned on. In the illustrated example, the code sequence consists of two pulses. The number of pulses can of course be increased and, as discussed below, a 32 or 64 bit switch is contemplated for some implementations.

Generally, the pulse duration of the power excitation and call letter signals can be 70 to 80 microseconds as shown. During this time period, the supply voltage is relatively constant and the sensor is not connected to the antenna. Thus there are no echo pulses excited in the sensor.

If the code sequence is correct and a turn-on voltage for the switch is received, the sensor is connected to the antenna. This state remains for a long time such as hundreds of microseconds. The SAW sensor is thus ready to measure the temperature and pressure. After sensing an interrogation pulse to the SAW sensor, it is necessary to pause before for approximately 20 microseconds (in this case) before sending a new interrogating pulse. This pause is necessary in order to let the echo pulses which still remain from the previous interrogating pulse to die out or dissipate. Thus, it is possible to execute sequentially 10 to 30 cycles of independent measurements since the retention time of a supply voltage is 300 to 500 microseconds.

A sensor can be disconnected from the antenna for one of two reasons:
1. When a special code sequence is received, the turn off all sensors code. This code sequence is the same for all sensors.
2. If the supply voltages has decreased below a threshold and no pulses come from the antenna which can happen, for example, when the vehicle is parked. In the illustrated example, this will happen in approximately 10 milliseconds.

Modeling of the circuit design has been done with the "CircuitMaker 2000" software package. It was assumed that a special microcircuit chip with a 1 to 1.5 V supply voltage and approximately a 10 microampere current mode is used. It conforms to the equivalent resistance which is connected to power supply, 10 K. Such microcircuit chips are used in electronic watches and micro calculators. Note that for a particular design if the supply voltage proves insufficient, it is possible to use diode voltage multipliers (in the circuit's schematic, a doubling diode detector is shown).

The above discussion assumes that the interrogator knows the switch ID for each wheel or other such device on the vehicle. Initially or after a tire rotation, for example, or the addition of additional similar devices, the vehicle interrogator will not know the switch IDs and thus a general method is required to teach the interrogator this information. Many schemes exist or can be developed to accomplish this goal. Each of the devices can be manually activated, for example, under an interrogator learning mode or through the use of a manual switch on each tire. An alternate and preferred method is to have this accomplished automatically as in plug-and-play. One way of accomplishing this will now be described but this invention is not limited to this particular method and encompasses any and all methods of automatically locating an RFID, SAW or similar sensing device including tire temperature and pressure monitors, other temperature, liquid level, switch, chemical etc. sensors as discussed anywhere else herein and other similar type devices that are not discussed herein. See also, for example, U.S. Pat. No. 6,577,238.

In a preferred implementation, each device is also provided with a conventional RFID tag which can be read with a general command in a similar method as conventional RFID tags. These tags may operate at a different frequency than the RFID switch discussed above. The RFID tag associated with a particular device will have either the same code as the RFID switch or one where the switch code is derivable from the tag code. The interrogator on key on, or at some other convenient time, will interrogate all RFID tags that are resident on the vehicle and record the returned identification numbers. During this process it will also determine the location of each tag based on time of flight, time of arrival at different elements of an antenna array, angle of arrival, coefficients of a smart antenna (such as Motia), or any other similar method. This is possible since the tags will be sending digital information according to a fixed protocol. This can be much more difficult to achieve with analogue data sent by a SAW transponder or sensor where the exact format can depend on the value of the measurements being made. Thus, by this method, the interrogator can determine the ID of the RFID switch and its location in a simple manner. Since this is a very infrequent event and in fact the interrogator can be designed to only conduct this polling operation once per hour or even no more than once per day, the power that can be transmitted by the interrogator can be the maximum allowable for the chosen frequency by the FCC. RFID readers can now read tags at a distance exceeding 3 meters, for example, can sort out 100 or more tags simultaneously. Note, that by using this method, the high power that is only intermittently allowed by FCC regulations is only needed to determine what devices are on the vehicle and where they are located. After this is known, a much lower power operation is used for switching the RFID switch and interrogating the SAW sensor.

The switching component that accompanies the RFID switch can be a FET, MEMS, PIN diode or CMOS device or equivalent (see, e.g., Prophet, G "MEMS flex their tiny muscles" pp. 63-72, EDN Magazine, Feb. 7, 2002). RF switches are designed to switch Radio Frequency signals, usually from the antenna. They must have low losses and be able to match the impedances to keep the standing ware ratio low. Some are designed to switch specific impedances e.g. 50 ohm, or 75 ohms and others are wide band and can switch from DC to GH signals. The three common types are:

1. MEMS which are mechanical. Wide band, low loss, can switch watts and requires milliwatts of Power to operate. The switching speed is in the microsecond to milliseconds range. One example switches in microseconds and requires (5 volts @ 1 ma) 5 mw DC power to operate. Others exist with lower switching voltage and power.

2. PIN Diode switches. Wide band, medium switching loss, switches watts and requires low power to operate. The switching speed is fast. Some are designed for specific impedances e.g. 50 ohm etc.

3. GaAs FET. These provide very fast switching with medium switching losses, microwatts of power are required to switch. Some require dual supply voltages to control switch.

The RF switch switches on and off the sensor which can be a SAW sensor to the antenna under control of a signal that comes from identification device. Desirable properties of the RF switch are:

Minimal level of required control voltage (1 V-2 V is preferred);
Minimal current consumption (less then 1 microampere is preferred);
High off isolation (should be not less then 30 dB) when drive signal is absent on control input pins;

Two types of RF switches have been tested for use in transponder. They are: ADG936BRU (absorptive) and ADG936BRU-R (reflective) ICs from Analog Devices (See specifications of RF-switches ADG936BRU " ADG936BRU-R from Analog Devices).

Figure 52B:
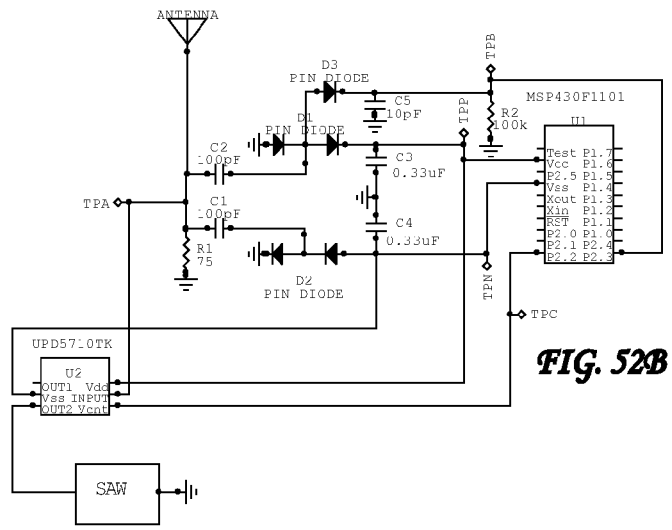
FIG. 52B illustrates an improved electronic circuit for use with an FID switch.
Figure 52C:
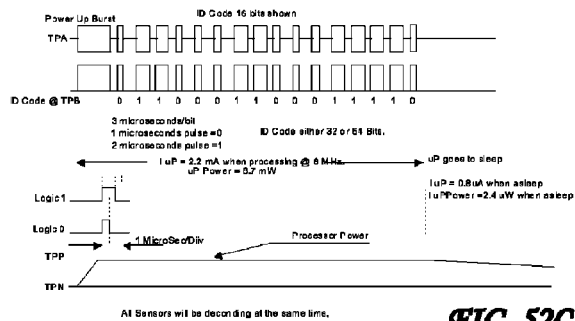
FIG. 52C is the timing diagram corresponding to FIG. 52B.

FIG. 52B illustrates an electronic circuit that can be used with the RFID switch discussed above and FIG. 52C illustrates an example of its timing diagram. The circuit operates as follows. The interrogator (not shown) transmits a high power RF pulse train which is received by all sensors. The power pulse is rectified by PIN diode circuits D1 and D2 charging Capacitors C3 and C4. This is the power source for the transponder. The voltage TPN to TPP is the supply voltage. The ID code is shown at TPB, this is the input to the comparator in the microprocessor. The microprocessor decodes the signal, the one and only one which has the matching Code will switch the CMOS switch U2 connecting the antenna to the SAW device which will respond. Note the normal interrogator pulses follow the ID code and are not shown on the above timing diagram.

All sensors not having the sent code will immediately go to sleep at the end of the ID code, only the one with matching code will switch its U2 CMOS switch. The microprocessor with the matching code will turn off U2 and go to sleep at the end of the SAW sensor's response. Since all SAW sensors receive the Power UP and ID code signal, all sensors will remain powered up at normal interrogation times. If there is a long time between interrogations, the Power UP and ID code will put all sensors in operation.

It is also proposed that an output from the microprocessor be made available so that, before the sensor is installed or put into the tire in the case of the TPM, the interrogator can read and store the ID code for the unit. This would eliminate the housekeeping chore of keeping track of codes. Each sensor will have a unique ID number, for a 64 bit code there are 1.8447 x E19 codes available. That's about 4k codes per each person in the world!

Power can also be supplied by a PZT circuit, or other energy harvesting method as discussed herein, which can generate voltage for an ultracapacitor by the motion of the tire. The microprocessor will operate with a supply voltage from 2.2 to 3.6 volts. There are others that will operate below this level but the selected CMOS switch won't operate below about 2.2 volts. The MSP430F is a low cost 16 bit microprossor from Texes Instruments. The above assumes a Pburst of at least 0.5 Watts from the interrogator as per FIG. 51.

This universal concept can now be used for all situations where a device is to be turned on wirelessly when the ID code is not initially known. This concept can be used with RFID tags that operate at any frequency from 12 KHz to 24 GHz and beyond. It can be at the same frequency as the RFID switch or at a different frequency. If the same frequency is used then the switch code can be different but derivable from the RFID tag. For example, the tag code can always be an odd number and the switch code equal the tag code plus 1. Any code length can be used but the preferred code length is 32 bits since it provides 4.3 billion unique codes which is sufficient for dozens of devices per vehicle.

The above discussion has covered SAW transponders and RFID transponders and the combination of an RFID switch with SAW and RFID tag transponders. RFID tags can send data as well as their ID. The SAW device, however, provides an analogue output which in general is interpreted by the interrogator to determine the tire pressure and temperature, for example. The incorporation of a typical analogue to digital converter generally requires more power than is readily available in the systems that have been described herein. However, the SAW device can and does in some of the above TPM examples provide a series of pulses that relate to the temperature and pressure, for example, that can also be interpreted as digital codes. These codes, with appropriate circuitry, can be converted into bits of data and communicated by an RFID tag thus eliminating the need to send data to the SAW from the interrogator. This also eliminates the need for the RFID switch. The drawback of such a system is that now the power sufficient to operate an RFID tag at a distance of two or more meters can exceed the limitations of Rule 15 of the FCC regulations which allows an occasional high powered transmission but not a continuous periodic transmission. However, this problem can disappear with improvements in circuitry and/or changes in or special exceptions allowed to the FCC rules.

In addition to SAW devices for temperature and pressure measurement, other low power devices exist such as capacitive, inductive or resistive-based temperature and pressure sensors and their use in conjunction with an RFID tag is contemplated by the invention disclosed herein. For a similar application of a combined passive RFID tag and a sensor see D. Watters "Wireless Sensors Will Monitor Bridge Decks", Better Roads Magazine, Feb. 2003. Previously, combined RFID tags and sensors that are passive have not been used on vehicles for tire temperature and pressure monitoring or for any other purpose. With the exception of the bridge deck monitor, when sensors have been used with passive RFID tags, only the tag has obtained its power from the RF signal while the sensor has been separately battery or otherwise powered (see, e.g., U.S. Pat. No. 6,377,203).

An alternate SAW based tire pressure and temperature monitor is illustrated in FIGS. 90A and 90B. This design uses a very low power circuit such that the power can be supplied by radio frequency in the same way that RFID tags are powered. Alternately the power can be supplied by an energy harvesting device or even a very long life battery or ultracapacitor. A block diagram is shown in FIG. 90A where:

Oscillator A can be either a delay line or resonator depending on how the sensor, for example a SAW, is used.

Oscillator B can be either a delay line or resonator depending on how the sensor, for example a SAW, is used.

F1 is the frequency which is determined by the sensor, for example the SAW.

F2 is the frequency which is determined by F1 but also varies with temperature.

F3 is the frequency which is determined by F1 but also varies with temperature and pressure.

1 is a signal point in FIG. 90A at the mixer A output and is equal to (F2+F1)+(F2−F1)

4 is a signal point in FIG. 90A at the mixer A after filtering output and is equal (F2−F1) which is a function of temperature.

2 is a signal point in FIG. 90A at the mixer B output and is equal to=(F3+F2)+(F3−F2)

3 a signal point in FIG. 90A at the mixer B after filtering output and is equal (F3−F2) which is a function of temperature.

The microprocessor measures frequency 3 and 4 by counting. It also stores a 32, for example, bit ID codes and the pressure and temperature calibration constants.

The operation is as follows. The Oscillator A and Oscillator B may be delay line oscillators or resonator oscillators. The SAW device is connected to low power Oscillator A and Oscillator B. The SAW determines the frequency of the Oscillator A and Oscillator B. The frequency, F2 of Oscillator A, changes with temperature. The frequency, F3 of Oscillator B, changes with temperature and with pressure. The frequency F1 (Crystal Controlled) for the microprocessor is stable with temperature. Mixer (MIX A) multiplies F2 and F1 giving an output of (F2+F1) and (F2−F1), the LP Filter (low pass filter) eliminates the (F2+F1) frequency leaving the output at 4 of (F2−F1) which is a function of the temperature. The temperature function is measured by counting with the microprocessor. The scale factor correction (stored in the microprocessor) sets the scale for temperature. The value is a digital number stored in the microprocessor.

Mixer (MIX B) multiplies frequencies F2 and F3 having an output of (F3+F2) and (F3−F2), the low pass filter (LP Filter) removes the (frequency (F3+F2) leaving the output at 3 of (F3−F2) which is the F(PSI) which is measured by the microprocessor by counting. The scale factor correction for PSI is stored in the microprocessor at calibration time. The resulting output is the corrected PSI which is stored in the microprocessor. The microprocessor controls an RF transmitter which transmits the ID (identification code) of the unit along with temperature and pressure to the receiver. The transmission is pseudo random. Between readings, the RF transmitter is OFF, and the microprocessor is in the sleep mode so that the average power is very low.

There is a connection to the microprocessor for calibration. At manufacture, the ID code typically 32 bits is stored in the microprocessor. Controlled temperature and pressure is applied to the unit, scale factors are determined and stored in the microprocessor. This allows for variation in SAW devices to be compensated. Before the unit is put into operation (into a tire etc.) the unit is plugged into the display unit which reads and stored the ID code. This is done using the Cal and install connector.

The central unit, the Display unit has an RF receiver which listens for a response, it reads the ID code, checks the ID against its stored codes and if the code agrees displays the readings. If two codes arrive at the same time, they are disregarded and since the units talk at random the next readings will arrive at different times and there will be no contention. The transmitter sends the ID and data at frequency F(x) which is totally independent of the frequency of the SAW device. The transmitted signal is more tolerant to noise since the signal transmitted is digital and not low level analog. Also the transmitted path is one way so signal losses are lower. All components except the SAW are low power and low cost CMOS parts. Power is supplied circuit 2 at a frequency independent of the F(x) frequency.

1.4.5 Exterior Tire Temperature Monitor

An externally-mounted tire temperature sensor will now be discussed. FIG. 56 illustrates a tire temperature sensor that is not mounted on the tire in accordance with an embodiment of one of the inventions herein. The tire temperature sensor 265 is mounted on the vehicle in a position to receive thermal radiation from the tire 266, e.g., situated in a tire well 267 of the vehicle. Each tire well of the vehicle can include one or more temperature sensors 265. If more than one tire is present in a well, e.g., on trucks, then the placement of a plurality of sensors would be advantageous for the reasons discussed below.

As shown in FIG. 56A, temperature sensor 265 includes a temperature measuring component 265A, a power supplying/temperature measurement initiating component 265B coupled to the temperature measuring component 265A and a temperature transmission component 265C also coupled to the temperature measuring component 265A.

Temperature measuring component 265A may be a transducer capable of measuring temperature within about 0.25 degrees (Centigrade). This becomes a very sensitive measure, therefore, of the temperature of the tire if the measuring component 265A is placed where it has a clear view of the tire tread or sidewall, i.e., the tire is in the field of view of the measuring component 265A. The status of a tire, for example whether it is worn and needs to be replaced, damaged or operating normally, can then be determined in a processor or central control module 268 by comparing it to one or more mating tires on the vehicle. In the case of a truck trailer, the mating tire would typically be the adjacent tire on the same axle. In an automobile, the mating tire could be the other tire at the front or back of the vehicle. Thus, for a sport utility vehicle (SUV), the temperature of the two rear tires of the SUV can be compared and if one is hotter than the other than it can be assumed that if this temperature differential persists that the hotter tire is under-inflated, delaminating, has a damaged carcass or is otherwise defective.

Temperature measuring component 265A will usually require power to enable it to function. Power is therefore supplied by the power supplying/temperature measurement initiating component 265B which may be in the form of appropriate circuitry. When inductively powering sensor 265, power supplying component 265B is located proximate the pair of parallel wires carrying high frequency alternating current through the vehicle and is designed to receive power inductively from the pair of wires. Communication with sensor 265 could be over the same pair of parallel wires, i.e., a single bus on the vehicle provides both communications and power, and sensor 265 would have a dedicated address to enable communication only with sensor 265 when desired. This concept is discussed, for example, in U.S. Pat. No. 6,326,704 and elsewhere herein. Power supplying component 265B can also be designed to be activated upon the transmission of radio frequency energy of a specific frequency. Thus, when such radio frequency energy is transmitted, power supplying component 265B is activated and provides sufficient power to the temperature measuring component 265A to conduct a measurement of the temperature of the tire and enable the transmission of the detected temperature to a processor or central control module of the vehicle via temperature transmission component 265C.

Power supplying component 265B can also be integrated with a battery in the event that the circuitry for receiving power inductively or through radio frequency energy is inoperable.

An electric circuit for inductively receiving power and an electric circuit for supplying power upon being activated upon transmission of a certain radio frequency are well-known in the art and can be any of those in the prior art or any improvements thereto. Also, the power supplying component 265B can be any component which is designed to receive power (electricity) wirelessly or receive an activation signal wirelessly or by wire.

The processor 268 is mounted in the vehicle and includes any necessary circuitry and components to perform the reception function, i.e., the reception of the transmitted temperature from the temperature transmission component 265C of each sensor 265, and the comparison function, i.e., to compare mated tires, or to compare the temperature of the tire to a threshold. The reception function may be performed by a receiver 269 mounted in connection with the processor 268.

The threshold to which the temperature of the tire is compared may be a predetermined threshold value for the specific tire, or it may be variable depending on the vehicle on which the tire is mounted. For example, it may depend on the weight of the vehicle, either in its unloaded state or in its loaded state. It could also vary based on the driving conditions, weather conditions or a combination of the previously mentioned factors.

Upon the processor 268 making such a determination based on the comparison of the data obtained from two tire temperature sensors, it can activate or direct the activation of a responsive system to alert the driver by displaying a warning light, sound an audible alarm or activate another type of alarm or warning system. A display can also be provided to display, e.g., to the vehicle occupant, an indication or representation of the determination by the processor. In general, such a display, alarm or warning device will be considered a response unit or responsive system. Another response unit may be a telecommunications unit which is operative to notify a vehicle service facility of the need to inflate one or more of the tires, or repair or replace one or more of the tires. In this regard, the invention can be integrated or incorporated into a remote vehicle diagnostic system as disclosed in U.S. Pat. No. 5,684,701 to the current assignee.

The tire temperature sensor 265 can also be used to warn of a potential delamination, as have occurred on many tires manufactured by Firestone. Long before the delamination causes a catastrophic tire failure, the tire begins to heat and this differential temperature can be measured by the tire temperature sensor 265 and used to warn the driver of a pending problem (via the response unit). Similarly, the delamination that accompanies retreaded tires on large trucks even when they are properly inflated can be predicted if the temperature of the tread of the vehicle is monitored. The more common problem of carcass failure from any cause can also be detected as either the defective tire or its mate, in the case of paired tires, will exhibit a temperature increase before ultimate failure occurs. The output of the tire temperature monitors can also be recorded so that if a warning went unheeded by the driver, he or she can be later held accountable. With the large quantity of tire debris littering roadways and the resulting accidents, a monitor, recording and warning system such as described herein which can eliminate this hazard may very well be mandated by governmental authorities.

One disadvantage of an external temperature measuring system is that it can be prone to being occluded by snow, ice, and dirt. This problem is particularly troublesome when a single external sensor is used but would be alleviated if multiple external sensors are used such as shown in FIG. 56. An alternate approach is to place a temperature sensor within the vehicle tire as with the pressure sensor, as described above. The resulting temperature measurement data can be then transmitted to the vehicle either inductively or by radio frequency, or other similar suitable method. A diagnostic system can be provided to inform the driver of a malfunctioning monitor. Such a diagnostic system can include a source of IR radiation that would irradiate a tire as a test for detection by the monitor.

In accordance with the invention, it is therefore possible to use both types of sensors, i.e., an externally-mounted sensor (external to the tire) and an internally-mounted tire, i.e., a sensor mounted in connection with the tire. FIG. 56 thus shows a sensor 270 is placed within the tire 266 for those situations in which it is desirable to actually measure the pressure or temperature within a tire (or for when the external sensor 265 is occluded). Sensor 270 can be designed to measure the temperature of the air within the tire, the temperature of the tire tread and/or the pressure of the air in the tire. Sensor 270 can be any of those described above.

Preferably, sensor 270 receives its operational power either inductively or through radio frequency. Previously, inductively-powered tire-mounted sensors have taken place at very low frequencies, e.g., about 100 Hz, and no attempt has been made to specifically design the inductive pickup so that the efficiency of power transfer is high. In contrast, the present invention operates at much higher frequencies, in some cases as high as 10 kHz or higher, and approaches 99 percent efficiency. Additionally, many systems have attempted to transmit tire pressure to the vehicle cab wirelessly with poor results due to the intervening metal surfaces of the vehicle. A preferred approach in the present invention is to transmit the information over the inductive power source wires.

FIGS. 57A and 57B show an embodiment for detecting a difference in temperature between two tires situated alongside one another, for example on a truck trailer. A difference in temperature between two tires operating alongside one another may be indicative of a pressure loss in one tire since if the tires are not inflated to the same pressure, the tire at the higher pressure will invariably carry more load than the under-inflated tire and therefore, the temperature of the tire at the higher pressure will be higher than the temperature of the under-inflated tire. It can also predict if one tire is delaminating.

In this embodiment, the tire temperature/pressure measuring system 274 includes a thermal emitted radiation detector 275, a Fresnel lens 276 in spaced relationship from the thermal emitted radiation detector 275 and a shutter 277 arranged between the thermal emitted radiation detector 275 and the Fresnel lens 276. The Fresnel lens 276 includes lens elements equal in number to the number of tires 280,281 situated alongside one another, two in the illustrated embodiment (lens elements 278,279). Each lens elements 278 and 279 defines a field of view for the detector 275 corresponding to the associated tire 280,281. The shutter 277 is operated between a first position 283, and is biased toward that position by a return spring 284, and a second position 285 and is attracted toward that second position by an electromagnet 286. In the first position 283, the shutter 277 blocks the field of view from the lens element 279 corresponding to tire 281 and allows the field of view from the lens element 278 corresponding to the tire 281. In the second position 285, on energizing electromagnet 286, the shutter 277 blocks the field of view from the lens element 278 and allows the fields of view from lens element 279. As the detector 275 is sensitive to changes in temperature, the switching between fields of view from one tire to the other tire will provide a difference if the temperature of one tire differs from the temperature of the other.

Referring to FIG. 57B, the detector 275 establishes fields of view 287 and 288 generally directed toward the tires 280, 281, respectively. The fields of view 287 and 288 correspond to the Fresnel lens elements 278 and 279, respectively. The thermal emitted radiation detector 275, for the 8-14 micron range, may be a single element pyroelectric detector such as the Hamamatsu P4736. As an alternative, a pyroelectric detector having two sensing elements, for example, a Hynman LAH958 may be used with one of the detecting elements covered. Alternatively, a semi custom device could be used. Such devices are usually manufactured with a large resistor, e.g., 100 GOhm, in parallel to the detecting elements. A lower value of this resistor provides a wider effective bandwidth with a tradeoff of less sensitivity at lower frequencies. If a lower frequency cutoff of about 10 Hz is desired, a resistor value of about 100 MOhm would be appropriate. These types of pyroelectric detectors are sensitive to changes in temperature and not to absolute temperature, thus the detector must see a change in temperature in order to generate an output signal. This change in temperature will occur when one tire is at a higher or lower pressure than the adjacent tire indicating under-inflation of one of the tires, a failing carcass or is delaminating. The measurement of the change in temperature between the tires may be accomplished by a shutter mechanism as described above. The shutter could be driven at a constant rate of about 10 Hz. The rate of operation must be slow enough to come within the band pass of the pyroelectric detector used. The preceding and following discussions were taken largely from U.S. Pat. No. 5,668,549 where a more detailed discussion of the operation of pyroelectric detectors can be found.

FIG. 58 illustrates a Fresnel lens 276 in accordance with one embodiment of the present invention. The Fresnel lens 276 includes lens elements 278 and 279 which are aligned with the tires 280,281. The lens elements 278 and 279 are offset from each other to provide different fields of view, as illustrated in FIG. 57B. The Fresnel lens 276 also includes a thermal emitted radiation opaque mask 289 around the lens areas. The lens elements 278 and 279 are dimensioned to ensure that the thermal emitted radiation collected by the lens elements 278,279 when the pressure of the tires is substantially the same will be the same, that is, no temperature difference will be detected.

Referring to FIG. 59, a circuit for driving the shutter mechanism and for driving from the detector to provide an indication of a temperature difference between a mated pair of tires situated alongside one another is shown. In this non-limiting embodiment, the circuit includes a detector circuit 293 providing input to an amplifier circuit 294 which provides input to a demodulator circuit 295 which provides input to an enunciator circuit 296. The demodulator circuit 295 is driven by a 10 Hz square wave generator 297 which also drives the shutter electromagnet 292. The detector circuit 293 includes the pyroelectric detector. Output from the detector is capacitively coupled via capacitor C1 to the amplifier circuit 293 provided with two amplification stages 298 and 299. The amplifier circuit 294 acts as a high pass filter with a cut off frequency of about 10 Hz. The output of the amplifier circuit 294 is applied as input to the demodulator circuit 295. The demodulator circuit 295 is operated at a frequency of 10 Hz by applying the output of the 10 Hz square wave generator 297 to switches within the modulator circuit. The enunciator circuit 296 has comparators 300 and 301 which compare the output of the demodulator circuit 295 to threshold values to determine a temperature difference between the mated tires above a threshold value and in response, e.g., provides an output indication in the form of a drive signal to an LED D3.

FIGS. 60-62 illustrate alternative embodiments of the thermal emitted radiation detector 274. In the preferred embodiment of FIGS. 57A and 57B, the reference fields of view of the tires 280, 281 are defined by Fresnel lens elements 278 and 279, respectively, with selection of the field of view being determined by the shutter 277. It is possible to provide various mechanical shutter arrangements, for example vibrating reeds or rotating blades. A LCD used as a shutter can work with thermal emitted radiation. It is also possible to change the field of view of the detector 275 by other means as described below.

Referring to FIG. 60, a single Fresnel lens 305 is provided and supported at one side by a vibrating device 306. Other types of lenses can be used. The vibrating device 306 may be electromechanical or piezoelectric in nature. On application of the drive signal to the vibrating device 306, the Fresnel lens 305 can be rocked between two positions, corresponding to a field of view of tire 280 and a field of view of tire 281. As the detector 275 is sensitive to change in temperature, the change in fields of view results in an output signal being generated when there is a difference in temperature between tires 280 and 281. Operation of the rest of the detector is as described with regard to the preferred embodiment. As is well known in the art, the optical elements lenses and the optical elements mirrors may be interchanged. The Fresnel lens of FIG. 60 may thus be replaced by a concave mirror or other type of lens.

FIG. 61 illustrates such an arrangement in another embodiment of the invention. In this embodiment, the Fresnel lens 305, of FIG. 60, is replaced by a concave mirror 307. The mirror 307 is mounted in a similar manner to the Fresnel lens, and in operation vibrates between two fields of view.

The embodiment of FIG. 62 uses fixed optics 308, i.e., a lens or a mirror, but imparts relative movement to the detector to define two fields of view. While the embodiments of FIGS. 60-62 have been described using the square wave generator of a preferred embodiment of FIGS. 57A and 57B, other waveforms are possible. The embodiments of FIGS. 60-62 define fields of view based on relative position and would capable of continuous movement between positions if the detector has sufficient bandwidth. For example, either an MCT (HgCdTe) detector or a pyroelectric with a relatively low parallel resistor (about 1 MOhm) would have sufficient bandwidth. A sawtooth waveform could thus be used to drive the vibration device 306 to cause the field of view to sweep an area covering both tires 280,281.

Instead of using the devices shown in FIGS. 57A, 57B and 60-62 for determining a temperature difference between mated tires, it is possible to substitute a heat generating or radiating element (as a reference source) for one of the tires whereby the heat generating element is heated to a predetermined temperature which should equal the temperature of a normally operating tire, or possibly the temperature of a tire in the same driving conditions, weather conditions, vehicle loading conditions, etc. (i.e., the temperature can be varied depending on the instantaneous use of the tire). Thus, the field of view would be of a single tire and the heat generating element. Any difference between the temperature of the heat generating element and the tire in excess of a predetermined amount would be indicative of, e.g., an under-inflated tire or an over-loaded tire. In this method, the sensor detects the absolute temperature of the tire rather than the relative temperature. It is also possible to construct the circuit using two detectors, one always looking at the reference source and the other at a tire and thereby eliminate the need for a moving mirror or lens etc.

FIG. 63 shows a schematic illustration of the system in accordance with the invention. Power receiving/supplying circuitry/component 310 is that portion of the arrangement which supplies electricity to the thermal radiation detectors 311, e.g., the appropriate circuitry for wired power connection, inductive reception of power or radio frequency energy transfer. Detectors 311 are the temperature sensors which measure, for example, the temperature of the tire tread or sidewall. For example, detector 311 may be the thermal emitted radiation detecting device described with reference to FIGS. 56, 57A and 57B. Amplifiers and/or signal conditioning circuitry 312 are preferably provided to condition the signals provided by the detectors 311 indicative of the measured temperature. The signals are then forwarded to a comparator 313 for a comparison in order to determine whether the temperature of the tire treads for mating tires differs by a predetermined amount. Comparator 313 may be resident or part of a microprocessor or other type of automated processing device. The temperature difference which would be indicative of a problem with one of the tires is obtained through analysis and investigation prior to manufacturing of the system and construction of the system. Comparator 313 provides a signal if the difference is equal to or above the predetermined amount. A warning/alarm device 314 or other responsive system is coupled to the comparator 313 and acts upon the signal provided by the comparator 313 indicative of a temperature difference between the mating tires which is greater than or equal to the predetermined amount. The amplifiers and signal conditioning circuitry 314 may be associated with the detectors 311, i.e., at the same location, or associated with the processor within which the comparator 313 is resident.

FIG. 64 shows a schematic illustration of the process for monitoring tire pressure in accordance with the invention. At step 318, power is provided wirelessly to a power supplying component associated with the thermal radiation detecting devices. At step 319, the thermal detecting devices are activated upon the reception of power by the power supplying component. At step 320, the thermal radiation from the tires is detected at a location external of and apart from the tires. The thermal radiation for mating tires is compared at step 321 and a determination made if the thermal radiation for mating tires differs by a predetermined amount at step 322. If so, an alarm will sound, a warning will be displayed to the driver and/or a vehicle service facility will be notified at step 323. If not, the process will continue with additional detections of thermal radiation from the tire(s) and comparisons.

Instead of designating mating tires and performing a comparison between the mated tires, the invention also encompasses determining the absolute temperature of the tires and analyzing the determined absolute temperatures relative to a fixed or variable threshold. This embodiment is shown schematically in FIG. 65. At step 324, power is provided wirelessly (alternately wires can be used) to a power supplying component associated with the thermal radiation detecting devices. At step 325, the thermal detecting devices are activated upon the reception of power by the power supplying component. At step 326, the thermal radiation from the tires is detected at a location external of and apart from the tires. The thermal radiation for each tire is analyzed relative to a fixed or variable threshold at step 327 and a determination is made based on the analysis of the thermal radiation for each tire relative to the threshold at step 328 as to whether the tire is experiencing a problem or is about to experience a problem, e.g., carcass failure, delaminating, running out of air, etc. The analysis may entail a comparison of the temperature, or a representation thereof, to the threshold, e.g., whether the temperature differs from the threshold by a predetermined amount. If so, an alarm will sound, a warning will be displayed to the driver and/or a vehicle service facility will be notified at step 329. If not, the process will continue with additional detections of thermal radiation from the tire(s) and analysis.

As noted above, the analysis may be a simple comparison of the determined absolute temperatures to the threshold. In this case, the thermal radiation detecting system, e.g., infrared radiation receivers, may also arranged external of and apart from the tires for detecting the temperature of the tires and a processor is coupled to the thermal radiation detecting system for receiving the detected temperature of the tires and analyze the detected temperature of the tires relative to a threshold. The infrared radiation receivers may be arranged in any location which affords a view of the tires. A response system is coupled to the processor and responds to the analysis of the detected temperature of the tires relative to the threshold. The response system may comprise an alarm for emitting noise into the passenger compartment, a display for displaying an indication or representation of the detected temperature or analysis thereof, a warning light for emitting light into the passenger compartment from a specific location and/or a telecommunications unit for sending a signal to a remote vehicle service facility.

Referring now to FIG. 66, in this embodiment, instead of comparing the temperature of one tire to the temperature of another tire or to a threshold, the temperature of a single tire at several circumferential locations is detected or determined and then the detected temperatures are compared to one another or to a threshold.

As shown in FIG. 66, a tire temperature detector 330, which may be any of those disclosed herein and in the prior art, detects the temperature of the tire 331 at the circumferential location designated A when the tire 331 is in the position shown. As the tire 331 rotates, other circumferential locations are brought into the detecting range of the detector 330 and the temperature of the tire 331 at those locations is then determined. In this manner, as the tire 331 completes one rotation, the temperature at all designated locations A-H is detected. The tire temperature detector 330 can also be designed to detect the temperature of a plurality of different circumferential locations, i.e., have multiple fields of view each encompassing one or more different circumferential locations. Two or more tire temperature detectors 330 could also be provided, all situated in the tire well around the tire 331.

The temperatures obtained by the tire temperature detector 330, such as those in the table in FIG. 67, are then analyzed, for example, to determine variations or differences between one another. An excessive high temperature at one location, i.e., a hot spot, may be indicative of the tire 331 being in the process of delamination or of the carcass failing. By detecting the high temperature at that location prior to the delamination, the delamination could be prevented if the tire 331 is removed or fixed.

The analysis to determine a hot spot may be a simple analysis of comparing each temperature to an average temperature or to a threshold. In FIG. 67, the average temperature is 61° so that the temperature at location F varies from the average by 14°, in comparison to a 1° variation from the average for other locations. As such, location F is a relative hot spot and may portend delamination or carcass failure. The existence of the hot spot at location F may be conveyed to the driver via a display, or to a remote vehicle maintenance facility, or in any of the other methods described above for notifying someone or something about a problem with a tire. The number of degrees above the average for a location to be considered a hot spot may be determined by experimental results or theoretical analysis.

Instead of using the average temperature, the difference between the temperature at each circumferential location and the temperature at the other circumferential locations is determined and this difference is analyzed relative to a threshold. For the temperatures set forth in FIG. 67, the variation between the temperatures range from about 0-14°. A processor can be designed to activate a warning system when any variation of the temperature at any two locations is above 10°. Using this criterion, again, location F would be considered a hot spot. The threshold variation can be determined based on experimental results or theoretical analysis.

As also shown in FIG. 67, a threshold of 70° is determined as a boundary between a normal operating temperature of a tire and an abnormal operating temperature possibly indicative of delamination. The temperature of the tire 331 at each circumferential location is compared to the threshold, e.g., in a processor, and it is found that the temperature at location F is above the threshold. This fact is again provided to the driver, remote facility, etc. to enable repair or replacement of the tire 331 prior to actual delamination or other failure.

Additional details about the construction, operation and use of the technique for measuring the temperature and pressure of a tire and the design of sensors capable of being positioned to measure the temperature of the tire can be found in Appendices 1-5 of the '139 application.

The thermal radiation detecting system may be provided with power and information in any of the ways discussed above, e.g., via a power receiving system which receive power by wires or wirelessly (inductively, through radio frequency energy transfer techniques and/or capacitively) and supply power to the thermal radiation detecting system. Further, the thermal radiation detecting system can be coupled to the processor. This may involve a transmitter mounted in connection with the thermal radiation detecting system and a receiver mounted in connection with or integrated into the processor such that the detected temperature of the tires is transmitted wirelessly from the thermal radiation detecting system to the processor.

In a similar manner, a method for monitoring tires mounted to a vehicle comprises the steps of detecting the temperature of the tires from locations external of and apart from the tires, analyzing the detected temperature of the tires relative to a threshold, and responding to the analysis of the detected temperature of the tires relative to the threshold. The temperature of the tires is detected by one or more thermal radiation detecting devices and power may be supplied wirelessly to the thermal radiation detecting device(s), e.g., inductively, through radio frequency energy transfer, capacitively.

The threshold may be a set temperature or a value relating to a set temperature. Also, the threshold may be fixed or variable based on for example, the environment in which the tires are situated, the vehicle on which the tire is situated, and the load of the vehicle on the tires. As noted above, the thermal radiation detecting devices may be wirelessly coupled to the processor central control module of the vehicle and adapted to receive power inductively, capacitively or through radio frequency energy transfer.

Thus, disclosed above is a vehicle including an arrangement for monitoring tires in accordance with the invention comprises a thermal radiation detecting system arranged external of and apart from the tires for detecting the temperature of the tires, a processor coupled to the thermal radiation detecting system for receiving the detected temperature of the tires and determining whether a difference in thermal radiation is present between associated mated pairs of the tires, and a response system coupled to the processor for responding to the determined difference in thermal radiation between mated pairs of the tires. Instead of determining whether a difference in thermal radiation is present between associated mated pairs of tires, a comparison or analysis may be made between the temperature of the tires individually and a predetermined value or threshold to determine the status of the tires, e.g., properly inflated, under inflated or delaminated, and appropriate action by the response system is undertaken in light of the comparison or analysis. The analysis may be in the form of a difference between the absolute temperature and the threshold temperature. Even simpler, an analysis of the detected temperature of each tire may be used and considered in a determination of whether the tire is experiencing or is about to experience a problem. Such an analysis would not necessarily entail comparison to a threshold.

The determination of which tires constitute mated pairs is made on a vehicle-by-vehicle basis and depends on the location of the tires on the vehicle. It is important to determine which tires form mated pairs because such tires should ideally have the same pressure and thus the same temperature. As a result, a difference in temperature between tires of a mated pair will usually be indicative of a difference in pressure between the tires. Such a pressure difference might be the result of under-inflation of the tire or a leak. One skilled in the art of tire inflation and maintenance would readily recognize which tires must be inflated to the same pressure and carry substantially the same load so that such tires would form mated pairs.

For example, for a conventional automobile with four tires, the mated pairs of tires would be the front tires and the rear tires. The front tires should be inflated to the same tire pressure and carry the same load so that they would have the same temperature, or have different temperatures within an allowed tolerance. Similarly, the rear tires should be inflated to the same tire pressure and carry the same load so that they would have the same temperature, or have different temperatures within an allowed tolerance.

It is also conceivable that three or more tires on the vehicle should be at the same temperature and thus form a plurality of mated pairs, i.e., the designation of one tire as being part of one mated pair does not exclude the tire from being part of another mated pair. Thus, if three tires should be at the same temperature and they each have a different temperature, this would usually be indicative of different pressures and thus would give rise to a need to check each tire.

The thermal radiation detecting system is coupled to the processor, preferably in a wireless manner, however wires can also be used alone or in combination with a wireless technique. For example, a suitable coupling may include a transmitter mounted in connection with the thermal radiation detecting device and a receiver mounted in connection with or integrated into the processor. Any of the conventions for wired or wirelessly transmitting data from a plurality of tire pressure-measuring sensors to a common receiver or multiple receivers associated with a single processor, as discussed in the U.S. patents above, may be used in accordance with the invention.

The thermal radiation detecting system may comprise infrared radiation receivers each arranged to have a clear field of view of at least one tire. The receivers may be arranged in any location on the vehicle from which a view of at least a part of the tire surface can be obtained. For example, the receivers may be arranged in the tire wells around the tires, on the side of the vehicle and on side mounted rear view mirrors.

In order to supply power to the thermal radiation detecting systems or devices described herein, several innovative approaches are possible in addition to directly connected wires. Preferably, power is supplied wirelessly, e.g., inductively, through radio frequency energy transfer or capacitively. In the inductive power supply arrangement, the vehicle is provided with a pair of looped wires arranged to pass within a short distance from a power receiving system electrically coupled to the thermal radiation detecting devices, i.e., the necessary circuitry and electronic components to enable an inductive current to develop between the pair of looped wires and a wire of the power receiving system such as disclosed in U.S. Pat. Nos. 5,293,308, 5,450,305, 5,528,113, 5,619,078, 5,767,592, 5,821,638, 5,839,554, 5,898,579 and 6,031,737.

1.4.6 Hall Effect Tire Pressure Monitors

FIGS. 94-97 illustrate improvements to prior art Hall effect tire pressure monitor designs described in U.S. Patent Application Publication No. 2006/0006994 to Moser. Reference is made to Moser for details about the operation of such tire pressure monitors.

One of the drawbacks of the Moser tire pressure monitoring designs is the presence of the coil spring 29 inside the piston 26 to which the magnet 27 is adhered. Several options for replacing the coil spring used in Moser with different types of springs are proposed and believed to improve the operation of the tire pressure monitors. Generally, the novel springs are placed outside of a solid magnet, and not inside of a hollowed piston as in Moser, so that the spring acts directly on the magnet and moves it axially in dependence on the pressure in a channel in a housing which communicates with the interior of the tire, with the housing being attachable to the wheel rim. Movement of the magnet is caused by the exertion of forces by the spring on one side and the diaphragm on the other which is exposed to the pressure in the interior of the housing which communicates with the interior of the tire.

In FIG. 94, the tire pressure sensor assembly is designated generally as 829 and includes a Hall effect sensor 824, shown within a magnetic line of flux 827 generated by magnet 823 which occurs once during each rotation of the wheel relative to the non-rotating part of the vehicle to which the Hall effect sensor 824 is mounted, and a cantilevered spring 828 mounted at one end to the housing of the sensor assembly and having a free opposite end contacting an axial surface of the magnet 823 which faces the non-rotating part of the vehicle on which the Hall effect sensor 824 is mounted. In the embodiment shown in FIG. 94A, a spring washer 831 is provided. Spring washer 831 is substantially circular and planar and is preferably attached around its periphery to the housing of the sensor assembly and in contact with an axial surface of the magnet 823. These alternate springs have the effect of substantially eliminating the influence of side forces due centripetal accelerations acting on the magnet 823 as the wheel rotates. These accelerations, which can reach a number of G's in magnitude, add friction forces and can delay or even prevent the motion of the magnet when the vehicle 830 is traveling at high speeds. Thus, a sudden leak in a tire may go unreported.

The Hall effect sensor 824 senses or detects magnetic field density of the magnet 823 as the magnet rotates 823, with the sensed or detected magnetic field density being convertible into an indication of the pressure in the channel in the housing, which is in communication with the interior of the tire, and thus an indication of the pressure in the tire. Such a conversion or derivation is known to those skilled in the art, as explained for example, in Moser. The detected magnetic field density may be communicated wirelessly to a processor on the vehicle for further processing, as in Moser.

A dust cover 832 is also illustrated in FIG. 94A which can be used in all of the designs discussed herein. Cantilever spring 828 and spring washer 831 are arranged inward of the dust cover 832, i.e., between the dust cover 832 and the surface of the magnet 823 facing the Hall effect sensor 824. A bracket 826, or other comparable structure, attaches the Hall effect sensor 824 to the non-rotating part of the vehicle 830 so that the Hall effect sensor 824 is opposite the wheel rim or other surface in which or to which the magnet 823 is mounted (and thus will be in the magnetic field generated by the magnet 823 once during rotation of the wheel).

To overcome another drawback of Moser, dual magnets are used in the embodiment shown in FIG. 95, one fixed and one whose position depends on the pressure in the tire as in the Moser patent application. Thus, as the tire rotates, each magnet passes the Hall effect sensor 824 almost simultaneously thereby generating two pulses. This permits a relative or differential motion of the moving magnets to be determined thereby eliminating the effect of tolerances due to mounting of the system.

Determining the differential motion of the moving magnets overcomes a significant drawback of the tire pressure monitors of Moser. A critical parameter in the tire pressure monitors of Moser is the gap between the magnet and the Hall effect sensor. As this gap changes, the sensitivity of the device also changes and may adversely affect the data provided by the device. According to Moser, this gap is ideally set at 1-2 mm. Manufacturing tolerances between vehicles for this gap are undoubtedly on the order of millimeters. As a vehicle ages, this gap will also change due to vehicle repairs, damage to the various parts that contribute to the gap, and the accumulation of debris especially iron particles that adhere to the magnet. A stone hitting the bracket that holds the Hall effect sensor, for example, can deform or dent the sensor or bracket by a millimeter or more.

By changing to a differential motion measurement as in the embodiment shown in FIG. 95 using multiple magnets, this problem is solved. Setting or placement of a fixed magnet 833 can be made such that the gap between the fixed magnet 833 and the Hall effect sensor 824 is the same as the gap between the movable magnet 834 and the Hall effect sensor when the pressure in the tire is proper. As the pressure in the tire drops, magnet 834 moves in a direction to increase the gap, so that as a result of this movement, a significant difference can be measured in the current or voltage of the Hall effect sensor between the fixed magnet 833 and the movable magnet 834. This current or voltage differential will exist regardless of the initial gap setting or if that setting changes due to the effects mentioned above.

More specifically, in a wheel assembly with a tire pressure monitoring system using dual magnets 833, 834, the assembly includes a wheel rim, a tire mounted thereon, a housing having an interior in flow communication with an interior of the tire such that the same pressure prevails in the tire and the interior of the housing, a first, movable magnet (say magnet 833) arranged in the housing and adapted to be movable in an axial direction of the wheel rim, and a spring coupled to the housing and arranged to move the first magnet in dependence on pressure in the interior of the housing. This structure so far may be the structure shown in FIGS. 94 and 94A or that shown in Moser. However, a novelty of this embodiment is that the wheel assembly further includes a second, fixed magnet (say magnet 834) fixed to the wheel rim in the same axial position as the first magnet will be in when the pressure in the tire is proper. This position can be determined by inflating the tire to the proper pressure, determining the position of the movable magnet 833 and then attaching the fixed magnet 824 to the wheel rim in the same axial position so that when the tire is at the proper pressure, both magnets 833, 834 will be the same distance from the Hall effect sensor 824. The Hall effect sensor senses magnetic field density of the magnets 833, 834 as the wheel rim rotates. The magnetic field density of the first magnet is comparable to the magnetic field density of the second magnet with any difference being indicative of the pressure in the tire not being proper, i.e., the magnets 833, 834 are different distances from the Hall effect sensor 824.

Another concern with the tire pressure monitors of Moser is that no attempt is made to channel the magnetic flux lines so as to make optimum use of the magnetic field emitted by the magnet. Thus, the size of the gap for a given magnet is limited as most of the flux is lost. A careful analysis and design of the magnet circuit is therefore required in order to make the design robust and optimal. One such design in illustrated in FIG. 96 where magnetic material such as iron is used in parts 835 and 836 to channel the magnetic flux from one pole of the wheel-based magnet to the other so that a greater amount of the magnetic field passes through the Hall effect sensor 824. A representative flux line is illustrated by the dashed line 827 in FIG. 94 and a modified flux line as 827A in FIG. 96. In FIG. 96, most of the flux passes through the Hall effect sensor 824 permitting either the magnet to be made weaker, a less expensive magnet material to be used, a larger gap to be used, or a less expensive Hall effect sensor to be used. Furthermore, once a magnetic circuit is designed and used, the magnet can be placed on the Hall effect sensor assembly rather than on the wheel. By eliminating the magnets on the wheel, the system cost is reduced and the design of the wheel-based system becomes simpler since only a thin piece of iron 838 is required (see FIG. 97).

Thus, the embodiments of FIGS. 96 and 97 include structure for channeling magnetic flux generated by the magnet or magnets as this structure can be used with either the single magnet embodiments of FIGS. 94 and 94A or those in the prior art such as those in Moser, or the dual-magnet embodiment of FIG. 95. The channeling structure may be a cup 835 made of metal such as iron and which defines an interior in which the magnet 823 is arranged with the opening of the cup facing the gap, i.e., facing the Hall effect sensor. Alternatively or additionally, the channeling structure may include a cup 836 defining an interior in which the Hall effect sensor 824 is arranged with the opening of this cup facing the magnet 823.

Additionally and advantageously, the magnet on the Hall effect sensor assembly can be made as an electromagnet 837 which has significantly less temperature sensitivity and also is less likely to retain iron particles or other magnetic materials during the life of the vehicle (see FIG. 97). This feature can also be used with the embodiments described in FIGS. 93-96.

It is important to note that in the embodiment shown in FIG. 97, the housing defining the channel communicating with the interior of the tire includes only a diaphragm and a piece of metallic material, such as a piece of iron 838 which may be securely attached to the diaphragm so that as the pressure in the tire changes, the diaphragm moves and thus the piece of iron 838 moves. A magnet is not placed on the rotating tire but rather is placed on the non-rotating part of the vehicle, i.e., on the Hall effect sensor assembly.

1.6 Occupant Sensing

Occupant or object presence and position sensing is another field in which SAW and/or RFID technology can be applied and the inventions herein encompasses several embodiments of SAW and RFID occupant or object presence and/or position sensors.

Many sensing systems are available to identify and locate occupants or other objects in a passenger compartment of the vehicle. Such sensors include ultrasonic sensors, chemical sensors (e.g., carbon dioxide), cameras and other optical sensors, radar systems, heat and other infrared sensors, capacitance, magnetic or other field change sensors, etc. Most of these sensors require power to operate and return information to a central processor for analysis. An ultrasonic sensor, for example, may be mounted in or near the headliner of the vehicle and periodically it transmits a burst of ultrasonic waves and receives reflections of these waves from occupying items of the passenger seat. Current systems on the market are controlled by electronics in a dedicated ECU.

FIG. 68 is a side view, with parts cutaway and removed of a vehicle showing the passenger compartment containing a rear-facing child seat 342 on a front passenger seat 343 and one mounting location for a first embodiment of a vehicle interior monitoring system in accordance with the invention. The interior monitoring system is capable of detecting the presence of an object, determining the type of object, determining the location of the object, and/or determining another property or characteristic of the object. A property of the object could be the presence or orientation of a child seat, the velocity of an adult and the like. For example, the vehicle interior monitoring system can determine that an object is present on the seat, that the object is a child seat and that the child seat is rear-facing. The vehicle interior monitoring system could also determine that the object is an adult, that he is drunk and that he is out-of-position relative to the airbag.

In this embodiment, six transducers 344, 345, 346, 347, 348 and 349 are used, although any number of transducers may be used. Each transducer 344, 345, 346, 347, 348, 349 may comprise only a transmitter which transmits energy, waves or radiation, only a receiver which receives energy, waves or radiation, both a transmitter and a receiver capable of transmitting and receiving energy, waves or radiation, an electric field sensor, a capacitive sensor, or a self-tuning antenna-based sensor, weight sensor, chemical sensor, motion sensor or vibration sensor, for example.

Such transducers or receivers 344-349 may be of the type which emit or receive a continuous signal, a time varying signal (such as a capacitor or electric field sensor) or a spatial varying signal such as in a scanning system. One particular type of radiation-receiving receiver for use in the invention is a receiver capable of receiving electromagnetic waves.

When ultrasonic energy is used, transducer 345 can be used as a transmitter and transducers 344,346 as receivers. Naturally, other combinations can be used such as where all transducers are transceivers (transmitters and receivers). For example, transducer 345 can be constructed to transmit ultrasonic energy toward the front passenger seat, which is modified, in this case by the occupying item of the passenger seat, i.e., the rear-facing child seat 342, and the modified waves are received by the transducers 344 and 346, for example. A more common arrangement is where transducers 344, 345 and 346 are all transceivers. Modification of the ultrasonic energy may constitute reflection of the ultrasonic energy as the ultrasonic energy is reflected back by the occupying item of the seat. The waves received by transducers 344 and 346 vary with time depending on the shape of the object occupying the passenger seat, in this case, the rear-facing child seat 342. Each object will reflect back waves having a different pattern. Also, the pattern of waves received by transducer 344 will differ from the pattern received by transducer 346 in view of its different mounting location. This difference generally permits the determination of the location of the reflecting surface (i.e., the rear-facing child seat 342) through triangulation. Through the use of two transducers 344,346, a sort of stereographic image is received by the two transducers and recorded for analysis by processor 340, which is coupled to the transducers 344, 345,346. This image will differ for each object that is placed on the vehicle seat and it will also change for each position of a particular object and for each position of the vehicle seat. Elements 344,345,346, although described as transducers, are representative of any type of component used in a wave-based analysis technique.

For ultrasonic systems, the "image" recorded from each ultrasonic transducer/receiver, is actually a time series of digitized data of the amplitude of the received signal versus time. Since there are two receivers, two time series are obtained which are processed by the processor 340. The processor 340 may include electronic circuitry and associated, embedded software. Processor 340 constitutes one form of a generating system in accordance with the invention which generates information about the occupancy of the passenger compartment based on the waves received by the transducers 344,345,346.

When different objects are placed on the front passenger seat, the two images from transducers 344,346, for example, are different but there are also similarities between all images of rear-facing child seats, for example, regardless of where on the vehicle seat they are placed and regardless of what company manufactured the child seat. Alternately, there will be similarities between all images of people sitting on the seat regardless of what they are wearing, their age or size. The problem is to find the "rules" which differentiate the images of one type of object from the images of other types of objects, e.g., which differentiate the occupant images from the rear-facing child seat images. The similarities of these images for various child seats are frequently not obvious to a person looking at plots of the time series and thus computer algorithms are developed to sort out the various patterns. For a more detailed discussion of pattern recognition, see U.S. Pat. No. 5,943,295 to Varga et al.

The determination of these rules is important to the pattern recognition techniques used in this invention. In general, three approaches have been useful, artificial intelligence, fuzzy logic and artificial neural networks (including cellular and modular or combination neural networks and support vector machines) (although additional types of pattern recognition techniques may also be used, such as sensor fusion). In some embodiments of this invention, such as the determination that there is an object in the path of a closing window as described below, the rules are sufficiently obvious that a trained researcher can sometimes look at the returned signals and devise an algorithm to make the required determinations. In others, such as the determination of the presence of a rear-facing child seat or of an occupant, artificial neural networks are used to determine the rules. One such set of neural network software for determining the pattern recognition rules is available from the International Scientific Research, Inc. of Panama City, Panama and Kyiv, Ukraine.

The system used in a preferred implementation of inventions herein for the determination of the presence of a rear-facing child seat, of an occupant or of an empty seat is the artificial neural network. In this case, the network operates on the two returned signals as sensed by transducers 344 and 346, for example. Through a training session, the system is taught to differentiate between the three cases. This is done by conducting a large number of experiments where all possible child seats are placed in all possible orientations on the front passenger seat. Similarly, a sufficiently large number of experiments are run with human occupants and with boxes, bags of groceries and other objects (both inanimate and animate). Sometimes, as many as 1,000,000 such experiments are run before the neural network is sufficiently trained so that it can differentiate among the three cases and output the correct decision with a very high probability. Of course, it must be realized that a neural network can also be trained to differentiate among additional cases, e.g., a forward-facing child seat.

Once the network is determined, it is possible to examine the result using tools supplied International Scientific Research, for example, to determine the rules that were finally arrived at by the trial and error techniques. In that case, the rules can then be programmed into a microprocessor resulting in a fuzzy logic or other rule-based system. Alternately, a neural computer, or cellular neural network, can be used to implement the net directly. In either case, the implementation can be carried out by those skilled in the art of pattern recognition. If a microprocessor is used, a memory device is also required to store the data from the analog-to-digital converters that digitize the data from the receiving transducers. On the other hand, if a neural network computer is used, the analog signal can be fed directly from the transducers to the neural network input nodes and an intermediate memory is not required. Memory of some type is needed to store the computer programs in the case of the microprocessor system and if the neural computer is used for more than one task, a memory is needed to store the network specific values associated with each task.

Electromagnetic energy-based occupant sensors exist that use various portions of the electromagnetic spectrum. A system based on the ultraviolet, visible or infrared portions of the spectrum generally operate with a transmitter and a receiver of reflected radiation. The receiver may be a camera, focal plane array, or a photo detector such as a pin or avalanche diode as described in detail in above-referenced patents and patent applications. At other frequencies, the absorption of the electromagnetic energy is primarily and at still other frequencies, the capacitance or electric field influencing effects are used. Generally, the human body will reflect, scatter, absorb or transmit electromagnetic energy in various degrees depending on the frequency of the electromagnetic waves. All such occupant sensors are included herein.

In the embodiment wherein electromagnetic energy is used, it is to be appreciated that any portion of the electromagnetic signals that impinges upon, surrounds or involves a body portion of the occupant is at least partially absorbed by the body portion. Sometimes, this is due to the fact that the human body is composed primarily of water, and that electromagnetic energy of certain frequencies is readily absorbed by water. The amount of electromagnetic signal absorption is related to the frequency of the signal, and size or bulk of the body portion that the signal impinges upon. For example, a torso of a human body tends to absorb a greater percentage of electromagnetic energy than a hand of a human body.

Thus, when electromagnetic waves or energy signals are transmitted by a transmitter, the returning waves received by a receiver provide an indication of the absorption of the electromagnetic energy. That is, absorption of electromagnetic energy will vary depending on the presence or absence of a human occupant, the occupant's size, bulk, surface reflectivity, etc. depending on the frequency, so that different signals will be received relating to the degree or extent of absorption by the occupying item on the seat. The receiver will produce a signal representative of the returned waves or energy signals which will thus constitute an absorption signal as it corresponds to the absorption of electromagnetic energy by the occupying item in the seat.

One or more of the transducers 344,345,346 can also be image-receiving devices, such as cameras, which take images of the interior of the passenger compartment. These images can be transmitted to a remote facility to monitor the passenger compartment or can be stored in a memory device for use in the event of an accident, i.e., to determine the status of the occupants of the vehicle prior to the accident. In this manner, it can be ascertained whether the driver was falling asleep, talking on the phone, etc.

To aid in the detection of the presence of child seats as well as their orientation, a device 341 can be placed on the child seat in some convenient location where its presence can be sensed by a vehicle-mounted sensor that can be in the seat, dashboard, headliner or any other convenient location depending on the system design. The device 341 can be a reflector, resonator, RFID tag, SAW device, or any other tag or similar device that permits easy detection of its presence and perhaps its location or proximity. Such a device can also be placed on any other component in the vehicle to indicate the presence, location or identity of the component. For example, a vehicle may have a changeable component where the properties of that component are used by another system within the vehicle and thus the identification of the particular object is needed so that the proper properties are used by the other system. An occupant monitoring system (e.g. ultrasonic, optical, electric field, etc.) may perform differently depending on whether the seat is made from cloth or leather or a weight sensor may depend on the properties of a particular seat to provide the proper occupant weight. Thus, incorporation of an RFID, SAW, barcode or other tag or mark on any object that can be interrogated by an interrogator is contemplated herein.

A memory device for storing the images of the passenger compartment, and also for receiving and storing any of the other information, parameters and variables relating to the vehicle or occupancy of the vehicle, may be in the form of a standardized "black box" (instead of or in addition to a memory part in a processor 340). The IEEE Standards Association is developing an international standard for motor vehicle event data recorders. The information stored in the black box and/or memory unit in the processor 340, can include the images of, or other information related to, the interior of the passenger compartment as well as the number of occupants and the health state of the occupants. The black box would preferably be tamper-proof and crash-proof and enable retrieval of the information after a crash. The use of wave-type sensors as the transducers 344,345,346 as well as electric field sensors is discussed above. Electric field sensors and wave sensors are essentially the same from the point of view of sensing the presence of an occupant in a vehicle. In both cases, a time-varying electric field is disturbed or modified by the presence of the occupant. At high frequencies in the visual, infrared and high frequency radio wave region, the sensor is based on its capability to sense change of wave characteristics of the electromagnetic field, such as amplitude, phase or frequency. As the frequency drops, other characteristics of the field are measured. At still lower frequencies, the occupant's dielectric properties modify parameters of the reactive electric field in the occupied space between/ near the plates of a capacitor. In this latter case, the sensor senses the change in charge distribution on the capacitor plates by measuring, for example, the current wave magnitude or phase in the electric circuit that drives the capacitor. These measured parameters are directly connected with parameters of the displacement current in the occupied space. In all cases, the presence of the occupant reflects, absorbs or modifies the waves or variations in the electric field in the space occupied by the occupant. Thus, for the purposes of this invention, capacitance, electric field or electromagnetic wave sensors are equivalent and although they are all technically "field" sensors they can be considered as "wave" sensors herein. What follows is a discussion comparing the similarities and differences between two types of field or wave sensors, electromagnetic wave sensors and capacitive sensors as exemplified by Kithil in U.S. Pat No. 5,602,734 (see also U.S. Pat Nos. 6,275,146, 6,014,602, 5,844,486, 5,802,479, 5,691, 693 and 5,366,241).

An electromagnetic field disturbed or emitted by a passenger in the case of an electromagnetic wave sensor, for example, and the electric field sensor of Kithil, for example, are in many ways similar and equivalent for the purposes of this invention. The electromagnetic wave sensor is an actual electromagnetic wave sensor by definition because it senses parameters of a wave, which is a coupled pair of continuously changing electric and magnetic fields. The electric field here is not a static, potential one. It is essentially a dynamic, rotational electric field coupled with a changing magnetic one, that is, an electromagnetic wave. It cannot be produced by a steady distribution of electric charges. It is initially produced by moving electric charges in a transmitter, even if this transmitter is a passenger body for the case of a passive infrared sensor.

In the Kithil sensor, a static electric field is declared as an initial material agent coupling a passenger and a sensor (see Column 5, lines 5-7): "The proximity sensor 12 each function by creating an electrostatic field between oscillator input loop 54 and detector output loop 56, which is affected by presence of a person near by, as a result of capacitive coupling, . . . ". It is a potential, non-rotational electric field. It is not necessarily coupled with any magnetic field. It is the electric field of a capacitor. It can be produced with a steady distribution of electric charges. Thus, it is not an electromagnetic wave by definition but if the sensor is driven by a varying current, then it produces a quasistatic electric field in the space between/ near the plates of the capacitor.

Kithil declares that his capacitance sensor uses a static electric field. Thus, from the consideration above, one can conclude that Kithil's sensor cannot be treated as a wave sensor because there are no actual electromagnetic waves but only a static electric field of the capacitor in the sensor system. However, this is not believed to be the case. The Kithil system could not operate with a true static electric field because a steady system does not carry any information. Therefore, Kithil is forced to use an oscillator, causing an alternate current in the capacitor and a reactive quasi-static electric field in the space between the capacitor plates, and a detector to reveal an informative change of the sensor capacitance caused by the presence of an occupant (see FIG. 7 and its description in the '734 patent). In this case, the system becomes a "wave sensor" in the sense that it starts generating actual time-varying electric field that certainly originates electromagnetic waves according to the definition above. That is, Kithil's sensor can be treated as a wave sensor regardless of the shape of the electric field that it creates a beam or a spread shape.

As follows from the Kithil patent, the capacitor sensor is likely a parametric system where the capacitance of the sensor is controlled by the influence of the passenger body. This influence is transferred by means of the near electromagnetic field (i.e., the wave-like process) coupling the capacitor electrodes and the body. It is important to note that the same influence takes place with a real static electric field also, that is in absence of any wave phenomenon. This would be a situation if there were no oscillator in Kithil's system. However, such a system is not workable and thus Kithil reverts to a dynamic system using time-varying electric fields.

Thus, although Kithil declares the coupling is due to a static electric field, such a situation is not realized in his system because an alternating electromagnetic field ("quasi-wave") exists in the system due to the oscillator. Thus, the sensor is actually a wave sensor, that is, it is sensitive to a change of a wave field in the vehicle compartment. This change is measured by measuring the change of its capacitance. The capacitance of the sensor system is determined by the configuration of its electrodes, one of which is a human body, that is, the passenger inside of and the part which controls the electrode configuration and hence a sensor parameter, the capacitance.

The physics definition of "wave" from Webster's Encyclopedic Unabridged Dictionary is:" 11. *Physics*. A progressive disturbance propagated from point to point in a medium or space without progress or advance of the points themselves, . . . ". In a capacitor, the time that it takes for the disturbance (a change in voltage) to propagate through space, the dielectric and to the opposite plate is generally small and neglected but it is not zero. As the frequency driving the capacitor increases and the distance separating the plates increases, this transmission time as a percentage of the period of oscillation can become significant. Nevertheless, an observer between the plates will see the rise and fall of the electric field much like a person standing in the water of an ocean in the presence of water waves. The presence of a dielectric body between the plates causes the waves to get bigger as more electrons flow to and from the plates of the capacitor. Thus, an occupant affects the magnitude of these waves which is sensed by the capacitor circuit. The electromagnetic field is a material agent that carries information about a passenger's position in both Kithil's and a beam-type electromagnetic wave sensor.

Considering now a general occupant sensor and its connection to the rest of the system, an alternate method as taught herein is to use an interrogator to send a signal to the headliner-mounted ultrasonic sensor, for example, causing that sensor to transmit and receive ultrasonic waves. The sensor in this case could perform mathematical operations on the received waves and create a vector of data containing perhaps twenty to forty values and transmit that vector wirelessly to the interrogator. By means of this system, the ultrasonic sensor need only be connected to the vehicle power system and the information can be transferred to and from the sensor wirelessly (either by electromagnetic or ultrasonic waves or equivalent). Such a system significantly reduces the wiring complexity especially when there may be multiple such sensors distributed in the passenger compartment. Then, only a power wire needs to be attached to the sensor and there does not need to be any direct connection between the sensor and the control module. The same philosophy applies to radar-based sensors, electromagnetic sensors of all kinds including cameras, capacitive or other electromagnetic field change sensitive sensors etc. In some cases, the sensor itself can operate on power supplied by the interrogator through radio frequency transmission. In this case, even the connection to the power line can be omitted. This principle can be extended to the large number of sensors and actuators that are currently in the vehicle where the only wires that are needed are those to supply power to the sensors and actuators and the information is supplied wirelessly.

Such wireless powerless sensors can also be used, for example, as close proximity sensors based on measurement of thermal radiation from an occupant. Such sensors can be mounted on any of the surfaces in the passenger compartment, including the seats, which are likely to receive such radiation.

A significant number of people are suffocated each year in automobiles due to excessive heat, carbon dioxide, carbon monoxide, or other dangerous fumes. The SAW sensor technology is particularly applicable to solving these kinds of problems. The temperature measurement capabilities of SAW transducers have been discussed above. If the surface of a SAW device is covered with a material which captures carbon dioxide, for example, such that the mass, elastic constants or other property of surface coating changes, the characteristics of the surface acoustic waves can be modified as described in detail in U.S. Pat. No. 4,637,987 and elsewhere based on the carbon dioxide content of the air. Once again, an interrogator can sense the condition of these chemical-sensing sensors without the need to supply power. The interrogator can therefore communicate with the sensors wirelessly. If power is supplied then this communication can be through the wires. If a concentration of carbon monoxide is sensed, for example, an alarm can be sounded, the windows opened, and/or the engine extinguished. Similarly, if the temperature within the passenger compartment exceeds a certain level, the windows can be automatically opened a little to permit an exchange of air reducing the inside temperature and thereby perhaps saving the life of an infant or pet left in the vehicle unattended.

In a similar manner, the coating of the surface wave device can contain a chemical which is responsive to the presence of alcohol. In this case, the vehicle can be prevented from operating when the concentration of alcohol vapors in the vehicle exceeds some predetermined limit. Such a device can advantageously be mounted in the headliner above the driver's seat.

Each year, a number of children and animals are killed when they are locked into a vehicle trunk. Since children and animals emit significant amounts of carbon dioxide, a carbon dioxide sensor connected to the vehicle system wireles sly and powerlessly provides an economic way of detecting the presence of a life form in the trunk. If a life form is detected, then a control system can release a trunk lock thereby opening the trunk. Alarms can also be sounded or activated when a life form is detected in the trunk. An infrared or other sensor can perform a similar function.

FIG. 69 illustrates a SAW strain gage as described above, where the tension in the seat belt 350 can be measured without the requirement of power or signal wires. FIG. 69 illustrates a powerless and wireless passive SAW strain gage-based device 357 for this purpose. There are many other places that such a device can be mounted to measure the tension in the seatbelt at one place or at multiple places. Additionally, a SAW-based accelerometer can be located on the seatbelt adjacent the chest of an occupant as a preferred measure of the stress placed on the occupant by the seatbelt permitting that stress to be controlled.

In FIG. 73, a bolt 360 is used to attach a vehicle seat to a support structure such as a slide mechanism as illustrated in FIGS. 21 and 22, among others, in U.S. Pat. No. 6,242,701. The bolt 360 is attached to the seat or seat structure (not shown) by inserting threaded section 361 containing threads 362 and then attaching a nut (not shown) to secure the bolt 360 to the seat or seat structure. Similarly, the lower section of the bolt 360 is secured to the slide mechanism (not shown) by lower bolt portion 363 by means of a nut (not shown) engaging threads 364. Four such bolts 360 are typically used to attach the seat to the vehicle.

As the weight in the seat increases, the load is transferred to the vehicle floor by means of stresses in bolts 360. The stress in the bolt section 365 is not affect by stresses in the bolt sections 361 and 363 caused by the engagement of the nuts that attach the bolts 360 to the seat and vehicle respectively.

The silicon strain gage 366 is attached, structured and arranged to measure the strain in bolt section 365 caused by loading from the seat and its contents. Silicon strain gage 366 is selected for its high gage factor and low power requirements relative to other strain gage technologies. Associated electronics 367 are typically incorporated into a single chip and may contain connections/couplings for wires, not shown, or radio frequency circuits and an antenna for radio frequency transfer of power and signals from the strain gage 366 to an interrogator mounted on the vehicle, not shown. In this manner, the interrogator supplies power and receives the instantaneous strain value that is measured by the strain gage 366.

Although a single strain element 366 has been illustrated, the bolt 360 may contain 1, 2, or even as many as 4 such strain gage assemblies on various sides of bolt section 365. Other stain gage technologies can also be used.

Another example of a stud which is threaded on both ends and which can be used to measure the weight of an occupant seat is illustrated in FIGS. 74A-74D. The operation of this device is disclosed in U.S. Pat. No. 6,653,577 wherein the center section of stud 371 is solid. It has been discovered that sensitivity of the device can be significantly improved if a slotted member is used as described in U.S. Pat. No. 5,539,236. FIG. 74A illustrates a SAW strain gage 372 mounted on a substrate and attached to span a slot 374 in a center section 375 of the stud 371. This technique can be used with any other strain-measuring device.

FIG. 74B is a side view of the device of FIG. 74A.

FIG. 74C illustrates use of a single hole 376 drilled off-center in the center section 375 of the stud 371. The single hole 376 also serves to magnify the strain as sensed by the strain gage 372. It has the advantage in that strain gage 372 does not need to span an open space. The amount of magnification obtained from this design, however, is significantly less than obtained with the design of FIG. 74A.

To improve the sensitivity of the device shown in FIG. 74C, multiple smaller holes 377 can be used as illustrated in FIG. 74D. FIG. 74E in an alternate configuration showing three of four gages 372 for determining the bending moments as well as the axial stress in the support member.

In operation, the SAW strain gage 372 receives radio frequency waves from an interrogator 378 and returns electromagnetic waves via a respective antenna 373 which are delayed based on the strain sensed by strain gage 372.

Occupant weight sensors can give erroneous results if the seatbelt is pulled tight pushing the occupant into the seat. This is particularly a problem when the seatbelt is not attached to the seat. For such cases, it has been proposed to measure the tension in various parts of the seatbelt. Conventional technology requires that such devices be hard-wired into the vehicle complicating the wire harness.

Other components of the vehicle can also be wirelessly coupled to the processor or central control module for the purposes of data transmission and/or power transmission. A discussion of some components follows.

Seat Systems

In more enhanced applications, it is envisioned that components of the seat will be integrated into the power transmission and communication system. In many luxury cars, the seat subsystem is becoming very complicated. Seat manufacturers state that almost all warranty repairs are associated with the wiring and connectors associated with the seat. The reliability of seat systems can therefore be substantially improved and the incidence of failures or warranty repairs drastically reduced if the wires and connectors can be eliminated from the seat subsystem.

Today, there are switches located on the seat or at other locations in the vehicle for controlling the forward and backward motions, up and down motions, and rotation of the seat and seat back. These switches are connected to the appropriate motors by wires. Additionally, many seats now contain an airbag that must communicate with a sensor located, for example, in the vehicle, B-pillar, sill or door. Many occupant presence sensors and weight sensing systems are also appearing on vehicle seats. Finally, some seats contain heaters and cooling elements, vibrators, and other comfort and convenience devices that require wires and switches.

As an example, let us now look at weight sensing. Under the teachings of an invention disclosed herein, silicon strain gage weight sensors can be placed on the bolts that secure each seat to the slide mechanism as shown in FIG. 73. These strain gage subsystems can contain sufficient electronics and inductive pickup coils so as to receive their operational energy from a pair of wires appropriately placed beneath the seats. The seat weight measurements can then be superimposed on the power frequency or transmitted wirelessly using RF or other convenient wireless technology. Other weight sensing technologies such as bladders and pressure sensors or two-dimensional resistive deflection sensing mats can also be handled in a similar manner.

Other methods of seat weight sensing include measuring the deflection of a part of the seat or the deflection of the bolts that connect the seat to the seat slide. For example, the strain in a bolt can be readily determined using, for example, SAW, wire or silicon strain gages, optical fiber strain gages, time of flight or phase of ultrasonic waves traveling through the strained bolt, or the capacitive change of two appropriately position capacitor plates.

Using the loosely coupled inductive system described above, power in excess of a kilowatt can be readily transferred to operate seat position motors without the use of directly connected wires. The switches can also be coupled into the inductive system without any direct wire connections and the switches, which now can be placed on the door armrest or on the seat as desired, can provide the information to control the seat motors. Additionally, since microprocessors will now be present on every motor and switch, the classical problem of the four-way seat system to control three degrees of freedom can be easily solved.

In current four-way seat systems, when an attempt is made to vertically raise the seat, the seat also rotates. Similarly, when an attempt is made to rotate the seat, it also invariably moves either up or down. This is because there are four switches to control three degrees of freedom and thus there is an infinite combination of switch settings for each seat position setting. This problem can be easily solved with an algorithm that translates the switch settings to the proper motor positions. Thus only three switches are needed.

The positions of the seat, seatback and headrest, can also be readily monitored without having direct wire connections to the vehicle. This can be done in numerous ways beginning with the encoder system that is currently in use and ending with simple RFID radar reflective tags that can be interrogated by a remote RFID tag reader. Based on the time of flight of RF waves, the positions of all of the desired surfaces of the seat can be instantly determined wirelessly.

1.7 Vehicle or Component Control

At least one invention herein is also particularly useful in light of the foreseeable implementation of smart highways. Smart highways will result in vehicles traveling down highways under partial or complete control of an automatic system, i.e., not being controlled by the driver. The on-board diagnostic system will thus be able to determine failure of a component prior to or upon failure thereof and inform the vehicle's guidance system to cause the vehicle to move out of the stream of traffic, i.e., onto a shoulder of the highway, in a safe and orderly manner. Moreover, the diagnostic system may be controlled or programmed to prevent the movement of the disabled vehicle back into the stream of traffic until the repair of the component is satisfactorily completed.

In a method in accordance with this embodiment, the operation of the component would be monitored and if abnormal operation of the component is detected, e.g., by any of the methods and apparatus disclosed herein (although other component failure systems may of course be used in this implementation), the guidance system of the vehicle which controls the movement of the vehicle would be notified, e.g., via a signal from the diagnostic module to the guidance system, and the guidance system would be programmed to move the vehicle out of the stream of traffic, or off of the restricted roadway, possibly to a service station or dealer, upon reception of the particular signal from the diagnostic module.

The automatic guidance systems for vehicles traveling on highways may be any existing system or system being developed, such as one based on satellite positioning techniques or ground-based positioning techniques. It can also be based on vision systems such as those used to provide lane departure warning. Since the guidance system may be programmed to ascertain the vehicle's position on the highway, it can determine the vehicle's current position, the nearest location out of the stream of traffic, or off of the restricted roadway, such as an appropriate shoulder or exit to which the vehicle may be moved, and the path of movement of the vehicle from the current position to the location out of the stream of traffic, or off of the restricted roadway. The vehicle may thus be moved along this path under the control of the automatic guidance system. In the alternative, the path may be displayed to a driver (on a heads-up or other display for example) and the driver can follow the path, i.e., manually control the vehicle. The diagnostic module and/or guidance system may be designed to prevent re-entry of the vehicle into the stream of traffic, or off of the restricted roadway, until the abnormal operation of the component is satisfactorily addressed.

FIG. 75 is a flow chart of some of the methods for directing a vehicle off of a roadway if a component is operating abnormally. The component's operation is monitored at step 380 and a determination is made at step 381 whether its operation is abnormal. If not, tthe operation of the component is monitored further. If the operation of the component is abnormal, the vehicle can be directed off the roadway at step 382. More particularly, this can be accomplished by generating a signal indicating the abnormal operation of the component at step 383, directing this signal to a guidance system in the vehicle at step 384 that guides movement of the vehicle off of the roadway at step 385. Also, if the component is operating abnormally, the current position of the vehicle and the location of a site off of the roadway can be determined at step 386, e.g., using satellite-based or ground-based location determining techniques, a path from the current location to the off-roadway location determined at step 387 and then the vehicle directed along this path at step 388. Periodically, a determination is made at step 389 whether the component's abnormality has been satisfactorily addressed and/or corrected and if so, the vehicle can re-enter the roadway and operation of the component begins again. If not, the re-entry of the vehicle onto the roadway is prevented at step 390.

FIG. 76 schematically shows the basic components for performing this method, i.e., a component operation monitoring system 391 (such as described above), an optional satellite-based or ground-based positioning system 392 and a vehicle guidance system 393.

2.0 Telematics 2.1 Transmission of Vehicle and Occupant Information

Described herein is a system for determining the status of occupants in a vehicle, and/or of the vehicle, and in the event of an accident or at any other appropriate time, transmitting the status of the occupants and/or the vehicle, and optionally additional information, via a communications channel or link to a remote monitoring facility. In addition to the status of the occupant, it is also important to be able to analyze the operating conditions of the vehicle and detect when a component of the vehicle is about to fail. By notifying the driver, a dealer or other repair facility and/or the vehicle manufacturer of the impending failure of the component, appropriate corrective action can be taken to avoid such failure.

As noted above, at least one invention herein relates generally to telematics and the transmission of information from a vehicle to one or more remote sites which can react to the position or status of the vehicle or occupant(s) therein.

Initially, sensing of the occupancy of the vehicle and the optional transmission of this information, which may include images, to remote locations will be discussed. This entails obtaining information from various sensors about the occupant(s) in the passenger compartment of the vehicle, e.g., the number of occupants, their type and their motion, if any. Thereafter, general vehicle diagnostic methods will be discussed with the diagnosis being transmittable via a communications device to the remote locations. Finally, a discussion of various sensors for use on the vehicle to sense different operating parameters and conditions of the vehicle is provided. All of the sensors discussed herein can be coupled to a communications device enabling transmission of data, signals and/or images to the remote locations, and reception of the same from the remote locations.

FIG. 77 shows schematically the interface between a vehicle interior monitoring system in accordance with the invention and the vehicle's cellular or other telematics communication system. An adult occupant 395 is shown sitting on the front passenger seat 343 and four transducers 344, 345, 347 and 348 are used to determine the presence (or absence) of the occupant on that seat 343. One of the transducers 345 in this case acts as both a transmitter and receiver while transducer 344 can act only as a receiver or as both a transmitter and receiver. Alternately, transducer 344 could serve as both a transmitter and receiver or the transmitting function could be alternated between the two transducers 344, 345. Also, in many cases more than two transmitters and receivers are used and in still other cases, other types of sensors, such as electric field, capacitance, self-tuning antennas (collectively represented by 347 and 348), weight, seatbelt, heartbeat, motion and seat position sensors, are also used in combination with the radiation sensors.

For a general object, transducers 344, 345, 347, 348 can also be used to determine the type of object, determine the location of the object and/or determine another property or characteristic of the object. A property of the object could be the presence and/or orientation of a child seat, the velocity of an adult and the like. For example, the transducers 344, 345, 347, 348 can be designed to enable a determination that an object is present on the seat, that the object is a child seat and that the child seat is rear-facing.

The transducers 344 and 345 are attached to the vehicle buried in the A-pillar trim, where their presence can be disguised, and are connected to processor 340 that may also be hidden in the trim as shown (this being a non-limiting position for the processor 340). Other mounting locations can also be used. For example, transducers 344, 345 can be mounted inside the seat (along with or in place of transducers 347 and 348), in the ceiling of the vehicle, in the B-pillar, in the C-pillar and in the doors. Indeed, the vehicle interior monitoring system in accordance with the invention may comprise a plurality of monitoring units, each arranged to monitor a particular seating location. In this case, for the rear seating locations, transducers might be mounted in the B-pillar or C-pillar or in the rear of the front seat or in the rear side doors. Possible mounting locations for transducers, transmitters, receivers and other occupant sensing devices are disclosed in the above-referenced patents and patent applications and all of these mounting locations are contemplated for use with the transducers described herein.

The cellular phone or other communications system 396 outputs to an antenna 397. The transducers 344, 345, 347 and 348 in conjunction with the pattern recognition hardware and software, which is implemented in processor 340 and is packaged on a printed circuit board or flex circuit along with the transducers 344 and 345, determine the presence of an occupant within a few seconds after the vehicle is started, or within a few seconds after the door is closed. Similar systems located to monitor the remaining seats in the vehicle also determine the presence of occupants at the other seating locations and this result is stored in the computer memory which is part of each monitoring system processor 340.

Periodically and in particular in the event of or in anticipation of an accident, the electronic system associated with the cellular phone or other telematics system 396 interrogates the various interior monitoring system memories and arrives at a count of the number of occupants in the vehicle, and optionally, even makes a determination as to whether each occupant was wearing a seatbelt and if he or she is moving after the accident. The phone or other communications system then automatically dials or otherwise contacts the EMS operator (such as 911 or through a telematics service such as OnStar (®) and the information obtained from the interior monitoring systems is forwarded so that a determination can be made as to the number of ambulances and other equipment to send to the accident site, for example. Such vehicles will also have a system, such as the global positioning system, which permits the vehicle to determine its exact location and to forward this information to the EMS operator, for example.

An alternate preferred communications system is the use of satellite internet or Wi-Fi internet such is expected to be operational on vehicles in a few years. In this manner, the vehicle will always have communications access regardless of its location on the earth. This is based on the premise that Wi-Fi will be in place for all those locations where satellite communication is not available such as in tunnels, urban canyons and the like.

Thus, in basic embodiments of the invention, wave or other energy-receiving transducers are arranged in the vehicle at appropriate locations, trained if necessary depending on the particular embodiment, and function to determine whether a life form is present in the vehicle and if so, how many life forms are present and where they are located etc. To this end, transducers can be arranged to be operative at only a single seating locations or at multiple seating locations with a provision being made to eliminate repetitive count of occupants. A determination can also be made using the transducers as to whether the life forms are humans, or more specifically, adults, children in child seats, etc. As noted above, this is possible using pattern recognition techniques. Moreover, the processor or processors associated with the transducers can be trained to determine the location of the life forms, either periodically or continuously or possibly only immediately before, during and after a crash. The location of the life forms can be as general or as specific as necessary depending on the system requirements, i.e., that a human is situated on the driver's seat in a normal position (general) or a determination can be made that a human is situated on the driver's seat and is leaning forward and/or to the side at a specific angle as well as the position of his or her extremities and head and chest (specifically). The degree of detail is limited by several factors, including, for example, the number, type and position of transducers and training of the pattern recognition algorithm.

In addition to the use of transducers to determine the presence and location of occupants in a vehicle, other sensors could also be used. For example, a heartbeat sensor which determines the number and presence of heartbeats can also be arranged in the vehicle, which would thus also determine the number of occupants as the number of occupants would be equal to the number of heartbeats. Conventional heartbeat sensors can be adapted to differentiate between a heartbeat of an adult, a heartbeat of a child and a heartbeat of an animal. As its name implies, a heartbeat sensor detects a heartbeat, and the magnitude thereof, of a human occupant of the seat, if such a human occupant is present. The output of the heartbeat sensor is input to the processor of the interior monitoring system. One heartbeat sensor for use in the invention may be of the types as disclosed in McEwan (U.S. Pat. Nos. 5,573, 012 and 5,766,208). The heartbeat sensor can be positioned at any convenient position relative to the seats where occupancy is being monitored. A preferred location is within the vehicle seat back.

An alternative way to determine the number of occupants is to monitor the weight being applied to the seats, i.e., each seating location, by arranging weight sensors at each seating location which might also be able to provide a weight distribution of an object on the seat. Analysis of the weight and/or weight distribution by a predetermined method can provide an indication of occupancy by a human, an adult or child, or an inanimate object.

Another type of sensor which is not believed to have been used in an interior monitoring system heretofore is a micropower impulse radar (MIR) sensor which determines motion of an occupant and thus can determine his or her heartbeat (as evidenced by motion of the chest). Such an MIR sensor can be arranged to detect motion in a particular area in which the occupant's chest would most likely be situated or could be coupled to an arrangement which determines the location of the occupant's chest and then adjusts the operational field of the MIR sensor based on the determined location of the occupant's chest. A motion sensor utilizing a micropower impulse radar (MIR) system is disclosed, for example, in McEwan (U.S. Pat. No. 5,361,070), as well as many other patents by the same inventor. Motion sensing is accomplished by monitoring a particular range from the sensor, as disclosed in that patent. MIR is one form of radar which has applicability to occupant sensing and can be mounted at various locations in the vehicle. It has an advantage over ultrasonic sensors in that data can be acquired at a higher speed and thus the motion of an occupant can be more easily tracked. The ability to obtain returns over the entire occupancy range is somewhat more difficult than with ultrasound resulting in a more expensive system overall. MIR has additional advantages in lack of sensitivity to temperature variation and has a comparable resolution to about 40 kHz ultrasound. Resolution comparable to higher frequency is also possible. Additionally, multiple MIR sensors can be used when high speed tracking of the motion of an occupant during a crash is required since they can be individually pulsed without interfering with each through time division multiplexing.

An alternative way to determine motion of the occupant(s) is to monitor the weight distribution of the occupant whereby changes in weight distribution after an accident would be highly suggestive of movement of the occupant. A system for determining the weight distribution of the occupants could be integrated or otherwise arranged in the right center and left, front and back vehicle seats such as 343 and several patents and publications describe such systems.

More generally, any sensor which determines the presence and health state of an occupant can also be integrated into the vehicle interior monitoring system in accordance with the invention. For example, a sensitive motion sensor can determine whether an occupant is breathing and a chemical sensor can determine the amount of carbon dioxide, or the concentration of carbon dioxide, in the air in the vehicle which can be correlated to the health state of the occupant(s). The motion sensor and chemical sensor can be designed to have a fixed operational field situated where the occupant's mouth is most likely to be located. In this manner, detection of carbon dioxide in the fixed operational field could be used as an indication of the presence of a human occupant in order to enable the determination of the number of occupants in the vehicle. In the alternative, the motion sensor and chemical sensor can be adjustable and adapted to adjust their operational field in conjunction with a determination by an occupant position and location sensor which would determine the location of specific parts of the occupant's body, e.g., his or her chest or mouth. Furthermore, an occupant position and location sensor can be used to determine the location of the occupant's eyes and determine whether the occupant is conscious, i.e., whether his or her eyes are open or closed or moving.

The use of chemical sensors can also be used to detect whether there is blood present in the vehicle, for example, after an accident. Additionally, microphones can detect whether there is noise in the vehicle caused by groaning, yelling, etc., and transmit any such noise through the cellular or other communication connection to a remote listening facility (such as operated by OnStar(R)).

FIG. 78 shows a schematic diagram of an embodiment of the invention including a system for determining the presence and health state of any occupants of the vehicle and a telecommunications link. This embodiment includes a system for determining the presence of any occupants 400 which may take the form of a heartbeat sensor or motion sensor as described above and a system for determining the health state of any occupants 401. The health state determining system may be integrated into the system for determining the presence of any occupants, i.e., one and the same component, or separate therefrom. Further, a system for determining the location, and optionally velocity, of the occupants or one or more parts thereof 402 are provided and may be any conventional occupant position sensor or preferably, one of the occupant position sensors as described herein (e.g., those utilizing waves. electromagnetic radiation or electric fields) or as described in the current assignee's patents and patent applications referenced above.

A processor 403 is coupled to the presence determining system 400, the health state determining system 401 and the location determining system 402. A communications unit 404 is coupled to the processor 403. The processor 403 and/or communications unit 404 can also be coupled to microphones 405 that can be distributed throughout the vehicle and include voice-processing circuitry to enable the occupant(s) to effect vocal control of the processor 403, communications unit 404 or any coupled component or oral communications via the communications unit 404. The processor 403 is also coupled to another vehicular system, component or subsystem 406 and can issue control commands to effect adjustment of the operating conditions of the system, component or subsystem. Such a system, component or subsystem can be the heating or air-conditioning system, the entertainment system, an occupant restraint device such as an airbag, a glare prevention system, etc. Also, a positioning system 407 could be coupled to the processor 403 and provides an indication of the absolute position of the vehicle, preferably using satellite-based positioning technology (e.g., a GPS receiver).

In normal use (other than after a crash), the presence determining system 400 determines whether any human occupants are present, i.e., adults or children, and the location determining system 402 determines the occupant's location. The processor 403 receives signals represenative of the presence of occupants and their location and determines whether the vehicular system, component or subsystem 406 can be modified to optimize its operation for the specific arrangement of occupants. For example, if the processor 403 determines that only the front seats in the vehicle are occupied, it could control the heating system to provide heat only through vents situated to provide heat for the front-seated occupants.

Another possible vehicular system, component or subsystem is a navigational aid, i.e., a route display or map. In this case, the position of the vehicle as determined by the positioning system 407 is conveyed through processor 403 to the communications unit 404 to a remote facility and a map is transmitted from this facility to the vehicle to be displayed on the route display. If directions are needed, a request for the same could be entered into an input unit 408 associated with the processor 403 and transmitted to the facility. Data for the display map and/or vocal instructions could be transmitted from this facility to the vehicle.

Moreover, using this embodiment, it is possible to remotely monitor the health state of the occupants in the vehicle and most importantly, the driver. The health state determining system 401 may be used to detect whether the driver's breathing is erratic or indicative of a state in which the driver is dozing off. The health state determining system 401 could also include a breath-analyzer to determine whether the driver's breath contains alcohol. In this case, the health state of the driver is relayed through the processor 403 and the communications unit 404 to the remote facility and appropriate action can be taken. For example, it would be possible to transmit a command (from the remote facility) to the vehicle to activate an alarm or illuminate a warning light or if the vehicle is equipped with an automatic guidance system and ignition shut-off, to cause the vehicle to come to a stop on the shoulder of the roadway or elsewhere out of the traffic stream. The alarm, warning light, automatic guidance system and ignition shut-off are thus particular vehicular components or subsystems represented by 406.

In use after a crash, the presence determining system 400, health state determining system 401 and location determining system 402 can obtain readings from the passenger compartment and direct such readings to the processor 403. The processor 403 analyzes the information and directs or controls the transmission of the information about the occupant(s) to a remote, manned facility. Such information would include the number and type of occupants, i.e., adults, children, infants, whether any of the occupants have stopped breathing or are breathing erratically, whether the occupants are conscious (as evidenced by, e.g., eye motion), whether blood is present (as detected by a chemical sensor) and whether the occupants are making noise. Moreover, the communications link through the communications unit 404 can be activated immediately after the crash to enable personnel at the remote facility to initiate communications with the vehicle.

An occupant sensing system can also involve sensing for the presence of a living occupant in a trunk of a vehicle or in a closed vehicle, for example, when a child is inadvertently left in the vehicle or enters the trunk and the trunk closes. To this end, a SAW-based chemical sensor 410 is illustrated in FIG. 79A for mounting in a vehicle trunk as illustrated in FIG. 79. The chemical sensor 410 is designed to measure carbon dioxide concentration through the mass loading effects as described in U.S. Pat. No. 4,895,017 with a polymer coating selected that is sensitive to carbon dioxide. The speed of the surface acoustic wave is a function of the carbon dioxide level in the atmosphere. Section 412 of the chemical sensor 410 contains a coating of such a polymer and the acoustic velocity in this section is a measure of the carbon dioxide concentration. Temperature effects are eliminated through a comparison of the sonic velocities in sections 412 and 411 as described above.

Thus, when the trunk lid 409 is closed and a source of carbon dioxide such as a child or animal is trapped within the trunk, the chemical sensor 410 will provide information indicating the presence of the carbon dioxide producing object to the interrogator which can then release a trunk lock permitting the trunk lid 409 to automatically open. In this manner, the problem of children and animals suffocating in closed trunks is eliminated. Alternately, information that a person or animal is trapped in a trunk can be sent by the telematics system to law enforcement authorities or other location or facility remote from the vehicle.

A similar device can be distributed at various locations within the passenger compartment of vehicle along with a combined temperature sensor. If the car has been left with a child or other animal while the owner is shopping, for example, and if the temperature rises within the vehicle to an unsafe level or, alternately, if the temperature drops below an unsafe level, then the vehicle can be signaled to take appropriate action which may involve opening the windows or starting the vehicle with either air conditioning or heating as appropriate. Alternately, information that a person or animal is trapped within a vehicle can be sent by the telematics system to law enforcement authorities or another location remote from the vehicle. Thus, through these simple wireless powerless sensors, the problem of suffocation either from lack of oxygen or death from excessive heat or cold can all be solved in a simple, low-cost manner through using an interrogator as disclosed in U.S. Pat. No. 6,662,642.

Additionally, a sensitive layer on a SAW can be made to be sensitive to other chemicals such as water vapor for humidity control or alcohol for drunk-driving control. Similarly, the sensitive layer can be designed to be sensitive to carbon monoxide thereby preventing carbon monoxide poisoning. Many other chemicals can be sensed for specific applications such as to check for chemical leaks in commercial vehicles, for example. Whenever such a sensor system determines that a dangerous situation is developing, an alarm can be sounded and/or the situation can be automatically communicated to an off-vehicle location through the internet, telematics, a cell phone such as a 911 call, the Internet or though a subscriber service such as OnStar®.

The operating conditions of the vehicle can also be transmitted along with the status of the occupants to a remote monitoring facility. The operating conditions of the vehicle include whether the motor is running and whether the vehicle is moving. Thus, in a general embodiment in which information on both occupancy of the vehicle and the operating conditions of the vehicle are transmitted, one or more properties or characteristics of occupancy of the vehicle are determined, such constituting information about the occupancy of the vehicle, and one or more states of the vehicle or of a component of the vehicle is determined, such constituting information about the operation of the vehicle. The information about the occupancy of the vehicle and operation of the vehicle are selectively transmitted, possibly the information about occupancy to an emergency response center and the information about the vehicle to a dispatcher, a dealer or repair facility and/or the vehicle manufacturer.

Transmission of the information about the operation of the vehicle, i.e., diagnostic information, may be achieved via a satellite and/or via the Internet. The vehicle would thus include appropriate electronic hardware and/or software to enable the transmission of a signal to a satellite, from where it could be re-transmitted to a remote location (for example via the Internet), and/or to enable the transmission to a web site or host computer. In the latter case, the vehicle could be assigned a domain name or e-mail address for identification or transmission origination purposes.

The diagnostic discussion above has centered on notifying the vehicle operator of a pending problem with a vehicle component. Today, there is great competition in the automobile marketplace and the manufacturers and dealers who are most responsive to customers are likely to benefit by increased sales both from repeat purchasers and new customers. The diagnostic module disclosed herein benefits the dealer by making him instantly aware, through the cellular telephone system, or other communication link, coupled to the diagnostic module or system in accordance with the invention, when a component is likely to fail. As envisioned when the diagnostic module 33 detects a potential failure it not only notifies the driver through a display 34 (as shown in FIGS. 3 and 4), but also automatically notifies the dealer through a vehicle cellular phone 32 or other telematics communication link such as the internet via satellite or Wi-Fi. The dealer can thus contact the vehicle owner and schedule an appointment to undertake the necessary repair at each party's mutual convenience. Contact by the dealer to the vehicle owner can occur as the owner is driving the vehicle, using a communications device. Thus, the dealer can contact the driver and inform him of their mutual knowledge of the problem and discuss scheduling maintenance to attend to the problem. The customer is pleased since a potential vehicle breakdown has been avoided and the dealer is pleased since he is likely to perform the repair work. The vehicle manufacturer also benefits by early and accurate statistics on the failure rate of vehicle components. This early warning system can reduce the cost of a potential recall for components having design defects. It could even have saved lives if such a system had been in place during the Firestone tire failure problem mentioned above. The vehicle manufacturer will thus be guided toward producing higher quality vehicles thus improving his competitiveness. Finally, experience with this system will actually lead to a reduction in the number of sensors on the vehicle since only those sensors that are successful in predicting failures will be necessary.

For most cases, it is sufficient to notify a driver that a component is about to fail through a warning display. In some critical cases, action beyond warning the driver may be required. If, for example, the diagnostic module detected that the alternator was beginning to fail, in addition to warning the driver of this eventuality, the diagnostic system could send a signal to another vehicle system to turn off all non-essential devices which use electricity thereby conserving electrical energy and maximizing the time and distance that the vehicle can travel before exhausting the energy in the battery. Additionally, this system can be coupled to a system such as OnStar® or a vehicle route guidance system, and the driver can be guided to the nearest open repair facility or a facility of his or her choice.

FIG. 80 shows a schematic of the integration of the occupant sensing with a telematics link and the vehicle diagnosis with a telematics link. As envisioned, the occupant sensing system 415 includes those components which determine the presence, position, health state, and other information relating to the occupants, for example the transducers discussed above with reference to FIGS. 68 and 69 and the SAW device discussed above with reference to FIG. 79. Information relating to the occupants includes information as to what the driver is doing, talking on the phone, communicating with OnStar®, the internet or other route guidance, listening to the radio, sleeping, drunk, drugged, having a heart attack, etc. The occupant sensing system may also be any of those systems and apparatus described in any of the current assignee's above-referenced patents and patent applications or any other comparable occupant sensing system which performs any or all of the same functions as they relate to occupant sensing. Examples of sensors which might be installed on a vehicle and constitute the occupant sensing system include heartbeat sensors, motion sensors, weight sensors, ultrasonic sensors, MIR sensors, microphones and optical sensors.

A crash sensor 416 is provided and determines when the vehicle experiences a crash. Crash sensor 416 may be any type of crash sensor.

Vehicle sensors 417 include sensors which detect the operating conditions of the vehicle such as those sensors discussed with reference to FIG. 79 and others above. Also included are tire sensors such as disclosed in U.S. Pat. No. 6,662,642. Other examples include velocity and acceleration sensors, and angular and angular rate pitch, roll and yaw sensors or an IMU. Of particular importance are sensors that tell what the car is doing: speed, skidding, sliding, location, communicating with other cars or the infrastructure, etc.

Environment sensors 418 include sensors which provide data concerning the operating environment of the vehicle, e.g., the inside and outside temperatures, the time of day, the location of the sun and lights, the locations of other vehicles, rain, snow, sleet, visibility (fog), general road condition information, pot holes, ice, snow cover, road visibility, assessment of traffic, video pictures of an accident either involving the vehicle or another vehicle, etc. Possible sensors include optical sensors which obtain images of the environment surrounding the vehicle, blind spot detectors which provide data on the blind spot of the driver, automatic cruise control sensors that can provide images of vehicles in front of the host vehicle, and various radar and lidar devices which provide the position of other vehicles and objects relative to the subject vehicle.

The occupant sensing system 415, crash sensors 416, vehicle sensors 417, and environment sensors 418 can all be coupled to a communications device 419 which may contain a memory unit and appropriate electrical hardware to communicate with all of the sensors, process data from the sensors, and transmit data from the sensors. The memory unit could be useful to store data from the sensors, updated periodically, so that such information could be transmitted at set time intervals.

The communications device 419 can be designed to transmit information to any number of different types of facilities. For example, the communications device 419 could be designed to transmit information to an emergency response facility 420 in the event of an accident involving the vehicle. The transmission of the information could be triggered by a signal from the crash sensor 416 that the vehicle was experiencing a crash or had experienced a crash. The information transmitted could come from the occupant sensing system 415 so that the emergency response could be tailored to the status of the occupants. For example, if the vehicle was determined to have ten occupants, more ambulances might be sent than if the vehicle contained only a single occupant. Also, if the occupants are determined not be breathing, then a higher priority call with living survivors might receive assistance first. As such, the information from the occupant sensing system 415 could be used to prioritize the duties of the emergency response personnel.

Information from the vehicle sensors 417 and environment sensors 418 could also be transmitted to law enforcement authorities 422 in the event of an accident so that the cause(s) of the accident could be determined. Such information can also include information from the occupant sensing system 415, which might reveal that the driver was talking on the phone, putting on make-up, or another distracting activity, information from the vehicle sensors 417 which might reveal a problem with the vehicle, and information from the environment sensors 418 which might reveal the existence of slippery roads, dense fog and the like.

Information from the occupant sensing system 415, vehicle sensors 417 and environment sensors 418 could also be transmitted to the vehicle manufacturer 423 in the event of an accident so that a determination can be made as to whether failure of a component of the vehicle caused or contributed to the cause of the accident. For example, the vehicle sensors might determine that the tire pressure was too low so that advice can be disseminated to avoid maintaining the tire pressure too low in order to avoid an accident. Information from the vehicle sensors 417 relating to component failure could be transmitted to a dealer/repair facility 421 which could schedule maintenance to correct the problem.

The communications device 419 could be designed to transmit particular information to each site, i.e., only information important to be considered by the personnel at that site. For example, the emergency response personnel have no need for the fact that the tire pressure was too low but such information is important to the law enforcement authorities 422 (for the possible purpose of issuing a recall of the tire and/or vehicle) and the vehicle manufacturer 423.

The communication device can be a cellular phone, DSRC, OnStar®, or other subscriber-based telematics system, a peer-to-peer vehicle communication system that eventually communicates to the infrastructure and then, perhaps, to the Internet with e-mail or instant message to the dealer, manufacturer, vehicle owner, law enforcement authorities or others. It can also be a vehicle to LEO or Geostationary satellite system such as SkyBitz which can then forward the information to the appropriate facility either directly or through the Internet or a direct connection to the internet through a satellite or 802.11 Wi-Fi link or equivalent.

The communication may need to be secret so as not to violate the privacy of the occupants and thus encrypted communication may, in many cases, be required. Other innovations described herein include the transmission of any video data from a vehicle to another vehicle or to a facility remote from the vehicle by any means such as a telematics communication system such as DSRC, OnStar®, a cellular phone system, a communication via GEO, geocentric or other satellite system and any communication that communicates the results of a pattern recognition system analysis. Also, any communication from a vehicle can combine sensor information with location information.

When optical sensors are provided as part of the occupant sensing system 415, video conferencing becomes a possibility, whether or not the vehicle experiences a crash. That is, the occupants of the vehicle can engage in a video conference with people at another location 424 via establishment of a communications channel by the communications device 419.

The vehicle diagnostic system described above using a telematics link can transmit information from any type of sensors on the vehicle.

In one particular use of the invention, a wireless sensing and communication system is provided whereby the information or data obtained through processing of input from sensors of the wireless sensing and communication system is further transmitted for reception by a remote facility. Thus, in such a construction, there is an intra-vehicle communications between the sensors on the vehicle and a processing system (control module, computer or the like) and remote communications between the same or a coupled processing system (control module, computer or the like). The electronic components for the intra-vehicle communication may be designed to transmit and receive signals over short distances whereas the electronic components which enable remote communications should be designed to transmit and receive signals over relatively long distances.

The wireless sensing and communication system includes sensors that are located on the vehicle or in the vicinity of the vehicle and which provide information which is transmitted to one or more interrogators in the vehicle by wireless radio frequency means, using wireless radio frequency transmission technology. In some cases, the power to operate a particular sensor is supplied by the interrogator while in other cases, the sensor is independently connected to either a battery, generator (piezo electric, solar etc.), vehicle power source or some source of power external to the vehicle.

One particular system requires mentioning which is the use of high speed satellite or Wi-Fi internet service such as supplied by Wi-Fi hot spots or KVH Industries, Inc. for any and all vehicle communications including vehicle telephone, TV and radio services. With thousands of radio stations available over the internet, for example (see shoutcast.com), a high speed internet connection is clearly superior to satellite radio systems that are now being marketed. Similarly, with ubiquitous internet access that KVH supplies throughout the country, the lack of coverage problems with cell phones disappears. This capability becomes particularly useful for emergency notification when a vehicle has an accident or becomes disabled.

2.2 Docking Stations and PDAs

There is a serious problem developing with vehicles such as cars, trucks, boats and private planes and computer systems. The quality and lifetime of vehicles is increasing and now many vehicles have a lifetime that exceeds ten or more years. On the other hand, computer and related electronic systems, which are proliferating on such vehicles, have shorter and shorter life spans as they are made obsolete by the exponential advances in technology. Owners do not want to dispose of their vehicles just because the electronics have become obsolete. Therefore, a solution as proposed in this invention, whereby a substantial portion of the information, programs, processing power and memory are separate from the vehicle, will increasingly become necessary. One implementation of such a system is for the information, programs, processing power and memory to be resident in a portable device that can be removed from the vehicle. Once removed, the vehicle may still be operable but with reduced functionality.

The navigation system, for example, may be resident on the removable device which hereinafter will be referred to as a Personal Information Device (PID) including a GPS subsystem and perhaps an IMU along with appropriate maps allowing a person to navigate on foot as well as in the vehicle.

The telephone system which can be either internet or cell phone-based and if internet-based, can be a satellite internet, Wi-Fi or equivalent system which could be equally operable in a vehicle or on foot. The software data and programs can be kept updated including all of the software for diagnostic functions, for example, for the vehicle through the internet connection. The vehicle could contain supplemental displays (such as a heads-up display), input devices including touch pads, switches, voice recognition and cameras for occupant position determination and gesture recognition, and other output devices such as speakers, warning lights etc., for example.

As computer hardware improves it can be an easy step for the owner to replace the PID with the latest version which may even be supplied to the owner under subscription by the Cell Phone Company, car dealership, vehicle manufacturer, computer manufacturer etc. Similarly, the same device can be used to operate the home computer system or entertainment system. In other words, the owner would own one device, the PID, which would contain substantially all of the processing power, software and information that the owner requires to operate his vehicles, computer systems etc. The system can also be periodically backed up (perhaps also over the Internet), automatically providing protection against loss of data in the event of a system failure. The PID can also have a biometrics-based identification system (fingerprint, voiceprint, face or iris recognition etc.) that prevents unauthorized users from using the system and an automatic call back location system based on GPS or other location technologies that permits the owner to immediately find the location of the PID in the event of misplacement or theft.

The PID can also be the repository of credit card information permitting instant purchases without the physical scanning of a separate credit card, home or car door identification system to eliminate keys and conventional keyless entry systems, and other information of a medical nature to aid emergency services in the event of a medical emergency. The possibilities are limitless for such a device. A PID, for example, can be provided with sensors to monitor the vital functions of an elderly person and signal if a problem occurs. The PID can be programmed and provided with sensors to sense fire, cold, harmful chemicals or vapors, biological agents (such as smallpox or anthrax) for use in a vehicle or any other environment. An automatic phone call, or other communication, can be initiated when a hazardous substance (or any other dangerous or hazardous situation or event) is detected to inform the authorities along with the location of the PID. Since the PID would have universal features, it could be taken from vehicle to vehicle allowing each person to have personal features in whatever vehicle he or she was operating. This would be useful for rental vehicles, for example, seats, mirrors, radio stations, HVAC can be automatically set for the PID owner. The same feature can apply to offices, homes, etc.

The same PID can also be used to signal the presence of a particular person in a room and thereby to set the appropriate TV or radio stations, room temperature, lighting, wall pictures etc. For example, the PID could also assume the features of a remote when a person is watching TV. A person could of course have more than one PID and a PID could be used by more than one person provided a means of identification is present such as a biometric based ID or password system. Thus, each individual would need to learn to operate one device, the PID, instead of multiple devices. The PID could even be used to automatically unlock and initiate some action such as opening a door or turning on lights in a vehicle, house, apartment or building. Naturally, the PID can have a variety of associated sensors as discussed above including cameras, microphones, accelerometers, an IMU, GPS receiver, Wi-Fi receiver etc.

Other people could also determine the location of a person carrying the PID, if such a service is authorized by the PID owner. In this manner, parents can locate their children or friends can locate each other in a crowded restaurant or airport. The location or tracking information can be made available on the Internet through the Skybitz or similar low power tracking system. Also, the batteries that operate the PID can be recharged in a variety of ways including fuel cells and vibration-based power generators, solar power, induction charging systems etc. For further background, see N. Tredennick "031201 Go Reconfigure", IEEE Spectrum Magazine, p. 37-40, December 2003 and D. Verkest "Machine Cameleon" ibid p. 41-46, which describe some of the non-vehicle related properties envisioned here for the PID. Also for some automotive applications see P. Hansen "Portable electronics threaten embedded electronics", Automotive Industries Magazine, December 2004. Such a device could also rely heavily on whatever network it had access to when it is connected to a network such as the Internet. It could use the connected network for many processing tasks which exceed the capability of the PID or which require information that is not PID-resident. In a sense, the network can become the computer for these more demanding tasks. Using the Internet as the computer gives the automobile companies more control over the software and permits a pricing model based on use rather than a one time sale. Such a device can be based on microprocessors, FPGAs or programmable logical devices or a combination thereof. This is the first disclosure of vehicular uses of such a device to solve the mismatched lifetimes of the vehicle and its electronic hardware and software as discussed above.

When brought into a vehicle, the PID can connect (either by a wire of wirelessly using Bluetooth, Zigbee or 802.11 protocols, for example) to the vehicle system and make use of resident displays, audio systems, antennas and input devices. In this case, the display can be a heads-up display (HUD) and the input devices can be by audio, manual switches, touchpad, joystick, or cameras as disclosed in section 4 and elsewhere herein.

2.3 Satellite and Wi-Fi Internet

Ultimately vehicles will be connected to the Internet with a high speed connection. Such a connection will still be too slow for vehicle-to-vehicle communications for collision avoidance purposes but it should be adequate for most other vehicle communication purposes. Such a system will probably obsolete current cell phone systems and subscriber systems such as OnStar™. Each user can have a single identification number (which could be his or her phone number) which locates his or her address, phone number, current location etc. The vehicle navigation system can guide the vehicle to the location based on the identification number without the need to input the actual address.

The ubiquitous Internet system could be achieved by a fleet of low earth orbiting satellites (LEOs) or transmission towers transmitting and receiving signals based on one of the 802.11 protocols having a radial range of 50 miles, for example. Thus, approximately 500 such towers could cover the continental United States.

A high speed Internet connection can be used for software upgrade downloading and for map downloading as needed. Each vehicle can become a probe vehicle that locates road defects such as potholes, monitors traffic and monitors weather and road conditions. It can also monitor for terrorist activities such as the release of chemical or biological agents as well as provide photographs of anomalies such as traffic accidents, mud slides or fallen trees across the road, etc., any or all of this information can be automatically fed to the appropriate IP address over the Internet providing for ubiquitous information gathering and dissemination. The same or similar system can be available on other vehicles such as planes, trains, boats, trucks etc.

Today, high speed Internet access is available via GEO satellite to vehicles using the KVH system. It is expected that more and more cities will provide citywide internet services via 802.11 systems including Wi-Fi, Wi-Max and Wi-Mobile or their equivalents. Eventually, it is expected that such systems will be available in rural areas thus making the Internet available nationwide and eventually worldwide through one or a combination of satellite and terrestrial systems. Although the KVH system is based on GEO satellites, it is expected that eventually LEO satellites will offer a similar service at a lower price and requiring a smaller antenna. Such an antenna will probably be based on phase array technology.

3.0 Wiring and Busses

In the discussion above, the diagnostic module of this invention assumes that a vehicle data bus exists which is used by all of the relevant sensors on the vehicle. Most vehicles today do not have a data bus although it is widely believed that most vehicles will have one in the future. In lieu of such a bus, the relevant signals can be transmitted to the diagnostic module through a variety of coupling systems other than through a data bus and this invention is not limited to vehicles having a data bus. For example, the data can be sent wirelessly to the diagnostic module using the Bluetooth™, ZIGBEE or 802.11 or similar specification. In some cases, even the sensors do not have to be wired and can obtain their power via RF from the interrogator as is well known in the RFID radio frequency identification field (either silicon or surface acoustic wave (SAW)-based)). Alternately, an inductive or capacitive power transfer system can be used.

Several technologies have been described above all of which have the objective of improving the reliability and reducing the complexity of the wiring system in an automobile and particularly the safety system. Most importantly, the bus technology described has as its objective simplification and increase in reliability of the vehicle wiring system. The safety system wiring was first conceived of as a method for permitting the location of airbag crash sensors at locations where they can most effectively sense a vehicle crash and yet permit that information to be transmitted to the airbag control circuitry which may be located in a protected portion of the interior of the vehicle or may even be located on the airbag module itself. Protecting this transmission requires a wiring system that is far more reliable and resistant to being destroyed in the very crash that the sensor is sensing. This led to the realization that the data bus that carries the information from the crash sensor must be particularly reliable. Upon designing such a data bus, however, it was found that the capacity of that data bus far exceeded the needs of the crash sensor system. This then led to a realization that the capacity, or bandwidth, of such a bus would be sufficient to carry all of the vehicle information requirements. In some cases, this requires the use of high bandwidth bus technology such as twisted pair wires, shielded twisted pair wires, or coax cable. If a subset of all of the vehicle devices is included on the bus, then the bandwidth requirements are less and simpler bus technologies can be used instead of a coax cable, for example. The economics that accompany a data bus design which has the highest reliability, highest bandwidth, is justified if all of the vehicle devices use the same system. This is where the greatest economies and greatest reliability occur. As described above, this permits, for example, the placement of the airbag firing electronics into or adjacent the housing that contains the airbag inflator. Once the integrity of the data bus is assured, such that it will not be destroyed during the crash itself, then the proper place for the airbag intelligence can be in, or adjacent to, the airbag module itself. This further improves the reliability of the system since the shorting of the wires to the airbag module will not inadvertently set off the airbag as has happened frequently in the past.

When operating on the vehicle data bus, each device should have a unique address. For most situations, therefore, this address must be predetermined and then assigned through an agreed-upon standard for all vehicles. Thus, the left rear tail light must have a unique address so that when the turn signal is turned to flash that light, it does not also flash the right tail light, for example. Similarly, the side impact crash sensor which will operate on the same data bus as the frontal impact crash sensor, must issue a command, directly or indirectly, to the side impact airbag and not to the frontal impact airbag.

One of the key advantages of a single bus system connecting all sensors in the vehicle together is the possibility of using this data bus to diagnose the health of the entire safety system or of the entire vehicle, as described in the detail above. Thus, there are clear synergistic advantages to all the disparate technologies described above.

The design, construction, installation, and maintenance a vehicle data bus network requires attention to many issues, including: an appropriate communication protocol, physical layer transceivers for the selected media, capable microprocessors for application and protocol execution, device controller hardware and software for the required sensors and actuators, etc. Such activities are known to those skilled in the art and will not be described in detail here.

An intelligent distributed system as described above can be based on the CAN Protocol, for example, which is a common protocol used in the automotive industry. CAN is a full function network protocol that provides both message checking and correction to insure communication integrity. Many of the devices on the system will have their own special diagnostics. For instance, an inflator control system can send a warning message if its backup power supply has insufficient charge. In order to assure the integrity and reliability of the bus system, most devices will be equipped with bi-directional communication as described above. Thus, when a message is sent to the rear right taillight to turn on, the light can return a message that it has executed the instruction.

In a refinement of this embodiment, more of the electronics associated with the airbag system can be decentralized and housed within or closely adjacent to each of the airbag modules. Each module can have its own electronic package containing a power supply and diagnostic and sometimes also the occupant sensor electronics. One sensor system is still used to initiate deployment of all airbags associated with the frontal impact. To avoid the noise effects of all airbags deploying at the same time, each module sometimes has its own delay. The modules for the rear seat, for example, can have a several millisecond firing delay compared with the module for the driver and the front passenger module can have a lesser delay. Each of the modules can also have its own occupant position sensor and associated electronics. In this configuration, there is a minimum reliance on the transmission of power and data to and from the vehicle electrical system which is the least reliable part of the airbag system, especially during a crash. Once each of the modules receives a signal from the crash sensor system, it is on its own and no longer needs either power or information from the other parts of the system. The main diagnostics for a module can also reside within the module which transmits either a ready or a fault signal to the main monitoring circuit which now needs only to turn on a warning light, and perhaps record the fault, if any of the modules either fails to transmit a ready signal or sends a fault signal.

Thus, the placement of electronic components in or near the airbag module can be important for safety and reliability reasons. The placement of the occupant sensing as well as the diagnostics electronics within or adjacent to the airbag module has additional advantages to solving several current important airbag problems. For example, there have been numerous inadvertent airbag deployments caused by wires in the system becoming shorted. Then, when the vehicle hits a pothole, which is sufficient to activate an arming sensor or otherwise disturb the sensing system, the airbag can deploy. Such an unwanted deployment of course can directly injure an occupant who is out-of-position or cause an accident resulting in occupant injuries. If the sensor were to send a coded signal to the airbag module rather than a DC voltage with sufficient power to trigger the airbag, and if the airbag module had stored within its electronic circuit sufficient energy to initiate the inflator, then these unwanted deployments could be prevented. A shorted wire cannot send a coded signal and the short can be detected by the module resident diagnostic circuitry.

This would require that the airbag module contain, or have adjacent to it, a power supply (formerly the backup power supply) which further improves the reliability of the system since the electrical connection to the sensor, or to the vehicle power, can now partially fail, as might happen during an accident, and the system will still work properly. It is well known that the electrical resistance in the "clockspring" connection system, which connects the steering wheel-mounted airbag module to the sensor and diagnostic system, has been marginal in design and prone to failure. The resistance of this electrical connection must be very low or there will not be sufficient power to reliably initiate the inflator squib. To reduce the resistance to the level required, high quality gold-plated connectors are preferably used and the wires should also be of unusually high quality. Due to space constraints, however, these wires frequently have only a marginally adequate resistance thereby reducing the reliability of the driver airbag module and increasing its cost. If, on the other hand, the power to initiate the airbag were already in the module, then only a coded signal needs to be sent to the module rather than sufficient power to initiate the inflator. Thus, the resistance problem disappears and the module reliability is increased. Additionally, the requirements for the clockspring wires become less severe and the design can be relaxed reducing the cost and complexity of the device. It may even be possible to return to the slip ring system that existed prior to the implementation of airbags.

Under this system, the power supply can be charged over a few seconds, since the power does not need to be sent to the module at the time of the required airbag deployment because it is already there. Thus, all of the electronics associated with the airbag system except the sensor and its associated electronics, if any, could be within or adjacent to the airbag module. This includes optionally the occupant sensor, the diagnostics and the (backup) power supply, which now becomes the primary power supply, and the need for a backup disappears. When a fault is detected, a message is sent to a display unit located typically in the instrument panel.

The placement of the main electronics within each module follows the development path that computers themselves have followed from a large centralized mainframe base to a network of microcomputers. The computing power required by an occupant position sensor, airbag system diagnostics and backup power supply can be greater than that required by a single point sensor or of a sensor system employing satellite sensors. For this reason, it can be more logical to put this electronic package within or adjacent to each module. In this manner, the advantages of a centralized single point sensor and diagnostic system fade since most of the intelligence will reside within or adjacent to the individual modules and not the centralized system. A simple and more effective CrushSwitch sensor such as disclosed in U.S. Pat. No. 5,441,301, for example, now becomes more cost effective than the single point sensor and diagnostic system which is now being widely adopted. Finally, this also is consistent with the migration to a bus system where the power and information are transmitted around the vehicle on a single bus system thereby significantly reducing the number of wires and the complexity of the vehicle wiring system. The decision to deploy an airbag is sent to the airbag module sub-system as a signal not as a burst of power. Although it has been assumed that the information would be sent over a wire bus, it is also possible to send the deploy command by a variety of wireless methods either using wires or wirelessly.

A partial implementation of the system as just described is depicted schematically in FIG. 81 which shows a view of the combination of an occupant position sensor and airbag module designed to prevent the deployment of the airbag for a seat which is unoccupied or if the occupant is too close to the airbag and therefore in danger of deployment-induced injury. The module, shown generally at 430, includes a housing which comprises an airbag 431, an inflator assembly 432 for the airbag 431, an occupant position sensor comprising an ultrasonic transmitter 433 and an ultrasonic receiver 434. Other occupant position sensors can also be used instead of the ultrasonic transmitter/receiver pair to determine the position of the occupant to be protected by the airbag 431, and also the occupant position sensor (433,434) may be located outside of the housing of the module 430. A preferred alternative occupant sensor system uses a camera as disclosed in several of the assignee's patents such as U.S. Pat. Nos. 5,748,473, 5,835,613, 6,141,432, 6,270,116, 6,324,453 and 6,856,873. In the ultrasonic example, the housing of the module 430 also can contain an electronic module or package 435 coupled to each of the inflator assembly 432, the transmitter 433 and the receiver 434 and which performs the functions of sending the ultrasonic signal to the transmitter 433 and processing the data from the occupant position sensor receiver 434. Electronics module 435 may be arranged within the housing of the module 430 as shown or adjacent or proximate to the housing of the module 430. Module 430 can also contain a power supply (not shown) for supplying power upon command by the electronics module 435 to the inflator assembly 432 to cause inflation of the airbag 431. Thus, electronics module 435 controls the inflation or deployment of the airbag 431 and may sometimes herein be referred to as a controller or control unit. In addition, the electronic module 435 can monitor the power supply voltage, to assure that sufficient energy is stored to initiate the inflator assembly 432 when required, and power the other processes, and can report periodically over the vehicle bus 436 to the central diagnostic module, shown schematically at 437, to indicate that the module is ready, i.e., there is sufficient power of inflate or deploy the airbag 431 and operate the occupant position sensor transmitter/receiver pair 433, 434, or sends a fault code if a failure in any component being monitored has been detected. A CrushSwitch sensor is also shown schematically at 438, which can be the only discriminating sensor in the system. Sensor 438 is coupled to the vehicle bus 436 and can transmit a coded signal over the bus to the electronics module 435 to cause the electronics module 435 to initiate deployment of the airbag 431 via the inflator assembly 432. The vehicle bus 436 connects the electronic package 435, the central sensor and diagnostic module 437 and the CrushSwitch sensor 438. Bus 436 may be the single bus system, i.e., consists of a pair of wires, on which power and information are transmitted around the vehicle as noted immediately above. Instead of CrushSwitch sensor 438, other crash sensors may be used.

When several crash sensors and airbag modules are present in the vehicle, they can all be coupled to the same bus or discrete portions of the airbag modules and crash sensors can be coupled to separate buses. Other ways for connecting the crash sensors and airbag modules to an electrical bus can also be implemented in accordance with the invention such as connecting some of the sensors and/or modules in parallel to a bus and others daisy-chained onto the bus. This type of bus architecture is described in U.S. Pat. No. 6,212,457.

Figure 82:
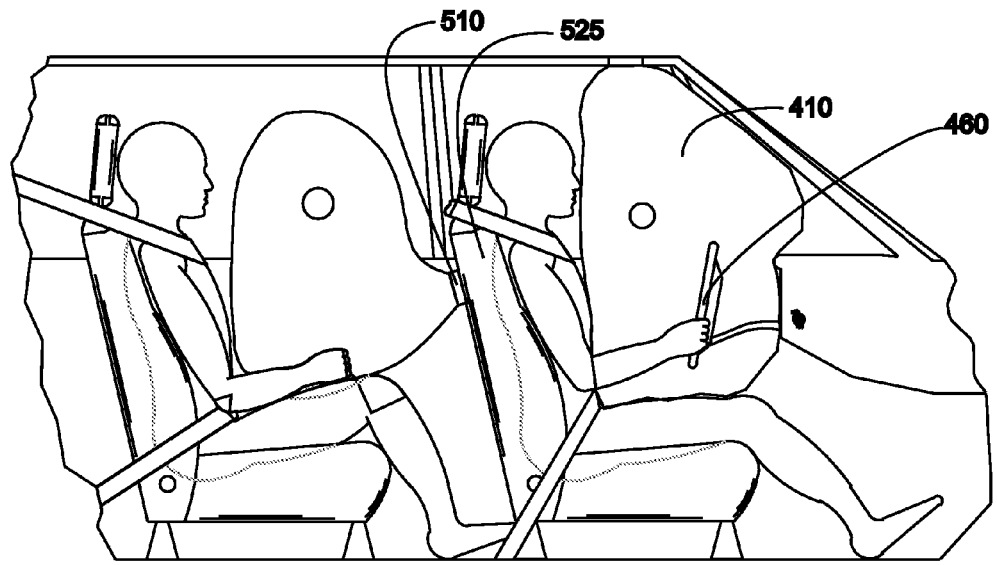

It should be understood that airbag module 430 is a schematic representation only and thus, may represent any of the airbag modules described above in any of the mounting locations. For example, airbag module 430 may be arranged in connection with the seat 525 as module 510 is in FIG. 82, as a side curtain airbag or as a passenger side airbag or elsewhere. For the seat example, the bus, which is connected to the airbag module 510, would inherently extend at least partially into and within the seat.

Figure 83:
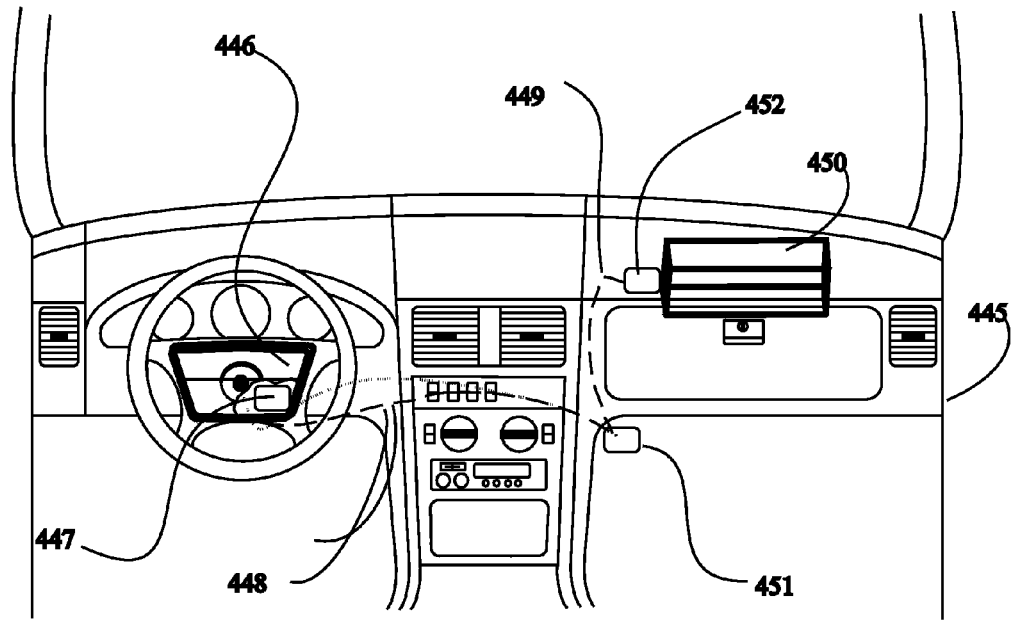

Another implementation of the invention incorporating the electronic components into and adjacent to the airbag module as illustrated in FIG. 83 which shows the interior front of the passenger compartment generally at 445. Driver airbag module 446 is partially cutaway to show an electronic module 447 incorporated within the airbag module 446. Electronic module 447 may be comparable to electronic module 435 in the embodiment of FIG. 81 in that it can control the deployment of the airbag in airbag module 446. Electronic airbag module 446 is connected to an electronic sensor illustrated generally as 451 by a wire 448. The electronic sensor 451 can be, for example, an electronic single point crash sensor that initiates the deployment of the airbag when it senses a crash. Passenger airbag module 450 is illustrated with its associated electronic module 452 outside of but adjacent or proximate to the airbag module. Electronic module 452 may be comparable to electronic module 439 in the embodiment of FIG. 81 in that it can control the deployment of the airbag in airbag module 450. Electronic module 452 is connected by a wire 449, which could also be part of a bus, to the electronic sensor 451. One or both of the electronic modules 447 and 452 can contain diagnostic circuitry, power storage capability (either a battery or a capacitor), occupant sensing circuitry, as well as communication electronic circuitry for either wired or wireless communication.

It should be understood that although only two airbag modules 446,450 are shown, it is envisioned that an automotive safety network may be designed with several and/or different types of occupant protection devices. Such an automotive network can comprise one or more occupant protection devices connected to the bus, each comprising a housing and a component deployable to provide protection for the occupant, at least one sensor system for providing an output signal relevant to deployment of the deployable component(s) (such as the occupant sensing circuitry), a deployment determining system for generating a signal indicating for which of the deployable components deployment is desired (such as a crash sensor) and an electronic controller arranged in, proximate or adjacent each housing and coupled to the sensor system(s) and the deployment determining system. The electrical bus electrically couples the sensor system(s), the deployment determining system and the controllers so that the signals from one or more of the sensor systems and the deployment determining system are sent over the bus to the controllers. Each controller controls deployment of the deployable component of the respective occupant protection device in consideration of the signals from the sensor system(s) and the deployment determining system. The crash sensor(s) may be arranged separate and at a location apart from the housings and generate a coded signal when deployment of any one of the deployable components is desired. Thus, the coded signal varies depending on which of deployment components are to be deployed. If the deployable component is an airbag associated with the housing, the occupant protection device would comprise an inflator assembly arranged in the housing for inflating the airbag.

The safety bus, or any other vehicle bus, may use a coaxial cable. A connector for joining two coaxial cables 457 and 458 is illustrated in FIGS. 70A, 70B, 70C and 70D generally at 455. A cover 456 can be hingably attached to a base 459. A connector plate 461 can be slidably inserted into base 459 and can contain two abrasion and connection sections 463 and 464. A second connecting plate 465 can contain two connecting pins 462, one corresponding to each cable to be connected. To connect the two cables 457 and 458 together is this implementation, they are first inserted into their respective holes 466 and 467 in base 459 until they are engaged by pins 462. Sliding connector plate 461 is then inserted and cover 460 rotated pushing connector plate 461 downward until the catch 468 snaps over mating catch 469. Other latching devices are of course usable in accordance with the invention. During this process, the serrated part 463 of connector plate 461 abrades the insulating cover off of the outside of the respective cable exposing the outer conductor. The particle coated section 464 of connector plate 461 then engages and makes electrical contact with the outer conductor of the coaxial cables 457 and 458. In this manner, the two coaxial cables 457,458 are electrically connected together in a very simple manner.

Consider now various uses of a bus system.

3.1 Airbag Systems

The airbag system currently involves a large number of wires that carry information and power to and from the airbag central processing unit. Some vehicles have sensors mounted in the front of the vehicle and many vehicles also have sensors mounted in the side structure (the door, B-Pillar, sill, or any other location that is rigidly connected to the side crush zone of the vehicle). In addition, there are sensors and an electronic control module mounted in the passenger compartment. All cars now have passenger and driver airbags and some vehicles have as many as eight airbags considering the side impact torso airbag and head airbags as well as knee bolster airbags.

To partially cope with this problem, there is a movement to connect all of the safety systems onto a single bus (see for example U.S. Pat. No. 6,326,704). Once again, the biggest problem with the reliability of airbag systems is the wiring and connectors. By practicing the teachings of this invention, one single pair of wires can be used to connect all of the airbag sensors and airbags together and, in one preferred implementation, to do so without the use of connectors. Thus, the reliability of the system is substantially improved and the reduced installation costs more than offsets the added cost of having a loosely coupled inductive network, for example, described elsewhere herein.

With such a system, more and more of the airbag electronics can reside within or adjacent to the airbag module with the crash sensor and occupant information fed to the electronics modules for the deploy decision. Thus, all of the relevant information can reside on the vehicle safety or general bus with each airbag module making its own deploy decision locally.

3.2 Steering Wheel

The steering wheel of an automobile is becoming more complex as more functions are incorporated utilizing switches and/or a touch pad, for example, on the steering wheel or other haptic or non-haptic input or even output devices. Many vehicles have controls for heating and air conditioning, cruise control, radio, etc.

Although previously not implemented, a steering can also be an output device by causing various locations on the steering wheel to provide a vibration, electrical shock or other output to the driver. This is in contrast to vibrating the entire steering wheel which has been proposed for an artificial rumble strip application when a vehicle departs from its lane. Such a local feedback can be used to identify for the driver which button he or she should press to complete an action such as dialing a phone number, for example (see H Kajimoto et al., SmartTouch: Electric Skin to Touch the Untouchable" IEEE Computer Graphics and Applications, pp 36-43, January-February, 2004, IEEE).

Additionally, the airbag must have a very high quality connection so that it reliably deploys even when an accident is underway.

This has resulted in the use of clockspring ribbon cables that make all of the electrical connections between the vehicle and the rotating steering wheel. The ribbon cable must at least able to carry sufficient current to reliably initiate airbag deployment even at very cold temperatures. This requires that the ribbon cable contain at least two heavy conductors to bring power to the airbag. Under the airbag network concept, a capacitor or battery can be used within the airbag module and kept charged thereby significantly reducing the amount of current that must pass through the ribbon cable. Thus, the ribbon cable can be kept considerably smaller, as discussed above.

An alternate and preferred solution uses the teachings of this invention to inductively couple the steering wheel with the vehicle thus eliminating all wires and connectors. All of the switch functions, control functions, and airbag functions are multiplexed on top of the inductive carrier frequency. This greatly simplifies the initial installation of the steering wheel onto the vehicle since a complicated ribbon cable is no longer necessary. Similarly, it reduces warranty repairs caused by people changing steering wheels without making sure that the ribbon cable is properly positioned.

As described elsewhere herein, an input device such as a mouse pad, joy stick or even one or more switches can be placed on the steering wheel and used to control a display such as a heads-up display thus permitting the vehicle operator to control many functions of a vehicle without taking his or her eyes off of the road. BMW recently introduced the IPOD haptic interface which attempts to permit the driver to control many vehicle functions (HVAC, etc.) but it lacks the display feedback and thus has been found confusing to vehicle operators. This problem disappears when such a device is coupled with a display and particularly a heads-up display as taught herein. Although a preferred location for the input device is the steering wheel, it can be placed at other locations in the vehicle as is the IPOD.

The use of a haptic device can be extended to give feedback to the operator. If the phone rings, for example, a particular portion of the steering wheel can be made to vibrate indicating where the operator should depress a switch to answer the phone. The display can also indicate to the driver that the phone is ringing and perhaps indicate to him or her the location of the switch or that a oral command should be given to answer the phone.

As one example of the implementation of this concept consider the following description used in conjunction with FIGS. 71A-72. FIG. 71A is a front view of a steering wheel having two generalized switches located at 3 and 9 o'clock on the steering wheel rim. FIG. 71B is a view similar to FIG. 71A with the addition of a thumb switch option and FIG. 71C is a rear view of the steering wheel of FIG. 71B with a finger trigger option.

Starting with the assumptions that:
The driver should be able to control various systems in the automobile without looking away from the road
The driver should be able to control these systems without taking his/her hands away from the steering wheel
All system control interfaces fundamentally will be menu-driven
Some sort of cursor on a heads-up or other easily visible display coupled with a mouse pad or joystick, as discussed below, might be distracting, it would be better to simply highlight and select from menu options.

Menus can easily be traversed with three buttons, one to move the selection up, one to move it down, and one to select. Since the driver should keep his/her hands on the steering wheel at all times, these buttons, 801, 802 and 803 should be placed so they can be accessed at the standard 3 o'clock and 9 o'clock hand positions.

Buttons could be placed on the front of the steering wheel such that the driver's thumbs can press them, or probably better, buttons could be placed on the rear of the steering wheel such that fingers could use them as triggers.

To prevent accidental menu launch (which could be distracting), all three buttons, 801, 802, and 803 could be pressed simultaneously to summon the menu on the heads-up display, or some similar scheme could be devised. If the driver presses on the brakes or makes a fast turn as an evasive maneuver, the menu can be designed to disappear so that the driver is not distracted when driving requires his/her attention.

In FIGS. 71A, 71B and FIG. 72, the two button cluster, 801, 803 (accessed by the left hand in the images, but side does not matter) can be, for example, menu option up and menu option down. The single button can be menu option select.

A press-knob could also be a good solution, but it has the disadvantage that it can't be placed in the optimal steering wheel driving position (3 or 9). This concept is likely similar to the IPOD input device now found on some BMW's, namely, a rotary knob that when turned highlights different menu options and when pressed selects the currently highlighted option. An advantage to this is that it is a better interface for temperature and volume controls in the car since it can be simply turned to adjust the parameter rather than pressed repeatedly, or pressed and held down as switches would be. This continuously varying function can also be achieved with a scroll wheel. FIG. 72 illustrates the addition of a mouse type scroll wheel 805 for the left hand.

Another solution would be a partial combination of the two. The menu item select function could be implemented as a wheel 805, similar to the scroll wheel on modern computer mice. Option select could be implemented with a wheel press or with a separate switch. The menu select wheel would be thumb-accessible, and a select switch could be a finger trigger switch.

All of the steering wheel mounted switched discussed above and below can be wireless and powerless devices such as those discussed herein based of RFID and SAW technologies.

3.3 Door Subsystem

More and more electrical functions are also being placed into vehicle doors. This includes window control switches and motors as well as seat control switches, airbag crash sensors, etc. As a result the bundle of wires that must pass through the door edge and through the A-pillar has become a serious assembly and maintenance problem in the automotive industry. Using the teachings of this invention, a loosely coupled inductive system could pass anywhere near the door and an inductive pickup system placed on the other side where it obtains power and exchanges information when the mating surfaces are aligned. If these surfaces are placed in the A-pillar, then sufficient power can be available even when the door is open. Alternately, a battery or capacitive storage system can be provided in the door and the coupling can exist through the doorsill, for example. This eliminates the need for wires to pass through the door interface and greatly simplifies the assembly and installation of doors. It also greatly reduces warranty repairs caused by the constant movement of wires at the door and car body interface.

3.4 Blind Spot Monitor

Many accidents are caused by a driver executing a lane change when there is another vehicle in his blind spot. As a result, several firms are developing blind spot monitors based on radar, optics, or passive infrared, to detect the presence of a vehicle in the driver's blind spot and to warn the driver should he attempt such a lane change. These blind spot monitors are typically placed on the outside of the vehicle near or on the side rear view mirrors. Since the device is exposed to rain, salt, snow etc., there is a reliability problem resulting from the need to seal the sensor and to permit wires to enter the sensor and also the vehicle. Special wire, for example, should be used to prevent water from wicking through the wire. These problems as well as similar problems associated with other devices which require electric power and which are exposed to the environment, such as forward-mounted airbag crash sensors, can be solved utilizing an inductive coupling techniques of this invention.

3.5 Truck-to-trailer Power and Information transfer

A serious source of safety and reliability problems results from the flexible wire connections that are necessary between a truck and a trailer. The need for these flexible wire connections and their associated connector problems can be eliminated using the inductive coupling techniques of this invention. In this case, the mere attachment of the trailer to the tractor automatically aligns an inductive pickup device on the trailer with the power lines imbedded in the fifth wheel, for example.

3.6 Wireless Switches

Switches in general do not consume power and therefore they can be implemented wirelessly according to the teachings of this invention in many different modes. For a simple on-off switch, a one bit RFID tag similar to what is commonly used for protecting against shoplifting in stores with a slight modification can be easily implemented. The RFID tag switch would contain its address and a single accessible bit permitting the device to be interrogated regardless of its location in the vehicle without wires. A SAW-based switch as disclosed elsewhere herein can also be used and interrogated wirelessly.

As the switch function becomes more complicated, additional power may be required and the options for interrogation become more limited. For a continuously varying switch, for example the volume control on a radio, it may be desirable to use a more complicated design where an inductive transfer of information is utilized. On the other hand, by using momentary contact switches that would set the one bit on only while the switch is activated and by using the duration of activation, volume control type functions can still be performed even though the switch is remote from the interrogator.

This concept then permits the placement of switches at arbitrary locations anywhere in the vehicle without regard to the placement of wires. Additionally, multiple switches can be easily used to control the same device or a single switch can control many devices.

For example, a switch to control the forward and rearward motion of the driver seat can be placed on the driver door-mounted armrest and interrogated by an RFID reader or SAW interrogator located in the headliner of the vehicle. The interrogator periodically monitors all RFID or SAW switches located in the vehicle which may number over 100. If the driver armrest switch is depressed and the switch bit is changed from 0 to 1, the reader knows based on the address or identification number of the switch that the driver intends to operate his seat in a forward or reverse manner. A signal can then be sent over the inductive power transfer line to the motor controlling the seat and the motor can thus be commanded to move the seat either forward based on one switch ID or backward based on another switch ID. Thus, the switch in the armrest could actually contain two identification RFIDs or SAW switches, one for forward movement of seat and one for rearward movement of the seat. As soon the driver ceases operating the switch, the switch state returns to 0 and a command is sent to the motor to stop moving the seat. The RFID or SAW device can be passive or active.

By this process as taught by this invention, all of the 100 or so switches and other simple sensors can become wireless devices and vastly reduce the number of wires in a vehicle and increase the reliability and reduce warranty repairs. One such example is the switch that determines whether the seatbelt is fastened which can now be a wireless switch.

3.7 Wireless Lights

In contrast to switches, lights require power. The power required generally exceeds that which can be easily transmitted by RF or capacitive coupling. For lights to become wireless, therefore, inductive coupling or equivalent can be required. Now, however, it is no longer necessary to have light sockets, wires and connectors. Each light bulb could be outfitted with an inductive pickup device and a microprocessor. The microprocessor can listen to the information coming over the inductive pickup line, or wirelessly, and when it recognizes its address, it activates an internal switch which turns on the light. If the information is transferred wirelessly, the RFID switch described in section 1.4.4 above can be used. The light bulb becomes a totally sealed, self-contained unit with no electrical connectors or connections to the vehicle. It is automatically connected by mounting in a holder and by its proximity, which can be as far away as several inches, to the inductive power line. It has been demonstrated that power transfer efficiencies of up to about 99 percent can be achieved by this system and power levels exceeding about 1 kW can be transferred to a device using a loosely coupled inductive system described above.

This invention therefore considerably simplifies the mounting of lights in a vehicle since the lights are totally self-contained and not plugged into the vehicle power system. Problems associated with sealing the light socket from the environment disappear vastly simplifying the installation of headlights, for example, into the vehicle. The skin of the vehicle need not contain any receptacles for a light plug and therefore there is no need to seal the light bulb edges to prevent water from entering behind the light bulb. Thus, the reliability of vehicle exterior lighting systems is significantly improved. Similarly, the ease with which light bulbs can be changed when they burn out is greatly simplified since the complicated mechanisms for sealing the light bulb into the vehicle are no longer necessary. Although headlights were discussed, the same principles apply to all other lights mounted on a vehicle exterior.

Since it is contemplated that the main power transfer wire pair will travel throughout the automobile in a single branched loop, several light bulbs can be inductively attached to the inductive wire power supplier by merely locating a holder for the sealed light bulb within a few inches of the wire. Once again, no electrical connections are required.

Consider for example the activation of the right turn signal. The microprocessor associated with the turn switch on the steering column is programmed to transmit the addresses of the right front and rear turn light bulbs to turn them on. A fraction of a second later, the microprocessor sends a signal over the inductive power transfer line, or wirelessly, to turn the light bulbs off. This is repeated for as long as the turn signal switch is placed in the activation position for a right turn. The right rear turn signal light bulb receives a message with its address and a bit set for the light to be turned on and it responds by so doing and similarly, when the signal is received for turning the light off. Once again, all such transmissions occur over a single power and information inductive line and no wire connections are made to the light bulb. In this example, all power and information is transferred inductively.

3.8 Keyless Entry

The RFID technology is particularly applicable to keyless entry. Instead of depressing a button on a remote vehicle door opener, the owner of vehicle need only carry an RFID card in his pocket. Upon approaching the vehicle door, the reader located in the vehicle door, activates the circuitry in the RFID card and receives the identification number, checks it and unlocks the vehicle if the code matches. It can even open the door or trunk based on the time that the driver stands near the door or trunk. Simultaneously, the vehicle now knows that this is driver No. 3, for example, and automatically sets the seat position, headrest position, mirror position, radio stations, temperature controls and all other driver specific functions including the positions of the petals to adapt the vehicle to the particular driver. When the driver sits in the seat, no ignition key is necessary and by merely depressing a switch which can be located anywhere in the vehicle, on the armrest for example, the vehicle motor starts. The switch can be wireless and the reader or interrogator which initially read the operator's card can be connected inductively to the vehicle power system.

U.S. Pat. No. 5,790,043 describes the unlocking of a door based on a transponder held by a person approaching the door. By adding the function of measuring the distance to the person, by use of the backscatter from the transponder antenna for example, the distance from the vehicle-based transmitter and the person can be determined and the door opened when the person is within 5 feet, for example, of the door as discussed elsewhere herein.

Using the RFID switch discussed above, for example, the integration of the keyless entry system with the tire monitor and all other similar devices can be readily achieved.

3.9 In-vehicle Mesh Network, Intra-vehicle Communications

The use of wireless networks within a vehicle has been discussed elsewhere herein. Of particular interest here is the use of a mesh network (or mesh) wherein the various wireless elements are connected via a mesh such that each device can communicate with each other to thereby add information that might aid a particular node. In the simplest case, nodes on the mesh can merely aid in the transfer of information to a central controller. In more advanced cases, the temperature monitored by one node can be used by other nodes to compensate for the effects of temperature on the node operation. In another case, the fact that a node has been damaged or is experiencing acceleration can be used to determine the extent of and to forecast the severity of an accident. Such a mesh network can operate in the discrete frequency or in the ultra wideband mode.

3.10 Road Conditioning Sensing—Black Ice Warning

A frequent cause of accidents is the sudden freezing of roadways or bridge surfaces when the roadway is wet and temperatures are near freezing. Sensors exist that can detect the temperature of the road surface within less than one degree either by direct measurement or by passive IR. These sensors can be mounted in locations on the vehicle where they have a clear view of the road and thus they are susceptible to assault from rain, snow, ice, salt etc. The reliability of connecting these sensors into the vehicle power and information system is thus compromised. Using the teachings of this invention, black ice warning sensors, for example, can be mounted on the exterior of the vehicle and coupled into the vehicle power and information system inductively, thus removing a significant cause of failure of such sensors. Also the use of appropriate cameras and sensors along with multispectral analysis of road surfaces can be particularly useful to discover icing.

Similar sensors can also used to detect the type of roadway on which the car is traveling. Gravel roads, for example, have typically a lower effective coefficient of friction than do concrete roads. Knowledge of the road characteristics can provide useful information to the vehicle control system and, for example, warn the driver when the speed driven is above what is safe for the road conditions, including the particular type of roadway.

3.11 Antennas Including Steerable Antennas

As discussed above, the antennas used in the systems disclosed herein can contribute significantly to the operation of the systems. In one case, a silicon or gallium arsenide (for higher frequencies) element can be placed at an antenna to process the returned signal as needed. High gain antennas such as the yagi antenna or steerable antennas such as electronically controllable (or tunable) dielectric constant phased array antennas are also contemplated. For steerable antennas, reference is made to U.S. Pat. No. 6,452,565 "Steerable-beam multiple-feed dielectric resonator antenna". Also contemplated, in addition to those discussed above, are variable slot antennas and Rotman lenses. All of these plus other technologies go under the heading of smart antennas and all such antennas are contemplated herein.

The antenna situation can be improved as the frequency increases. Currently, SAW devices are difficult to make that operate much above about 2.4 GHz. It is expected that as lithography systems improve that eventually these devices will be made to operate in the higher GHz range permitting the use of antennas that are even more directional.

3.12 Other Miscellaneous Sensors

Many new sensors are now being adapted to an automobile to increase the safety, comfort and convenience of vehicle occupants. Each of the sensors currently requires separate wiring for power and information transfer. Under the teachings of this invention, these separate wires can become unnecessary and sensors could be added at will to the automobile at any location within a few inches of the inductive power line system or, in some cases, within range of an RF interrogator. Even sensors that were not contemplated by the vehicle manufacturer can be added later with a software change to the appropriate vehicle CPU as discussed above.

Such sensors include heat load sensors that measure the sunlight coming in through the windshield and adjust the environmental conditions inside the vehicle or darken the windshield to compensate. Seatbelt sensors that indicate that the seatbelt is buckled and the tension or acceleration experienced by the seatbelt can now also use RFID and/or SAW technology as can low power microphones. Door-open or door-ajar sensors also can use the RFID and/or SAW technology and would not need to be placed near an inductive power line. Gas tank fuel level and other fluid level sensors which do not require external power and are now possible thus eliminating any hazard of sparks igniting the fuel in the case of a rear impact accident which ruptures the fuel tank, for example.

Capacitive proximity sensors that measure the presence of a life form within a few meters of the automobile can be coupled wirelessly to the vehicle. Cameras or other vision or radar or lidar sensors that can be mounted external to the vehicle and not require unreliable electrical connections to the vehicle power system permitting such sensors to be totally sealed from the environment are also now possible. Such sensors can be based on millimeter wave radar, passive or active infrared, or optical or any other portion of the electromagnetic spectrum that is suitable for the task. Radar, passive sound or ultrasonic backup sensors or rear impact anticipatory sensors also are now feasible with significantly greater reliability.

The use of passive audio requires additional discussion. One or more directional microphones aimed from the rear of the vehicle can determine from tire-produced audio signals, for example, that a vehicle is approaching and might impact the target vehicle which contains the system. The target vehicle's tires as well as those to the side of the target vehicle will also produce sounds which need to be cancelled out of the sound from the directional microphones using well-known noise cancellation techniques. By monitoring the intensity of the sound in comparison with the intensity of the sound from the target vehicle's own tires, a determination of the approximate distance between the two vehicles can be made. Finally, a measurement of the rate of change in sound intensity can be used to estimate the time to collision. This information can then be used to pre-position the headrest, for example, or other restraint device to prepare the occupants of the target vehicle for the rear end impact and thus reduce the injuries therefrom. A similar system can be used to forecast impacts from other directions. In some cases, the microphones will need to be protected in a manner so as to reduce noise from the wind such as with a foam protection layer. This system provides a very inexpensive anticipatory crash system.

Previously, the use of radio frequency to interrogate an RFID tag has been discussed. Other forms of electromagnetic radiation are possible. For example, an infrared source can illuminate an area inside the vehicle and a pin diode or CMOS camera can receive reflections from corner cube or dihedral corner (as more fully described below) reflectors located on objects that move within the vehicle. These objects would include items such as the seat, seatback, and headrest. Through this technique, the time of flight, by pulse or phase lock loop technologies, can be measured or modulated IR radiation and phase measurements can be used to determine the distance to each of the corner cube or dihedral corner reflectors.

The above discussion has concentrated on applications primarily inside of the vehicle (although mention is often made of exterior monitoring applications). There are also a significant number of applications concerning the interaction of a vehicle with its environment. Although this might be construed as a deviation from the primary premise of this invention, which is that the device is either powerless in the sense that no power is required other than perhaps that which can be obtained from a radio frequency signal or a powered device and where the power is obtained through induction coupling, it is encompassed within the invention.

When looking exterior to the vehicle, devices that interact with the vehicle may be located sufficiently far away that they will require power and that power cannot be obtained from the automobile. In the discussion below, two types of such devices will be considered, the first type which does not require infrastructure-supplied power and the second which does.

A rule of thumb is that an RFID tag of normal size that is located more than about a meter away from the reader or interrogator must have an internal power source. Exceptions to this involve cases where the only information that is transferred is due to the reflection off of a radar reflector-type device and for cases where the tag is physically larger. For those cases, a purely passive RFID can be five and sometimes more meters away from the interrogator. Nevertheless, we shall assume that if the device is more than a few meters away that the device must contain some kind of power supply.

An interesting application is a low-cost form of adaptive cruise control or forward collision avoidance system. In this case, a purely passive RFID tag could be placed on every rear license plate in a particular geographical area, such as a state. The subject vehicle would contain two readers, one on the forward left side of the vehicle and one on the forward right side. Upon approaching the rear of a car having the RFID license plate, the interrogators in the vehicle would be able to determine the distance, by way of reflected signal time of flight, from each reader to the license plate transducer. If the license plate RFID is passive, then the range is limited to about 5 meters depending on the size of the tag. Nevertheless, this will be sufficient to determine that there is a vehicle in front of or to the right or left side of the subject vehicle. If the relative velocity of the two vehicles is such that a collision will occur, the subject vehicle can automatically have its speed altered so as to prevent the collision, typically a rear end collision. Alternately, the front of the vehicle can have two spaced-apart tags in which case, a single interrogator could suffice.

The following explanation is from Prof G. Khlopov of the Institute of RadioPhysics and Electronics of National Academy of Science of Ukraine.

General

The dihedral corner reflector is widely used as a standard target for calibration of radar. Such reflector consists of two planes by dimensions a×b that cross at right angles as shown in FIGS. 84 and 84A.

In the general case, the properties of such a target are described by scattering pattern power (angle dependence of power reflected), value of radar cross section (RCS), which determines its radar visibility and dependence of RCS on polarization of the incident wave.

Scattering Power Pattern

In the azimuth plane the RCS for horizontal $-\sigma_{xx}(\phi)$ and vertical $\sigma_{yy}(\phi)$ polarizations is determined by the expression (1), which is valid for a quite large reflector in comparison with the radar wavelength $a \gg \lambda$.

$$\sigma_{xx}(\varphi) = \sigma_{yy}(\varphi) \qquad (1)$$

$$= 2\sigma_m \left| \frac{\cos(\frac{\pi}{4} + |\varphi|) - \frac{1}{2}\cos(\frac{\pi}{4} + \varphi^2)}{ka\sin(\frac{\pi}{4} - |\varphi|)} \sin[ka\sin(\frac{\pi}{4} - |\varphi|)] \times e^{-j\frac{ka}{2}\cos(\frac{\pi}{4} + |\varphi|)} \right|^2,$$

where $\phi$ is the azimuth angle $$\left(-\frac{\pi}{4} \leq \varphi \leq \frac{\pi}{4}\right), \sigma_m = 8\pi\left(\frac{ab}{\lambda}\right)^2 -$$

value of RCS in the boresight of scattering pattern ($\phi$=0), $$k = \left(\frac{2\pi}{\lambda}\right)$$

wave number. For example, the scattering pattern is shown for a=6.4λ in FIG. 85, which slightly depends on value of a/λ.

As shown, the scattering pattern is approximately of 30 degrees width at level −3 dB (independently of value a/λ for a≧λ) and two side lobes at −3 dB level.

In the vertical plane (along Y axis), the scattering pattern is determined by the expression $$\sigma_{xx}(\theta) = \sigma_{yy}(\theta) = 8\pi\left(\frac{ab}{\lambda}\right)^2 \left[\frac{\sin[kb\sin\theta]}{kb\sin\theta}\right]^2, \qquad (2)$$

where θ—elevation angle.

The shape of scattering pattern in the vertical plane is presented in FIG. 86 and its width is approximately 25 λ/b degrees at level −3 dB.

Radar Cross Section

The RCS of dihedral corner reflector in boresight of scattering pattern (θ=φ0) is described by the formulas when its dimensions are more than radar wavelength a,b≧λ. When the incidence field is polarized in the principal planes (horizontal and vertical planes), the RCS is determined by the expression $$\sigma_{xx}(\theta) = \sigma_{yy}(\theta) = 8\pi \left(\frac{ab}{\lambda}\right)^2 \quad (3)$$

Polarization Properties.

When the plane of polarization of incidence field does not coincide with the principal planes of dihedral corner and is inclined at the angle α—FIG. 87, then reflector scattered the incident field also at the orthogonal polarization. In other words the total power reflected can be represented as the sum of two components—vertical and horizontal, according to the following expression (for θ=0)

$$\sigma_{Ver}(\alpha, \varphi) = 2\sigma_m \cos^2 2\alpha \cdot \cos^2\left(\frac{\pi}{4} + |\varphi|\right), \quad (4)$$

$$\sigma_{Hor}(\alpha, \varphi) = 2\sigma_m \sin^2 2\alpha \cdot \cos^2\left(\frac{\pi}{4} + |\varphi|\right).$$

For this reason, the total vector of the reflected field is linear polarized and its plane is rotated on angle β=2α relatively to the principal plane of dihedral corner—FIG. 87.

This property is widely used in microwave devices for rotating of linear polarization on angle 90 deg, when the plane of polarization of incidence field is oriented at 45 deg. to the principal plane of the corner—FIG. 88.

Nevertheless, it is not only the possibility of polarization angles that are produced. There are no limits on the rotation angle and, for example, it is possible to obtain the rotation angle β=±45 deg when the angle α is equal to ±22.5 deg.

Application of Dihedral Corner Reflector in Development of Radar Precise Positioning System of Vehicles In the project "Radar development for Precise Positioning System of Vehicles" developed jointly with Orion Company (Kiev, Ukraine) in the interests of the current assignee, the principal problem is to select signals, scattered from corner reflectors S1 and S2 (FIG. 88), which are located along the road in a special way. Actually, such signals usually are masked by clutter from terrain because any objects may appear within the radar beam (buildings, constructions, trees etc.).

The simplest way to solve the problem is to provide a large signal-to-clutter ratio that is quite hard in the case under consideration. As the research shows, most anthropogenic objects (buildings, constructions etc.) are of spatial distributed type, their dimensions are essentially larger than the diameter of the radar beam and its RCS in millimeter wave band is about tens of m². The RCS of traditional trihedral corner reflector is equal to $\sigma_0 = 4\pi\alpha^4/3\lambda^2$ (α—size of edge, λ—wavelength) and it is practically impossible to provide values of RCS more than 50-100 m² in 4 mm millimeter wavelengths because of the following reasons:

the necessary dimensions of corner reflector are quite large ≈200×200×200 mm;

the necessary accuracy of producing is too high—angle between the corner edges must be equal 90±0.1 deg.

That's why the application of usual trihedral corner reflectors cannot stand out over the background of the clutter. On the other hand, the application of dihedral angle reflector can provide an effective polarization selection of such reflector on the background of clutter from terrain.

As is well known for composite targets, including anthropogenic objects (buildings, constructions, background clutters etc.), the main reflected power is concentrated on co-polarized component, i.e. plane of polarization of which is coincident with the polarization of incident wave. For this reason, it is possible to decrease their influence if the reflector provides rotation of polarization plane of scattered field at 90 degrees. In that case the radar receiver also must be turned on reception of cross-polarized component that provides significant decreasing of clutter power.

Such a property may be provided by using a dihedral corner reflector, which is oriented at 45 degrees relative to the plane of polarization of the incident field—FIG. 89.

When the incident field $E_{in}$ is transformed to the orthogonal polarized reflected field $-E_s$, on which the RCS of composite targets usually does not exceed 0.01 -0.015 m².

Therefore, the dihedral corner reflector enables the signal-to-clutter ratio more than 10 dB (a=30 mm, b=90 mm) and this is enough to provide reliable selection of signals from the reflectors on the clutter background. As a result, the reception of reflected signals on cross-polarized component also provides high isolation between transmitter and receiver that improves signal-to-noise ratio for CW FM radar.

This leads to a novel addition or substitution to putting an RFID tag onto a license plate is to emboss the license plate or otherwise attach to it or elsewhere on the vehicle a corner cube or dihedral corner reflector which can yield a bright reflection from a radar or ladar (laser radar) transmitter from a following vehicle, for example. Further, the reflector can be designed to rotate the polarization of a beam by 90 degrees, thus the potential problem of the receiver being blinded by another vehicle's system is reduced. Additionally, a reflector can be designed as described above to reflect a polarized beam from a non-polarized beam or better to rotate a polarized beam through an arbitrary angle. In this manner, some information about the vehicle such as its mass class can be conveyed to the interrogating vehicle. A polarization on only 0 degrees can signify a passenger car, only 90 degrees an SUV or other large passenger vehicle or pickup truck, 45 degrees a small truck, both 0 and 45 degrees (using two reflectors) a larger truck, 45 and 90 degrees a larger truck etc. yielding 7 or more classifications. Thus using a very low cost reflector, a great deal of information can be conveyed including the range to the vehicle based on time-of-flight or phase angle comparison if the transmitted beam is modulated. Noise or pseudo-noise modulated radar would also be applicable as a modulation based system for distance measurement.

Additions to an RFID-based system that can be used alone or along with the reflector system discussed above include the addition of an energy harvesting system such as solar power or power from vibrations. Thus the tag can start out as a pure passive tag providing up to about 10 meters range and grow to an active tag providing a 30 or more meter range. With the use of RFID, a great deal of additional information can be transmitted such as the vehicle weight, license plate number, tolling ID etc. Once a tire pressure interrogator as discussed above is on the vehicle, the cost to add one or more license plate interrogating antennas is small and the cost addition to a license plate can be as low as 1-5 US dollars. Since no electrical connection need be made to the vehicle, the installation cost is no more than for an ordinary license plate.

An alternate approach is to visually scan license plates using an imager such as a camera. An infrared imager and a source of infrared illumination can be used. Using such a system, the characters (numbers and letters) can be read and if the license plate-issuing authority has coded the properties (type of vehicle, weight, etc.) into these characters, a vehicle can identify those properties of a vehicle that it may soon impact and that information can be a factor in the vehicle control algorithm or restraint deployment decision.

Systems are under development that will permit an automobile to determine its absolute location on the surface of the earth. These systems are being developed in conjunction with intelligent transportation systems. Such location systems are frequently based on differential GPS (DGPS). One problem with such systems is that the appropriate number of GPS satellites is not always within view of the automobile. For such cases, it is necessary to have an earth-based system which will provide the information to the vehicle permitting it to absolutely locate itself within a few centimeters. One such system can involve the use of RFID tags placed above, adjacent or below the surface of the highway.

For the cases where the RFID tags are located more than a few meters from the vehicle, a battery or other poser source will probably be required and this will be discussed below. For the systems without batteries, such as placing the RFID tag in the concrete, with two readers located one on each side of the vehicle, the location of the tag embedded in the concrete can be precisely determine based on the time of flight of the radar pulse from the readers to the tag and back. Using this method, the precise location of the vehicle relative to a tag within a few centimeters can be readily determined and since the position of the tag will be absolutely known by virtue of an in-vehicle resident digital map, the position of the vehicle can be absolutely determined regardless of where the vehicle is. For example, if the vehicle is in a tunnel, then it will know precisely its location from the RFID pavement embedded tags. Note that the polarization rotation reflector discussed above will also perform this task excellently.

It is also possible to determine the relative velocity of the vehicle relative to the RFID tag or reflector using the Doppler Effect based on the reflected signals. For tags located on license plates or elsewhere on the rear of vehicles, the closing velocity of the two vehicles can be determined and for tags located in or adjacent to the highway pavement, the velocity of the vehicle can be readily determined. The velocity can in both cases be determined based on differentiating two distance measurements.

In many cases, it may be necessary to provide power to the RFID tag since the distance to the vehicle will exceed a few meters. This is currently being used in reverse for automatic tolling situations where the RFID tag is located on the vehicle and interrogated using readers located at the toll both.

When the RFID tag to be interrogated by vehicle-mounted readers is more than a few meters from the vehicle, the tag in many cases must be supplied with power. This power can come from a variety of sources including a battery which is part of the device, direct electrical connections to a ground wire system, solar batteries, generators that generate power from vehicle or component vibration, other forms of energy harvesting or inductive energy transfer from a power line.

For example, if an RFID tag were to be placed on a light post in downtown Manhattan, sufficient energy could be obtained from an inductive pickup from the wires used to power the light to recharge a battery in the RFID. Thus, when the lights are turned on at night, the RFID battery could be recharged sufficiently to provide power for operation 24 hours a day. In other cases, a battery or ultracapacitor could be included in the device and replacement or recharge of the battery would be necessitated periodically, perhaps once every two years.

An alternate approach to having a vehicle transmit a pulse to the tag and wait for a response, would be to have the tag periodically broadcast a few waves of information at precise timing increments. Then, the vehicle with two receivers could locate itself accurately relative to the earth-based transmitter.

For example, in downtown Manhattan, it would be difficult to obtain information from satellites that are constantly blocked by tall buildings. Nevertheless, inexpensive transmitters could be placed on a variety of lampposts that would periodically transmit a pulse to all vehicles in the vicinity. Such a system could be based on a broadband micropower impulse radar system as disclosed in several U.S. patents. Alternately, a narrow band signal can be used.

Once again, although radar type microwave pulses have been discussed, other portions of the electromagnetic spectrum can be utilized. For example, a vehicle could send a beam of modulated infrared toward infrastructure-based devices such as poles which contain corner or polarization modifying reflectors. The time of flight of IR radiation from the vehicle to the reflectors can be accurately measured and since the vehicle would know, based on accurate maps, where the reflector is located, there is the little opportunity for an error.

The invention is also concerned with wireless devices that contain transducers. An example is a temperature transducer coupled with appropriate circuitry which is capable of receiving power either inductively or through radio frequency energy transfer or even, and some cases, capacitively. Such temperature transducers may be used to measure the temperature inside the passenger compartment or outside of the vehicle. They also can be used to measure the temperature of some component in the vehicle, e.g., the tire. A distinctive feature of some embodiments of this invention is that such temperature transducers are not hard-wired into the vehicle and do not rely solely on batteries. Such temperature sensors have been used in other environments such as the monitoring of the temperature of domestic and farm animals for health monitoring purposes.

Upon receiving power inductively or through the radio frequency energy transfer, the temperature transducer conducts its temperature measurement and transmits the detected temperature to a process or central control module in the vehicle.

The wireless communication within a vehicle can be accomplished in several ways. The communication can be through the same path that supplies power to the device, or it can involve the transmission of waves that are received by another device in the vehicle. These waves can be either electromagnetic (radio frequency, microwave, infrared, etc) or ultrasonic. If electromagnetic, they can be sent using a variety of protocols such as CDMA, FDMA, TDMA or ultra-wideband (see, e.g., Hiawatha Bray, "The next big thing is actually ultrawide", Boston Globe, Jun. 25, 2004).

Many other types of transducers or sensors can be used in this manner. The distance to an object from a vehicle can be measured using a radar reflector type RFID (Radio Frequency Identification) tag which permits the distance to the tag to be determined by the time of flight of radio waves. Another method of determining distance to an object can be through the use of ultrasound wherein the device is commanded to emit an ultrasonic burst and the time required for the waves to travel to a receiver is an indication of the displacement of the device from the receiver.

Although in most cases the communication will take place within the vehicle, and some cases such as external temperature transducers or tire pressure transducers, the source of transmission will be located outside of the compartment of the vehicle.

A discussion of RFID technology including its use for distance measurement is included in the *RFID Handbook*, by Klaus Finkenzeller, John Wiley & Sons, New York 1999.

In one simple form, the invention can involve a single transducer and system for providing power and receiving information. An example of such a device would be an exterior temperature monitor which is placed outside of the vehicle and receives its power and transmits its information through the windshield glass. At the other extreme, a pair of parallel wires carrying high frequency alternating current can travel to all parts of the vehicle where electric power is needed. In this case, every device could be located within a few inches of this wire pair and through an appropriately designed inductive pickup system, each device receives the power for operation inductively from the wire pair. A system of this type which is designed for use in powering vehicles is described in several U.S. patents listed above.

In this case, all sensors and actuators on the vehicle can be powered by the inductive power transfer system. The communication with these devices could either be over the same system or, alternately, could be take place via RF, ultrasound, infrared or other similar communication system. If the communication takes place either by RF or over a modulated wire system, a protocol such as the Bluetooth™ or Zigbee protocol can be used. Other options include the Ethernet and token ring protocols.

The above system technology is frequently referred to as loosely coupled inductive systems. Such systems have been used for powering a vehicle down a track or roadway but have not been used within the vehicle. The loosely coupled inductive system makes use of high frequency (typically 10,000 Hz) and resonant circuits to achieve a power transfer approaching 99 percent efficiency. The resonant system is driven using a switching amplifier. As discussed herein, this is believed to be the first example of a high frequency power system for use within vehicles.

Every device that utilizes the loosely coupled inductive system would contain a microprocessor and thus would be considered a smart device. This includes every light, switch, motor, transducer, sensor etc. Each device could have an address and would respond only to information containing its address.

It is now contemplated that the power systems for next generation automobiles and trucks will change from the current standard of 12 volts to a new standard of 42 volts. The power generator or alternator in such vehicles will produce alternating current and thus will be compatible with the system described herein wherein all power within the vehicle will be transmitted using AC.

It is contemplated that some devices will require more power than can be obtained instantaneously from the inductive, capacitive or radio frequency source. In such cases, batteries, capacitors or ultra-capacitors may be used directly associated with a particular device to handle peak power requirements. Such a system can also be used when the device is safety critical and there is a danger of disruption of the power supply during a vehicle crash, for example. In general, the battery or capacitor would be charged when the device is not being powered.

In some cases, the sensing device may be purely passive and require no power. One such example is when an infrared or optical beam of energy is reflected off of a passive reflector to determine the distance to that reflector. Another example is a passive reflective RFID tag.

As noted above, several U.S. patents describe arrangements for monitoring the pressure inside a rotating tire and to transmit this information to a display inside the vehicle. A preferred approach for monitoring the pressure within a tire is to instead monitor the temperature of the tire using a temperature sensor and associated power supplying circuitry as discussed above and to compare that temperature to the temperature of other tires on the vehicle, as discussed above. When the pressure within a tire decreases, this generally results in the tire temperature rising if the vehicle load is being carried by that tire. In the case where two tires are operating together at the same location such as on a truck trailer, just the opposite occurs. That is, the temperature of the fully inflated tire can increase since it is now carrying more load than the partially inflated tire.

4. Summary

As stated at the beginning this application is one in a series of applications covering safety and other systems for vehicles and other uses. The disclosure herein goes beyond that needed to support the claims of the particular invention that is being claimed herein. This is not to be construed that the inventor is thereby releasing the unclaimed disclosure and subject matter into the public domain. Rather, it is intended that patent applications have been or will be filed to cover all of the subject matter disclosed above.

The inventions described above are, of course, susceptible to many variations, combinations of disclosed components, modifications and changes, all of which are within the skill of the art. It should be understood that all such variations, modifications and changes are within the spirit and scope of the inventions and of the appended claims. Similarly, it will be understood that applicant intends to cover and claim all changes, modifications and variations of the examples of the preferred embodiments of the invention herein disclosed for the purpose of illustration which do not constitute departures from the spirit and scope of the present invention as claimed.

Although several preferred embodiments are illustrated and described above, there are possible combinations using other geometries, sensors, materials and different dimensions for the components that perform the same functions. This invention is not limited to the above embodiments and should be determined by the following claims.

The invention claimed is:

1. A vehicle, comprising:

a frame defining a passenger compartment having at least one seat and a seating position defined by said seat;

at least one component subject to control by an occupant in the passenger compartment, each of said at least one component being arranged on said frame; and at least one switch assembly, each of said at least one switch assembly being arranged to control a respective one of said at least one component based on pressure applied by a hand or finger of the occupant of the vehicle to an exposed surface of said passenger compartment of the vehicle, said at least one switch assembly being arranged in a position on a side of or in front of said seat such that the occupant when sitting in said seating position is able to touch said exposed surface with their hand or finger, each of said at least one switch assembly comprising:

a substrate underlying said exposed surface;

at least one wireless transmission component arranged on said substrate to wirelessly transmit an indication of the application of pressure by the occupant's hand or finger to said exposed surface, said at least one wireless component being arranged such that pressure transferred to said substrate affects the wireless transmission of said at least one wireless transmission component; and a manually controlled control device that controls the wireless transmission by said at least one wireless transmission component based on the application of pressure by the occupant's hand or finger to said exposed surface by transferring the pressure applied by the occupant's hand or finger on said exposed surface to said substrate.

2. The vehicle of claim 1, wherein said at least one switch assembly further comprises a material sheet defining said exposed surface, said material sheet being any sheet having an outer surface exposed to the passenger compartment of the vehicle and an inner surface facing said substrate.

3. The vehicle of claim 2, wherein said control device comprises a projection arranged on or between said material sheet and a space on said substrate such that pressure applied by the occupant's hand or finger on said exposed surface of said material sheet is transferred by said projection to said substrate and the indication of the application of pressure is wirelessly transmitted by said at least one wireless transmission component to be used to control the respective one of said at least one component.

4. The vehicle of claim 3, wherein said projection is formed on or in connection with said material sheet.

5. The vehicle of claim 3, wherein said projection is formed on or in connection with said substrate.

6. The vehicle of claim 5, further comprising an additional projection formed on or in connection with said material sheet and in alignment with said projection formed on said substrate.

7. The vehicle of claim 3, wherein said at least one wireless transmission component includes an interdigital transducer arranged on said substrate and a reflector arranged on said substrate spaced from said interdigital transducer, said space on said substrate being situated between said interdigital transducer and said reflector.

8. The vehicle of claim 7, wherein said at least one switch assembly includes a variable impedance device attached across said reflector to enable a determination of the magnitude of the pressure applied by the occupant's hand or finger to said exposed surface of said material sheet.

9. The vehicle of claim 2, wherein at least one wireless transmission component is arranged to wirelessly transmit a magnitude of the application of pressure by the occupant's hand or finger to said substrate.

10. The vehicle of claim 1, wherein said at least one switch assembly is a passive switch assembly in that power for said at least one wireless transmission component is provided through radio frequency transmission.

11. The vehicle of claim 1, wherein said at least one switch assembly is an active switch assembly in that power for said at least one wireless transmission component is provided through a wire leading from a source of power mounted on the vehicle.

12. The vehicle of claim 1, wherein said exposed surface is an armrest of the vehicle, a steering wheel cover of the vehicle or an airbag cover of the vehicle.

13. The vehicle of claim 1, wherein said at least one wireless transmission component includes an interdigital transducer arranged on said substrate, and a reflector arranged on said substrate spaced from said interdigital transducer, said control device comprising a switch arranged across said interdigital transducer or said reflector and arranged relative to said exposed surface such that pressure applied by the occupant's hand or finger to said exposed surface alters said switch between a fully closed position and a fully open position, whereby when said switch is in the open position, said at least one wireless transmission component is unable to transmit.

14. The vehicle of claim 1, wherein said at least one wireless transmission component includes at least one reflector arranged on said substrate, said control device comprising a variable impedance arranged across one of said at least one reflector and arranged relative to said exposed surface such that pressure applied by the occupant's hand or finger to said exposed surface alters said variable impedance, whereby when the condition of said variable impedance determines the wireless transmission via said at least one wireless transmission component.

15. The vehicle of claim 1, wherein said at least one switch assembly comprises a radio-frequency identification device (RFID), said at least one wireless transmission component being a part of said RFID, said control device being arranged to enable a circuit to be completed without said RFID such that said RFID does not receive a signal and therefore does not provide a responsive signal.

16. The vehicle of claim 15, wherein said at least one switch assembly further comprises an antenna coupled to said RFID and said control device comprises a switch or variable impedance connecting an output from and an input to said antenna and arranged relative to said exposed surface such that pressure applied by the occupant's hand or finger to said exposed surface alters said switch or said variable impedance and thereby causes variation of a responsive signal provided by said RFID.

17. The vehicle of claim 1, wherein said at least one switch assembly comprises a surface-acoustic-wave (SAW) device.

18. The vehicle of claim 17, wherein said at least one switch assembly further comprises an antenna coupled to said SAW device and said control device comprises a switch or variable impedance connecting an output from and an input to said antenna and arranged relative to said exposed surface such that pressure applied by the occupant's hand or finger to said exposed surface alters said switch or said variable impedance and thereby causes variation of a signal provided by said SAW device.

19. The vehicle of claim 1, further comprising an interrogator that transmits signals to said at least one switch assembly to obtain a responsive signal generated or modified by said at least one switch assembly.

20. The vehicle of claim 1, wherein said at least one wireless transmission component comprises an antenna that reflects a received signal and said control device comprises a switch or variable impedance connecting an intermediate portion of said antenna to ground and arranged relative to said exposed surface such that pressure applied by the occupant's hand or finger to said exposed surface alters said switch or said variable impedance and thereby causes variation of the reflected signal.

21. The vehicle of claim 1, wherein said at least one switch assembly is permanently mounted on said frame.

22. The vehicle of claim 1, wherein the at least one component comprises a plurality of components and said at least one switch assembly comprises a plurality of switches assemblies, each of said switch assemblies controlling a respective one of said components such that said at least one wireless transmission component of each of said switch assemblies is independent of said at least one wireless transmission component of any other one of said switch assemblies.

23. The vehicle of claim 1, wherein each of said at least one switch assemblies is arranged to utilize energy harvesting to power said at least one wireless transmission component, the energy harvesting including receiving power for said at least one wireless transmission component from a radio frequency interrogating signal, receiving power from the sun, receiving inductive power and generating power through vibrations.

24. The vehicle of claim 1, further comprising an interrogator that transmits radio-frequency signals to said at least one switch assembly to obtain a responsive signal generated or modified by said at least one switch assembly, said at least one switch assembly comprising a radio-frequency identification device (RFID), said at least one wireless transmission component being a part of said RFID, said interrogator being arranged to individually interrogate each of said at least one switch assembly by transmitting a radio frequency signal and said at least one wireless transmission component being arranged to respond to the interrogation signal sent thereto and provide an indication of the application of pressure by the occupant's hand or finger to said exposed surface.

25. A method for controlling at least one component in a vehicle based on a pressure measurement on an exposed surface within a passenger compartment of the vehicle, the passenger compartment being defined by a frame of the vehicle and the vehicle having at least one seat and a seating position defined by the seat, the at least one component being arranged on the frame, the method comprising:

coupling each of the at least one component to a respective manually controlled switch assembly to enable control of the component upon application of pressure by a hand or finger of the occupant to an exposed surface of the vehicle, each switch assembly being arranged in a position on a side of or in front of the seat such that the occupant when sitting in the seating position is able to touch the exposed surface with their hand or finger;

arranging a substrate to underlie the exposed surface;

arranging at least one wireless transmission component on the substrate to wirelessly transmit an indication of the application of pressure by the occupant's hand or finger to the exposed surface, the at least one wireless transmission component being arranged such that pressure transferred to the substrate affects the wireless transmission of the at least one wireless transmission component;

controlling the wireless transmission by the at least one wireless transmission component based on the application of pressure by the occupant's hand or finger to the exposed surface by transferring the pressure applied by the occupant's hand or finger on the exposed surface to the substrate; and controlling the at least one component based on the wireless transmission by the at least one wireless transmission component.

26. The method of claim 25, wherein the wireless transmission is controlled by arranging a switch or variable impedance in connection with the at least one wireless transmission component such that pressure applied by the occupant's hand or finger to the exposed surface alters the switch or variable impedance and thereby causes variation of a signal provided by the at least one wireless transmission component.

27. The method of claim 25, further comprising arranging at least one projection on or between a material sheet defining the exposed surface and a space on the substrate underlying the material sheet such that pressure applied by the occupant's hand or finger on the exposed surface of the material sheet is transferred by the projection to the substrate.

28. The method of claim 25, further comprising permanently mounting each switch assembly on the frame.

* * * * *